US012501823B2

(12) United States Patent
Heo et al.

(10) Patent No.: US 12,501,823 B2
(45) Date of Patent: Dec. 16, 2025

(54) ORGANIC LIGHT EMITTING DEVICE

(71) Applicant: LG CHEM, LTD., Seoul (KR)

(72) Inventors: Dong Uk Heo, Daejeon (KR); Miyeon Han, Daejeon (KR); Jae Tak Lee, Daejeon (KR); Jung Min Yoon, Daejeon (KR); Heekyung Yun, Daejeon (KR); Hoyoon Park, Daejeon (KR); Sung Kil Hong, Daejeon (KR)

(73) Assignee: LG CHEM, LTD., Seoul (KR)

( * ) Notice: Subject to any disclaimer, the term of this patent is extended or adjusted under 35 U.S.C. 154(b) by 425 days.

(21) Appl. No.: 18/039,780

(22) PCT Filed: Feb. 28, 2022

(86) PCT No.: PCT/KR2022/002859
§ 371 (c)(1),
(2) Date: Jun. 1, 2023

(87) PCT Pub. No.: WO2022/191488
PCT Pub. Date: Sep. 15, 2022

(65) Prior Publication Data

US 2024/0016053 A1 Jan. 11, 2024

(30) Foreign Application Priority Data

Mar. 8, 2021 (KR) ........................ 10-2021-0030418

(51) Int. Cl.
*H10K 85/60* (2023.01)
*H10K 50/15* (2023.01)
(Continued)

(52) U.S. Cl.
CPC ........... *H10K 85/615* (2023.02); *H10K 50/15* (2023.02); *H10K 50/16* (2023.02); *H10K 85/654* (2023.02);
(Continued)

(58) Field of Classification Search
None
See application file for complete search history.

(56) References Cited

U.S. PATENT DOCUMENTS 6,821,643 B1 11/2004 Hu et al.
2003/0163003 A1 8/2003 Zhang et al.
(Continued)

FOREIGN PATENT DOCUMENTS

CN 106554771 A 4/2017
CN 106565434 A 4/2017
(Continued)

OTHER PUBLICATIONS

Mboyi et al., "Bridge-Clamp Bis(tetrazine)s with $[N]_8$ π-Stacking Interactions and Azido-s-Aryl Tetrazines: Two Classes of Doubly Clickable Tetrazines," Angewandte Chemie International Edition, 59:1149-1154 (2020).
(Continued)

*Primary Examiner* — Anthony Ho
(74) *Attorney, Agent, or Firm* — Bryan Cave Leighton Paisner LLP

(57) ABSTRACT

Provided is an organic light-emitting device comprising: a light emitting layer comprising a compound of the following Chemical Formula 1, and one or more of an electron transport layer, an electron injection layer, or an electron
(Continued)

transport and injection layer that comprises at least one of a compound of the following Chemical Formula 2 and a compound of the following Chemical Formula 3:

[Chemical Formula 1]

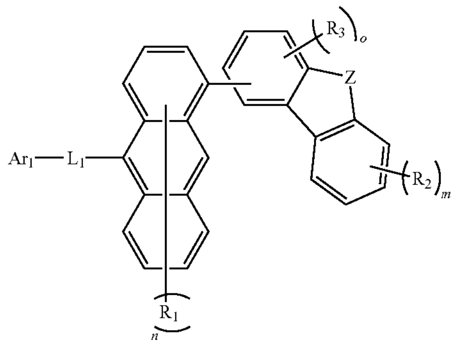

[Chemical Formula 2]

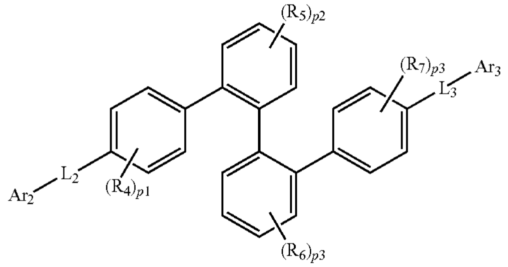

[Chemical Formula 3]

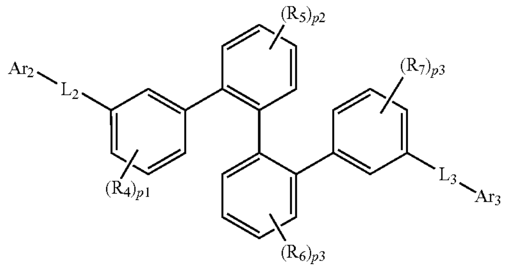

wherein $Ar_2$ and $Ar_3$ are each independently a substituent of Chemical Formula 4,

[Chemical Formula 4]

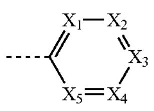

where $X_1$ to $X_5$ are each independently N or $C(R_8)$, wherein at least two of $X_1$ to $X_5$ are N, and the other substituents are as defined in the specification. The organic light emitting device including the heterocyclic compound of Chemical Formula 1 and the heterocyclic compound of Chemical Formula 2 or 3 had significantly superior efficiency and lifespan.

13 Claims, 1 Drawing Sheet

(51) Int. Cl.
*H10K 50/16* (2023.01)
*H10K 50/17* (2023.01)

(52) U.S. Cl.
CPC ..... *H10K 85/6574* (2023.02); *H10K 85/6576* (2023.02); *C07B 2200/05* (2013.01); *H10K 50/171* (2023.02)

(56) References Cited

U.S. PATENT DOCUMENTS

2004/0251816 A1 12/2004 Leo et al.
2007/0196692 A1 8/2007 Ise et al.
2008/0297037 A1 12/2008 Vestweber et al.
2009/0146554 A1 6/2009 Lee et al.
2012/0104941 A1 5/2012 Jung et al.
2015/0255730 A1 9/2015 Chuang et al.
2017/0098778 A1 4/2017 Oh et al.
2018/0114917 A1 4/2018 Lee et al.
2018/0301635 A1 10/2018 Lee et al.
2019/0181351 A1 6/2019 Jang et al.
2019/0312223 A1 10/2019 Chun et al.
2020/0039903 A1 2/2020 Stoessel et al.
2020/0083463 A1 3/2020 Stoessel et al.
2020/0194706 A1 6/2020 Han et al.
2020/0227650 A1 7/2020 Kim et al.
2021/0198215 A1 7/2021 Galan et al.
2022/0173335 A1 6/2022 Itoi et al.
2023/0354701 A1 11/2023 Stoessel et al.

FOREIGN PATENT DOCUMENTS

CN 111116562 A 5/2020
EP 3674299 A1 7/2020
JP H09-188874 7/1997
JP 2008-195841 8/2008
JP 2009-170818 7/2009
JP 2012-126718 7/2012
JP 2013-115066 6/2013
JP 2018-524276 A 8/2018
JP 2020515602 A 5/2020
KR 10-2000-0051826 8/2000
KR 10-2009-0059842 6/2009
KR 10-2014-0094408 7/2014
KR 10-2017-0045558 4/2017
KR 10-2017-0048159 5/2017
KR 10-2017-0067424 A 6/2017
KR 10-2017-0111802 10/2017
KR 10-1884130 B1 7/2018
KR 10-2019-0024640 3/2019
KR 10-2019-0134675 12/2019
KR 10-2020-0113078 10/2020
KR 10-2021-0009912 1/2021
WO 2001-014299 3/2001
WO 2003-012890 A2 2/2003
WO 2007-065678 6/2007
WO 2011-005060 A2 1/2011
WO 2017-069442 4/2017
WO 2018-021663 2/2018
WO 2018087346 A1 5/2018
WO 2018-182145 10/2018
WO 2019-004584 1/2019
WO 2019-061796 4/2019
WO 2019-238858 12/2019

(56) References Cited

FOREIGN PATENT DOCUMENTS

| | | | |
|---|---|---|---|
| WO | 2020-012685 | A1 | 1/2020 |
| WO | 2020-209307 | | 10/2020 |

OTHER PUBLICATIONS

Zhu et al., "Ruthenium-Catalyzed Reductive Cleavage of Unstrained Aryl-Aryl Bonds: Reaction Development and Mechanistic Study," Journal of the American Chemical Society, 141(46):18630-18640 (2019).

Chen et al., "High-spin enforcement in first-row metal complexes of a constrained polyaromatic ligand: synthesis, structure, and properties," New Journal of Chemistry, 42:18667-18677 (2018).

Sham et al., "Coordination properties of axially unfixed chiral dipyridine ligands towards metal and ammonium ions," Polyhedron, 30(6):1149-1156 (2011).

【FIG. 1】
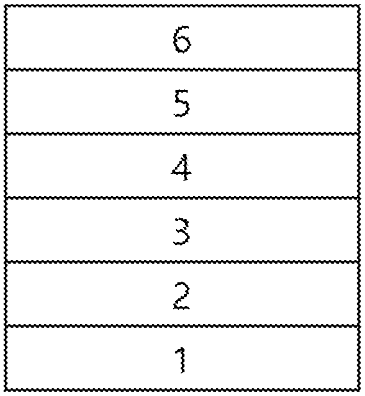
【FIG. 2】
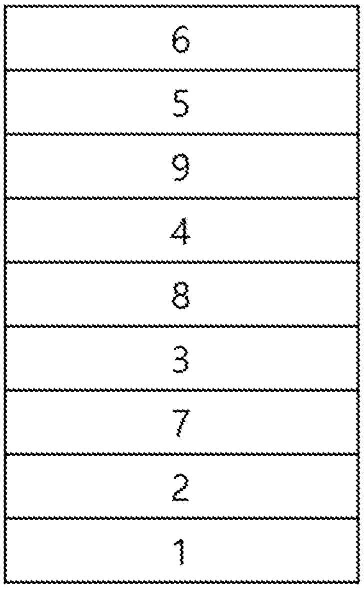

ORGANIC LIGHT EMITTING DEVICE

CROSS-REFERENCE TO RELATED APPLICATION(S)

This application is a National Stage Application of International Application No. PCT/KR2022/002859 filed on Feb. 28, 2022, which claims priority to and the benefit of Korean Patent Application No. 10-2021-0030418 filed on Mar. 8, 2021 in the Korean Intellectual Property Office, the disclosures of which are incorporated herein by reference in their entirety.

TECHNICAL FIELD

The present disclosure relates to an organic light emitting device.

BACKGROUND

In general, an organic light emitting phenomenon refers to a phenomenon where electric energy is converted into light energy by using an organic material. The organic light emitting device using the organic light emitting phenomenon has characteristics such as a wide viewing angle, an excellent contrast, a fast response time, an excellent luminance, driving voltage and response speed, and thus many studies have proceeded.

The organic light emitting device generally has a structure which comprises an anode, a cathode, and an organic material layer interposed between the anode and the cathode. The organic material layer frequently has a multilayered structure that comprises different materials in order to enhance efficiency and stability of the organic light emitting device, and for example, the organic material layer can be formed of a hole injection layer, a hole transport layer, a light emitting layer, an electron transport layer, an electron injection layer, and the like. In the structure of the organic light emitting device, if a voltage is applied between two electrodes, the holes are injected from an anode into the organic material layer and the electrons are injected from the cathode into the organic material layer, and when the injected holes and electrons meet each other, an exciton is formed, and light is emitted when the exciton falls to a ground state again.

There is a continuing need for the development of new materials for the organic materials used in the organic light emitting devices as described above.

PRIOR ART LITERATURE

Patent Literature (Patent Literature 0001) Korean Unexamined Patent Publication No. 10-2000-0051826

(Patent Literature 0002) US Patent Publication No. 2007-0196692

(Patent Literature 0003) Korean Unexamined Patent Publication No. 10-2017-0048159

(Patent Literature 0004) U.S. Pat. No. 6,821,643

DETAILED DESCRIPTION OF THE INVENTION

Technical Problem

The present disclosure relates to an organic light emitting device.

Technical Solution

In the present disclosure, provided is an organic light emitting device including:

an anode;

a hole transport layer;

a light emitting layer;

an electron transport layer, an electron injection layer, or an electron transport and injection layer; and a cathode, wherein the light emitting layer includes a compound of the following Chemical Formula 1, and the electron transport layer, the electron injection layer, or the electron transport and injection layer includes at least one of the compound of the following Chemical Formula 2 and the compound of Chemical Formula 3 below:

[Chemical Formula 1]

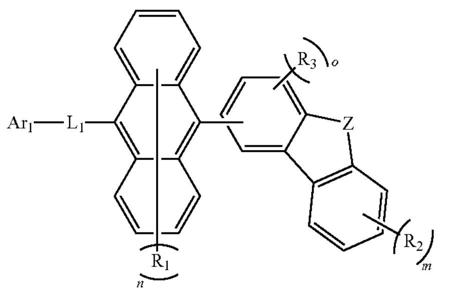

wherein in the Chemical Formula 1:

Z is O or S;

$L_1$ is a direct bond or a substituted or unsubstituted $C_{6-60}$ arylene;

$Ar_1$ is a substituted or unsubstituted $C_{6-60}$ aryl;

$R_1$ to $R_3$ are each independently hydrogen, deuterium, or a substituted or unsubstituted $C_{6-60}$ aryl, or two adjacent substituents thereof combine to form a benzene ring;

n is an integer of 0 to 8;

m is an integer of 0 to 4; and o is an integer of 0 to 3;

[Chemical Formula 2]

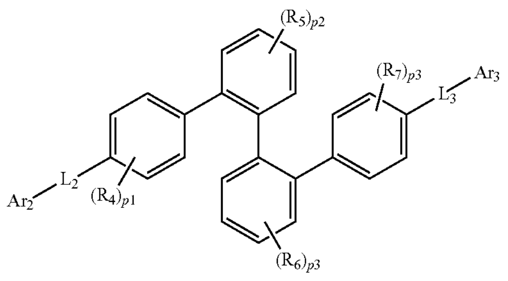

-continued

[Chemical Formula 3]

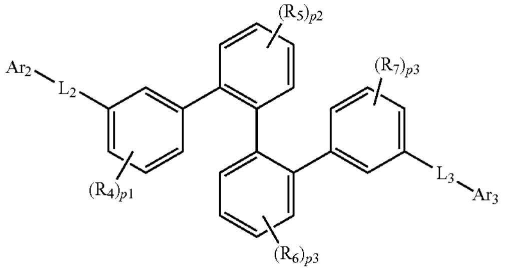

wherein in the Chemical Formula 2 or 3:

$R_4$ to $R_7$ are each independently hydrogen or deuterium;

p1 to p4 are an integer of 1 to 4;

$L_2$ and $L_3$ are each independently a direct bond or a substituted or unsubstituted $C_{6-60}$ arylene; and $Ar_2$ and $Ar_3$ are each independently a substituent of Chemical Formula 4:

[Chemical Formula 4]

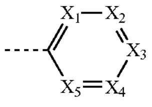

wherein in the Chemical Formula 4:

$X_1$ to $X_5$ are each independently N or $C(R_8)$, wherein at least two of $X_1$ to $X_5$ are N; and each $R_8$ is independently hydrogen, deuterium, a substituted or unsubstituted $C_{1-20}$ alkyl, a substituted or unsubstituted $C_{6-60}$ aryl, or a substituted or unsubstituted $C_{2-60}$ heteroaryl containing at least one heteroatom selected from the group consisting of N, O and S, or two adjacent $R_8$s combine to form a benzene ring.

Advantageous Effects

The above-described organic light emitting device controls the compound included in the light emitting layer and the electron transport layer, thereby improving efficiency, low driving voltage, and/or lifespan of the organic light emitting device.

BRIEF DESCRIPTION OF THE DRAWINGS

FIG. 1 shows an example of an organic light emitting device including a substrate 1, an anode 2, a hole transport layer 3, a light emitting layer 4, an electron transport and injection layer 5, and a cathode 6.

FIG. 2 shows an example of an organic light emitting device including a substrate 1, an anode 2, a hole injection layer 7, a hole transport layer 3, an electron blocking layer 8, a light emitting layer 4, a hole blocking layer 9, an electron transport and injection layer 5, and a cathode 6.

DETAILED DESCRIPTION OF THE EMBODIMENTS

Hereinafter, embodiments of the present disclosure will be described in more detail to facilitate understanding of the invention.

As used herein, the notation , or  means a bond linked to another substituent group.

As used herein, the term "substituted or unsubstituted" means being unsubstituted or substituted with one or more substituents selected from the group consisting of deuterium, a halogen group, a nitrile group, a nitro group, a hydroxyl group, a carbonyl group, an ester group, an imide group, an amino group, a phosphine oxide group, an alkoxy group, an aryloxy group, an alkylthioxy group, an arylthioxy group, an alkylsulfoxy group, an arylsulfoxy group, a silyl group, a boron group, an alkyl group, a cycloalkyl group, an alkenyl group, an aryl group, an aralkyl group, an aralkenyl group, an alkylaryl group, an alkylamine group, an aralkylamine group, a heteroarylamine group, an arylamine group, an arylphosphine group, and a heterocyclic group containing at least one of N, O and S atoms, or being unsubstituted or substituted with a substituent in which two or more substituents of the above-exemplified substituents are connected. For example, "a substituent in which two or more substituents are connected" can be a biphenyl group. Namely, a biphenyl group can be an aryl group, or it can also be interpreted as a substituent in which two phenyl groups are connected.

In the present disclosure, the carbon number of a carbonyl group is not particularly limited, but is preferably 1 to 40. Specifically, the carbonyl group can be a compound having the following structural formulae, but is not limited thereto:

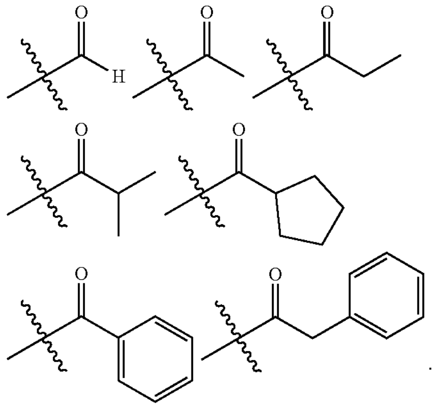

In the present disclosure, an ester group can have a structure in which oxygen of the ester group is substituted by a straight-chain, branched-chain, or cyclic alkyl group having 1 to 25 carbon atoms, or an aryl group having 6 to 25 carbon atoms. Specifically, the ester group can be a compound having the following structural formulae, but is not limited thereto:

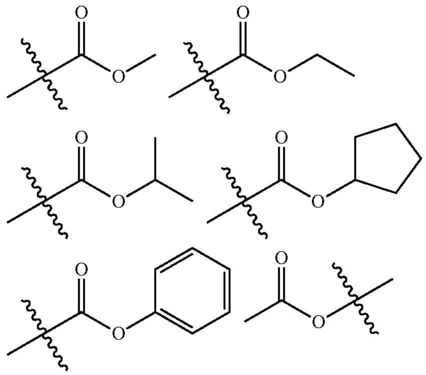

-continued

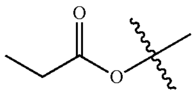
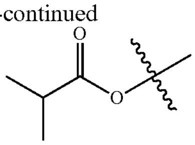
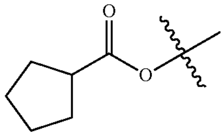
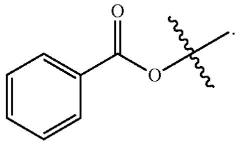

In the present disclosure, the carbon number of an imide group is not particularly limited, but is preferably 1 to 25. Specifically, the imide group can be a compound having the following structural formulae, but is not limited thereto:

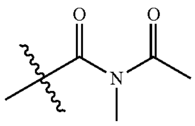
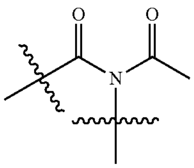
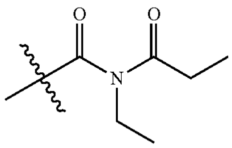
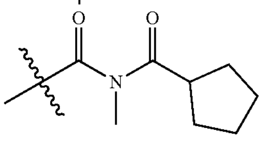
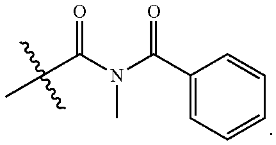

In the present disclosure, a silyl group specifically includes a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but is not limited thereto.

In the present disclosure, a boron group specifically includes a trimethylboron group, a triethylboron group, a t-butyldimethylboron group, a triphenylboron group, a phenylboron group, and the like, but is not limited thereto.

In the present disclosure, examples of a halogen group include fluorine, chlorine, bromine, or iodine.

In the present disclosure, the alkyl group can be straight-chain, or branched-chain, and the carbon number thereof is not particularly limited, but is preferably 1 to 40. According to one embodiment, the carbon number of the alkyl group is 1 to 20. According to another embodiment, the carbon number of the alkyl group is 1 to 10. According to another embodiment, the carbon number of the alkyl group is 1 to 6. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl, and the like, but are not limited thereto.

In the present disclosure, the alkenyl group can be straight-chain or branched-chain, and the carbon number thereof is not particularly limited, but is preferably 2 to 40. According to one embodiment, the carbon number of the alkenyl group is 2 to 20. According to another embodiment, the carbon number of the alkenyl group is 2 to 10. According to another embodiment, the carbon number of the alkenyl group is 2 to 6. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present disclosure, a cycloalkyl group is not particularly limited, but the carbon number thereof is preferably 3 to 60. According to one embodiment, the carbon number of the cycloalkyl group is 3 to 30. According to another embodiment, the carbon number of the cycloalkyl group is 3 to 20. According to another embodiment, the carbon number of the cycloalkyl group is 3 to 6. Specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present disclosure, an aryl group is not particularly limited, but the carbon number thereof is preferably 6 to 60, and it can be a monocyclic aryl group or a polycyclic aryl group. According to one embodiment, the carbon number of the aryl group is 6 to 30. According to one embodiment, the carbon number of the aryl group is 6 to 20. The monocyclic aryl group includes a phenyl group, a biphenyl group, a terphenyl group and the like, but is not limited thereto. The polycyclic aryl group includes a naphthyl group, an anthracenyl group, a phenanthryl group, a pyrenyl group, a perylenyl group, a chrysenyl group, a fluorenyl group or the like, but is not limited thereto.

In the present disclosure, a fluorenyl group can be substituted, and two substituents can be bonded to each other to form a spiro structure. In the case where the fluorenyl group is substituted,

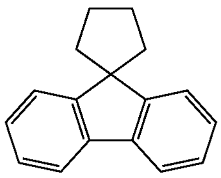
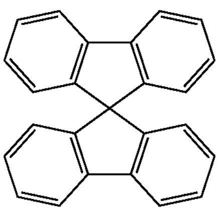
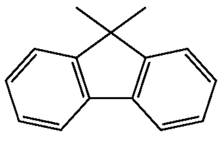
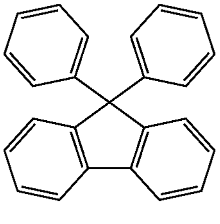

-continued

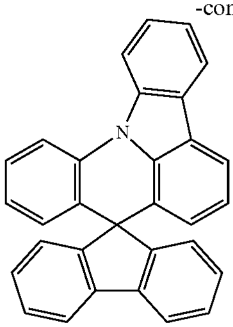
, and the like can be formed. However, the structure is not limited thereto.

In the present disclosure, a heterocyclic group is a heterocyclic group containing at least one heteroatom of O, N, Si and S as a heterogeneous element, and the carbon number thereof is not particularly limited, but is preferably 2 to 60. Examples of the heterocyclic group include a thiophene group, a furan group, a pyrrole group, an imidazole group, a thiazole group, an oxazol group, an oxadiazol group, a triazol group, a pyridyl group, a bipyridyl group, a pyrimidyl group, a triazine group, an acridyl group, a pyridazine group, a pyrazinyl group, a quinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzoimidazole group, a benzothiazol group, a benzocarbazole group, a benzothiophene group, a dibenzothiophene group, a benzofuranyl group, a phenanthroline group, an isoxazolyl group, a thiadiazolyl group, a phenothiazinyl group, a dibenzofuranyl group, and the like, but are not limited thereto.

In the present disclosure, the aryl group in the aralkyl group, the aralkenyl group, the alkylaryl group, and the arylamine group is the same as the aforementioned examples of the aryl group. In the present disclosure, the alkyl group in the aralkyl group, the alkylaryl group and the alkylamine group is the same as the aforementioned examples of the alkyl group. In the present disclosure, the heteroaryl in the heteroarylamine can apply the aforementioned description of the heterocyclic group. In the present disclosure, the alkenyl group in the aralkenyl group is the same as the aforementioned examples of the alkenyl group. In the present disclosure, the aforementioned description of the aryl group can be applied except that the arylene is a divalent group. In the present disclosure, the aforementioned description of the heterocyclic group can be applied except that the heteroarylene is a divalent group. In the present disclosure, the aforementioned description of the aryl group or cycloalkyl group can be applied except that the hydrocarbon ring is not a monovalent group but formed by combining two substituent groups. In the present disclosure, the aforementioned description of the heterocyclic group can be applied, except that the heterocycle is not a monovalent group but formed by combining two substituent groups.

In the present disclosure, provided is an organic light emitting device including an anode; a hole transport layer; a light emitting layer; an electron transport layer, an electron injection layer, or an electron transport and injection layer; and a cathode, wherein the light emitting layer includes a compound of Chemical Formula 1, and the electron transport layer, the electron injection layer, or the electron transport and injection layer includes at least one of the compound of Chemical Formula 2 and the compound of Chemical Formula 3.

The organic light emitting device according to the present disclosure controls the compound included in the light emitting layer and the compound included in the electron transport layer, the electron injection layer, or the electron transport and injection layer, thereby improving efficiency, low driving voltage, and/or lifespan of the organic light emitting device.

Hereinafter, the present invention will be described in detail for each configuration.

Anode and Cathode

As the anode material, generally, a material having a large work function is preferably used so that holes can be smoothly injected into the organic material layer. Specific examples of the anode material include metals such as vanadium, chrome, copper, zinc, and gold, or an alloy thereof; metal oxides such as zinc oxides, indium oxides, indium tin oxides (ITO), and indium zinc oxides (IZO); a combination of metals and oxides, such as ZnO:Al or $SnO_2$:Sb; conductive polymers such as poly(3-methylthiophene), poly[3,4-(ethylene-1,2-dioxy)thiophene](PEDOT), polypyrrole, and polyaniline, and the like, but are not limited thereto.

As the cathode material, generally, a material having a small work function is preferably used so that electrons can be easily injected into the organic material layer. Specific examples of the cathode material include metals such as magnesium, calcium, sodium, potassium, titanium, indium, yttrium, lithium, gadolinium, aluminum, silver, tin, and lead, or an alloy thereof; a multilayered structure material such as LiF/Al or $LiO_2$/Al, and the like, but are not limited thereto.

Hole Injection Layer

The organic light emitting device according to the present disclosure can include a hole injection layer between the anode and the hole transport layer, if necessary.

The hole injection layer is a layer for injecting holes from the electrode, and the hole injection material is preferably a compound which has a capability of transporting the holes, thus has a hole injecting effect in the anode and an excellent hole-injecting effect to the light emitting layer or the light emitting material, prevents excitons produced in the light emitting layer from moving to an electron injection layer or the electron injection material, and is excellent in the ability to form a thin film.

It is preferable that a HOMO (highest occupied molecular orbital) of the hole injection material is between the work function of the anode material and a HOMO of a peripheral organic material layer. Specific examples of the hole injection material include metal porphyrine, oligothiophene, an arylamine-based organic material, a hexanitrile hexaazatriphenylene-based organic material, a quinacridone-based organic material, a perylene-based organic material, anthraquinone, polyaniline and polythiophene-based conductive polymer, and the like, but are not limited thereto.

Hole Transport Layer

In addition, the hole transport layer is a layer that receives holes from an anode or a hole injection layer formed on the anode and transports the holes to the light emitting layer. The hole transport material is suitably a material having large mobility to the holes, which can receive holes from the anode or the hole injection layer and transfer the holes to the light emitting layer. Specific examples thereof include an arylamine-based organic material, a conductive polymer, a block copolymer in which a conjugate portion and a non-conjugate portion are present together, and the like, but are not limited thereto.

Electron Blocking Layer

The organic light emitting device according to the present disclosure can include an electron blocking layer between a hole transport layer and a light emitting layer, if necessary. The electron blocking layer is a layer which is formed on the hole transport layer, is preferably provided in contact with the light emitting layer, and thus serves to control hole mobility, to prevent excessive movement of electrons, and to increase the probability of hole-electron bonding, thereby improving the efficiency of the organic light emitting device. The electron blocking layer includes an electron blocking material, and an arylamine-based organic material can be used as the electron blocking material, but is not limited thereto.

Light Emitting Layer

The light emitting material included in the light emitting layer is suitably a material capable of emitting light in a visible ray region by receiving holes and electrons from the hole transport layer and the electron transport layer, respectively, to combine them, and having good quantum efficiency to fluorescence or phosphorescence. The light emitting layer can include a host material and a dopant material, and the compound of Chemical Formula 1 can be included as a host in the present disclosure.

Preferably, $L_1$ is a direct bond, phenylene, biphenylene, or naphthylene; and the phenylene, biphenylene, or naphthylene is each independently unsubstituted or substituted with deuterium.

Preferably, $Ar_1$ is phenyl, biphenylyl, naphthyl, or phenanthrenyl; and the phenyl, biphenylyl, naphthyl, or phenanthrenyl is each independently unsubstituted or substituted with deuterium.

Preferably, $R_1$ to $R_3$ are each independently hydrogen, deuterium, phenyl, or naphthyl, or two adjacent substituents thereof are combined to form a benzene ring; and the phenyl, naphthyl, or benzene ring is each independently unsubstituted or substituted with deuterium.

Preferably, each $R_1$ is independently hydrogen or deuterium; each $R_2$ or $R_3$ is independently hydrogen, deuterium, phenyl, or naphthyl, or two adjacent substituents thereof are combined to form a benzene ring; and the phenyl, naphthyl, or benzene ring is each independently unsubstituted or substituted with deuterium.

Preferably, the compound of Chemical Formula 1 contains at least one deuterium.

Representative examples of the compound of Chemical Formula 1 are as follows:

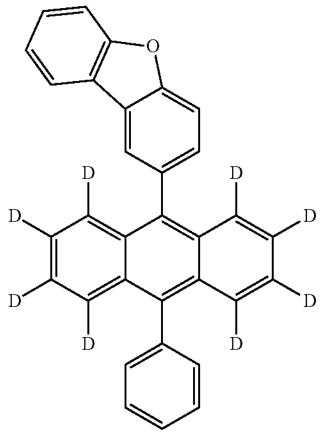

-continued

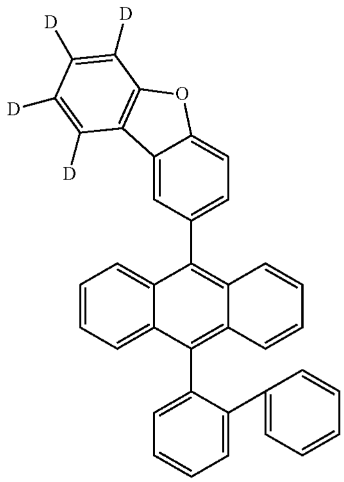

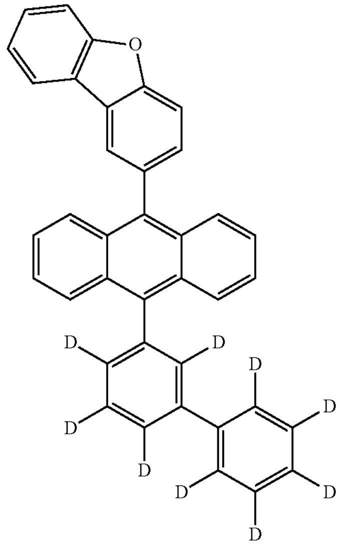

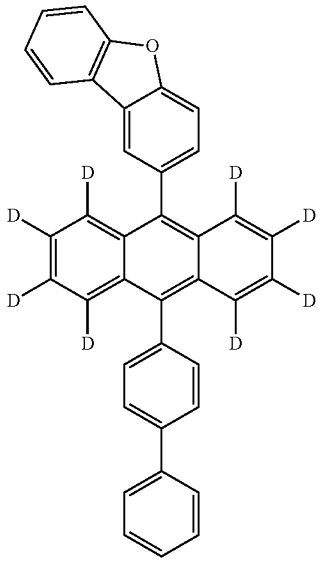

-continued
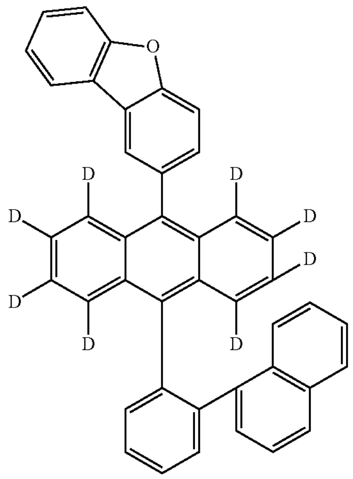
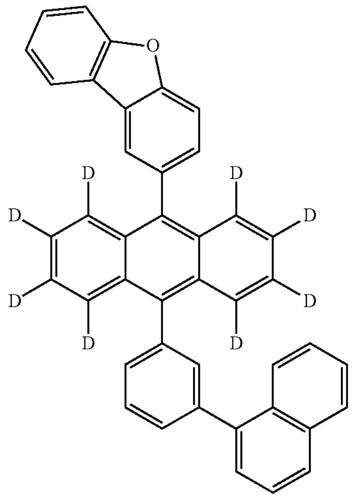
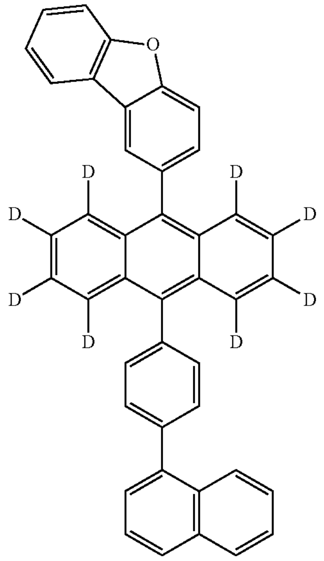
-continued
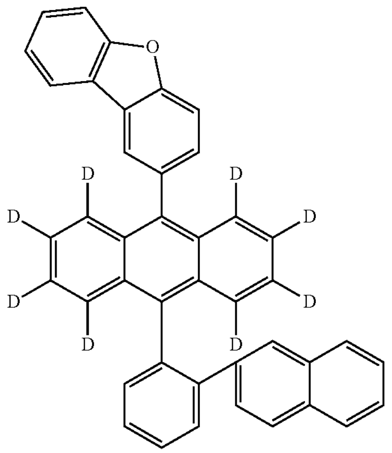
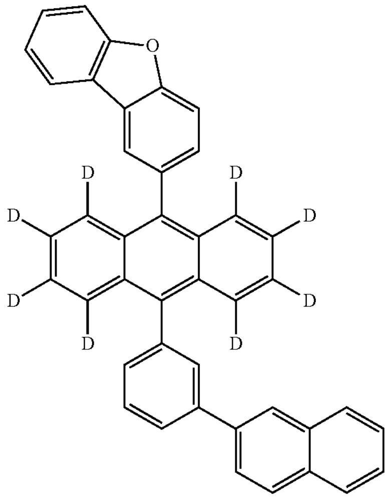
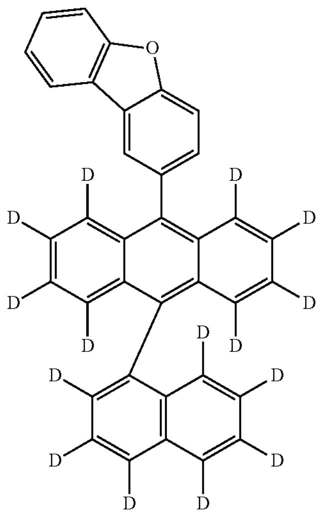

-continued
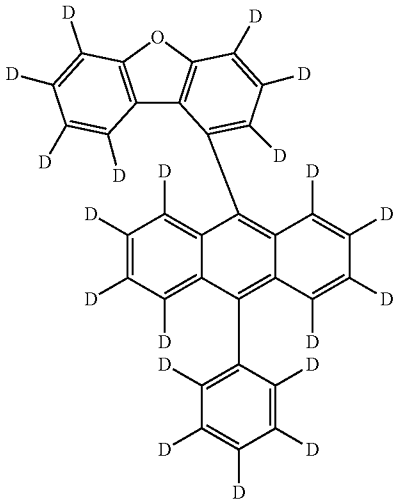
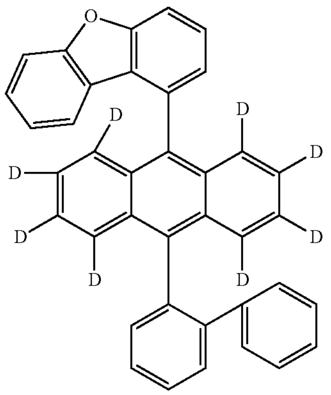
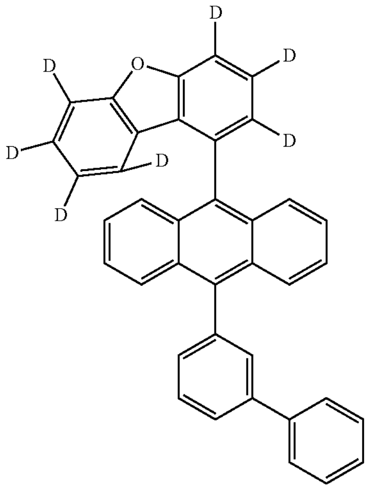
-continued
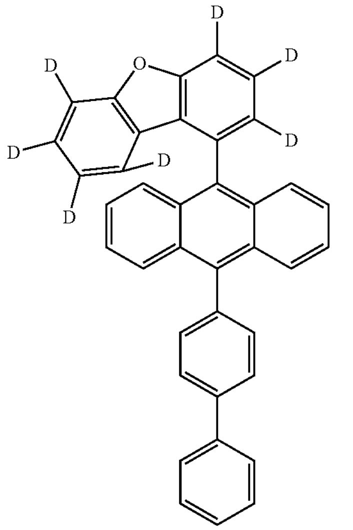
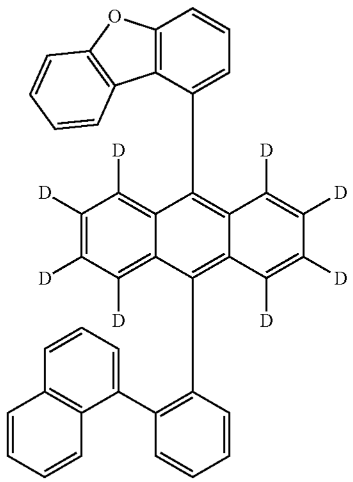
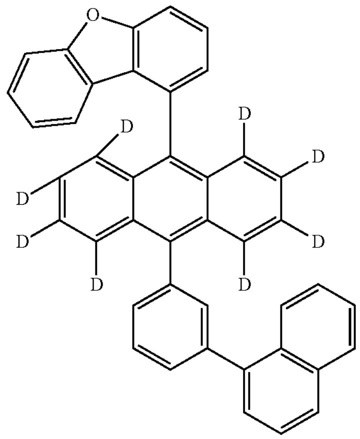

-continued
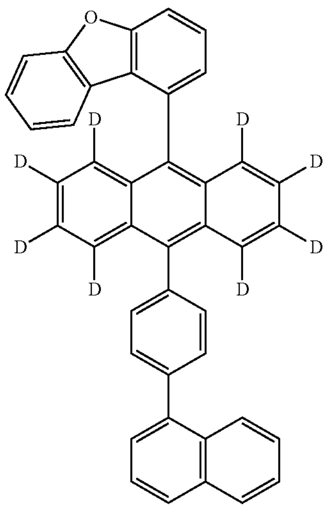
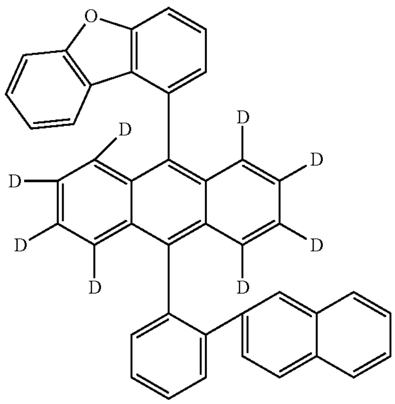
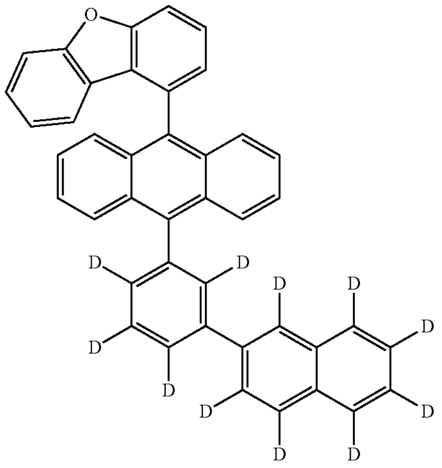
-continued
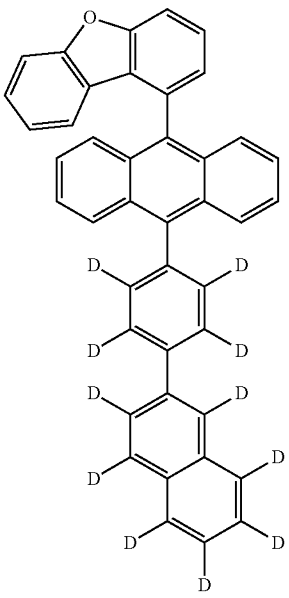
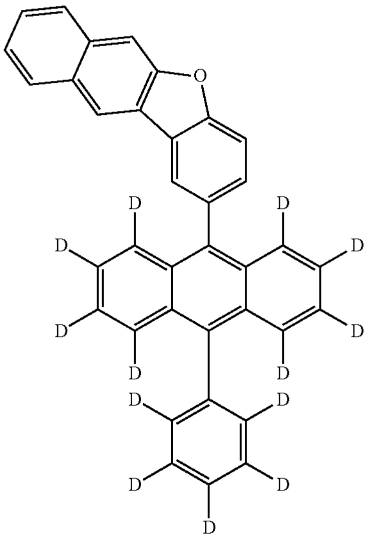
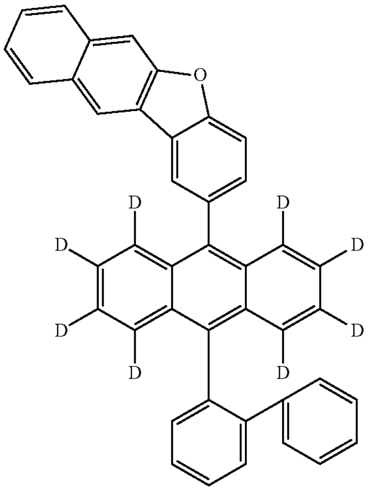

-continued
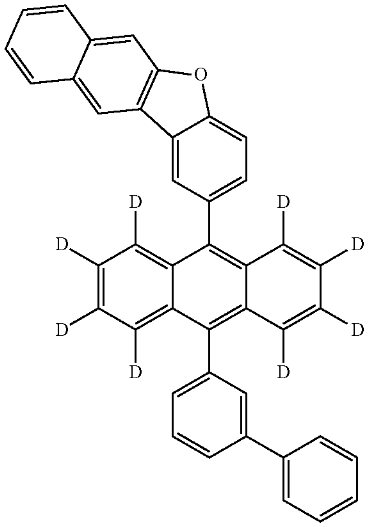
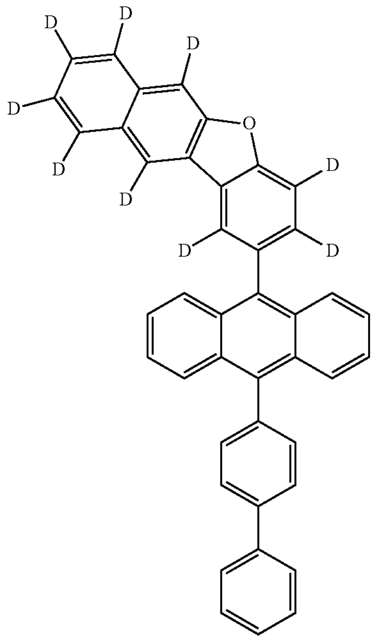
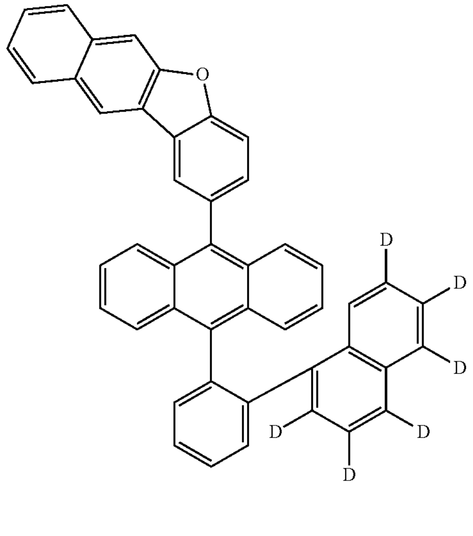
-continued
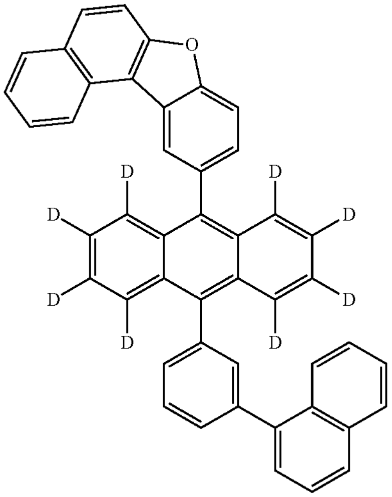
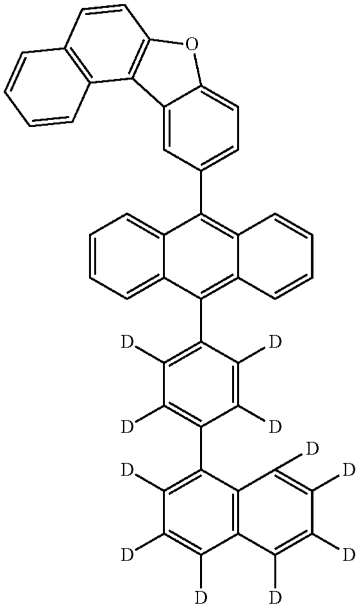
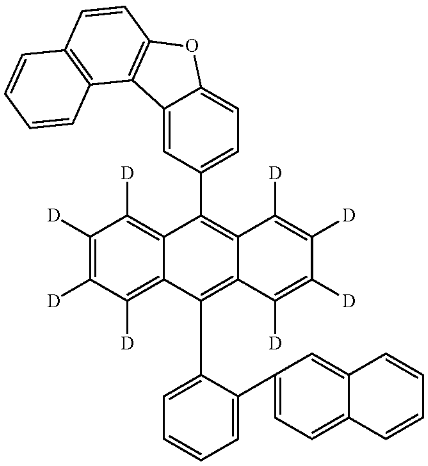

-continued
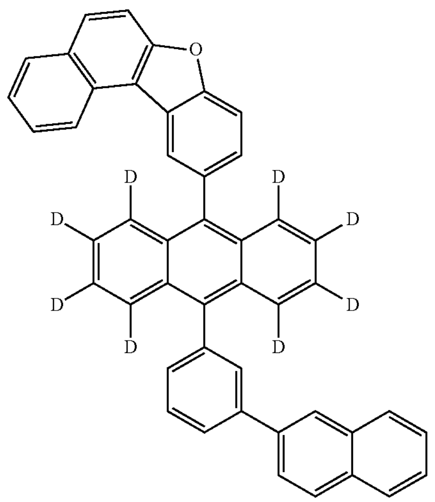
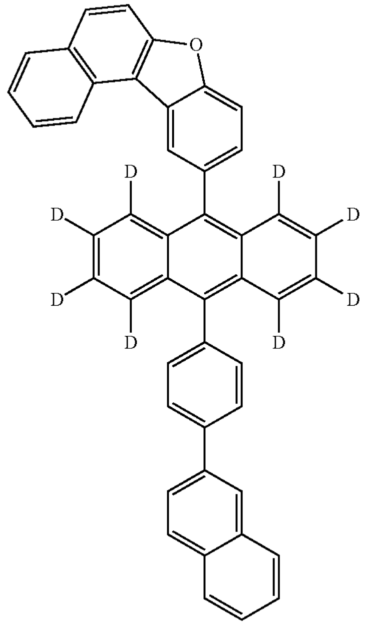
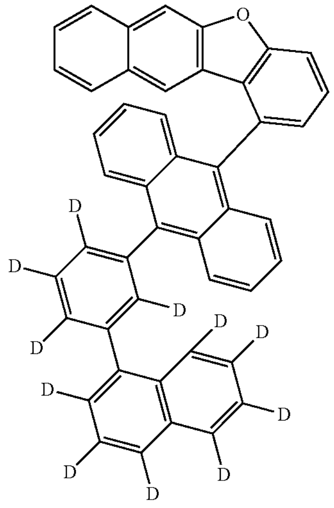
-continued
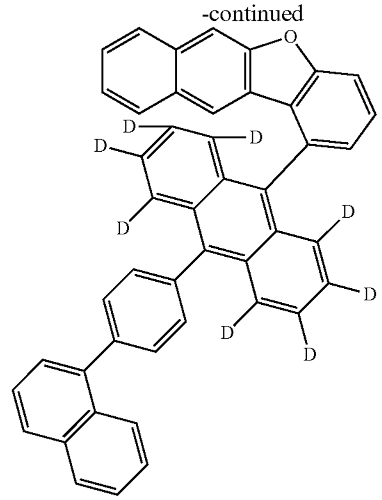
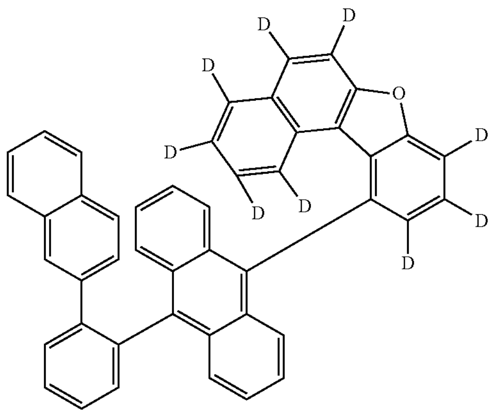
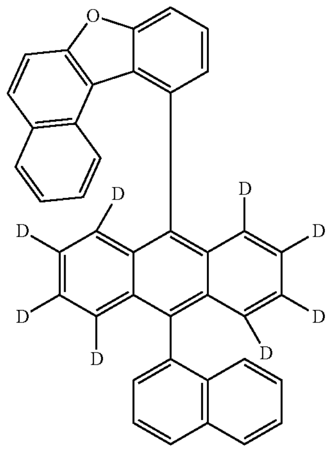

-continued
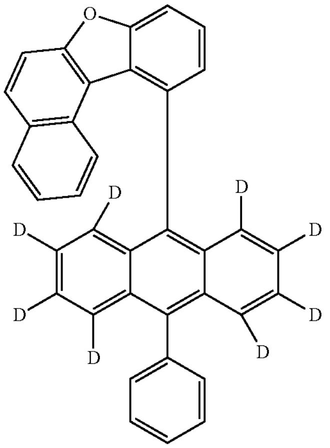
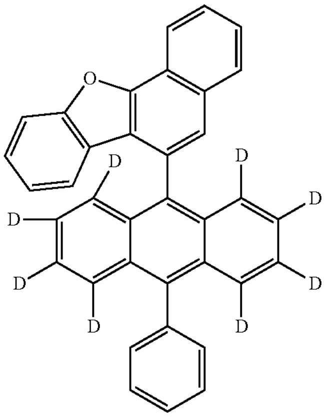
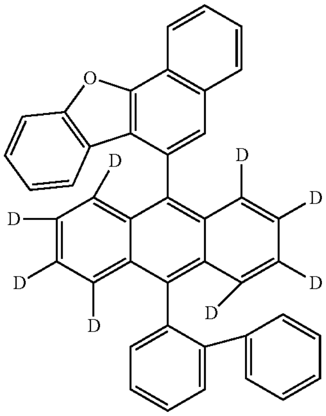
-continued
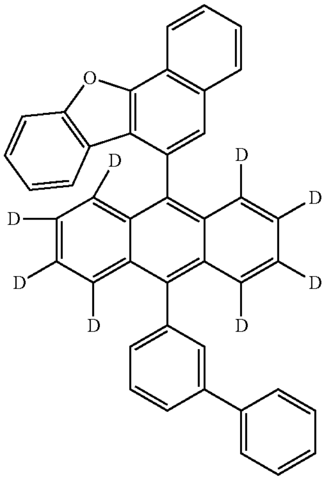
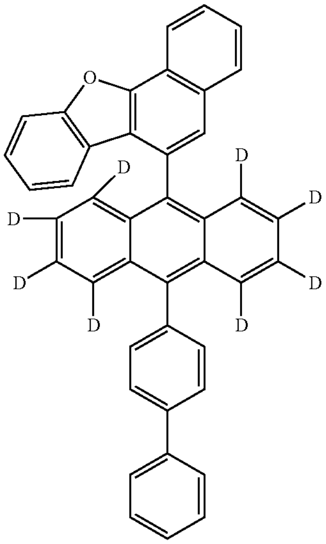
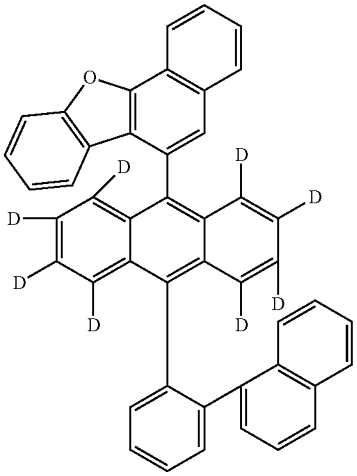

-continued
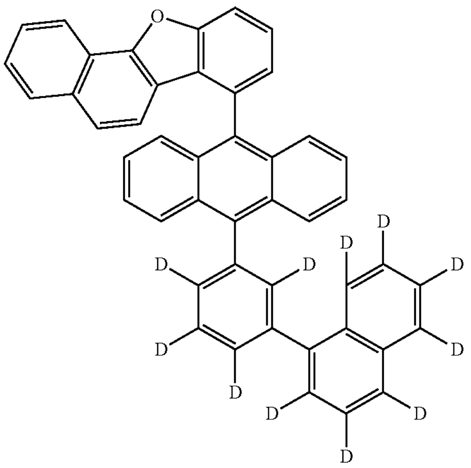
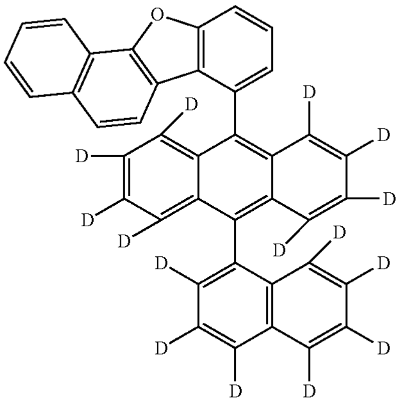
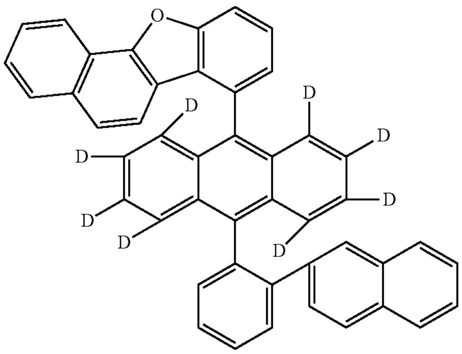
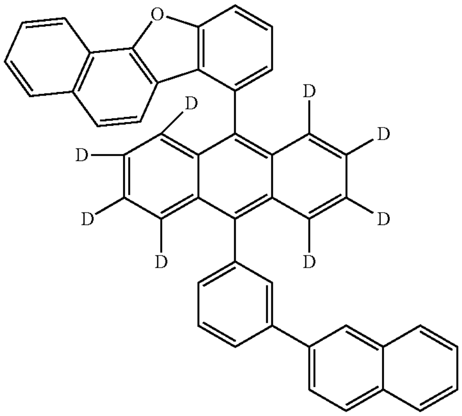
-continued
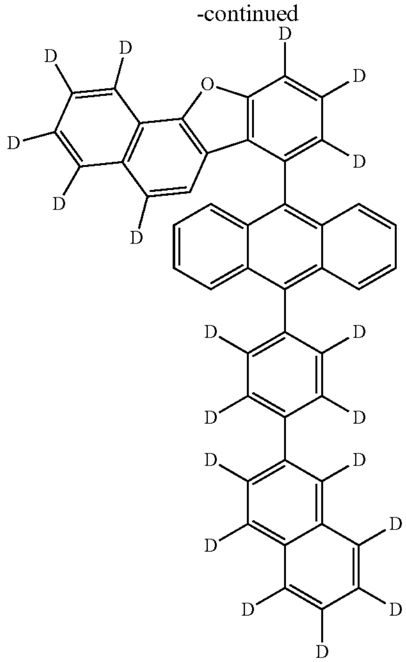
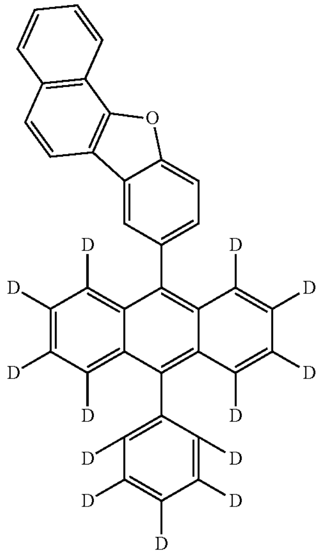
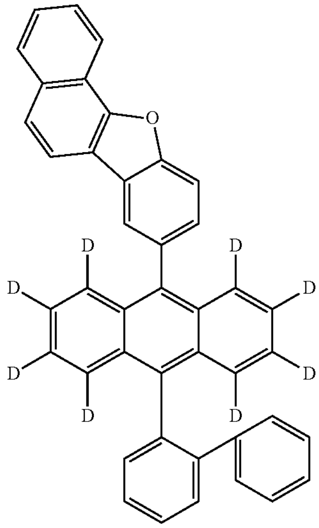

-continued
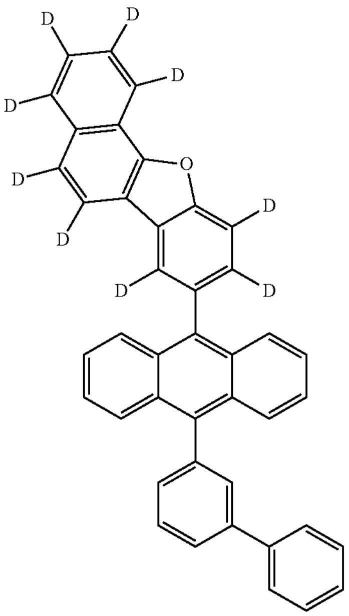
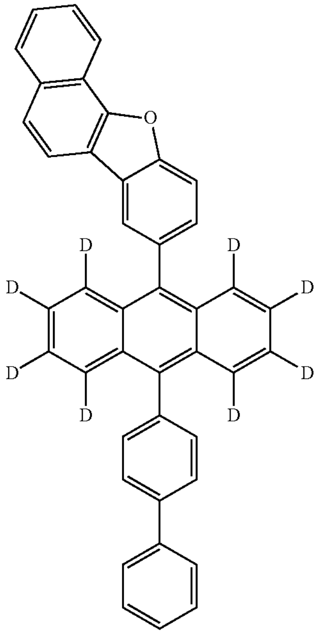
-continued
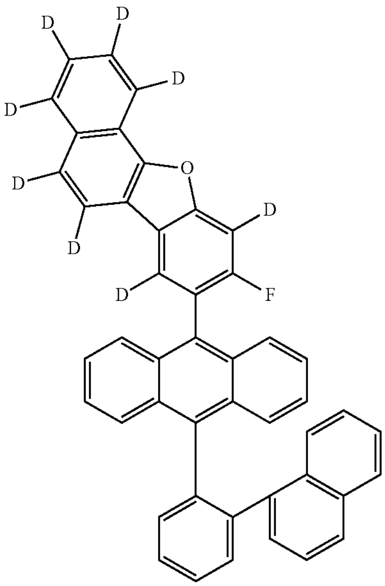
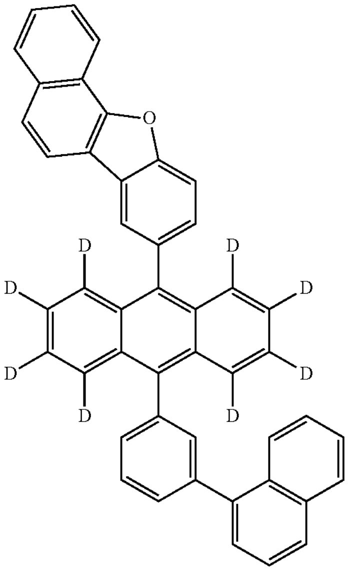

-continued
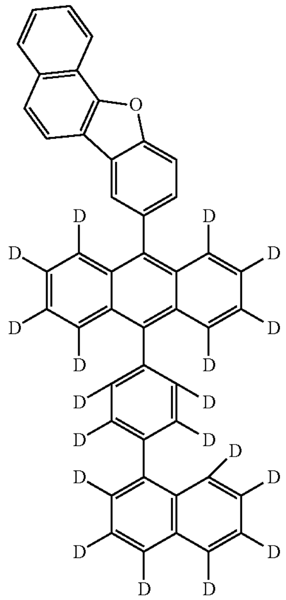
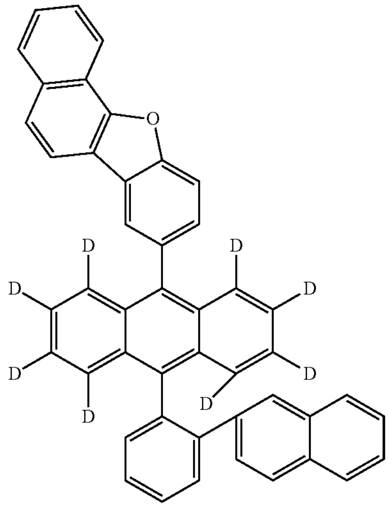
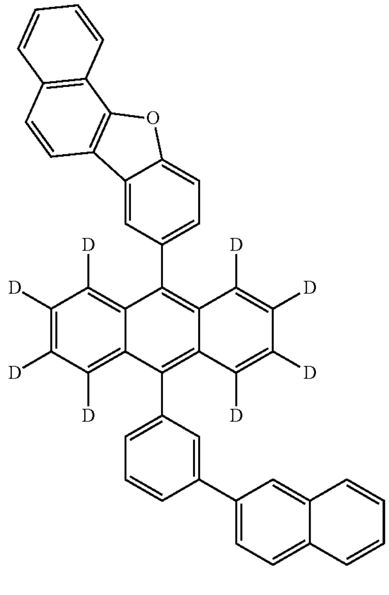
-continued
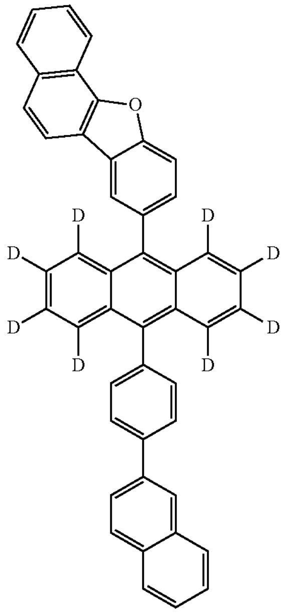
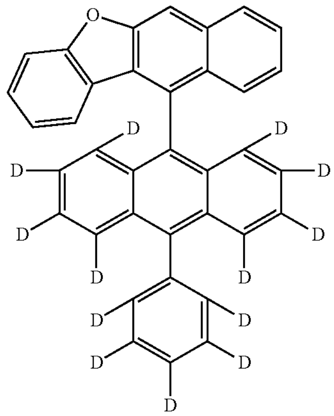
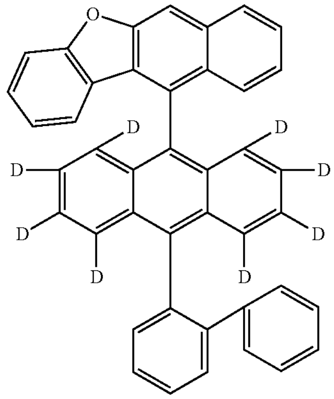

-continued
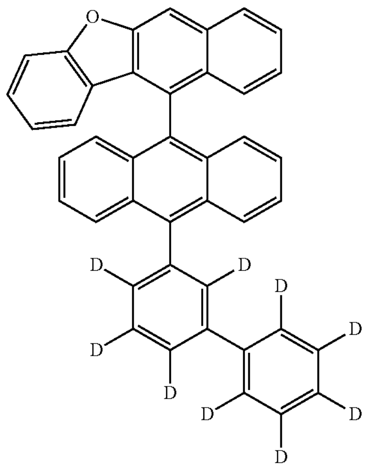
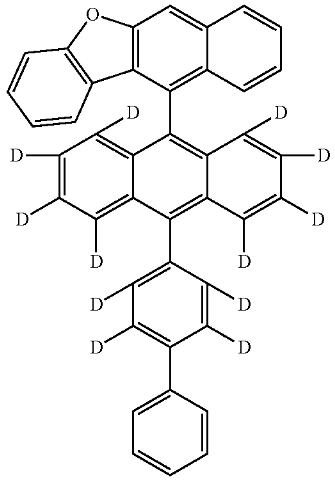
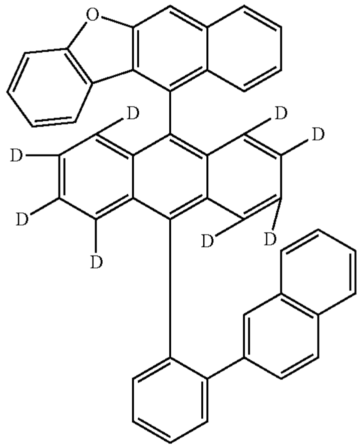
-continued
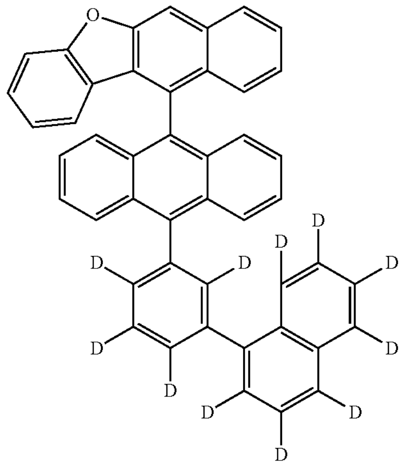
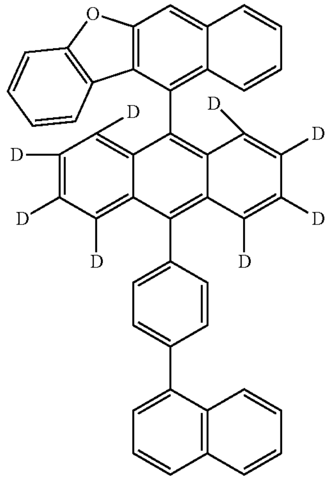
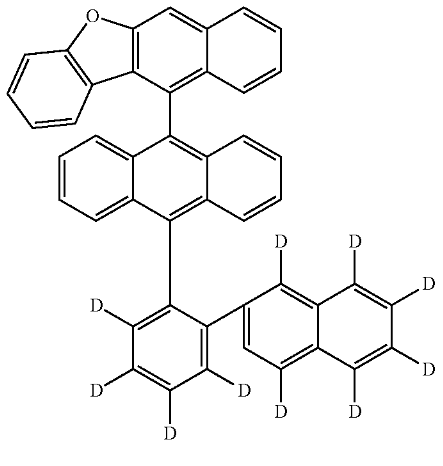

-continued
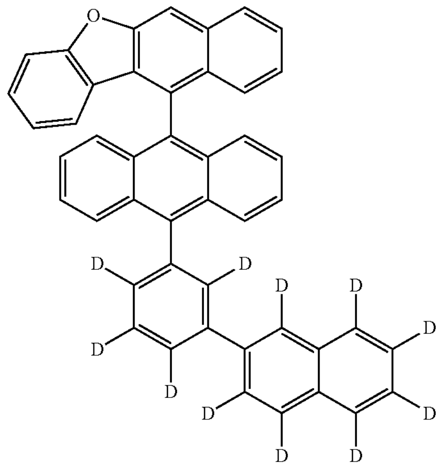
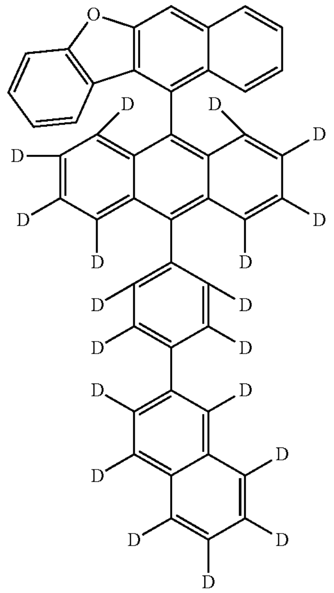
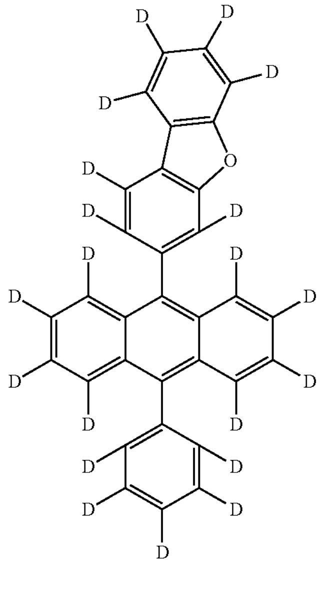
-continued
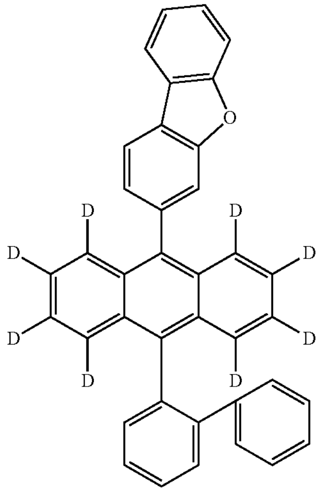
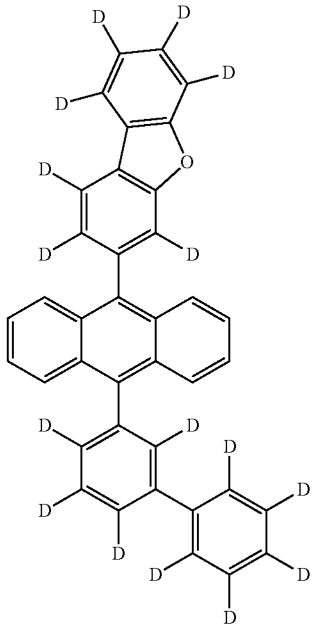
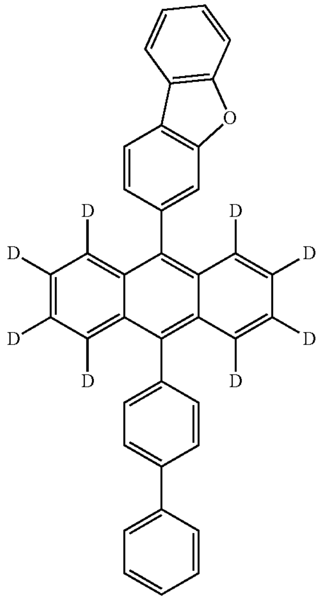

-continued
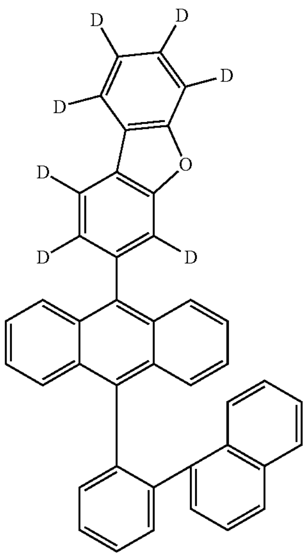
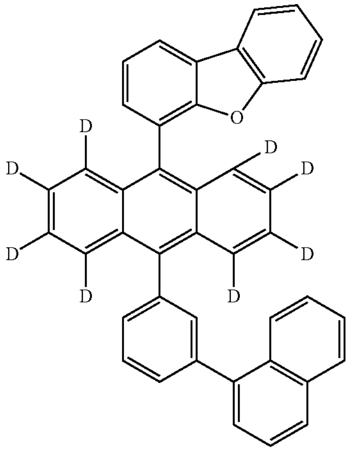
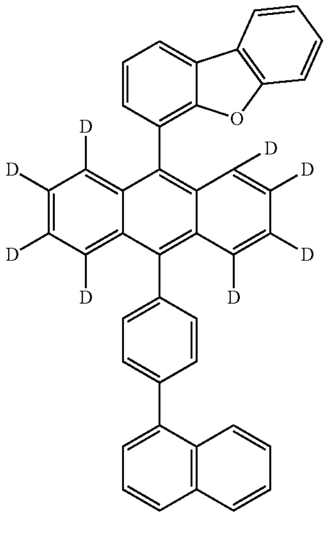
-continued
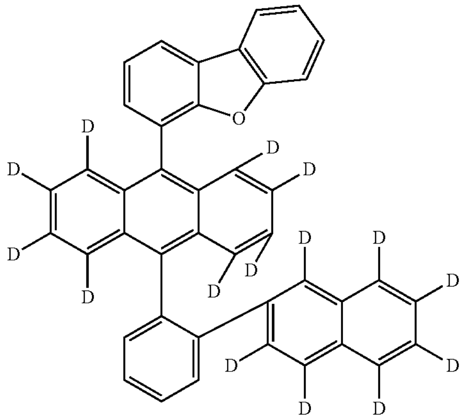
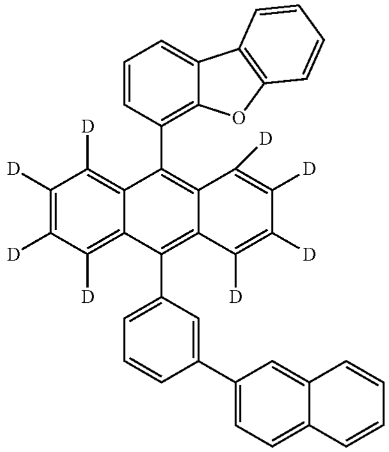
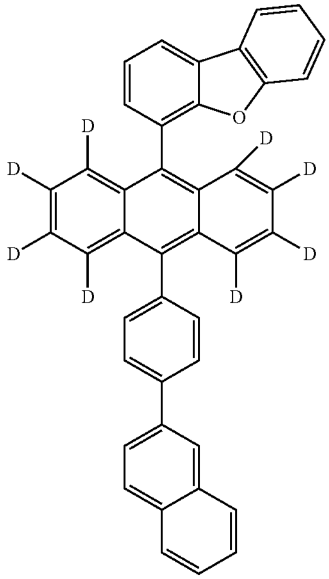

-continued
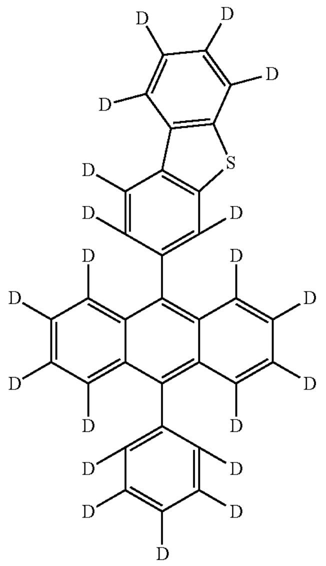
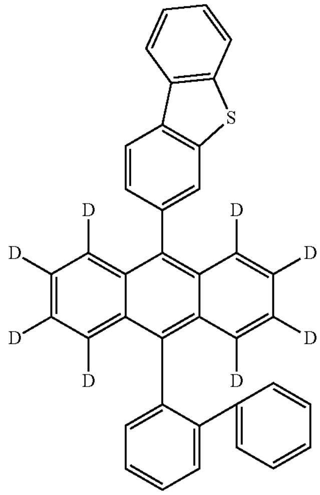
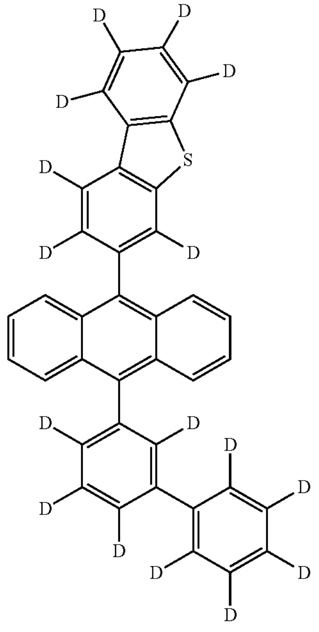
-continued
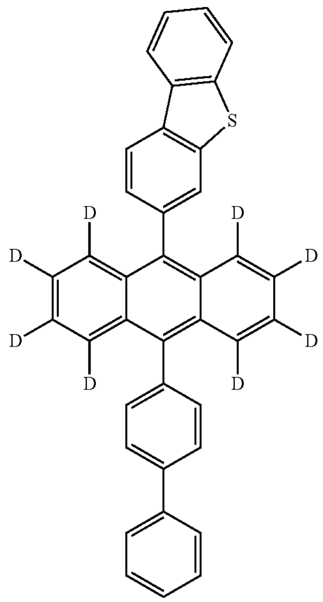
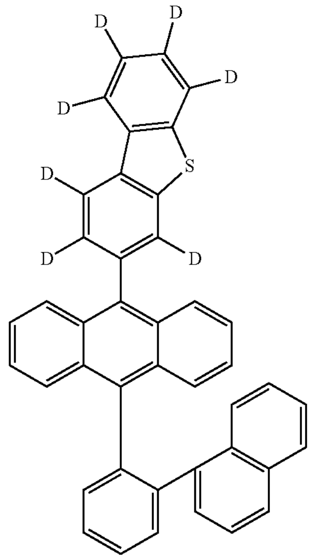
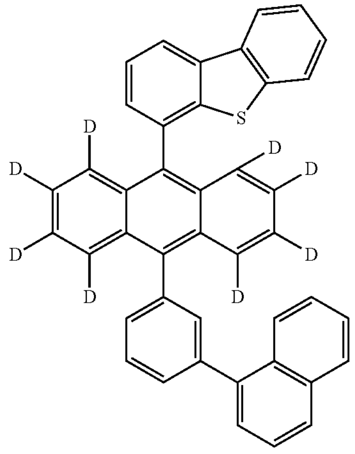

-continued
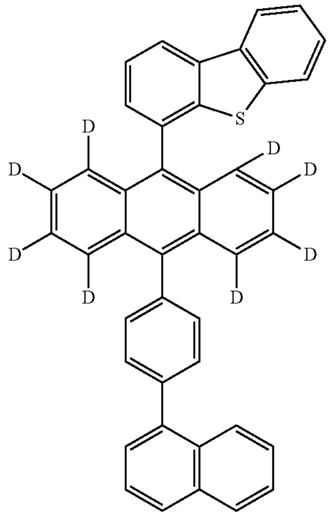
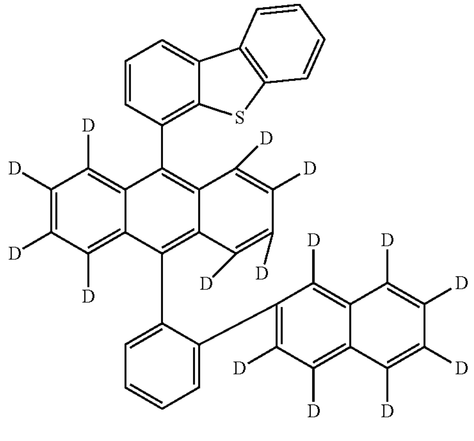
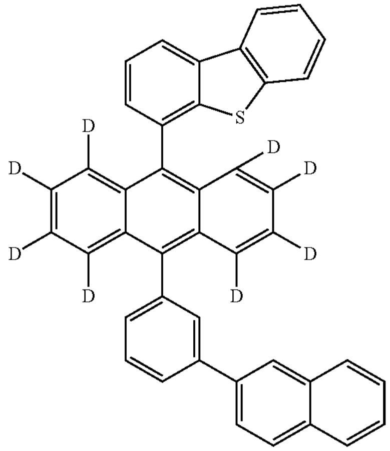
-continued
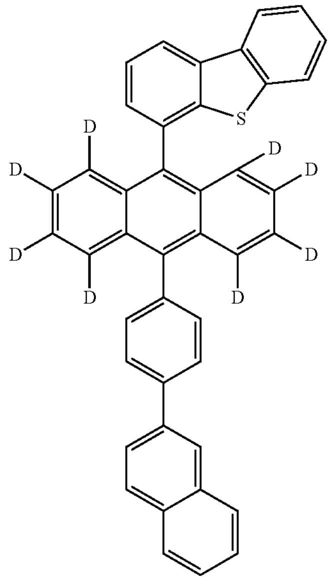
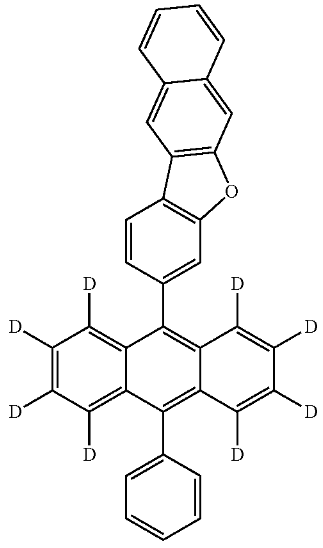
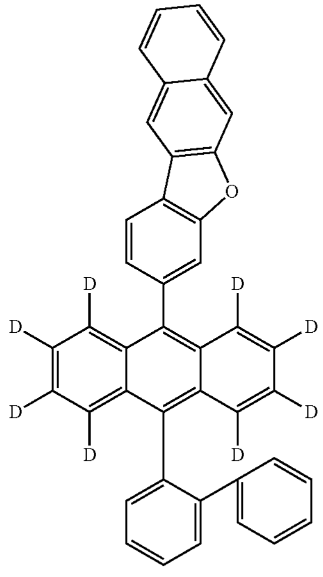

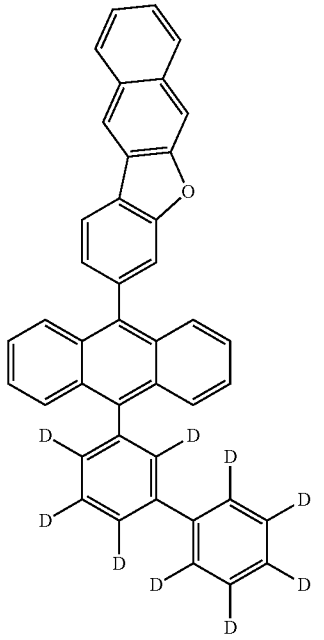
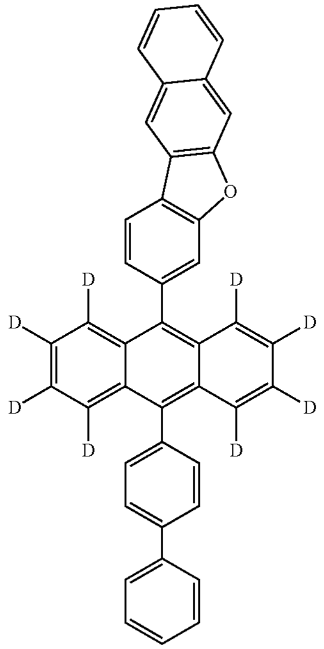
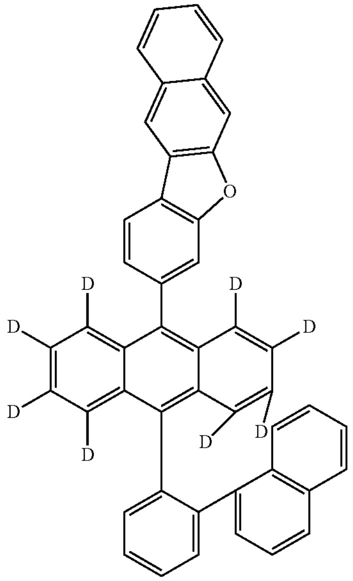
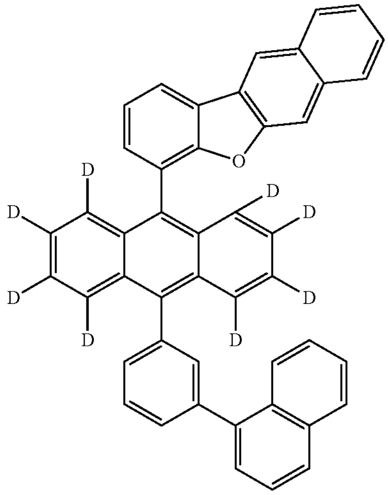
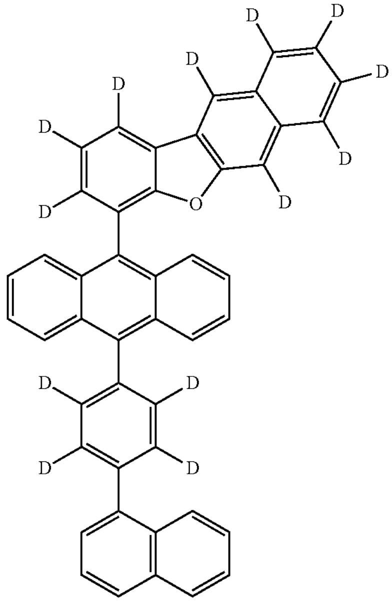

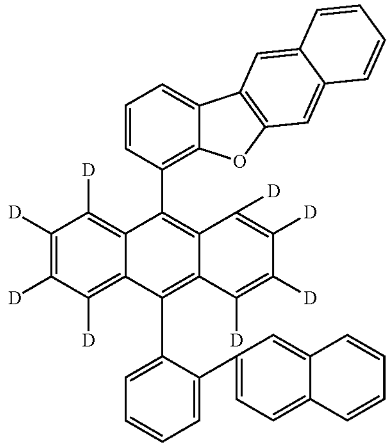
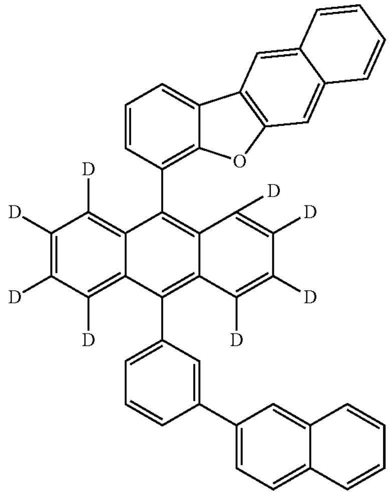
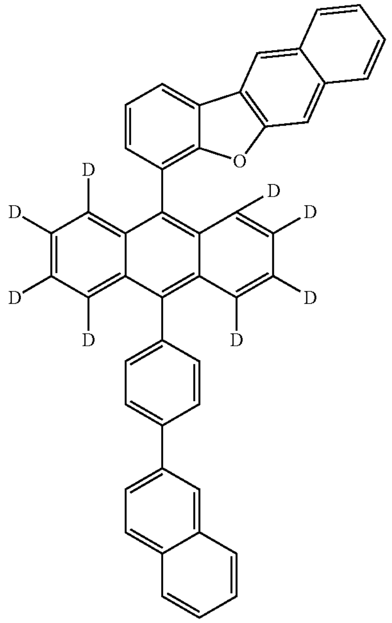
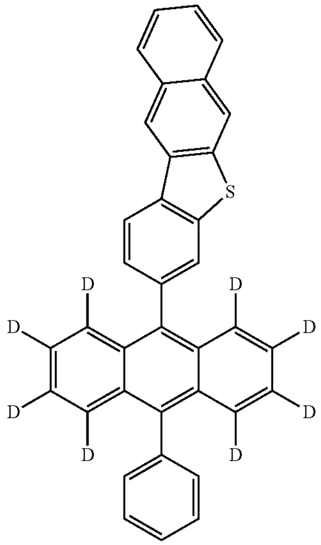
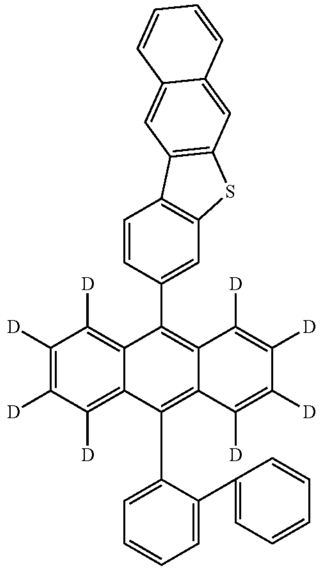

-continued
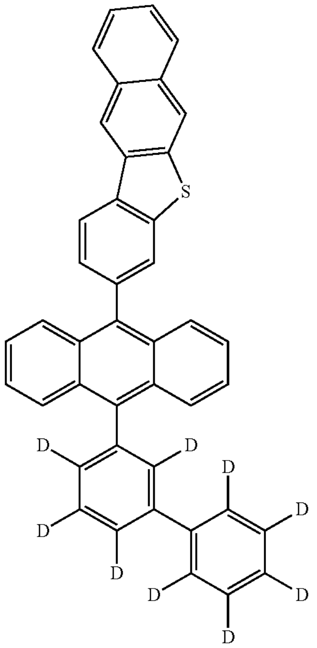
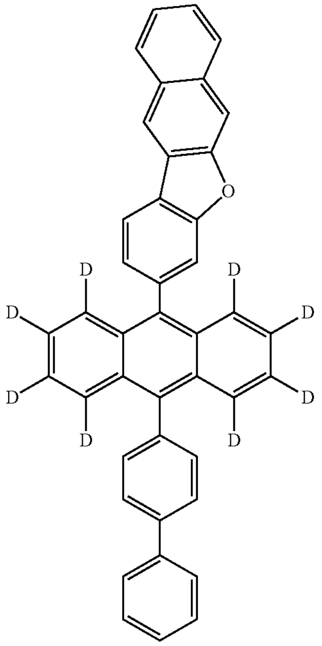
-continued
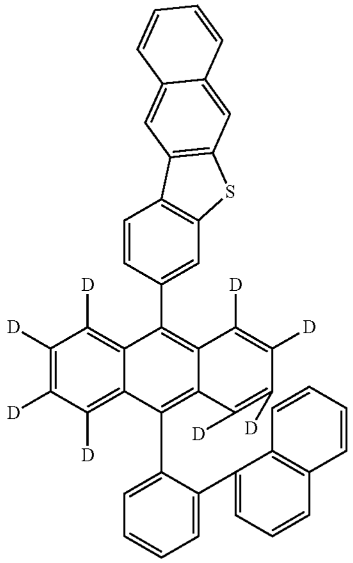
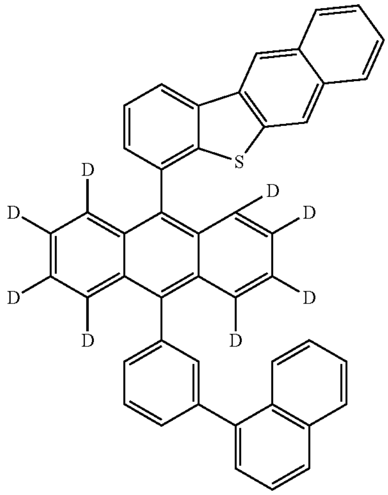
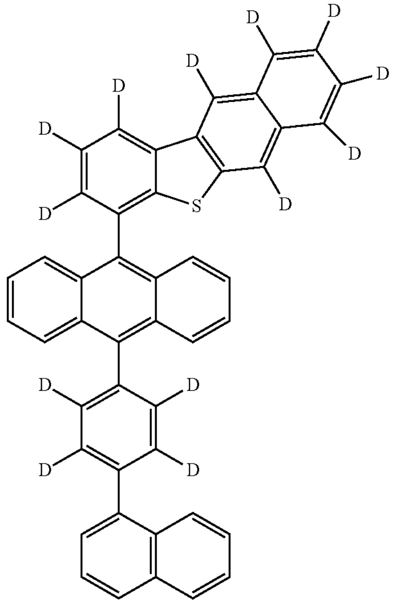

-continued
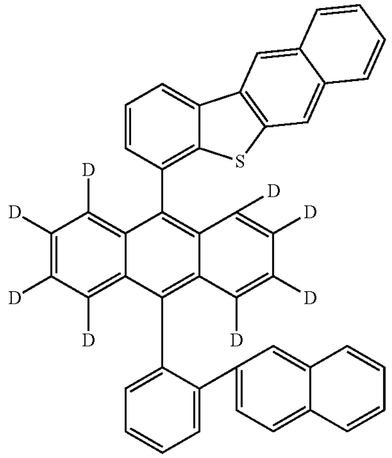
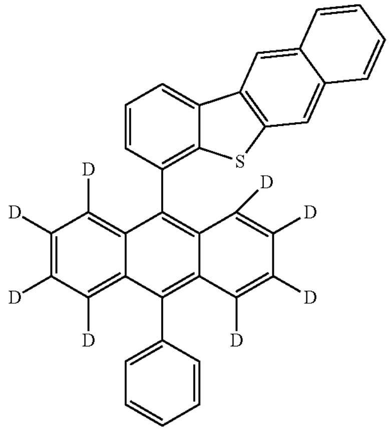
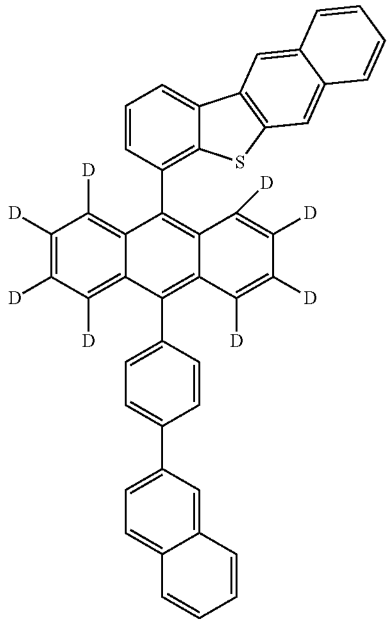
-continued
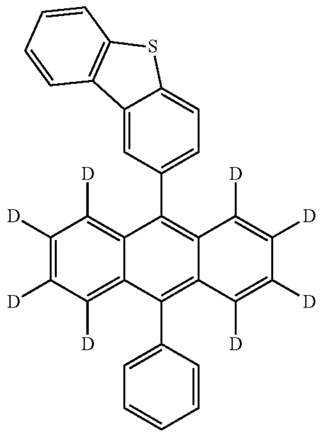
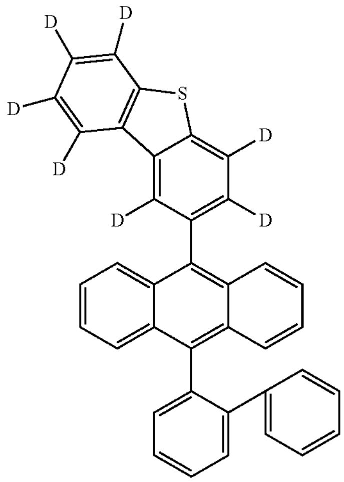
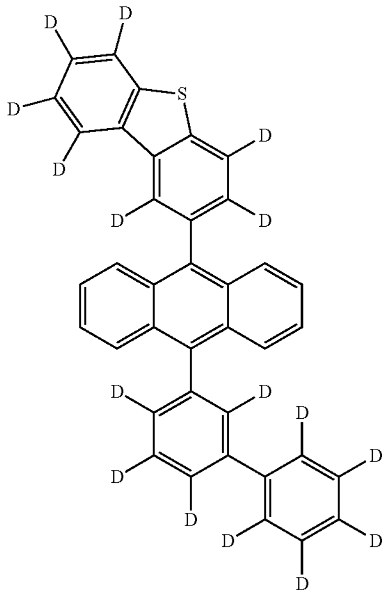

-continued
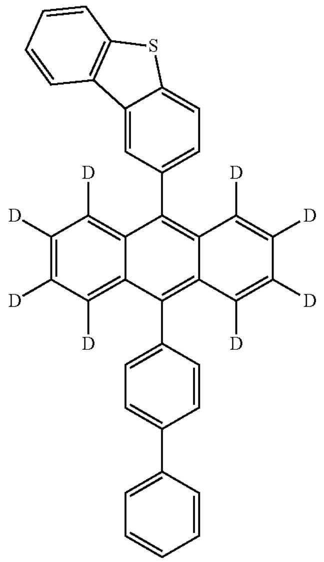
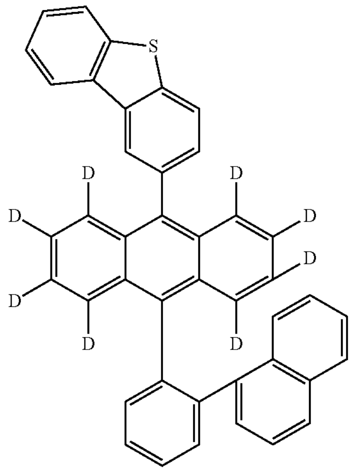
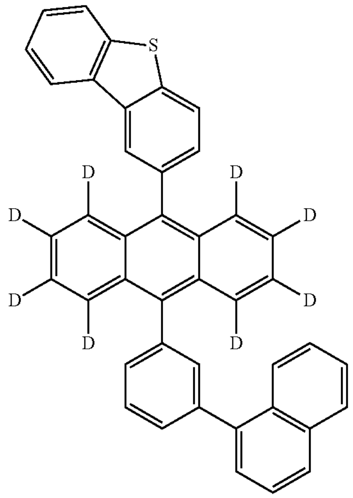
-continued
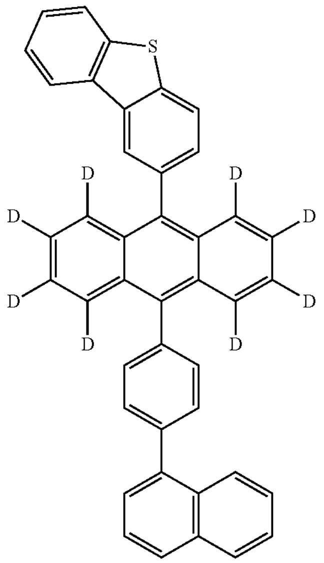
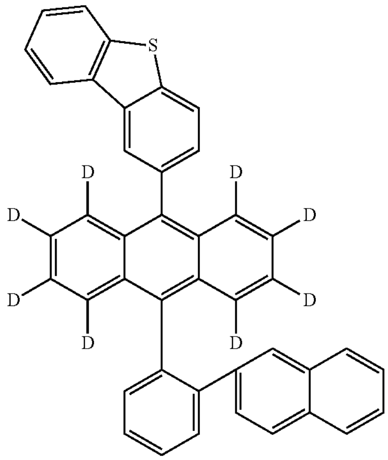
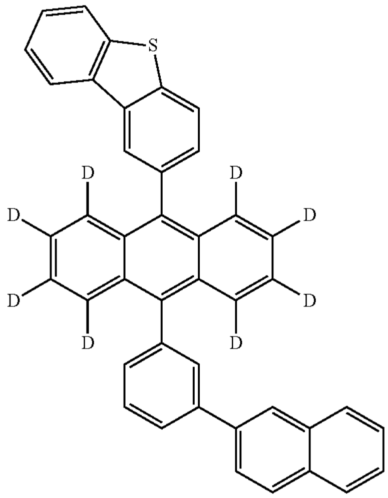

-continued
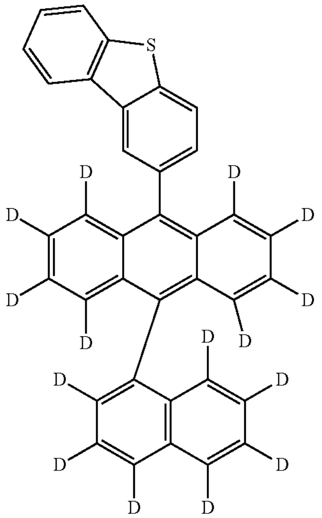
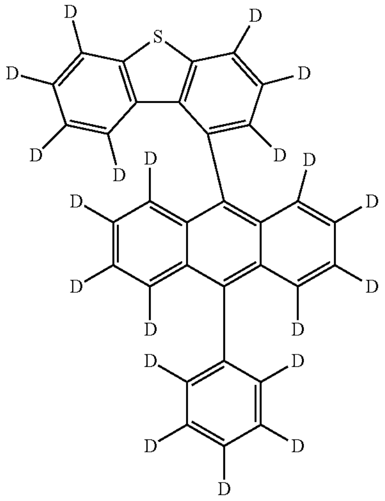
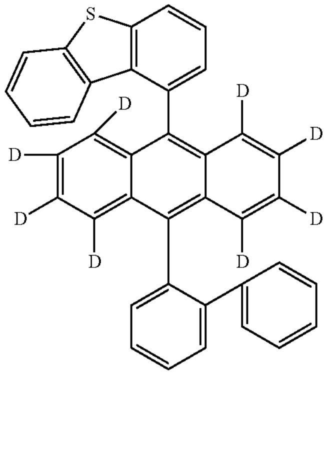
-continued
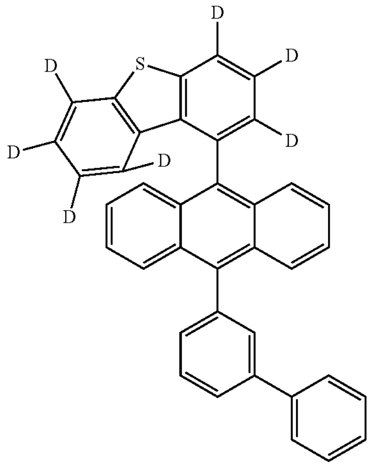
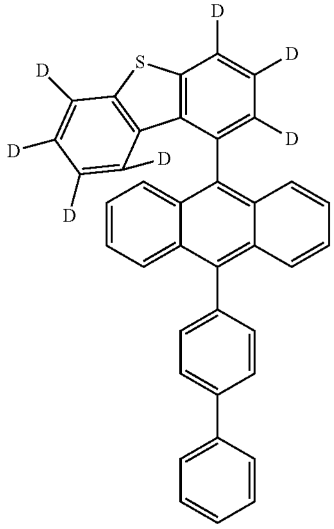
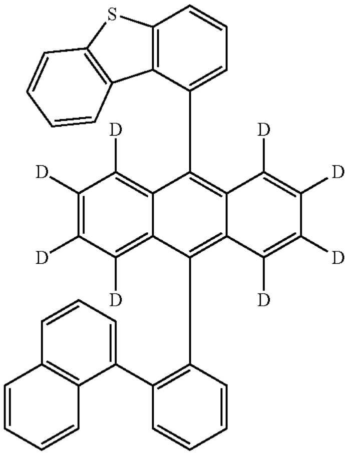

-continued
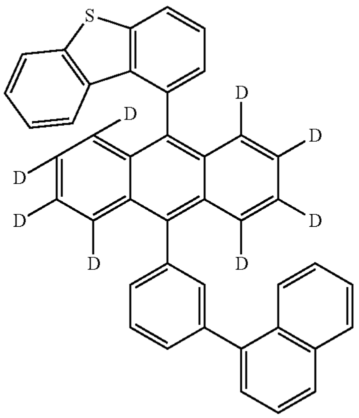
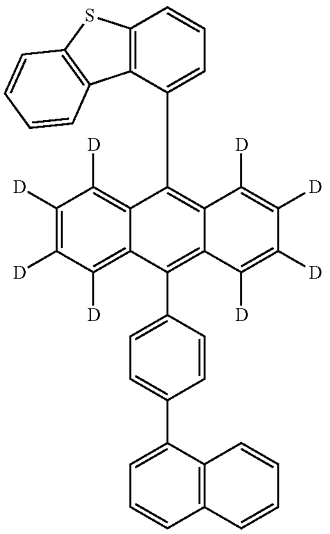
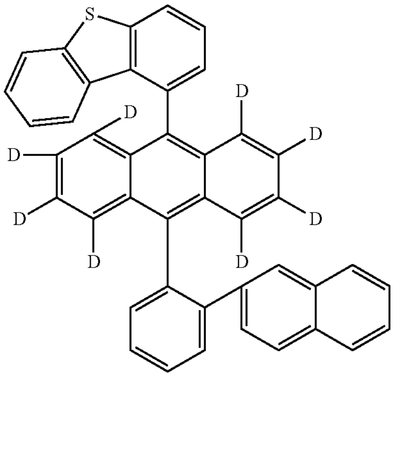
-continued
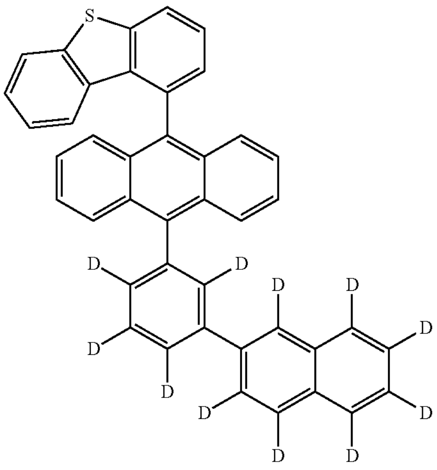
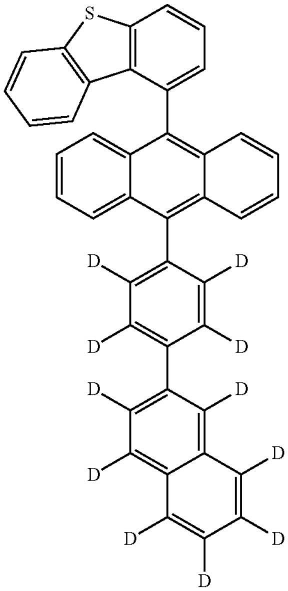
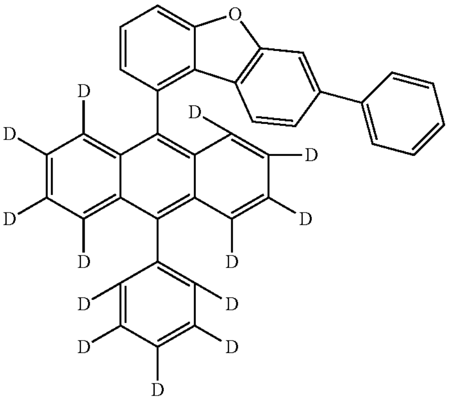

-continued
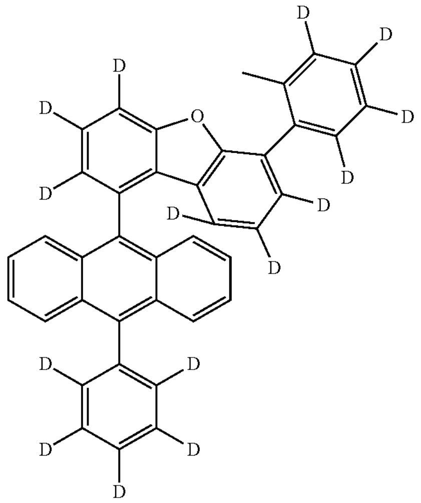
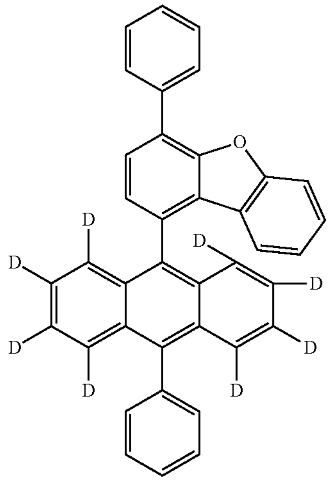
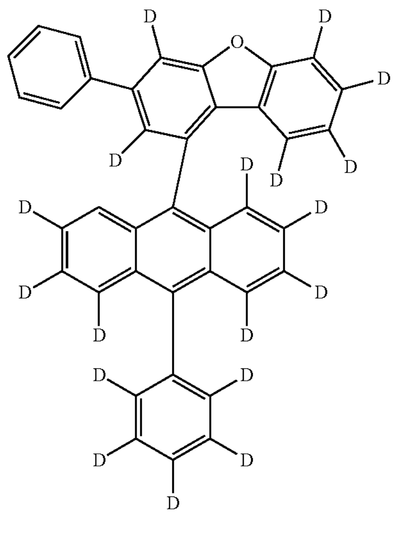
-continued
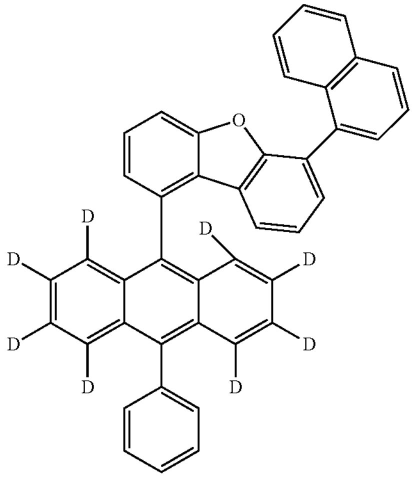
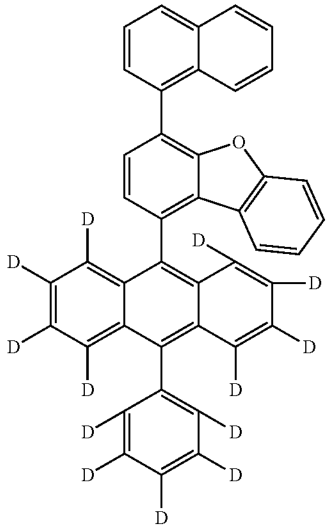
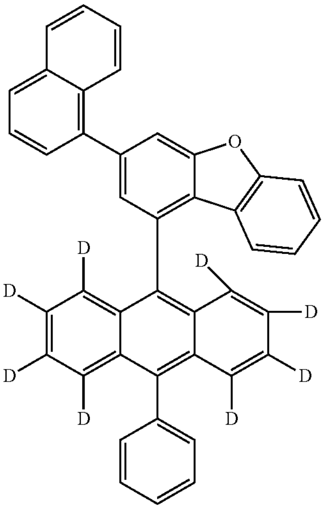

-continued
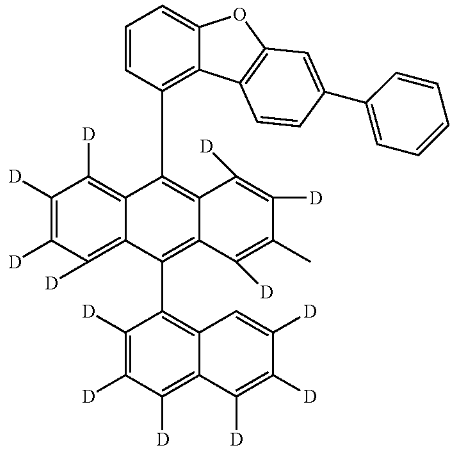
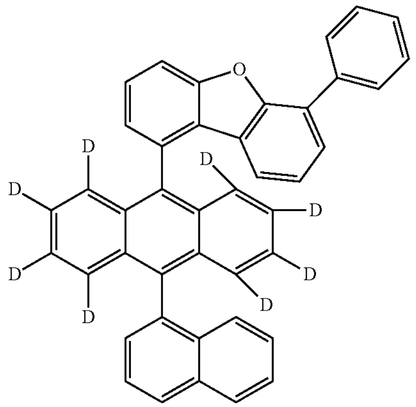
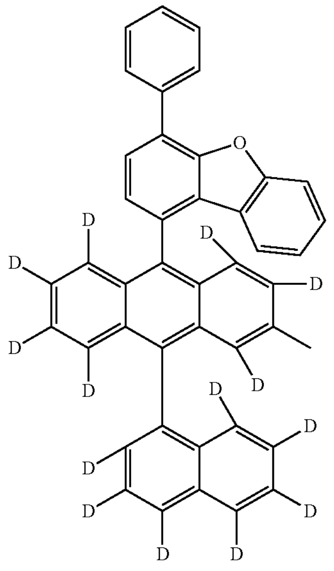
-continued
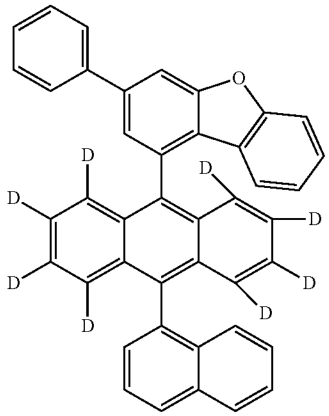
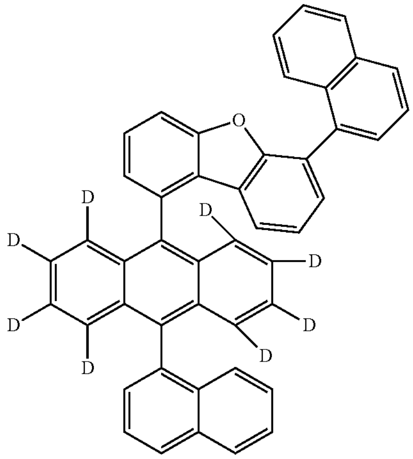
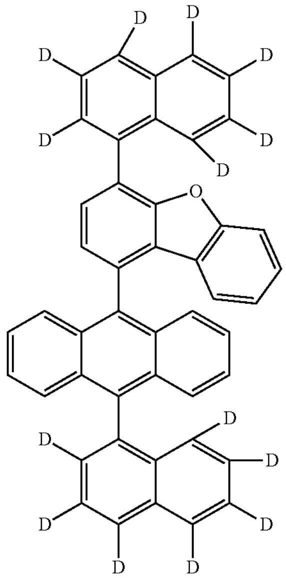

-continued
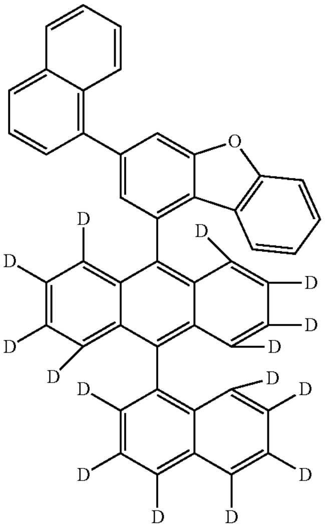
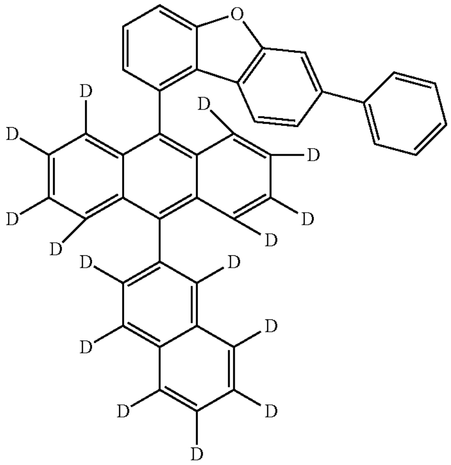
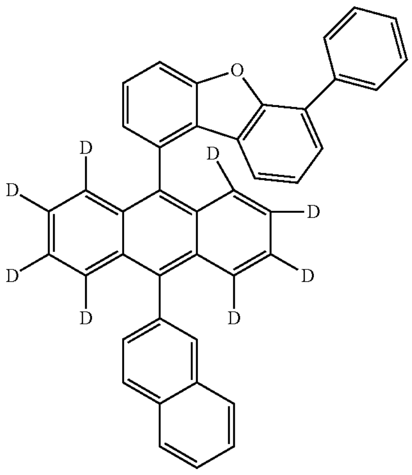
-continued
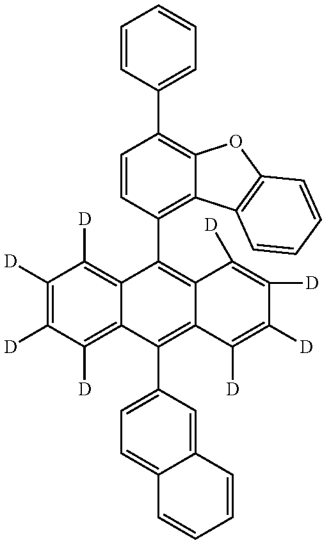
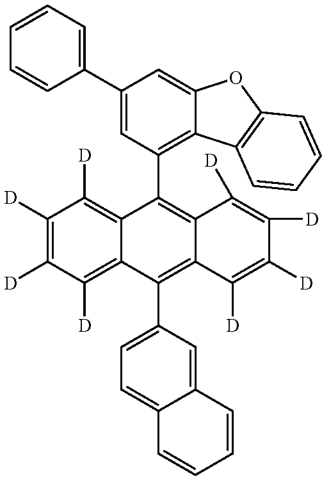
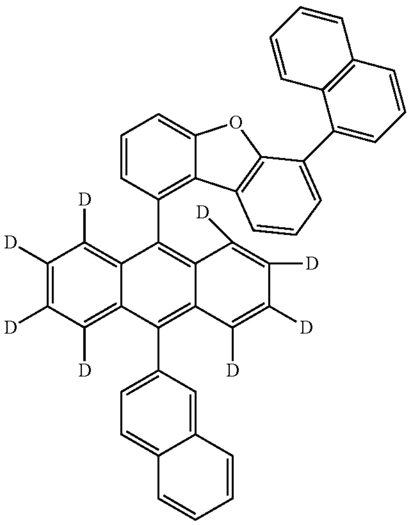

-continued
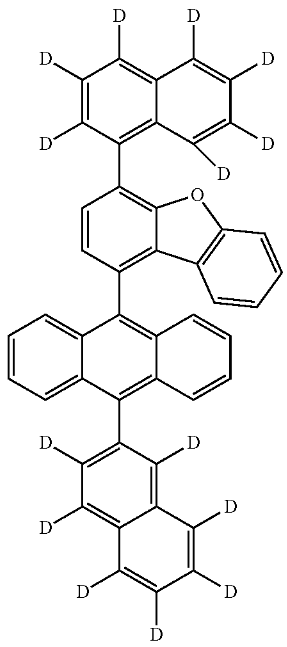
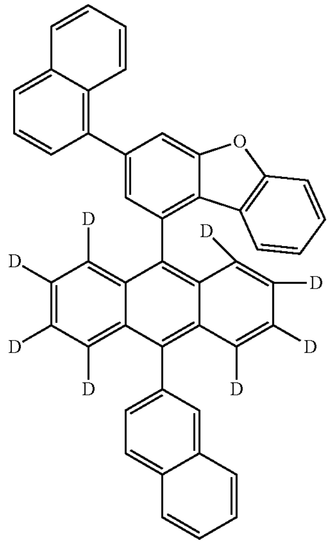
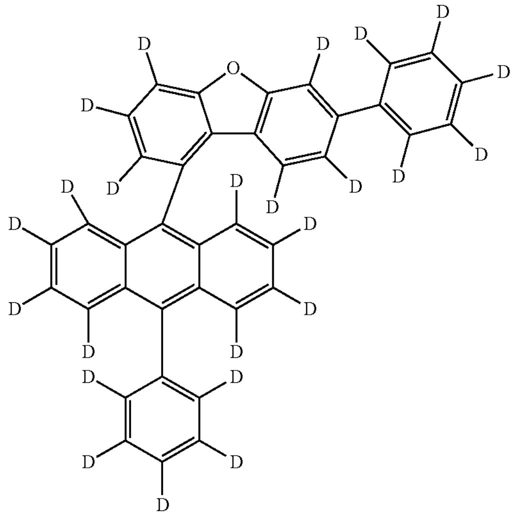
-continued
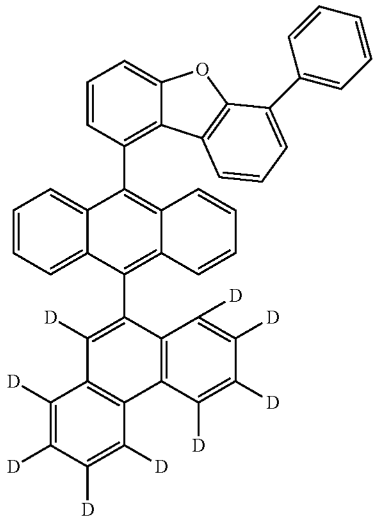
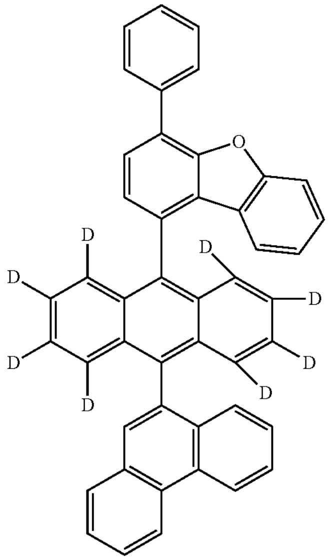
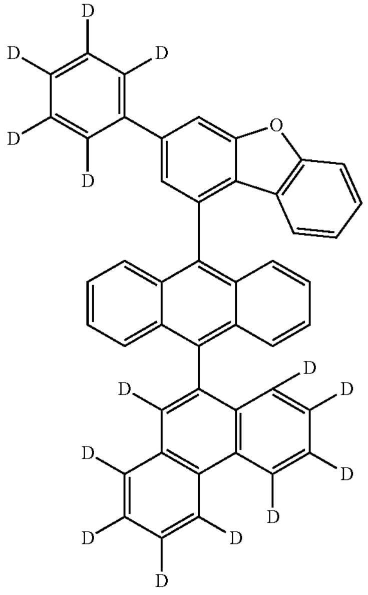

-continued
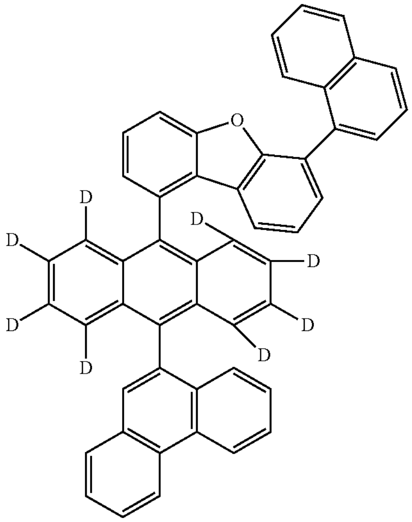
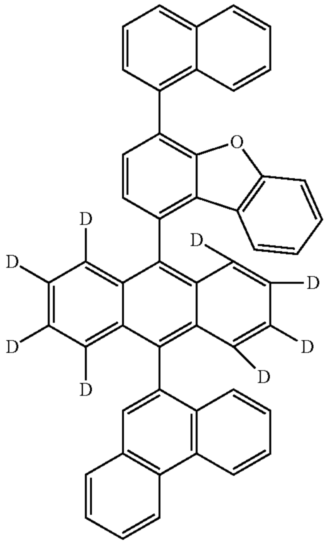
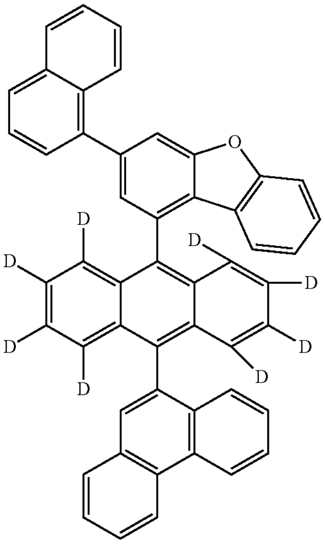
-continued
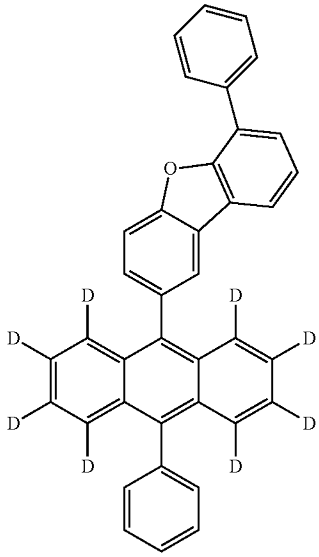
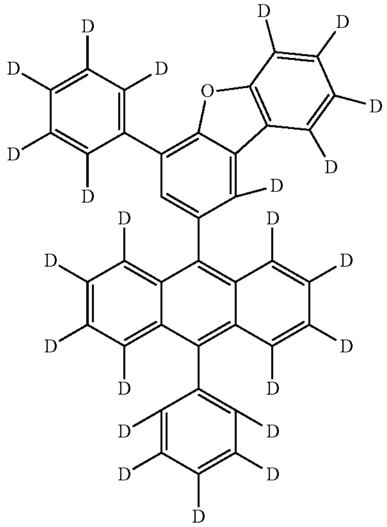
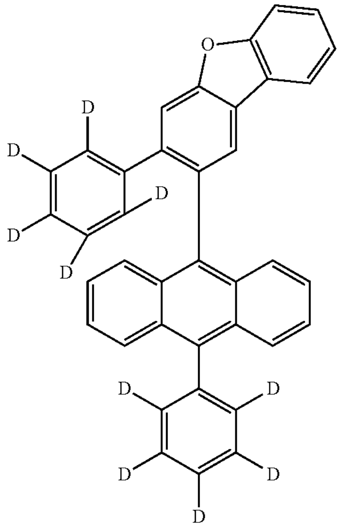

-continued
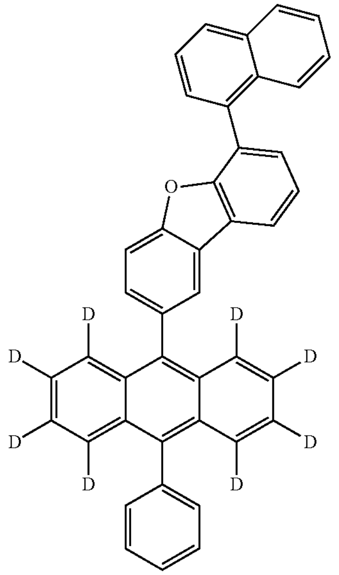
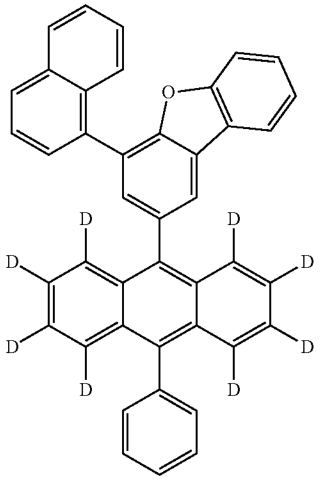
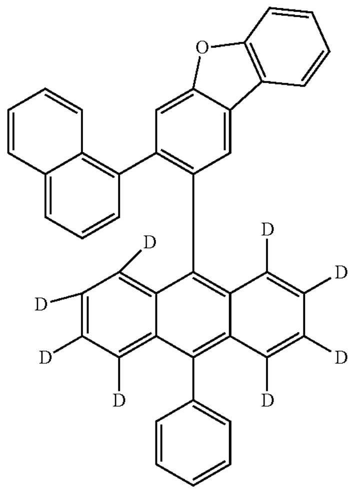
-continued
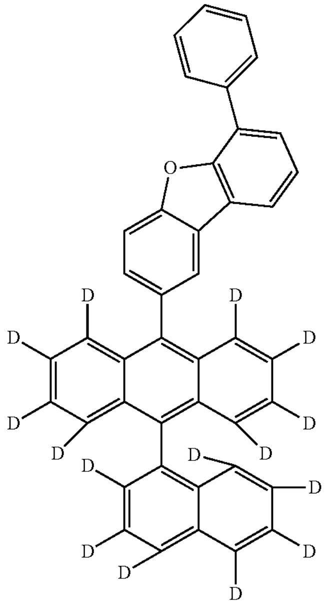
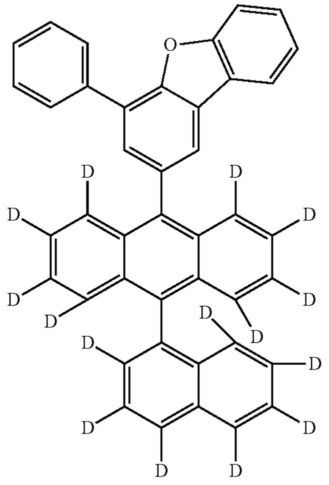
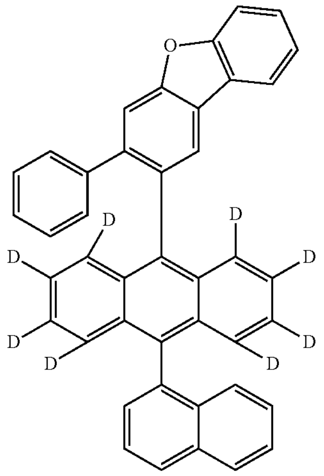

-continued
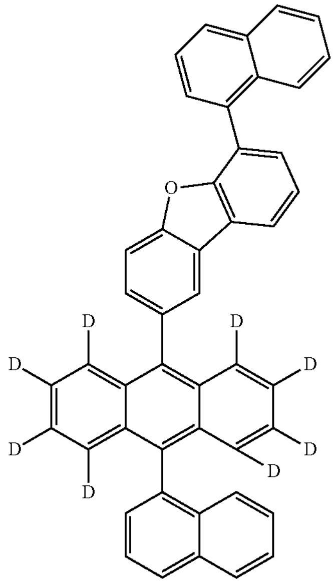
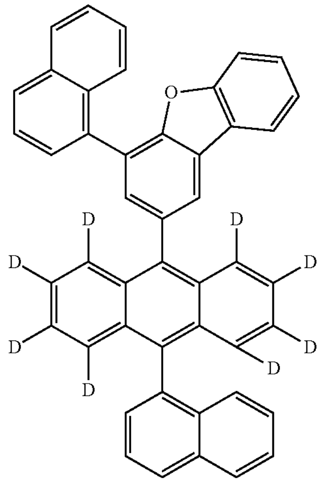
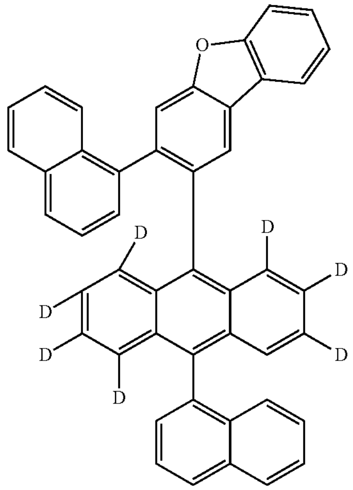
-continued
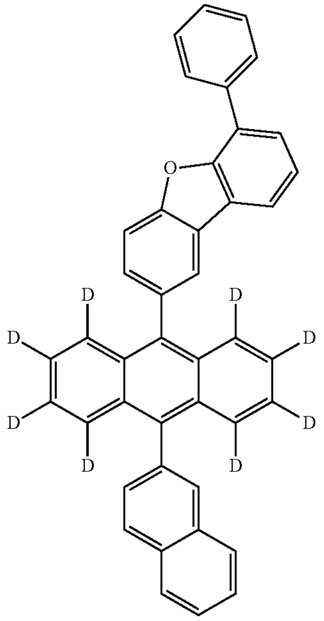
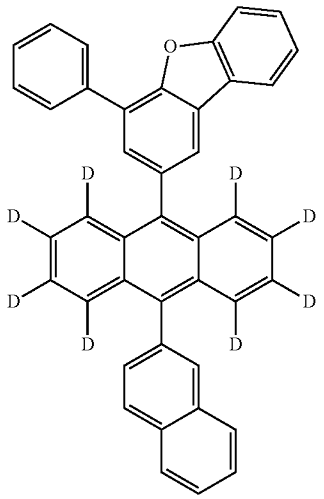
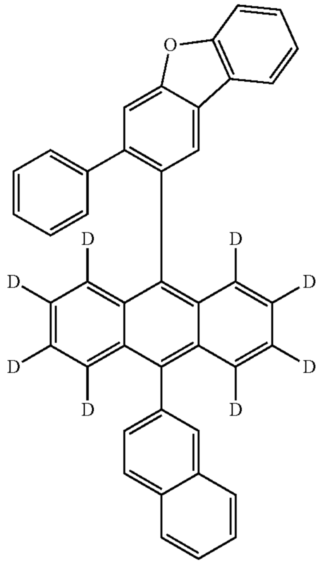

-continued
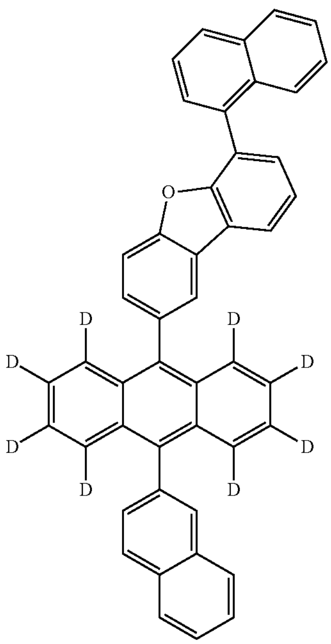
-continued
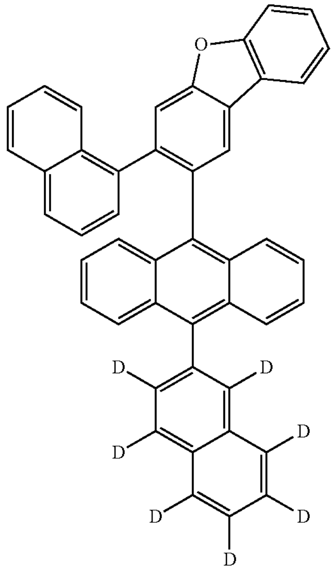
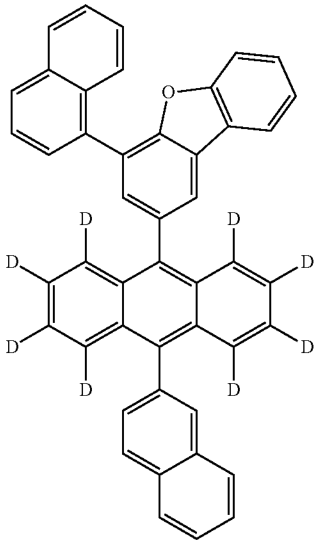
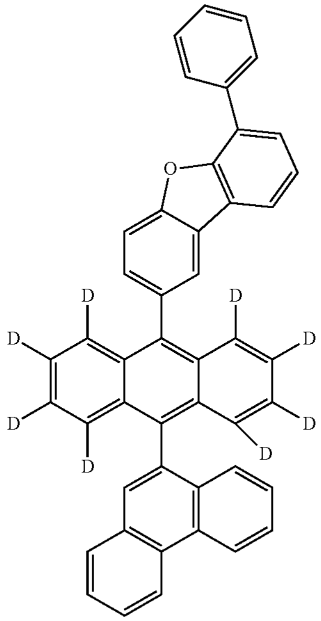

-continued
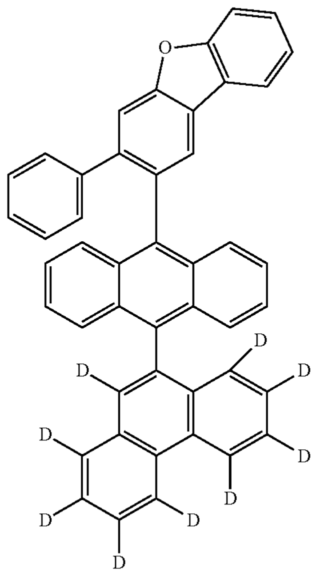
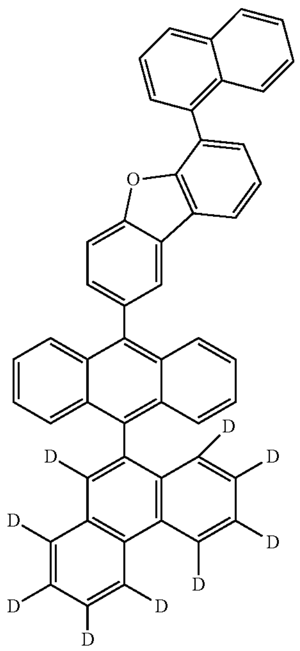
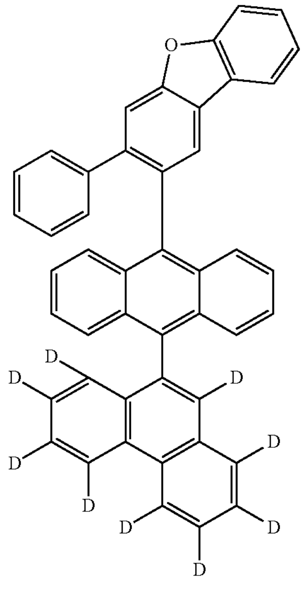
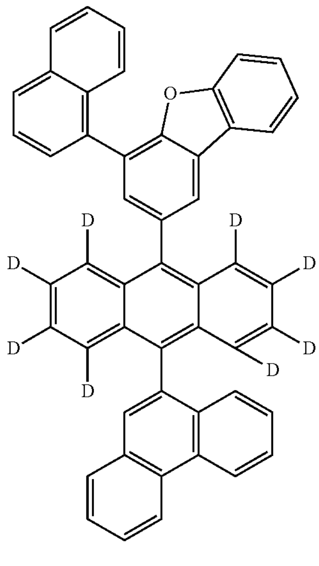

-continued
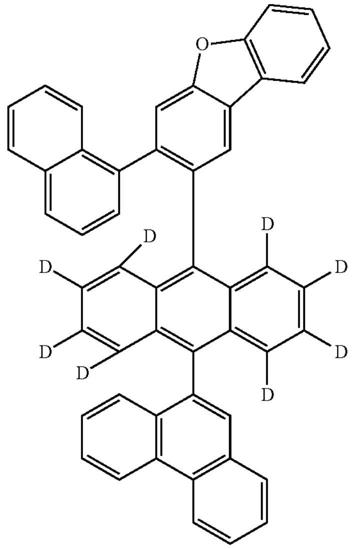
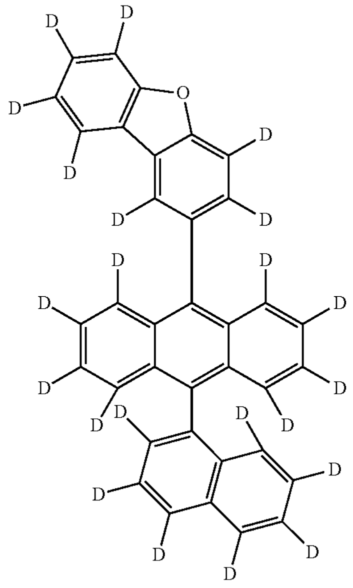
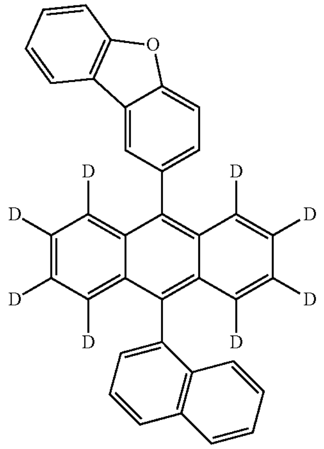
-continued
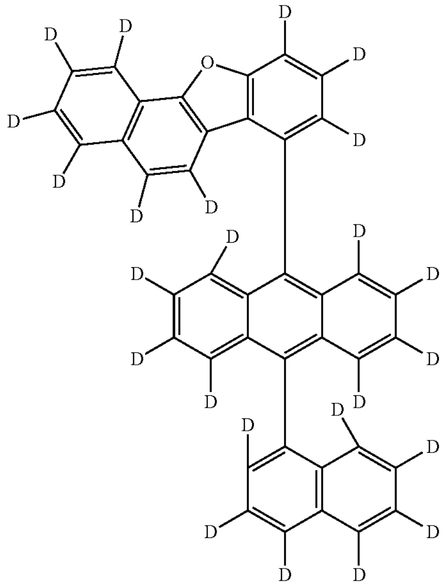
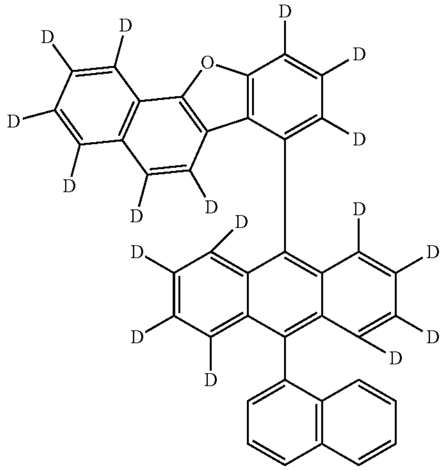
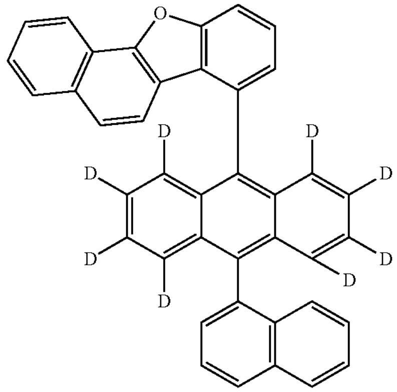

-continued
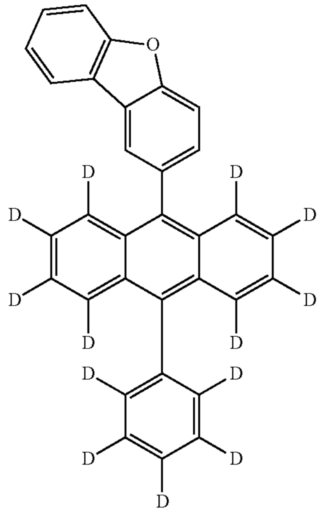
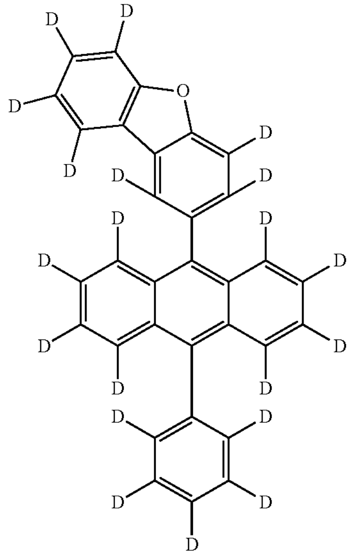
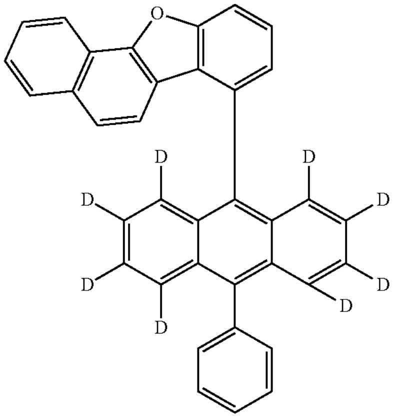
-continued
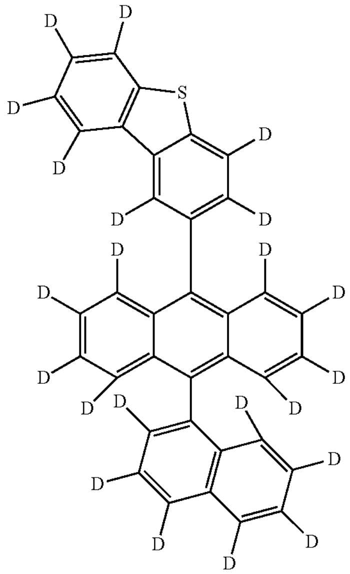
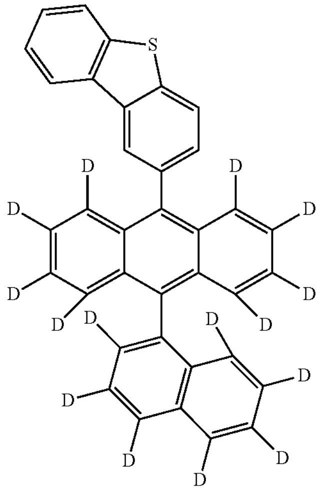
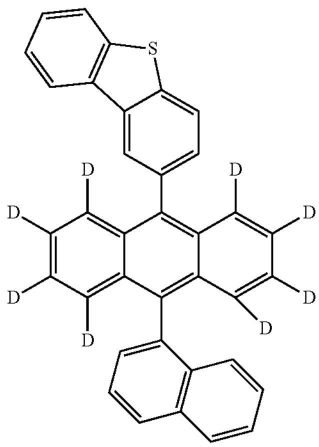

-continued
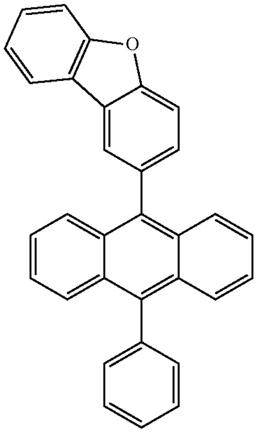
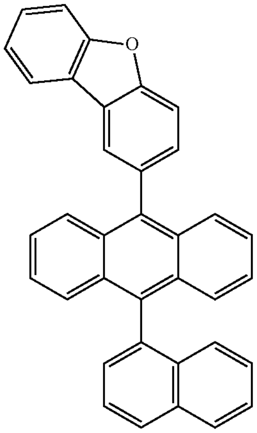
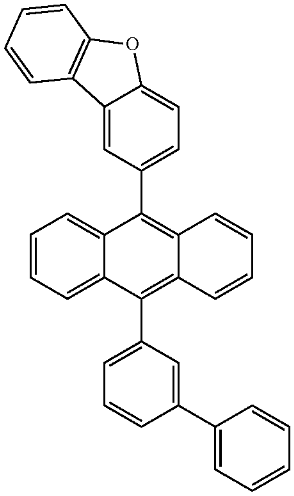
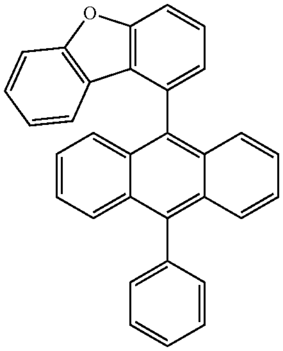
-continued
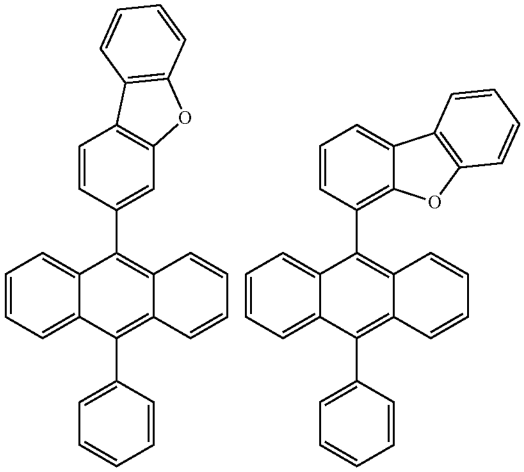
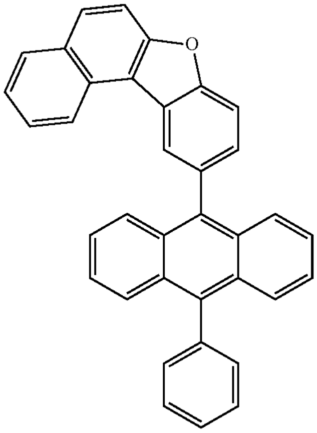
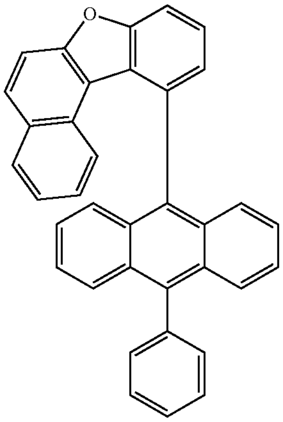

-continued
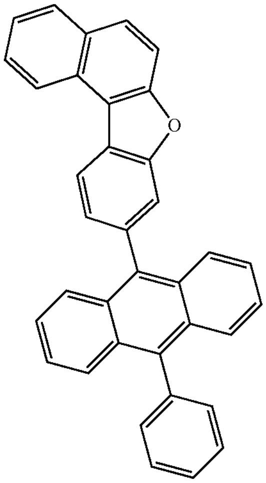
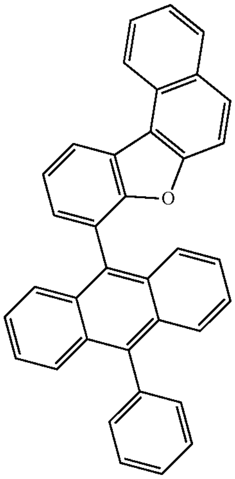
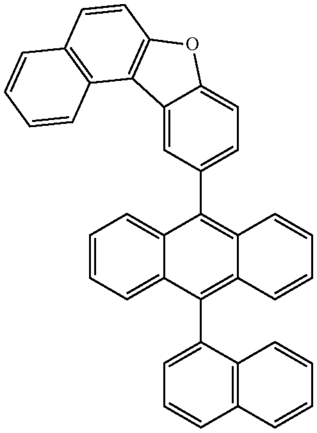
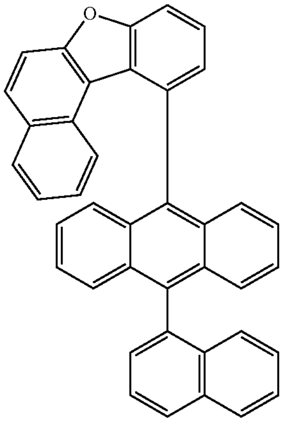
-continued
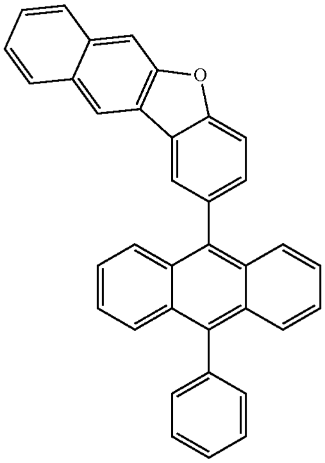
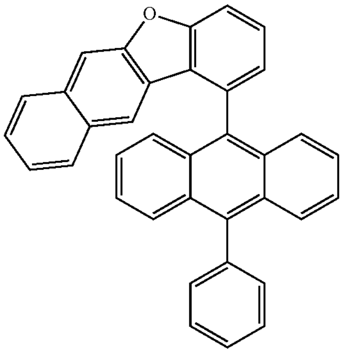
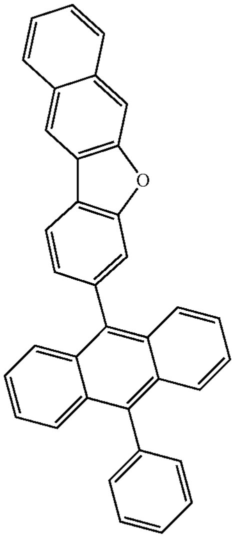

-continued
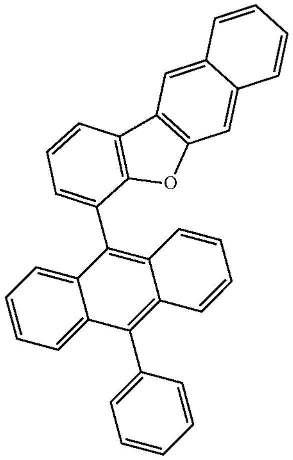
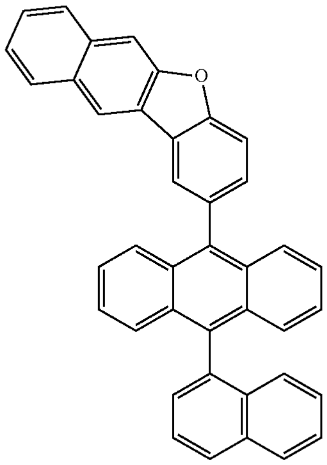
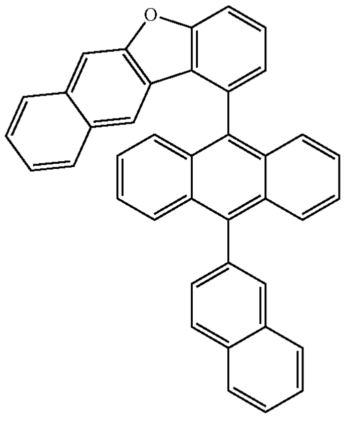
-continued
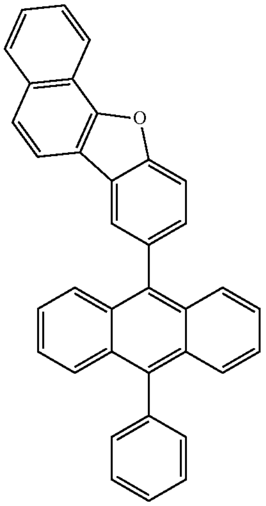
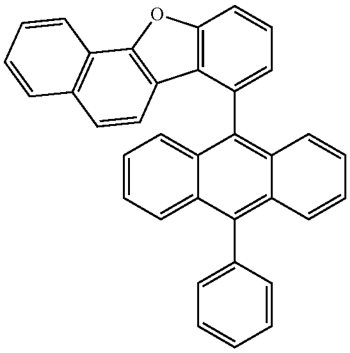
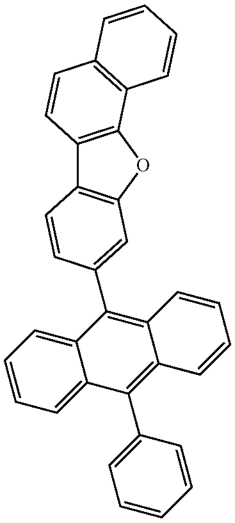

-continued
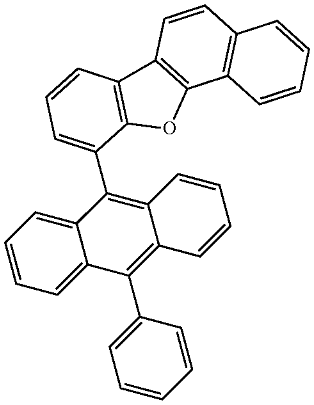
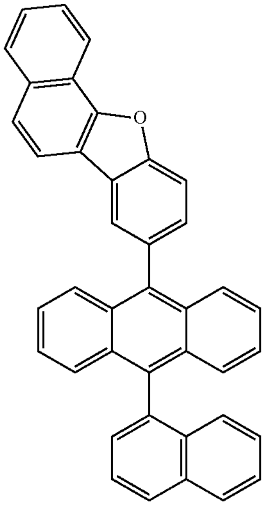
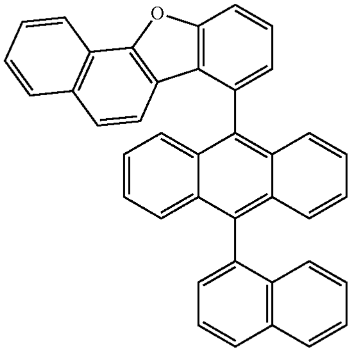
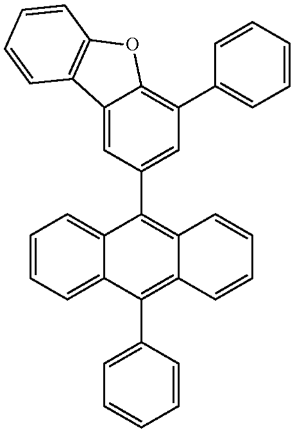
-continued
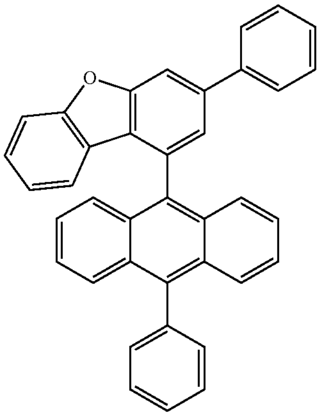
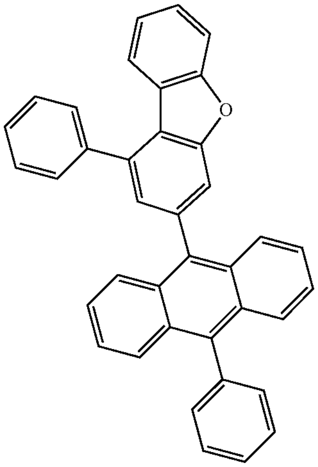
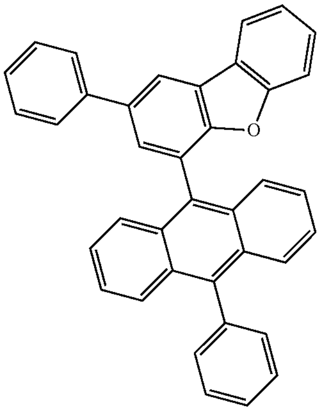
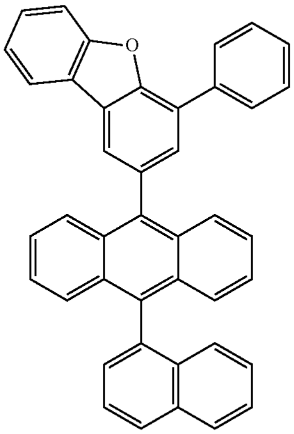

-continued
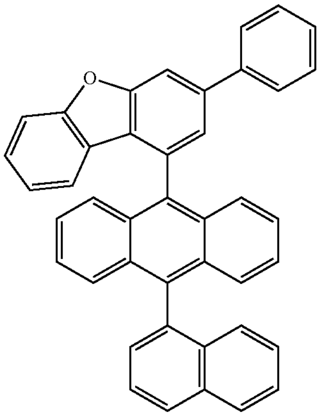
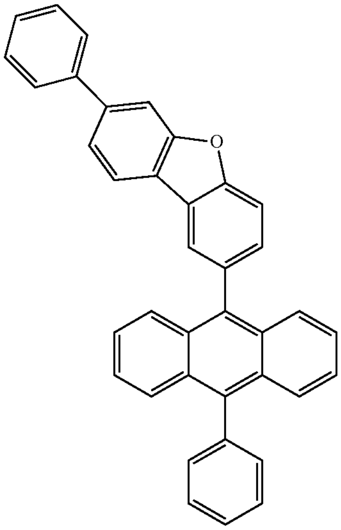
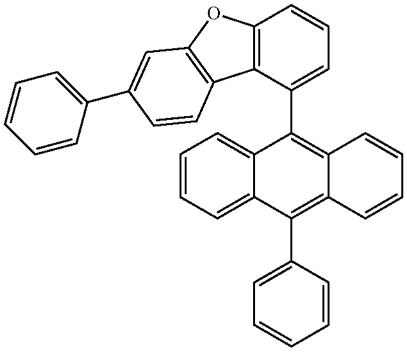
-continued
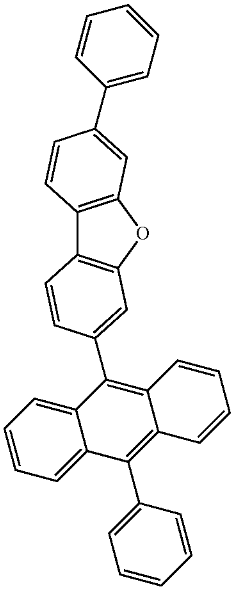
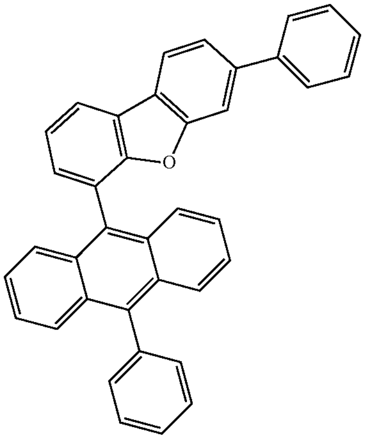
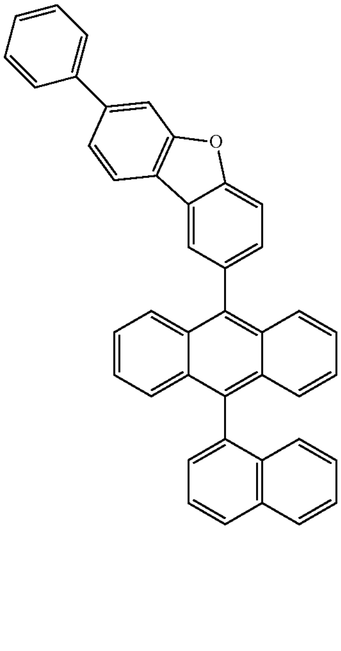

-continued

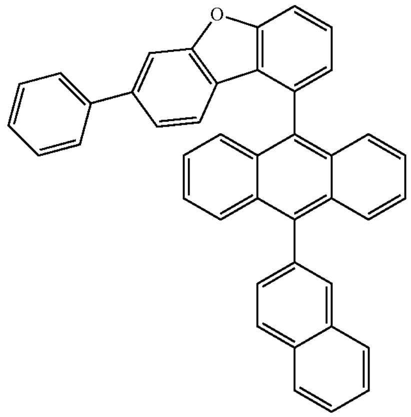

In addition, the present disclosure provides a method for preparing a compound of Chemical Formula 1, as shown in Reaction Scheme 1 below.

[Reaction Scheme 1]

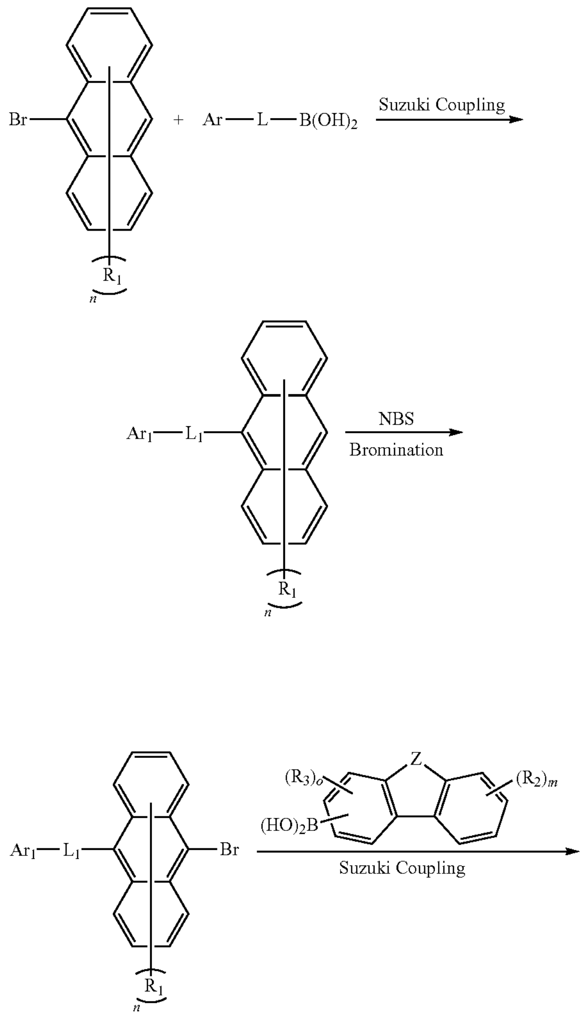

-continued

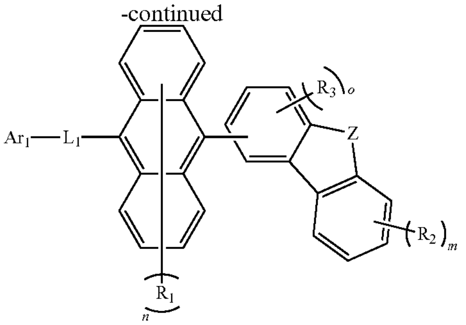

In the Reaction Scheme 1, Z, $L_1$, $Ar_1$, $R_1$ to $R_3$, n, m, and o are as defined above, and NBS is N-bromosuccinimide.

The above reaction uses a Suzuki coupling reaction, and can be more specifically described in Examples described below.

Hole Blocking Layer

The organic light emitting device according to the present disclosure includes a hole blocking layer between the light emitting layer and the electron transport layer, if necessary. Preferably, the hole blocking layer is in contact with the light emitting layer.

The hole blocking layer serves to improve the efficiency of an organic light emitting device by suppressing holes injected from the anode from being transferred to the cathode without recombination in the light emitting layer. Specific examples of the hole blocking material include an oxadiazole derivative, a triazole derivative, a phenanthroline derivative, BCP, an aluminum complex, and the like, but are not limited thereto.

Electron Transport Layer, Electron Injection Layer, or Electron Transport and Injection Layer The organic light emitting device according to the present disclosure can include an electron transport layer, an electron injection layer, or an electron transport and injection layer between the light emitting layer and the cathode.

The electron transport layer is a layer which receives electrons from a cathode or an electron injection layer formed on the cathode and transports the electrons to a light emitting layer, and can suppress the transfer of holes in the light emitting layer. An electron transport material is suitably a material which can receive electrons well from a cathode and transport the electrons to a light emitting layer, and at least one of the compound of Chemical Formula 2 and the compound of Chemical Formula 3 can be included in the present disclosure.

The electron injection layer is a layer which injects electrons from an electrode, and the electron injection material is preferably a compound which can transport electrons, has an effect of injecting electrons from a cathode and an excellent effect of injecting electrons into a light emitting layer or a light emitting material, prevents excitons produced from the light emitting layer from moving to a hole injection layer, and is also excellent in the ability to form a thin film. In the present disclosure, at least one of the compound of Chemical Formula 2 and the compound of Chemical Formula 3 can be included The electron transport and injection layer is a layer capable of simultaneously performing electron transport and electron injection, and can include at least one of the compound of Chemical Formula 2 and the compound of Chemical Formula 3.

Preferably, the Chemical Formula 2 is the following Chemical Formula 2-1; and the Chemical Formula 3 is the following Chemical Formula 3-1:

[Chemical Formula 2-1]

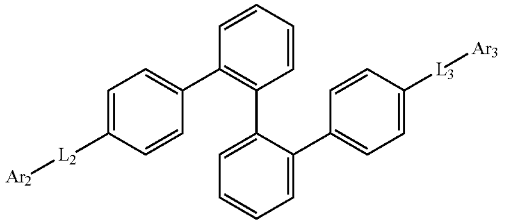

[Chemical Formula 3-1]

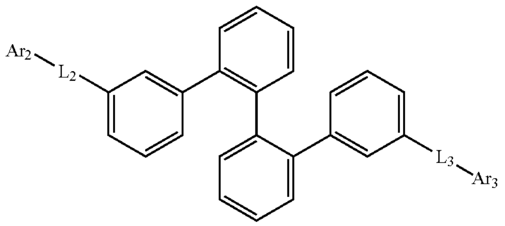

in the Chemical Formula 2-1 or 3-1, $L_2$, $L_3$, $Ar_2$ and $Ar_3$ are as defined above.

Preferably, $L_2$ and $L_3$ are each independently a direct bond, phenylene, or biphenyldiyl.

Preferably, $Ar_2$ and $Ar_3$ are each independently any one selected from the group consisting of:

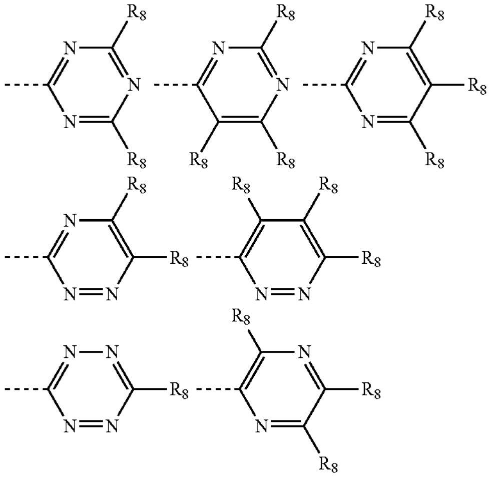

wherein in the above group, $R_8$ is as defined above.

Preferably, each $R_8$ is independently hydrogen, deuterium, methyl, tert-butyl, phenyl, biphenylyl, terphenylyl, naphthyl, pyridinyl, furanyl, or thiophenyl, or two adjacent $R_8$s are combined to form a benzene ring; and the phenyl, biphenylyl, terphenylyl, naphthyl, pyridinyl, furanyl, or thiophenyl is each independently unsubstituted or substituted with deuterium, methyl, or tert-butyl.

Preferably, $Ar_2$ and $Ar_3$ are each independently any one selected from the group consisting of:

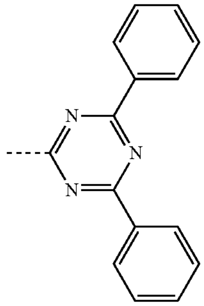
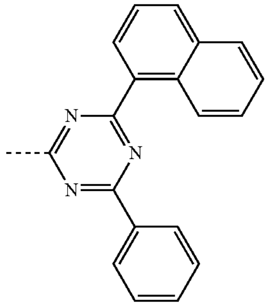

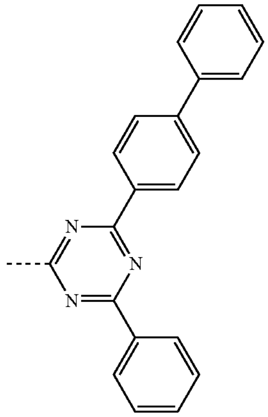

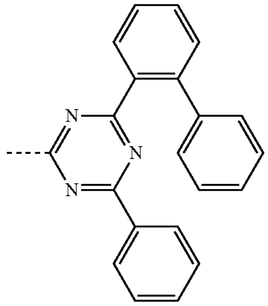
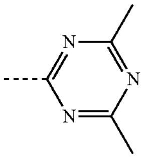

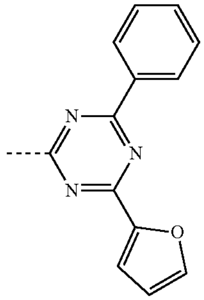
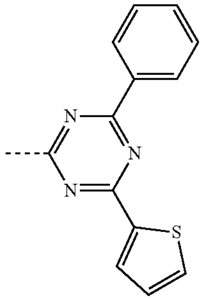

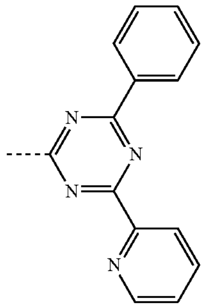
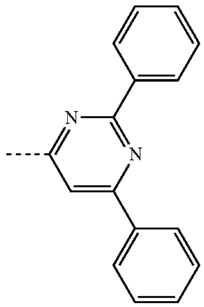

-continued
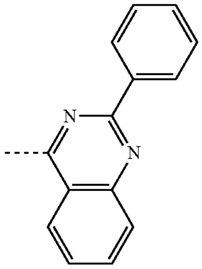
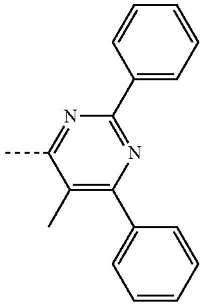
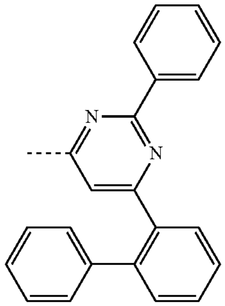
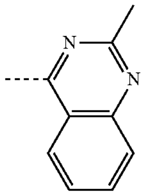
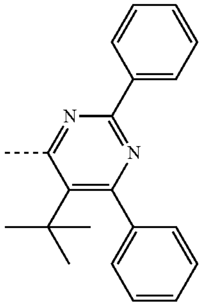
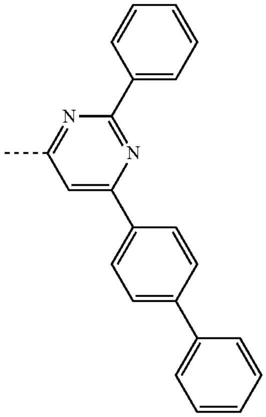
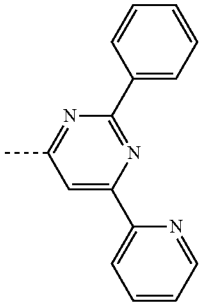
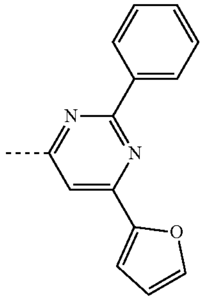
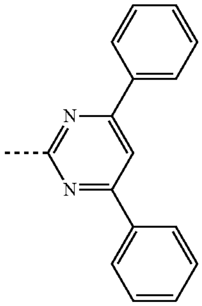
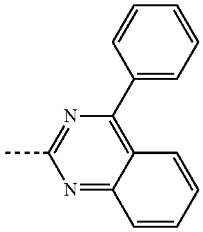
-continued
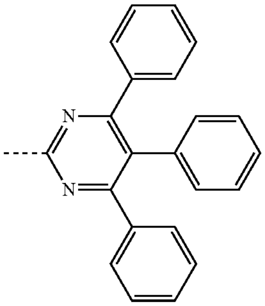
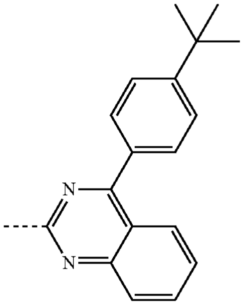
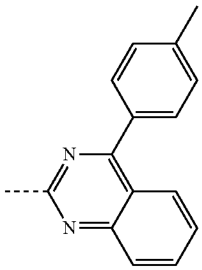
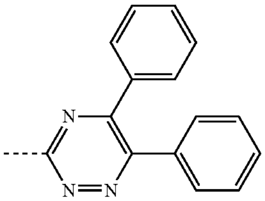
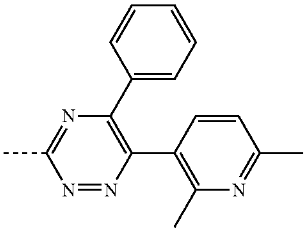
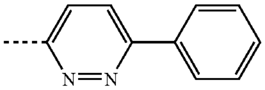
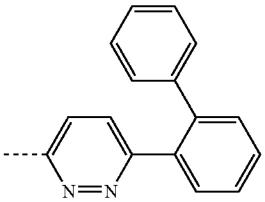
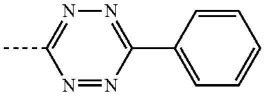
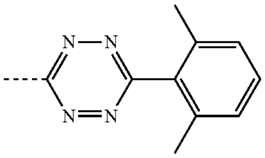

-continued
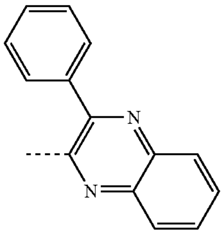
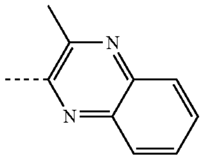
-continued
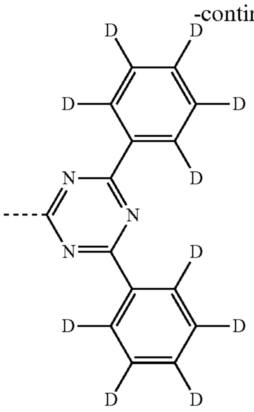
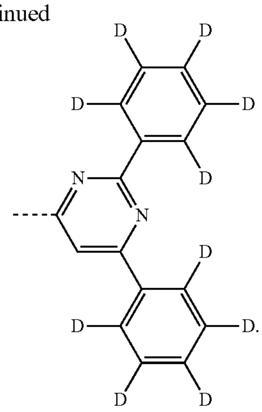
Representative examples of the compound of Chemical Formula 2 and the compound of Chemical Formula 3 are as follows:
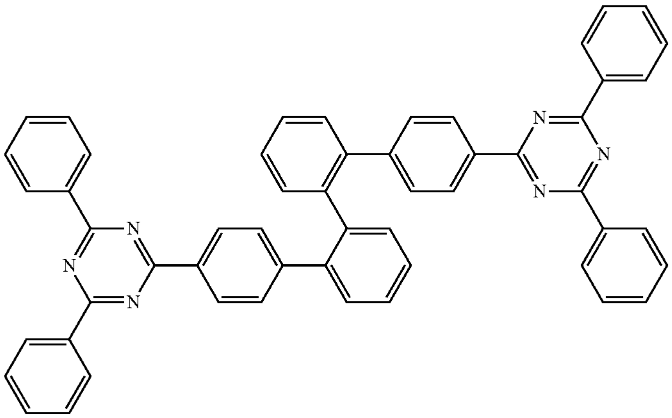
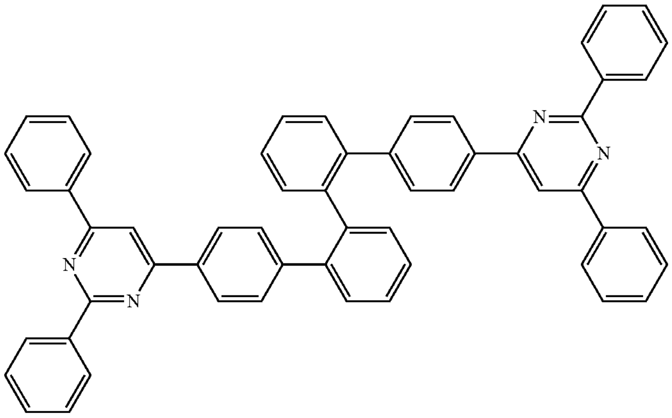

-continued
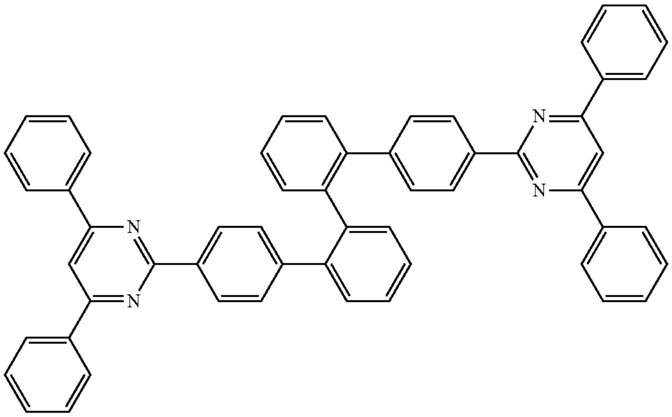
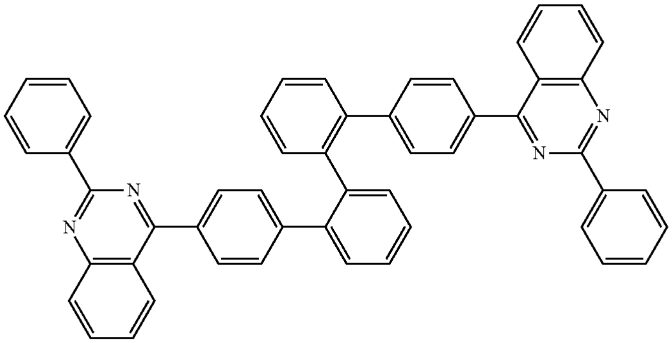
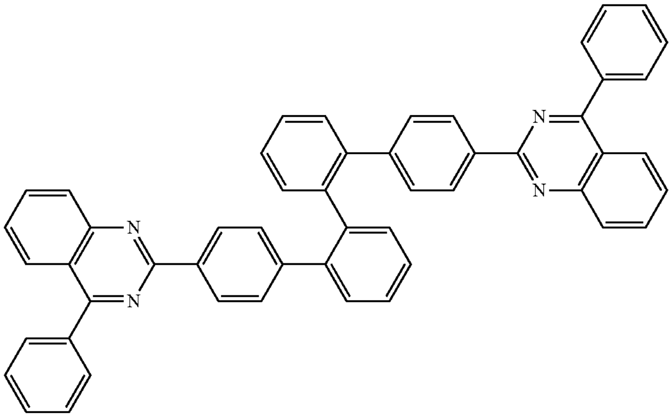
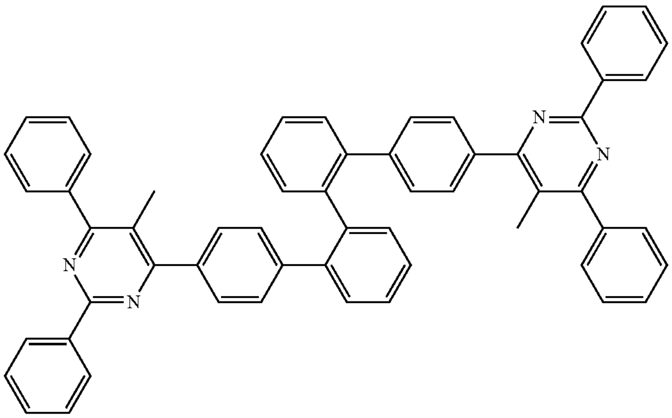

-continued
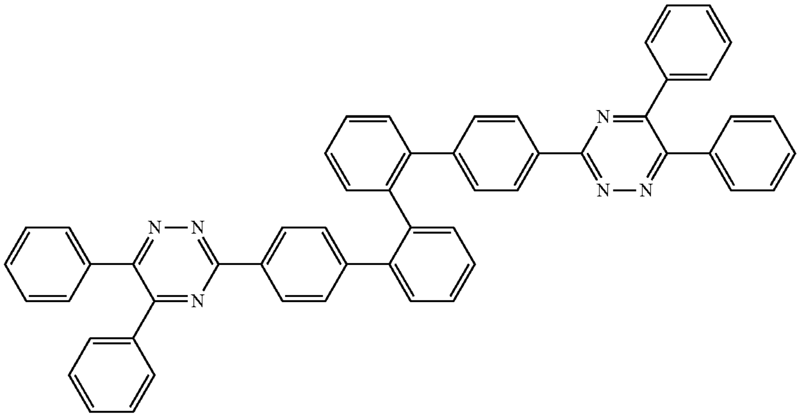
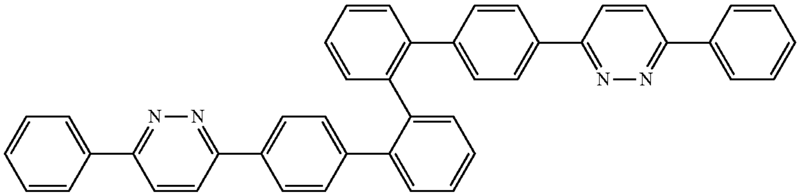
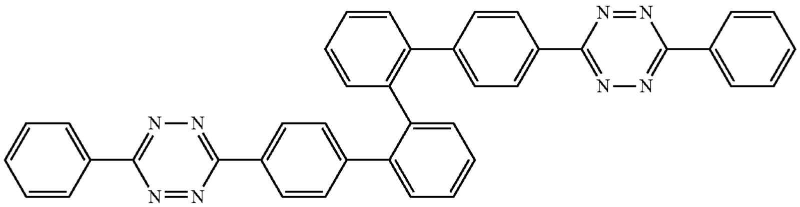
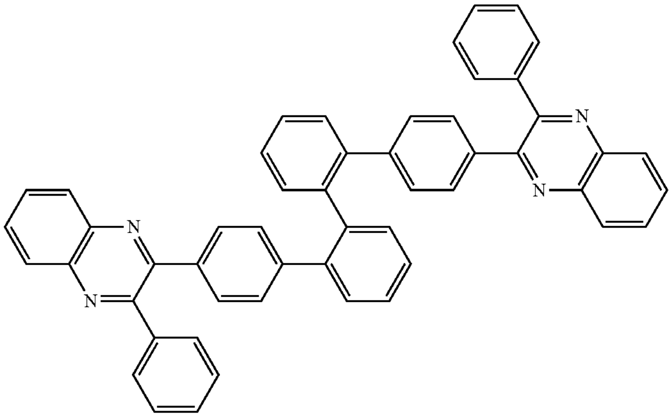
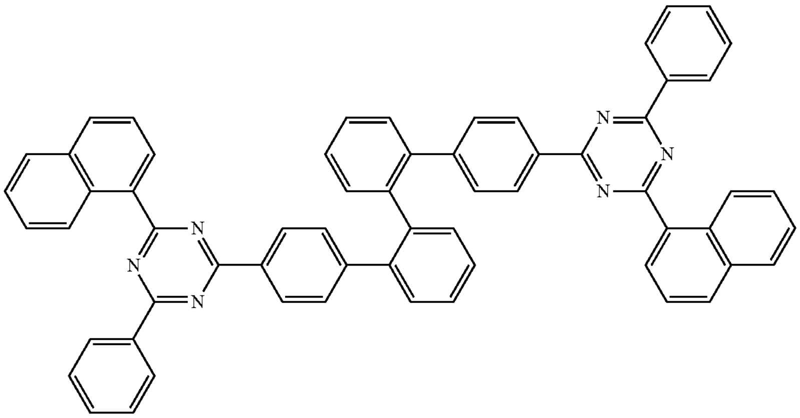

-continued
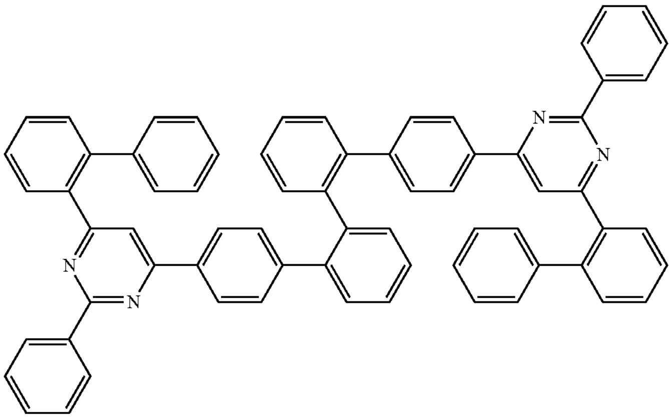
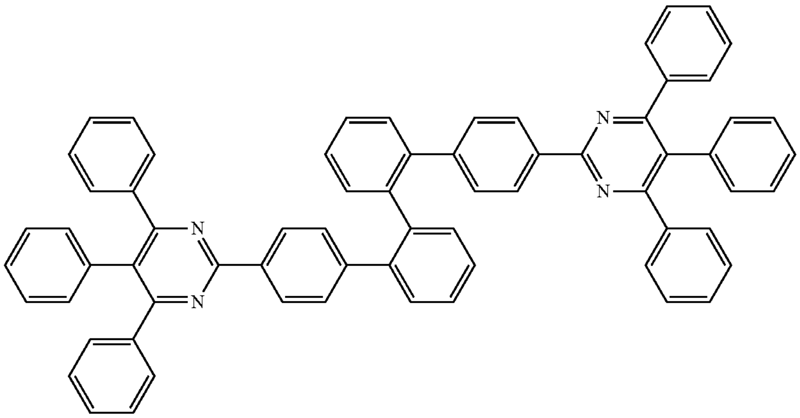
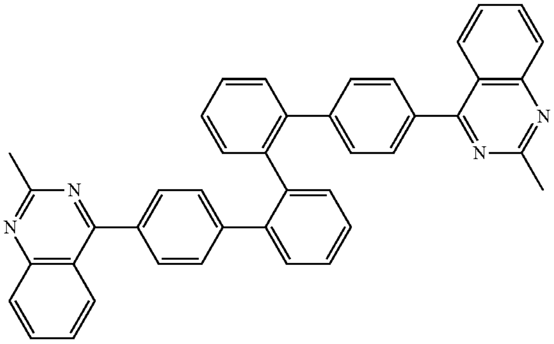

-continued
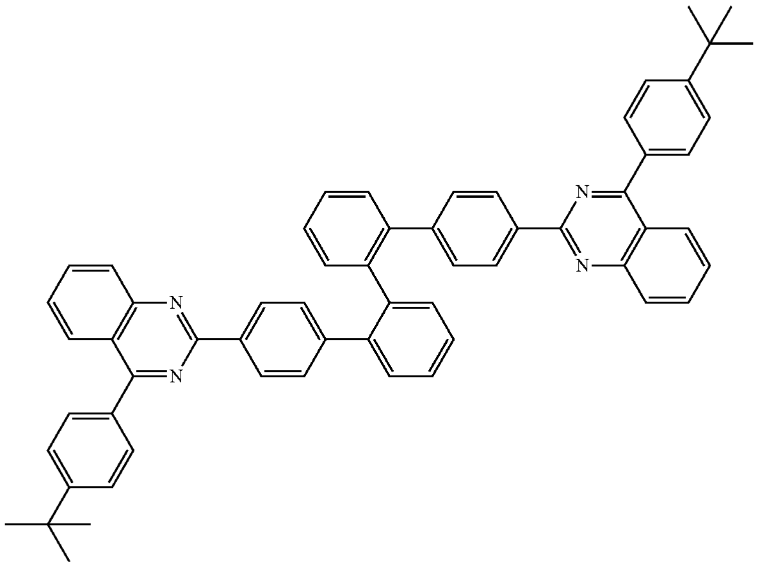
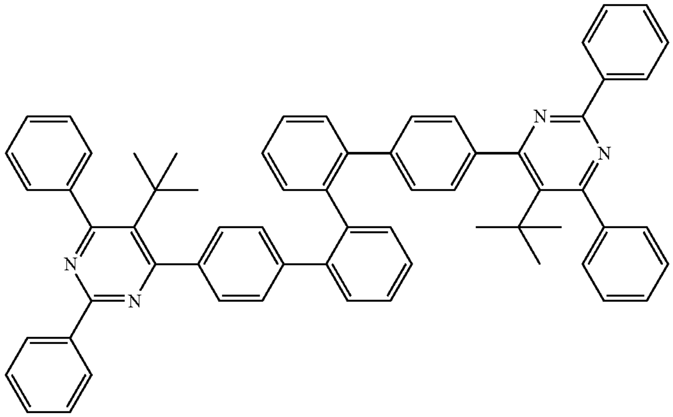
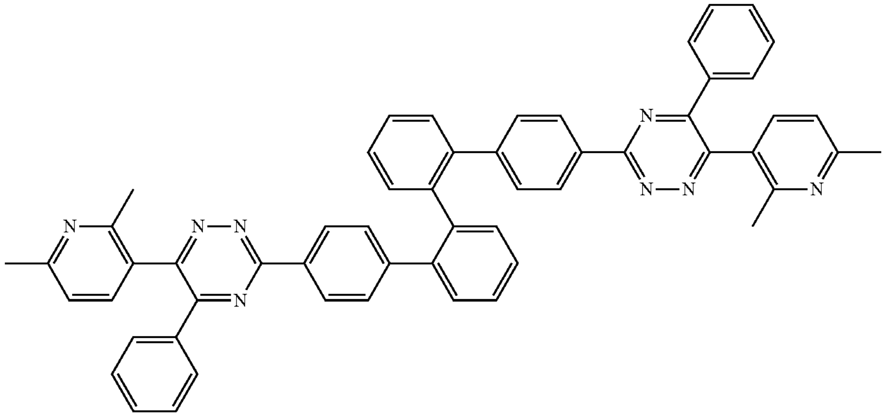

-continued
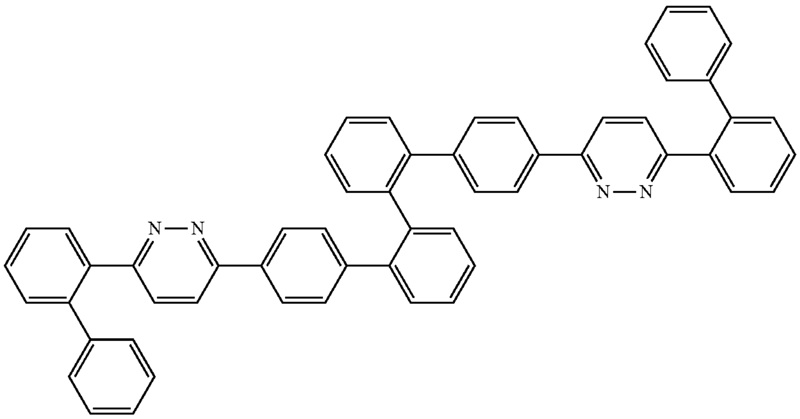
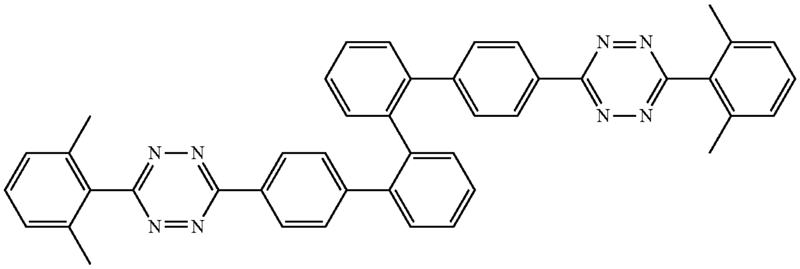
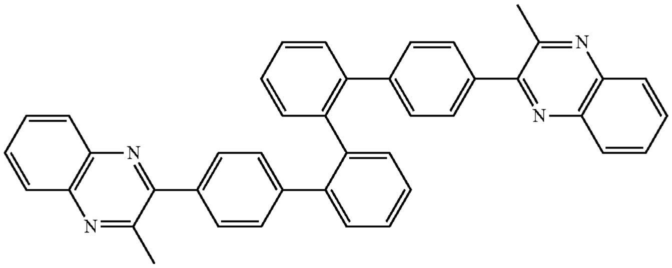
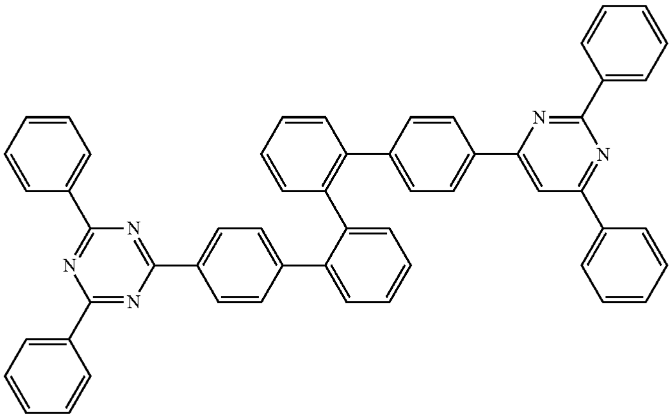

-continued
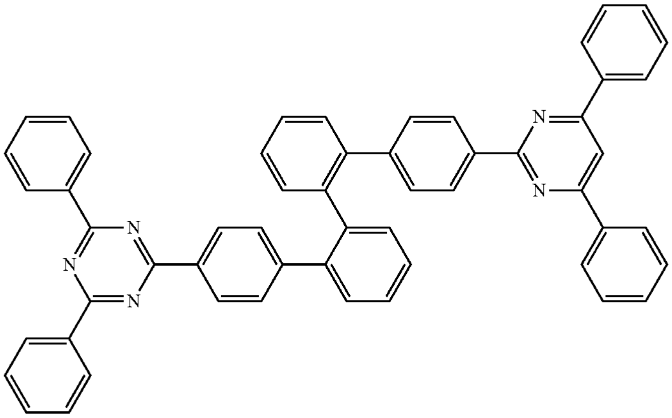
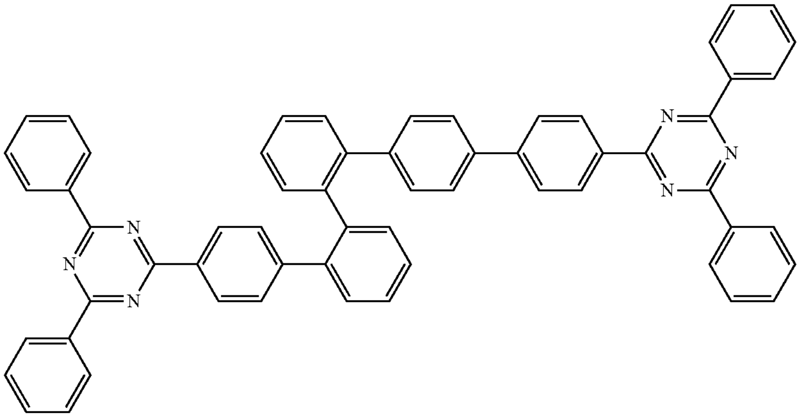
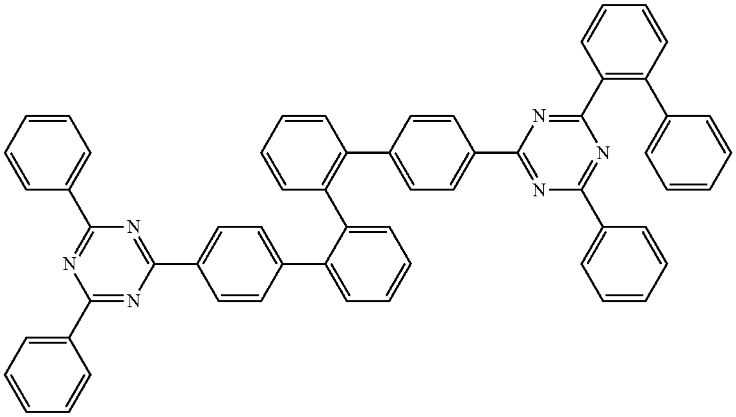
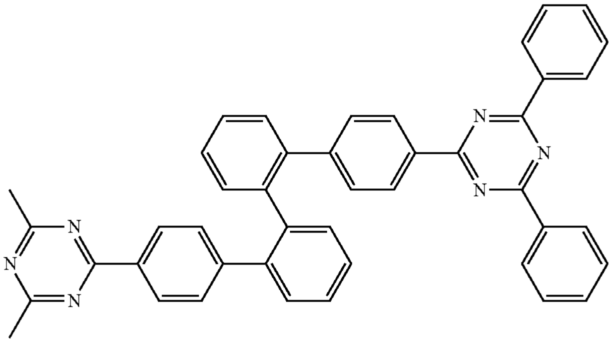

-continued
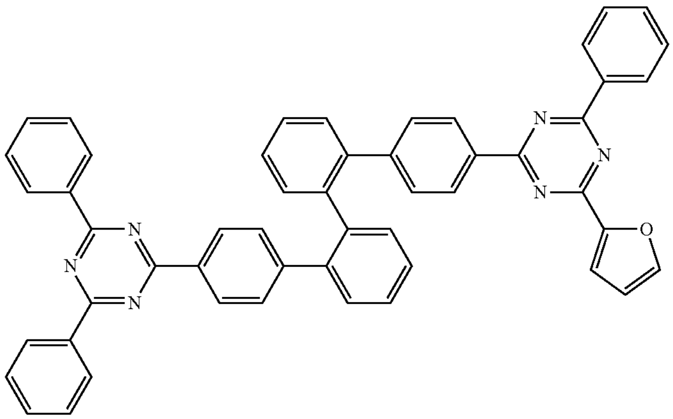
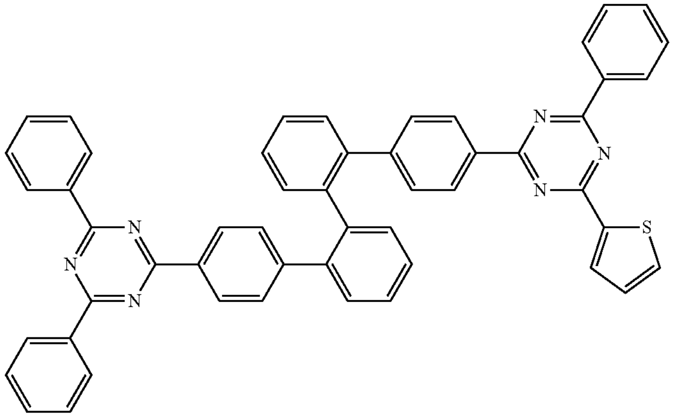
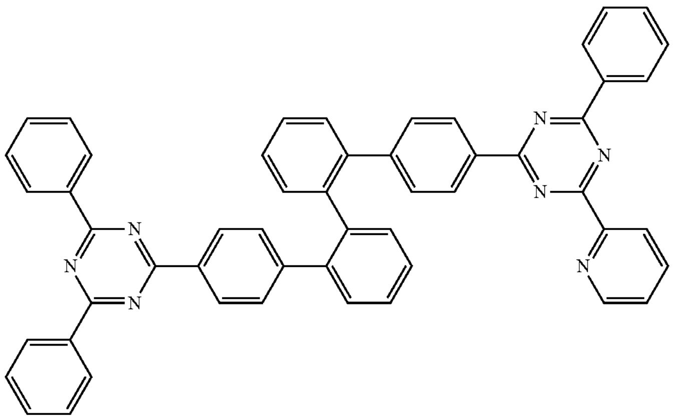
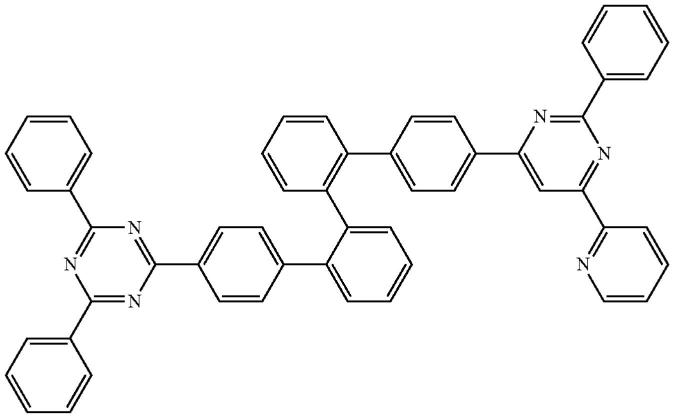

-continued
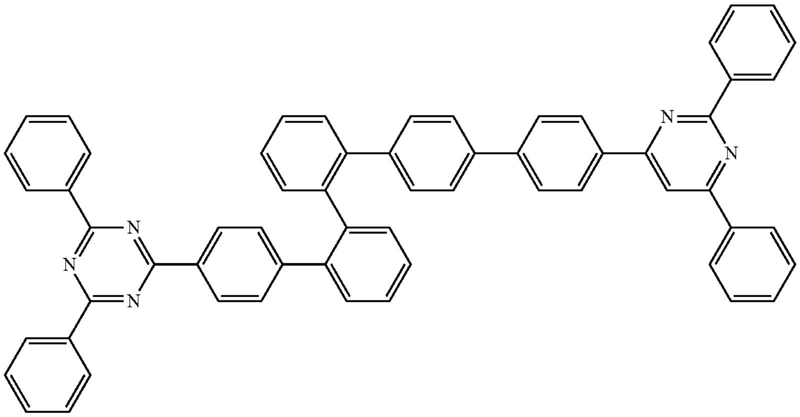
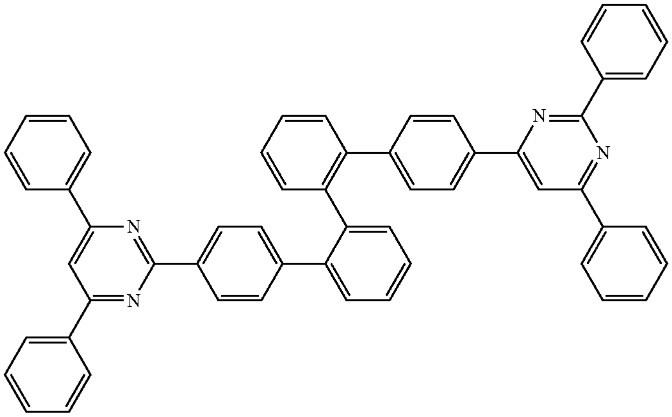
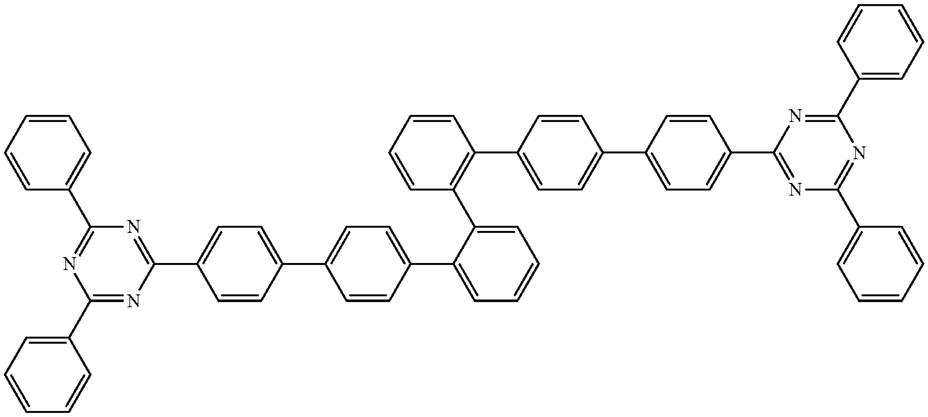
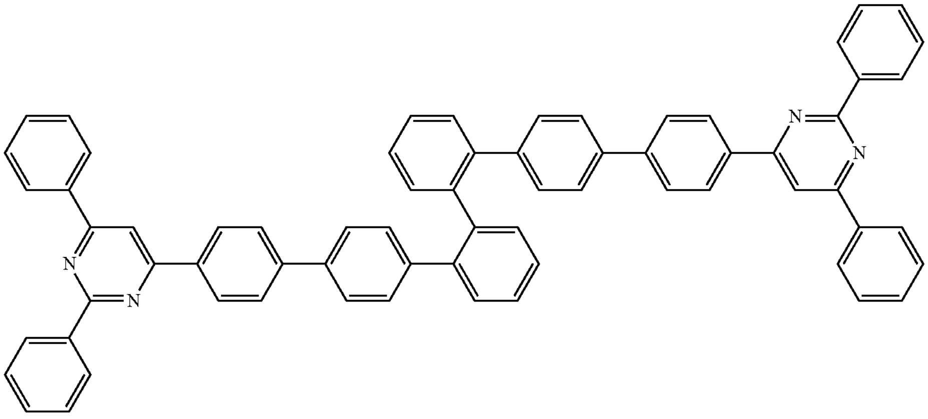

-continued
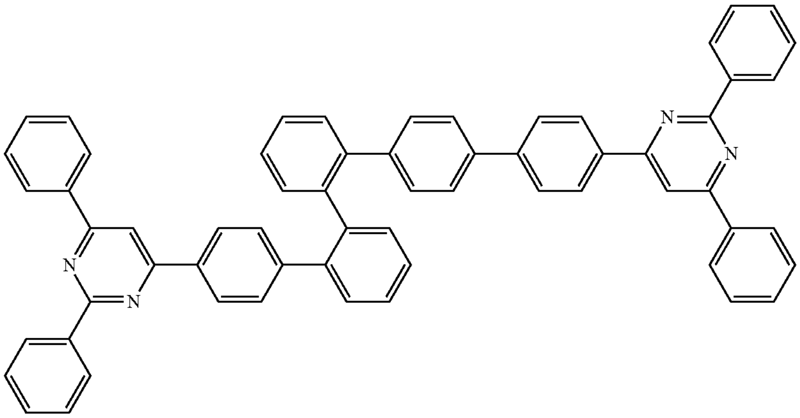
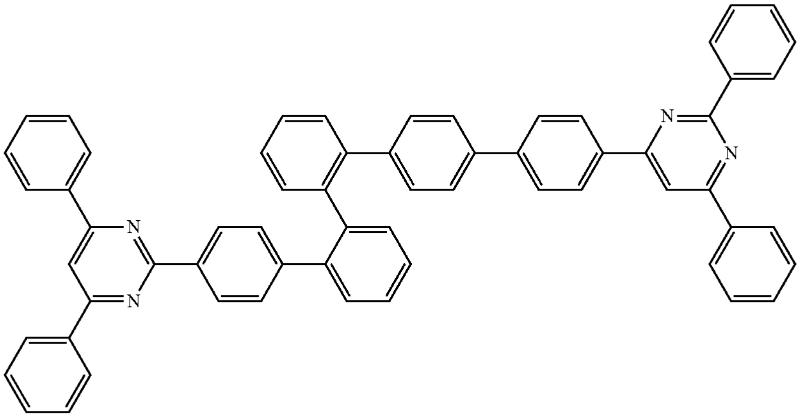
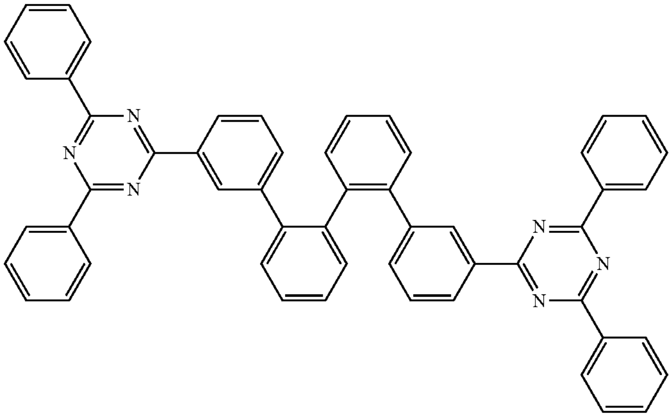
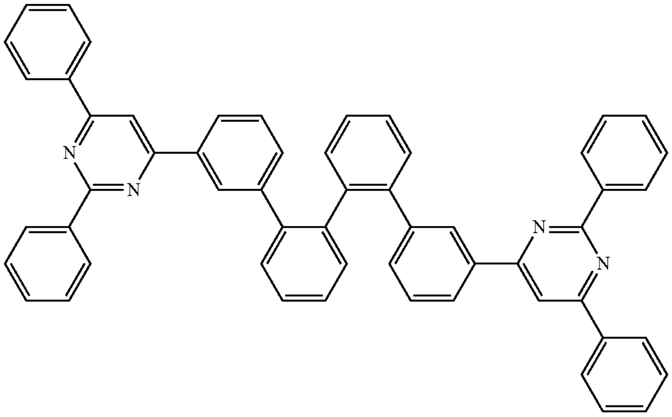

-continued
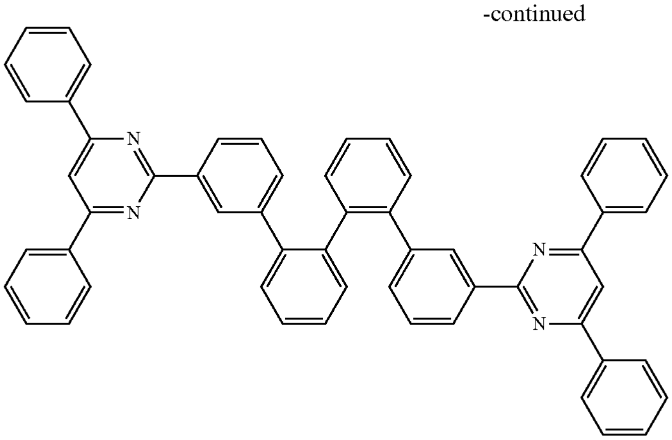
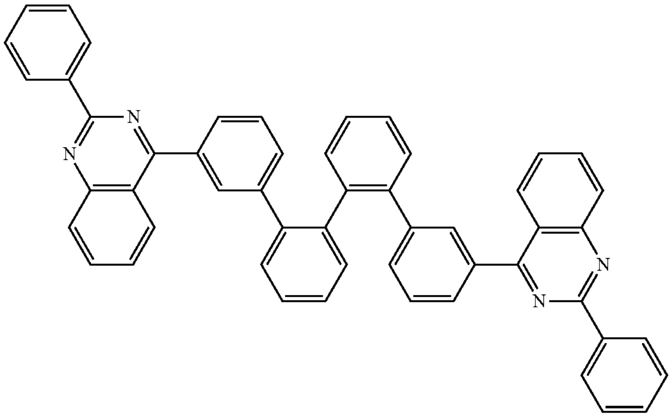
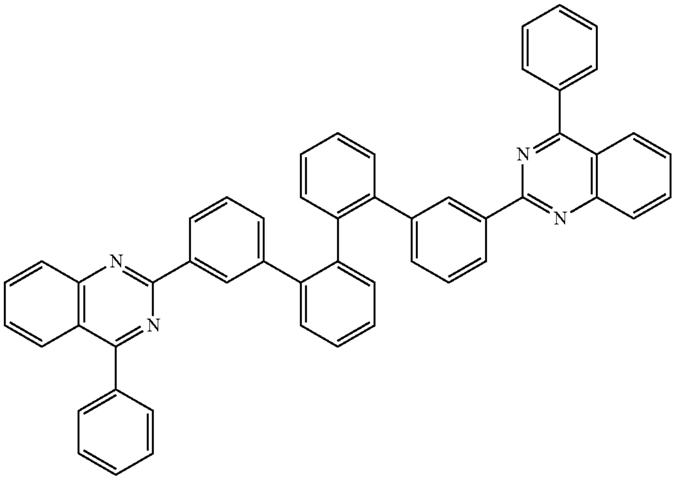
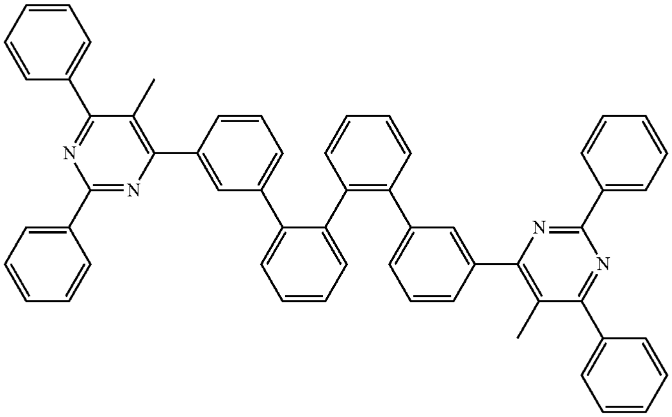

-continued
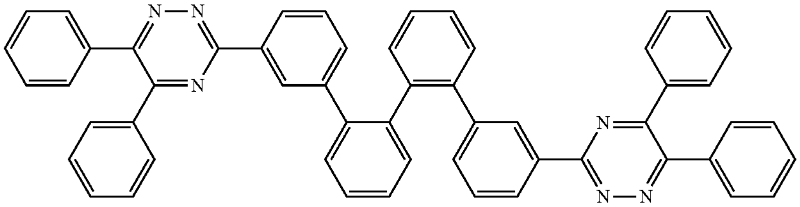
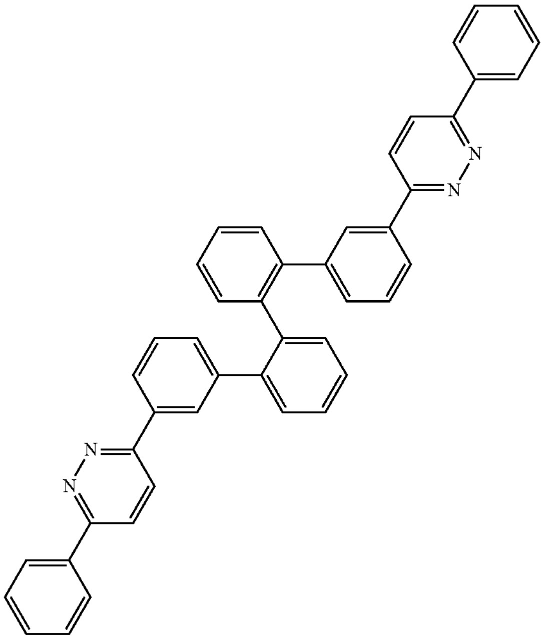
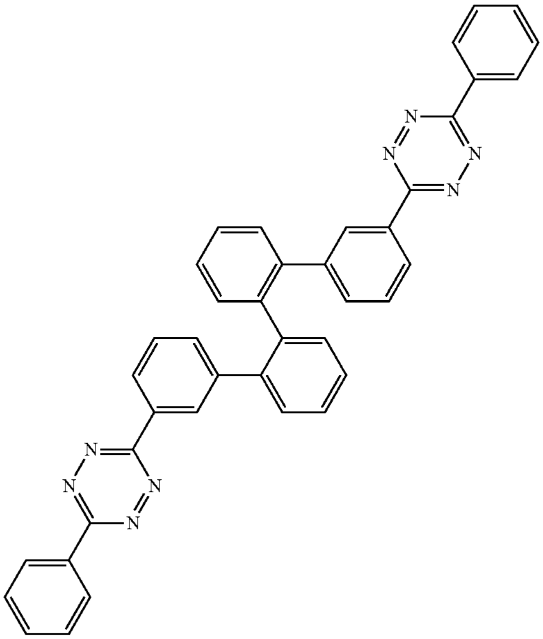
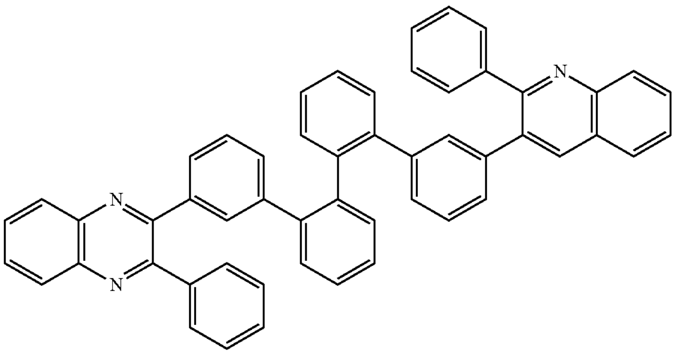

-continued
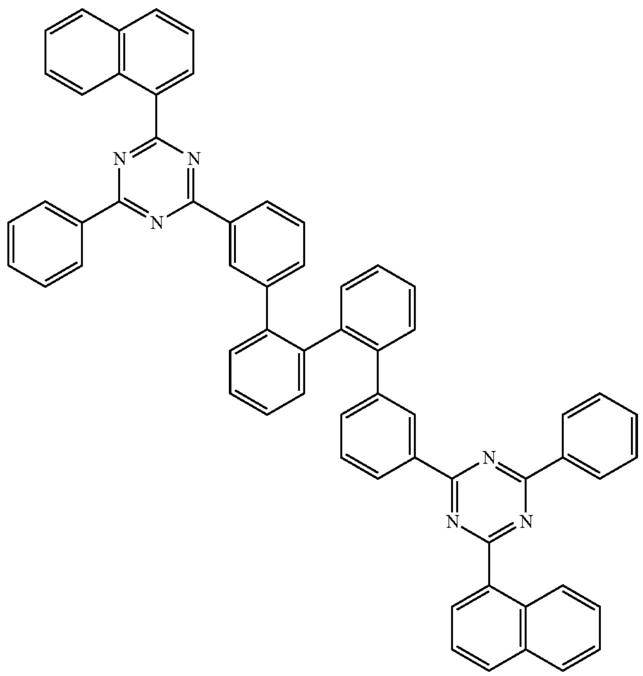
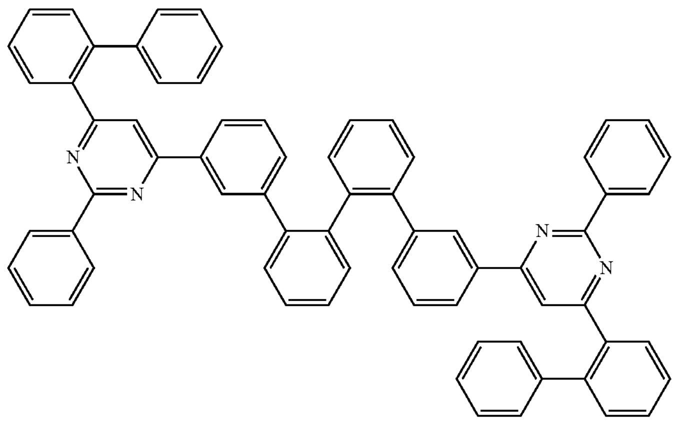
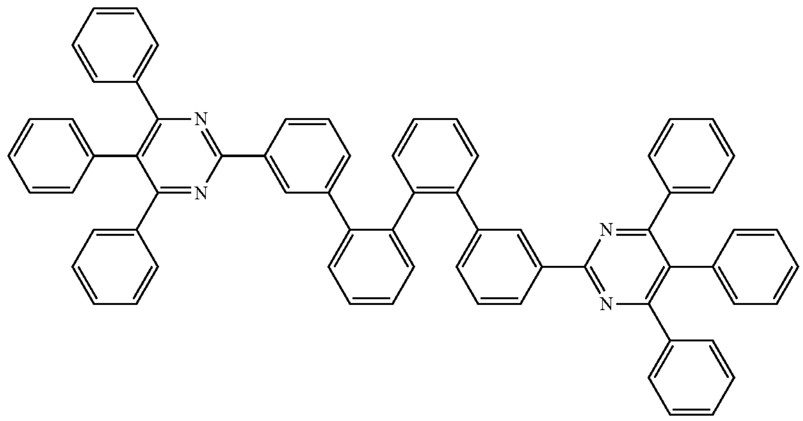

-continued
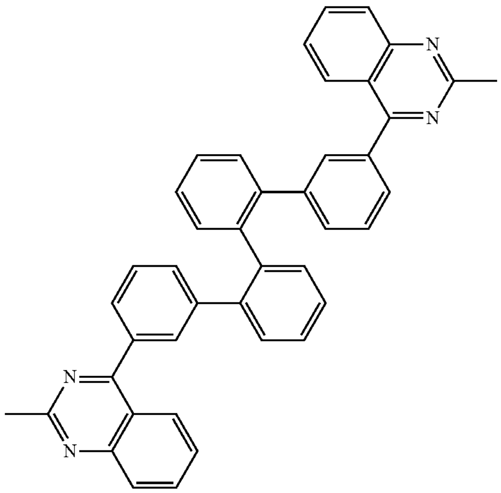
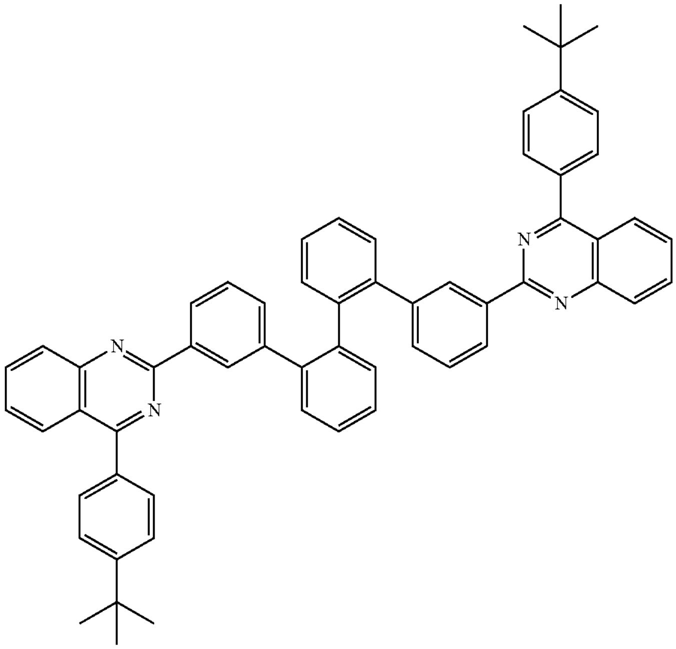
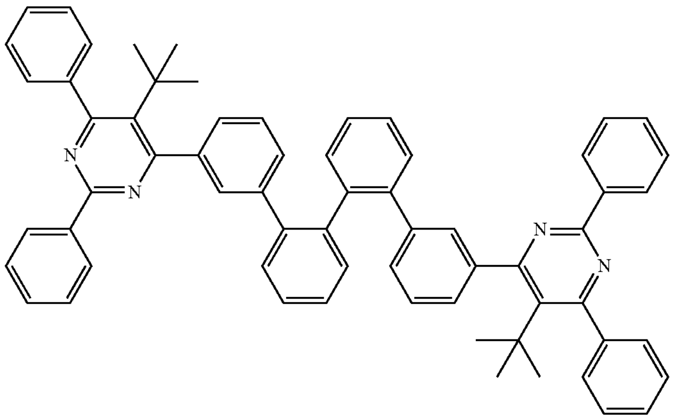

-continued
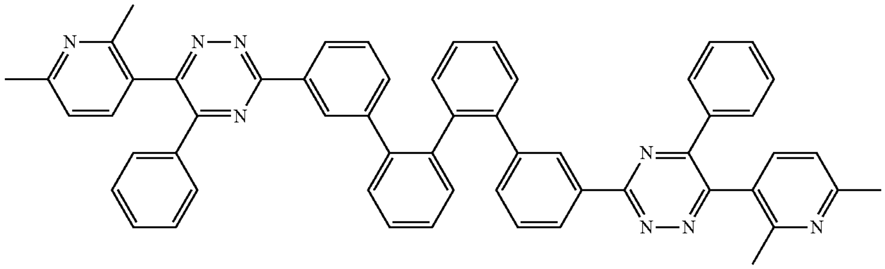
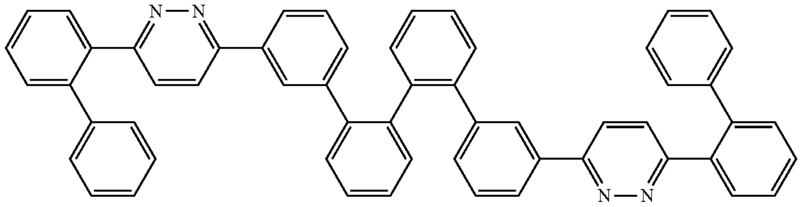
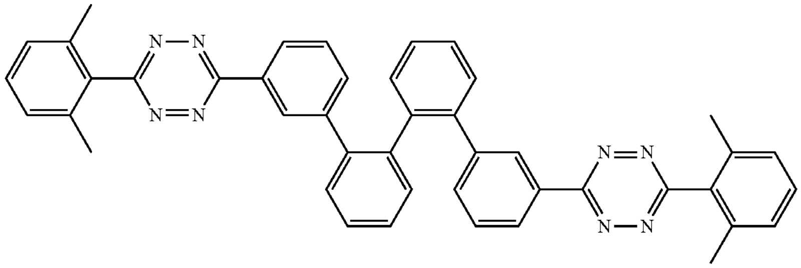
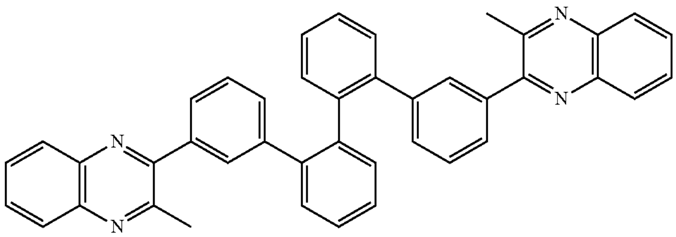
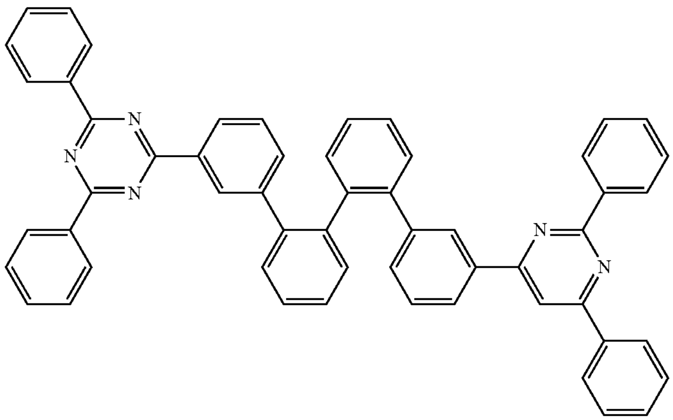

-continued
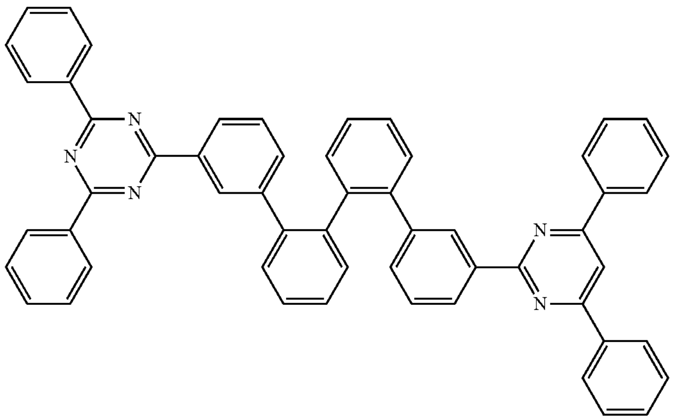
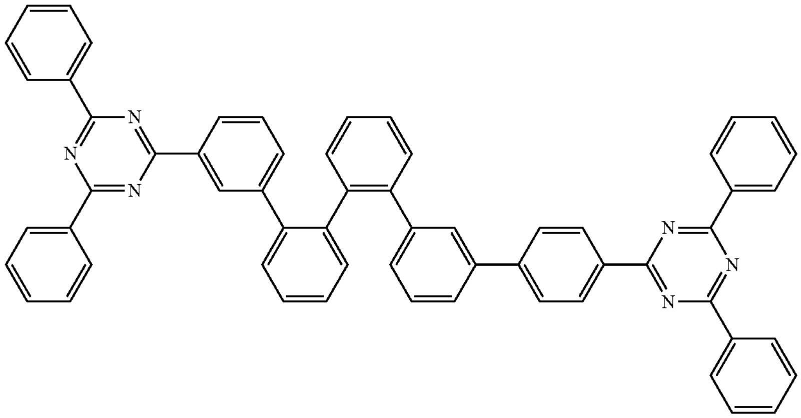
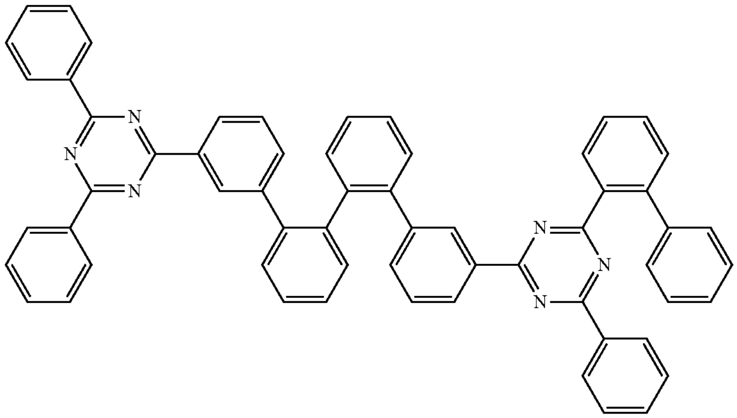

-continued
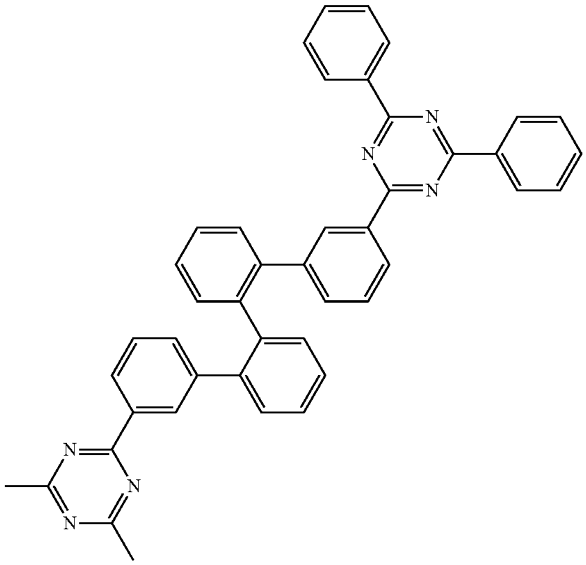
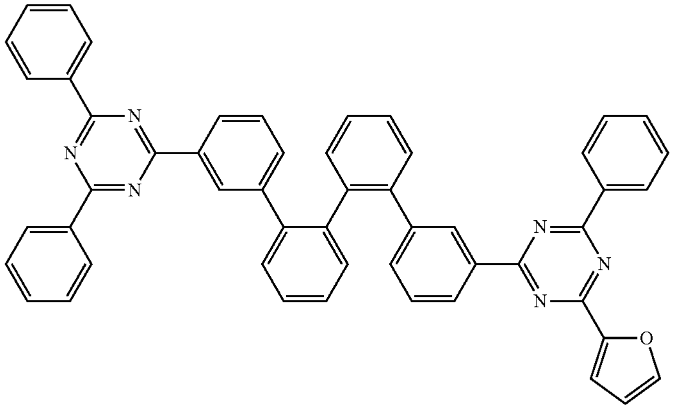
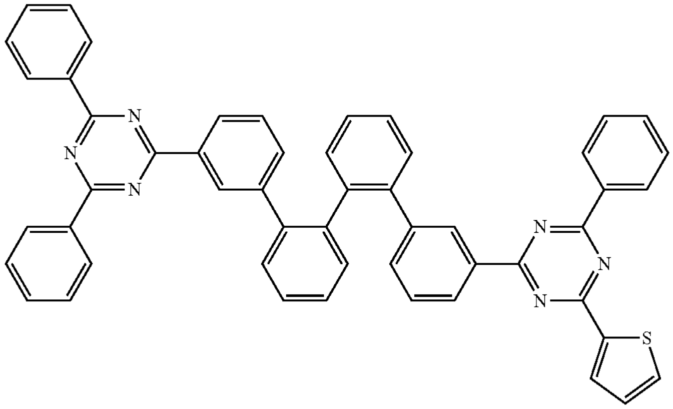

-continued
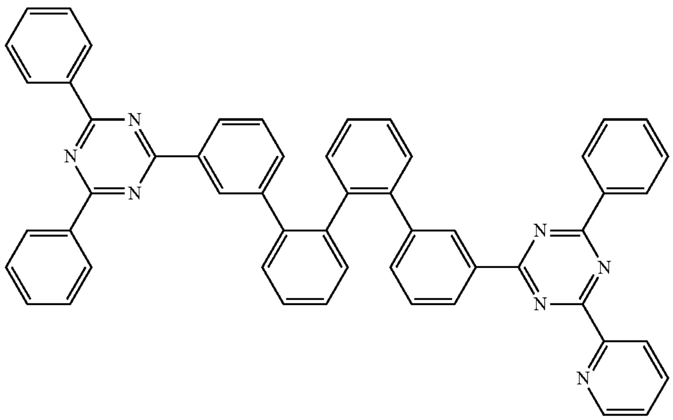
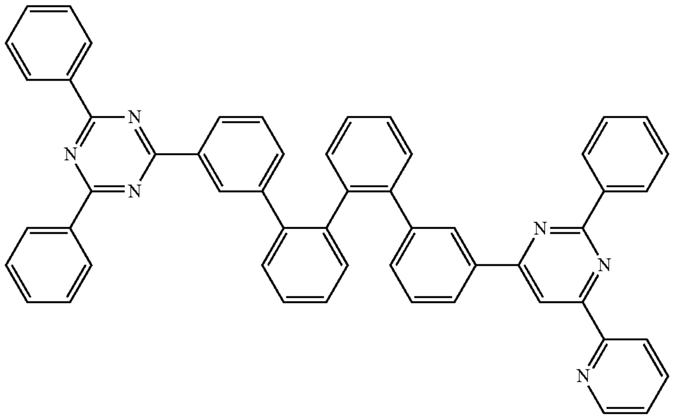
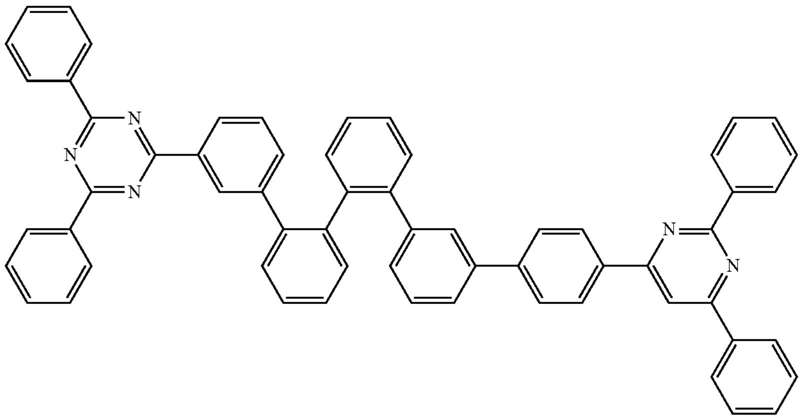
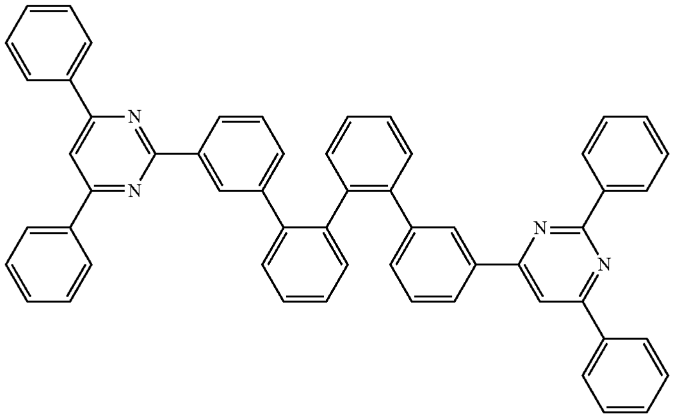

-continued
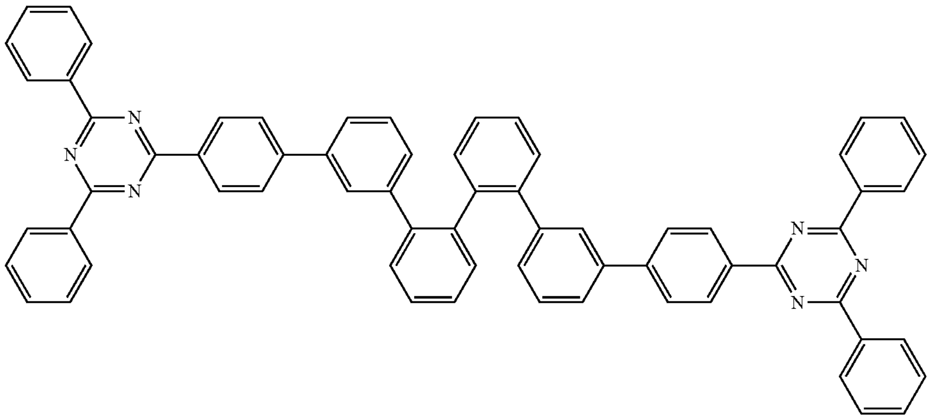
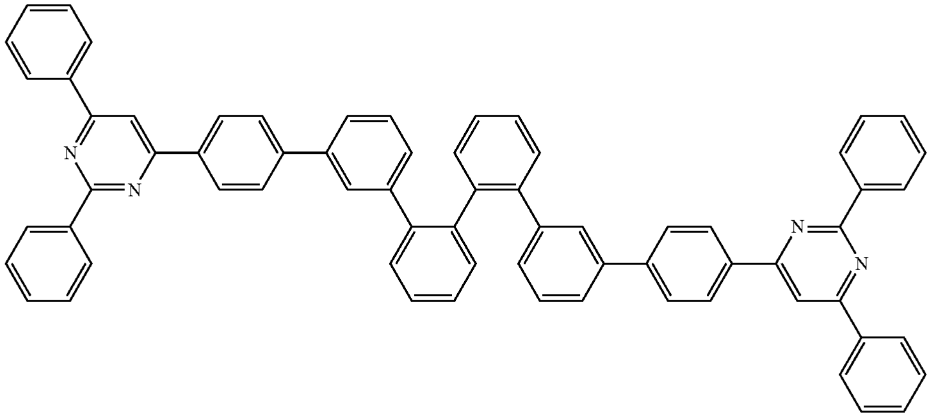
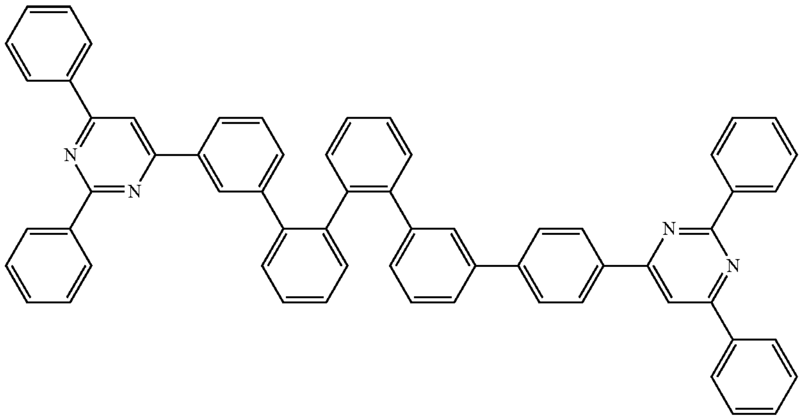
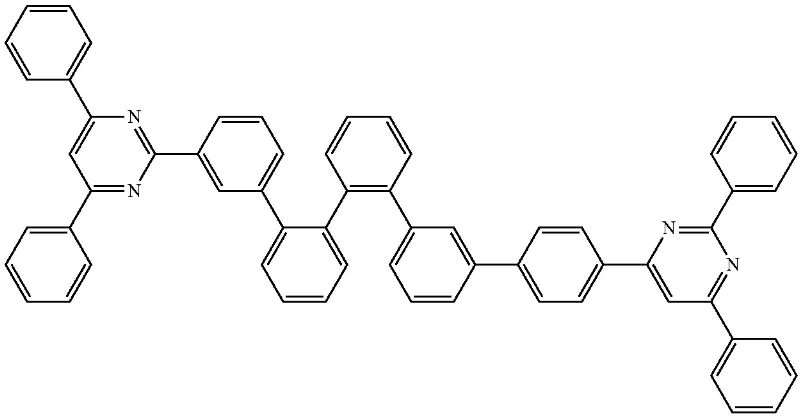

-continued
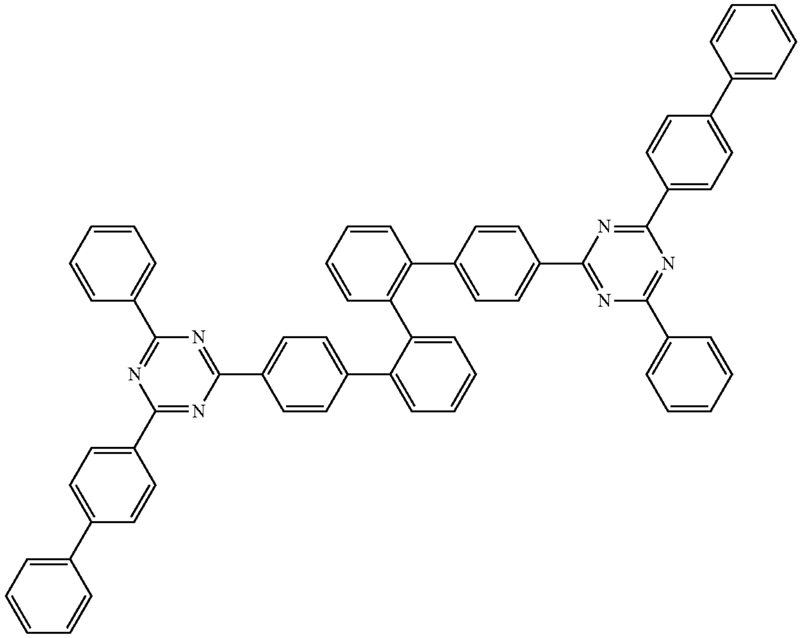
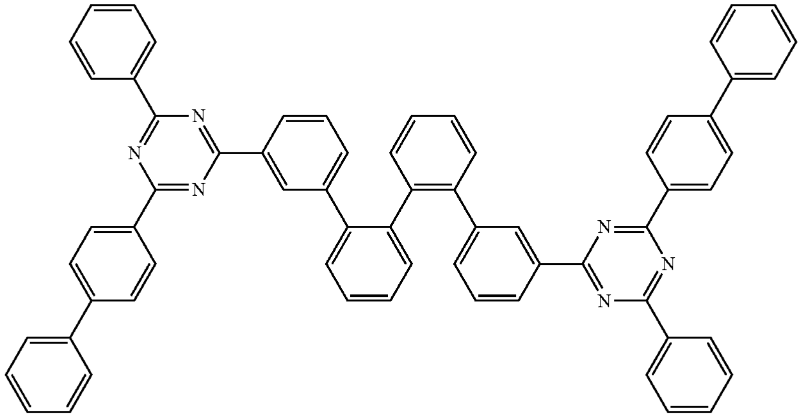
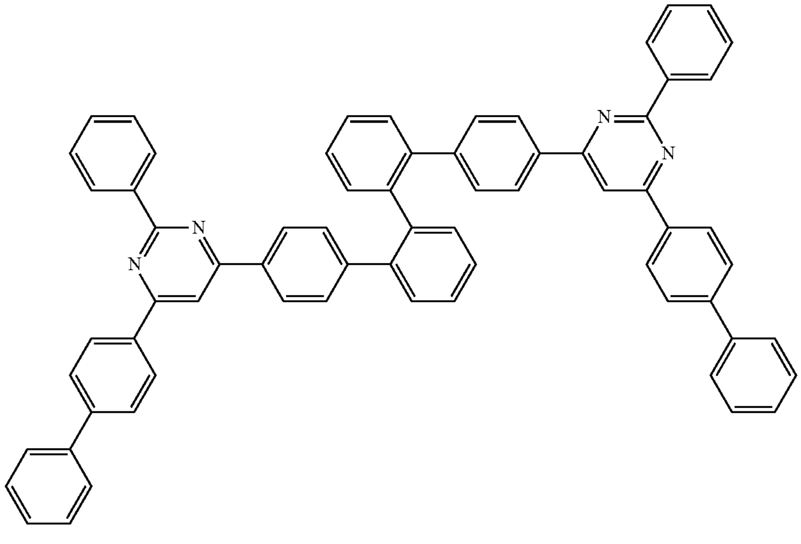

-continued
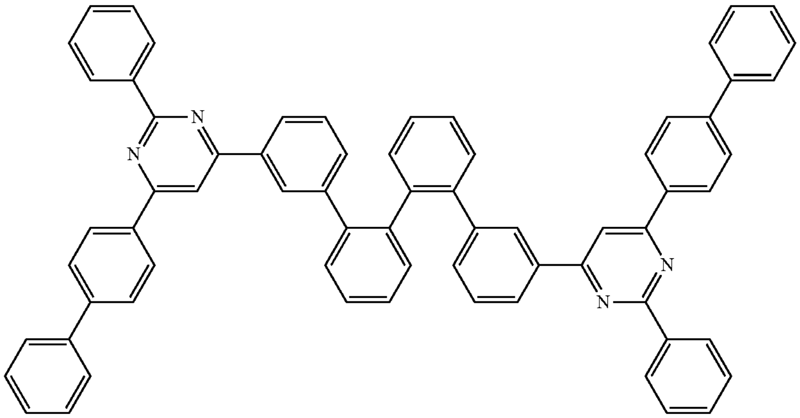
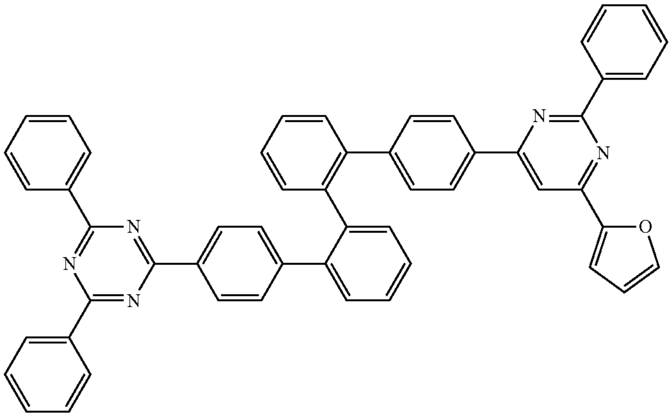
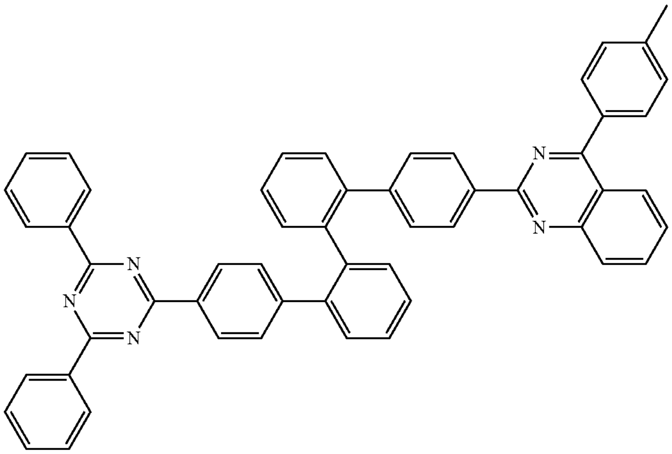
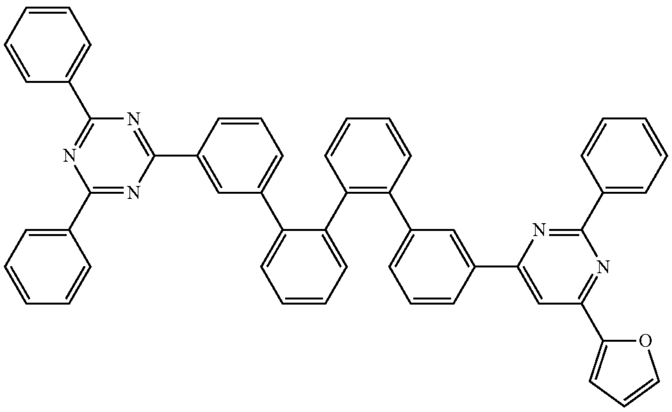

-continued
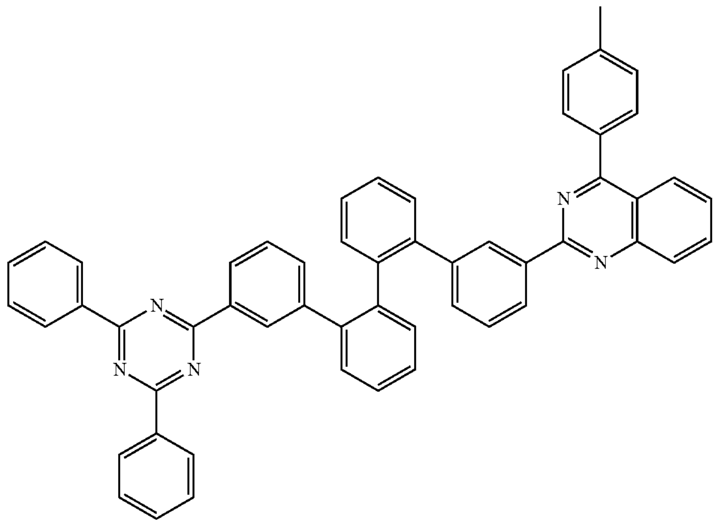
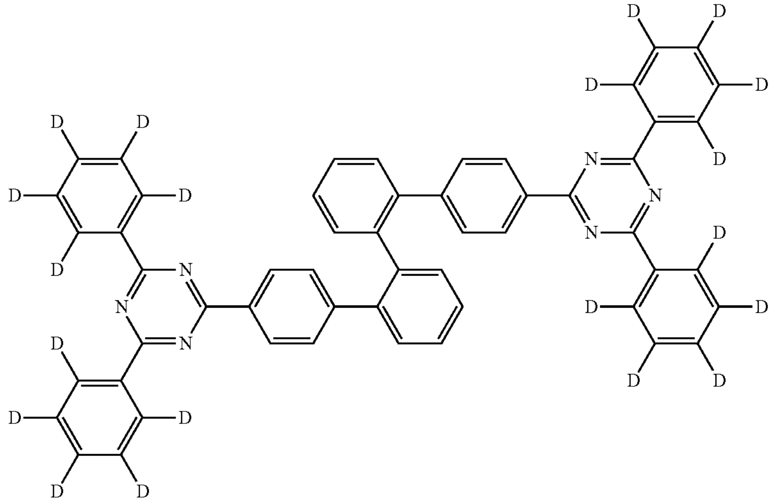
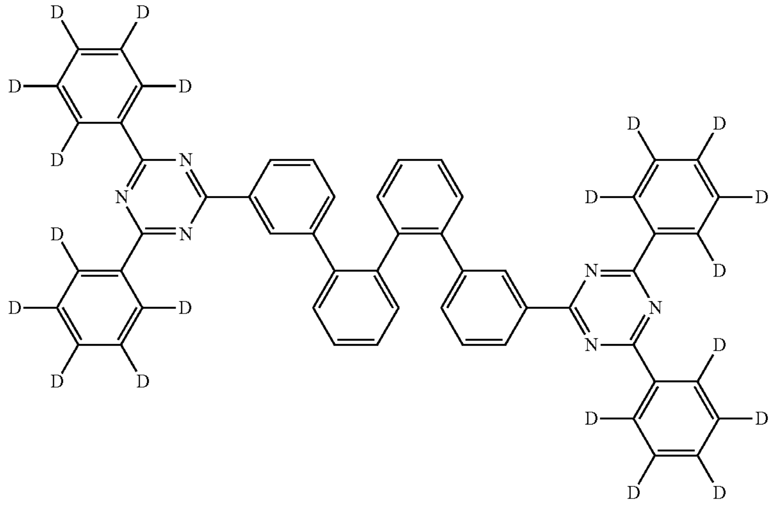

-continued
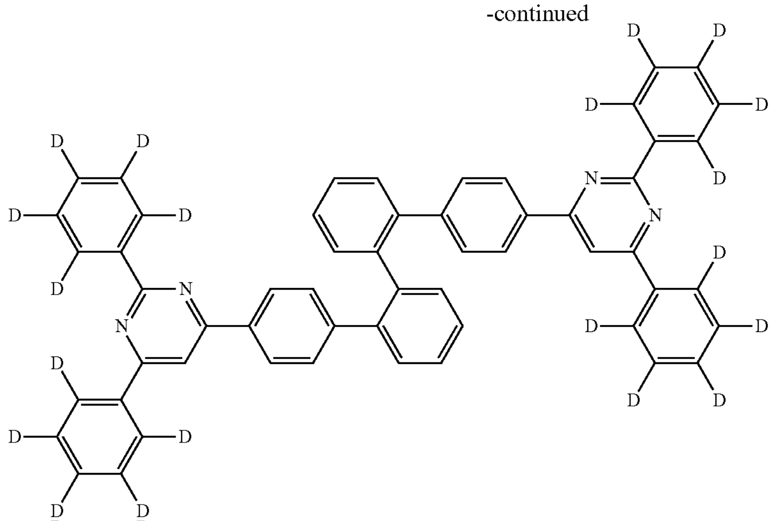
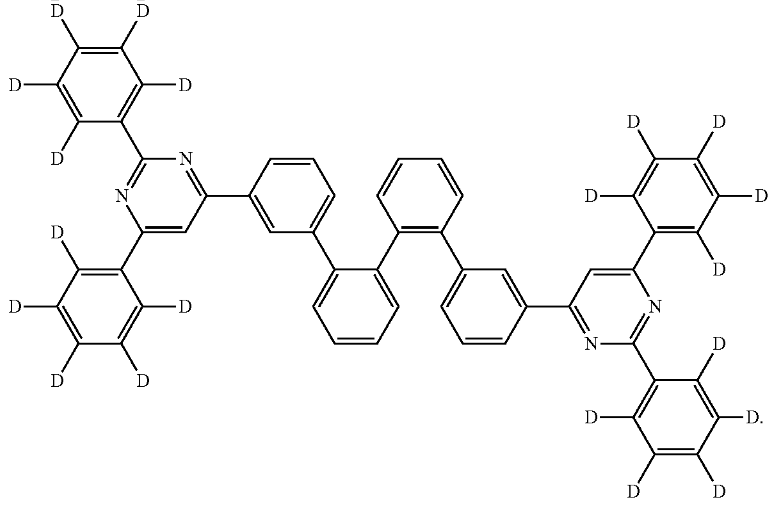
In addition, the present disclosure provides a method for preparing a compound of Chemical Formula 2 or a compound of Chemical Formula 3, as shown in Reaction Schemes 2 to 5 below.
[Reaction Scheme 2]
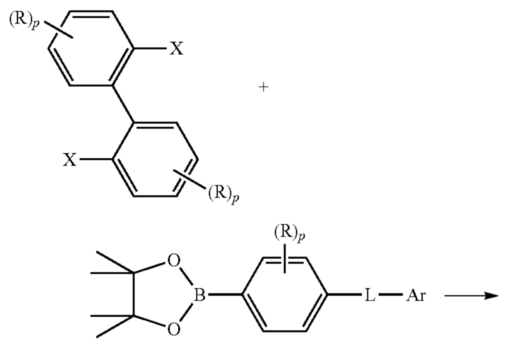
-continued
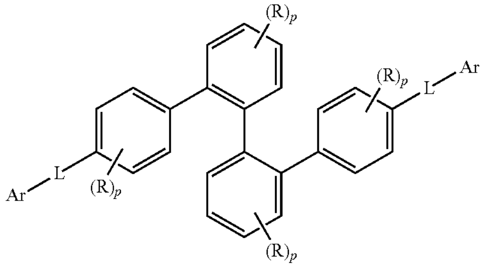
[Reaction Scheme 3]
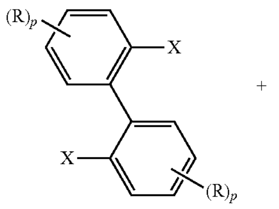

-continued

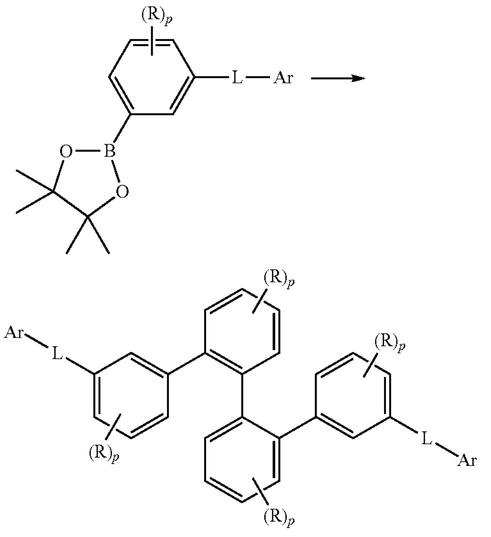

[Reaction Scheme 4]

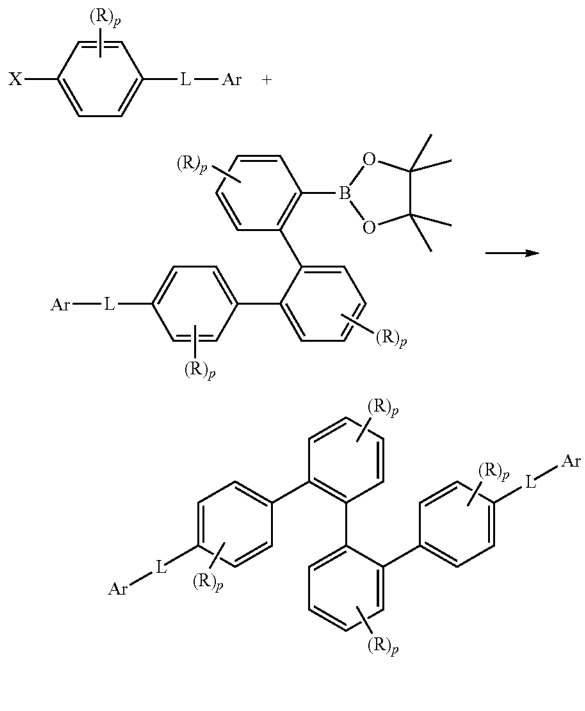

[Reaction Scheme 5]

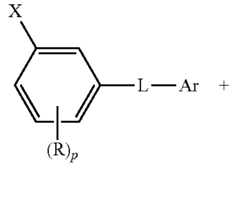

-continued

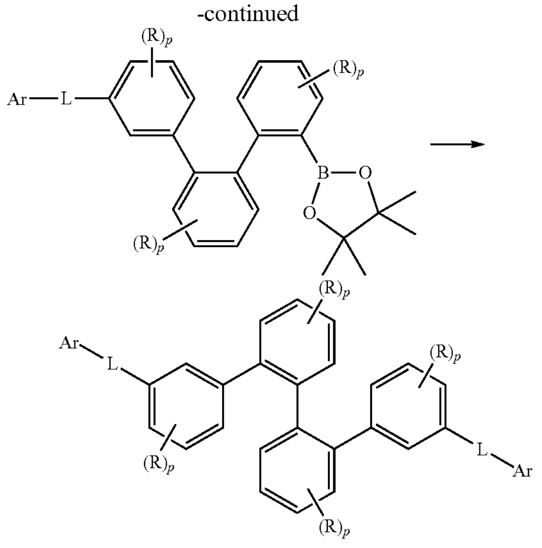

In the Reaction Schemes 2 to 5, each L is independently $L_2$ or $L_3$; each Ar is independently $Ar_2$ or $Ar_3$; each R is independently any one of $R_4$ to $R_7$; and each p is independently any one of p1 to p4. In addition, $L_2$, $L_3$, $Ar_2$, $Ar_3$, $R_4$ to $R_7$, and p1 to p4 are as defined above, and X is halogen, preferably bromo, or chloro.

In addition, the electron transport layer can further include a metal complex compound. Examples of the metal complex compound include 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato)gallium, bis(10-hydroxybenzo[h]quinolinato)-beryllium, bis(10-hydroxybenzo[h]quinolinato)zinc, bis(2-methyl-8-quinolinato)chlorogallium, bis(2-methyl-8-quinolinato)(o-cresolato)gallium, bis(2-methyl-8-quinolinato)(1-naphtholato)aluminum, bis(2-methyl-8-quinolinato)(2-naphtholato)gallium, and the like, but are not limited thereto.

In addition, the electron injection layer can further include a metal complex compound. Examples of the metal complex compound include 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato)gallium, bis(10-hydroxybenzo[h]quinolinato)-beryllium, bis(10-hydroxybenzo[h]quinolinato)zinc, bis(2-methyl-8-quinolinato)chlorogallium, bis(2-methyl-8-quinolinato)(o-cresolato)gallium, bis(2-methyl-8-quinolinato)(1-naphtholato)aluminum, bis(2-methyl-8-quinolinato)(2-naphtholato)gallium, and the like, but are not limited thereto.

Organic Light Emitting Device

A structure of the organic light emitting device according to the present disclosure is illustrated in FIG. 1. FIG. 1 shows an example of an organic light emitting device including a substrate 1, an anode 2, a hole transport layer 3, a light emitting layer 4, an electron transport and injection layer 5, and a cathode 6.

In addition, FIG. 2 shows an example of an organic light emitting device including a substrate 1, an anode 2, a hole injection layer 7, a hole transport layer 3, an electron blocking layer 8, a light emitting layer 4, a hole blocking layer 9, an electron transport and injection layer 5, and a cathode 6.

The organic light emitting device according to the present disclosure can be manufactured by sequentially laminating the above-described components. In this case, the organic light emitting device can be manufactured by depositing a metal, metal oxides having conductivity, or an alloy thereof on the substrate using a PVD (physical vapor deposition) method such as a sputtering method or an e-beam evaporation method to form an anode, forming the above-mentioned respective layers thereon, and then depositing a material that can be used as the cathode thereon. In addition to such a method, the organic light emitting device can be manufactured by sequentially depositing the above-described components from a cathode material to an anode material in the reverse order on a substrate (WO 2003/012890). Further, the light emitting layer can be formed using the host and the dopant by a solution coating method as well as a vacuum deposition method. Herein, the solution coating method means a spin coating, a dip coating, a doctor blading, an inkjet printing, a screen printing, a spray method, a roll coating, or the like, but is not limited thereto.

The organic light emitting device according to the present disclosure can be a front side emission type, a backside emission type, or a double-sided emission type according to the used material.

Hereinafter, preferred examples are presented to help the understanding of the present invention. However, these examples are presented for illustrative purposes only, and are not intended to limit the scope of the present disclosure.

PREPARATION EXAMPLES

Preparation Example 1-1: Preparation of Compound B1

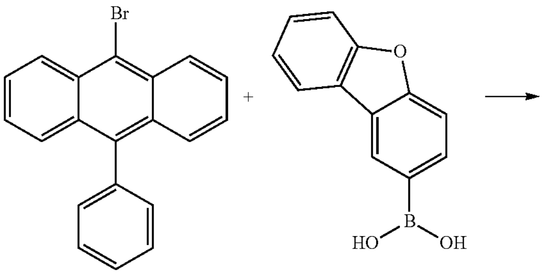

B1-A B1-B

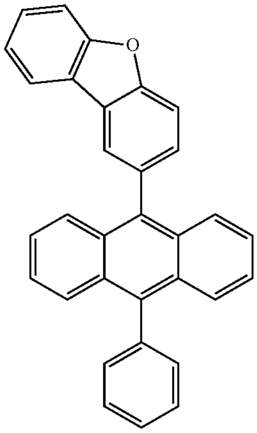

B1

B1-A (20 g, 60 mmol) and B1-B (12.7 g, 60 mmol) were added to tetrahydrofuran (400 ml) under a nitrogen atmosphere, and the mixture was stirred and refluxed. Then, potassium carbonate (24.9 g, 180.1 mmol) was dissolved in water (25 ml), and then added thereto. Thereafter, it was stirred sufficiently, followed by adding tetrakistriphenylphosphinopalladium (2.1 g, 1.8 mmol). After 1 hour of reaction, cooling was performed to room temperature. Then, the organic layer was separated from the water layer, and then the organic layer was distilled. Then, this was dissolved again in chloroform (20 times, 505 mL), and washed twice with water. Thereafter, the organic layer was separated, treated with anhydrous magnesium sulfate, stirred, then filtered, and the filtrate was distilled under reduced pressure. The concentrated compound was recrystallized with chloroform and ethyl acetate to prepare Compound B1 in the form of solid (12.6 g, 50%).

MS: $[M+H]^+=421$

Preparation Example 1-2: Preparation of Compound B2

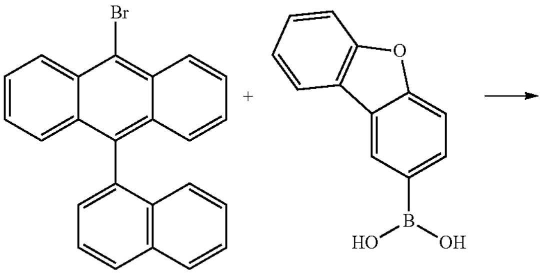

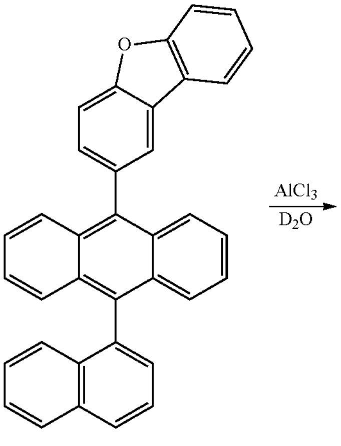

B2-A

-continued

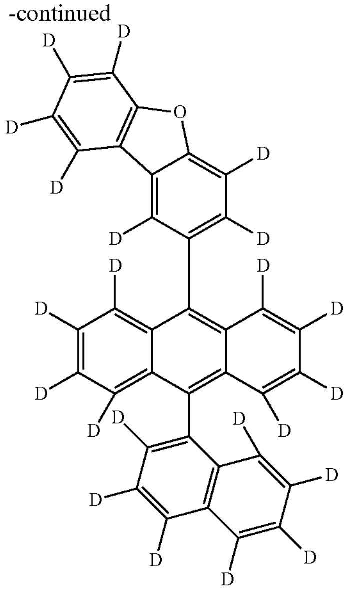

B2

Compound B2-A was prepared in the same manner as in Preparation Example 1-1, except that each starting material was used as in the above reaction scheme (MS: $[M+H]^+$ =471).

Structural Formula B2-A (40.9 g, 86.9 mmol) and $AlCl_3$ (0.5 g) were added to $C_6D_6$ (400 ml) and stirred for 2 hours. After completion of the reaction, $D_2O$ (60 ml) was added, and stirred for 30 minutes, followed by adding trimethylamine (6 ml) dropwise. The reaction solution was transferred to a separatory funnel, and extracted with water and toluene. The extract was dried with anhydrous magnesium sulfate ($MgSO_4$) and recrystallized with ethyl acetate to obtain Structural Formula B2 (21.4 g, 50%).

MS: $[M+H]^+$=493

Preparation Example 1-3: Preparation of Compound B3

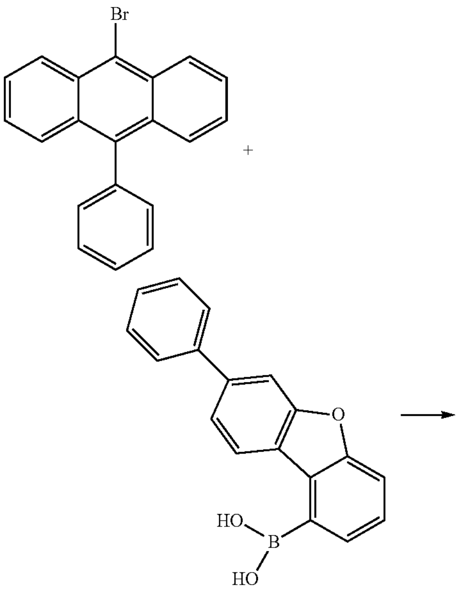

-continued

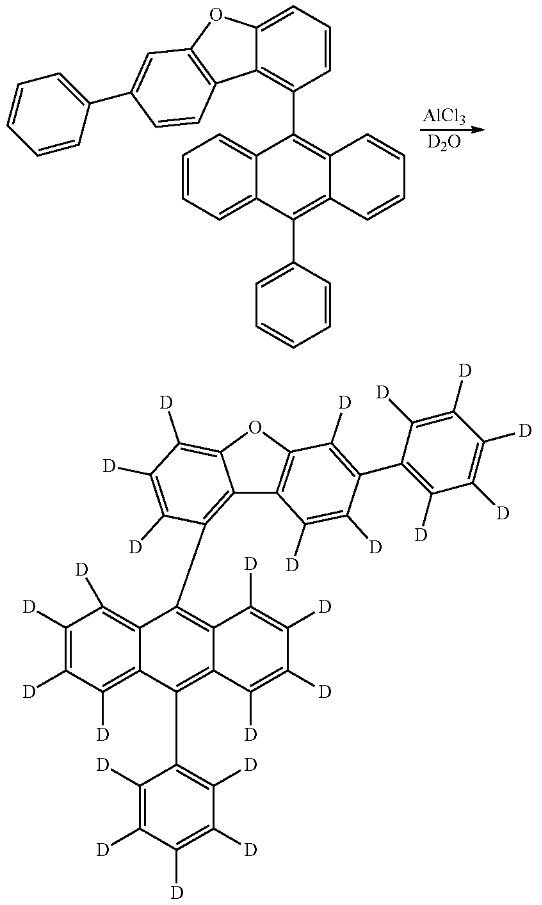

B3

Compound B3 was prepared in the same manner as in Preparation Example 1-2, except that each starting material was used as in the above reaction scheme.

MS: $[M+H]^+$=521

Preparation Example 1-4: Preparation of Compound B4

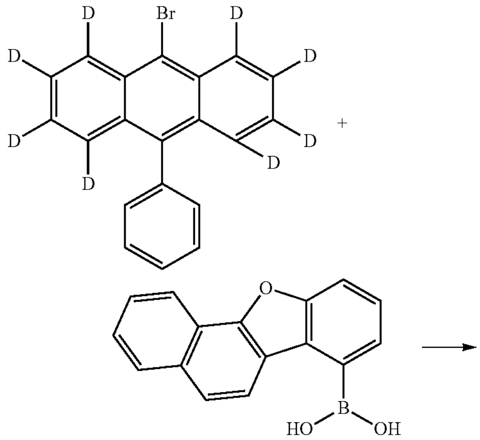

-continued

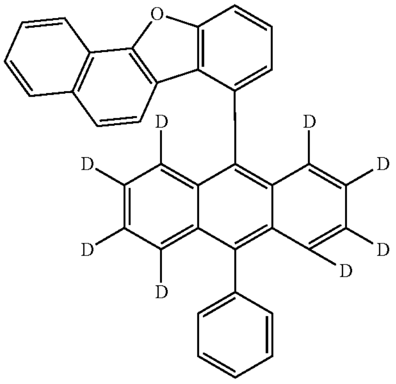

B4

Compound B4 was prepared in the same manner as in Preparation Example 1-1, except that each starting material was used as in the above reaction scheme.

MS: $[M+H]^+$=479

Preparation Example 1-5: Preparation of Compound B5

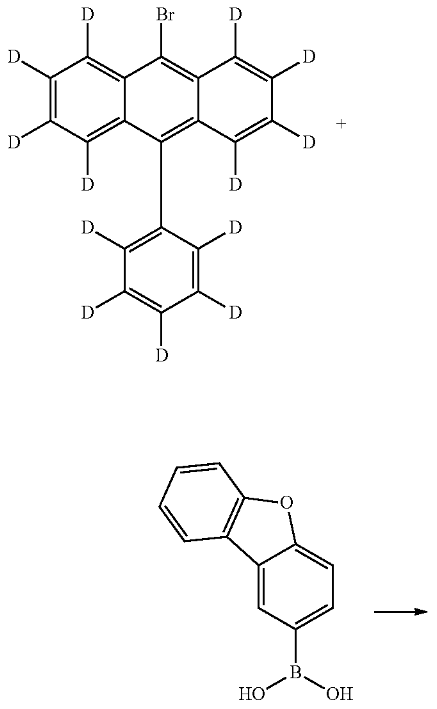

-continued

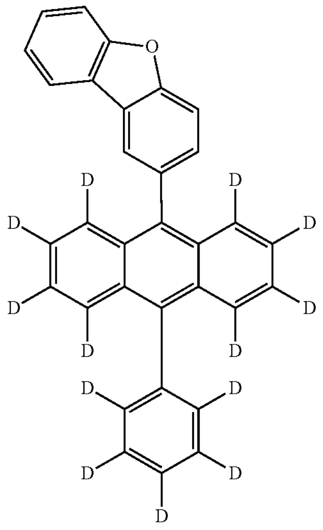

B5

Compound B5 was prepared in the same manner as in Preparation Example 1-1, except that each starting material was used as in the above reaction scheme.

MS: $[M+H]^+$=434

Preparation Example 2-1: Preparation of Compound E1

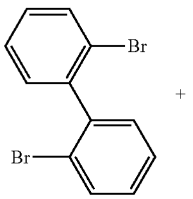

E1-A

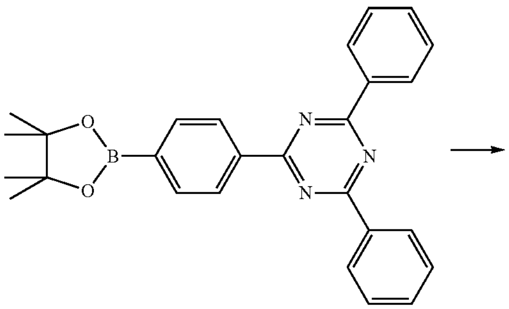

E1-B

-continued

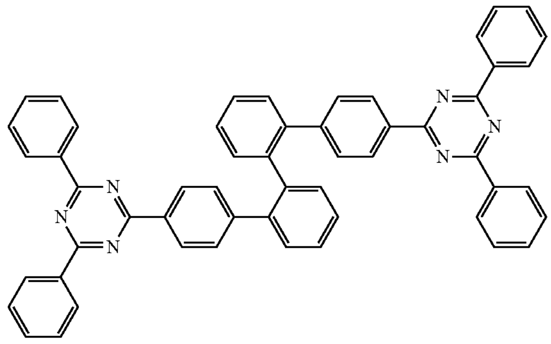

E1

E1-A (20 g, 64.1 mmol) and E1-B (55.8 g, 128.2 mmol) were added to tetrahydrofuran (400 ml) under a nitrogen atmosphere, and the mixture was stirred and refluxed. Then, potassium carbonate (26.6 g, 192.3 mmol) was dissolved in water (27 ml), and then added thereto. Thereafter, it was stirred sufficiently, followed by adding tetrakistriphenyl-phosphinopalladium (2.2 g, 1.9 mmol). After 1 hour of reaction, cooling was performed to room temperature. Then, the organic layer was separated from the water layer, and then the organic layer was distilled. Then, this was dissolved again in chloroform (20 times, 986 mL), and washed twice with water. Thereafter, the organic layer was separated, treated with anhydrous magnesium sulfate, stirred, then filtered, and the filtrate was distilled under reduced pressure. The concentrated compound was recrystallized with chloroform and ethyl acetate to prepare Compound E1 in the form of white solid (32.5 g, 66%).

MS: $[M+H]^+=769$

Preparation Example 2-2: Preparation of Compound E2

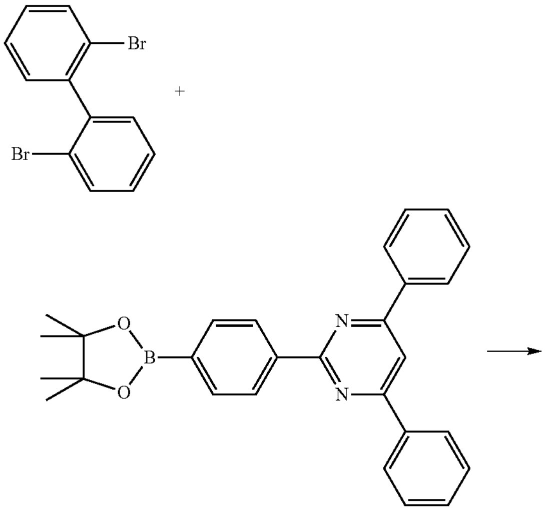

-continued

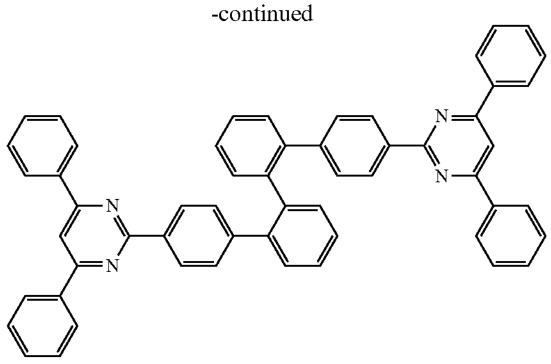

E2

Compound E2 was prepared in the same manner as in Preparation Example 2-1, except that each starting material was used as in the above reaction scheme.

MS: $[M+H]^+=767$

Preparation Example 2-3: Preparation of Compound E3

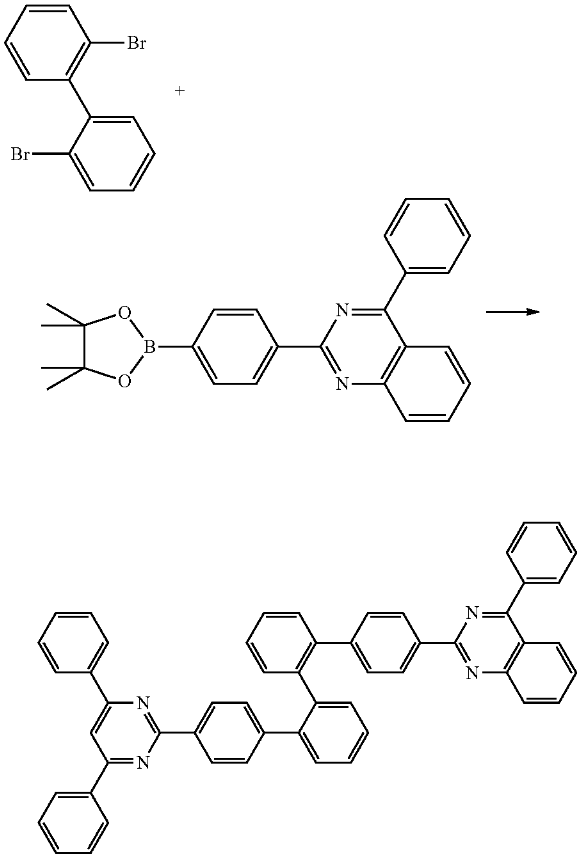

E3

Compound E3 was prepared in the same manner as in Preparation Example 2-1, except that each starting material was used as in the above reaction scheme.

MS: $[M+H]^+=715$

Preparation Example 2-4: Preparation of Compound E4

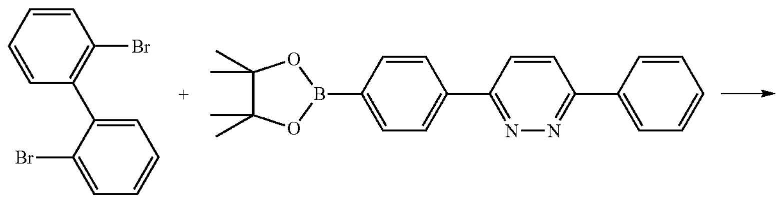

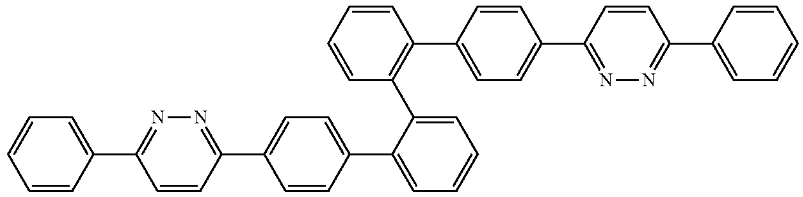

E4

Compound E4 was prepared in the same manner as in Preparation Example 2-1, except that each starting material was used as in the above reaction scheme.

MS: $[M+H]^+$=615

Preparation Example 2-5: Preparation of Compound E5

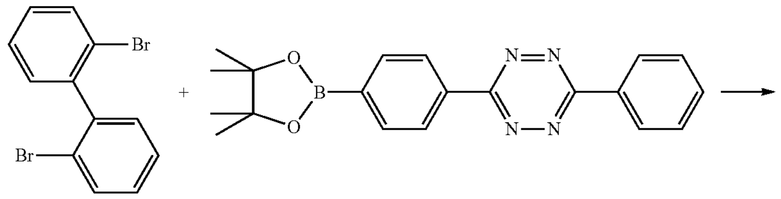

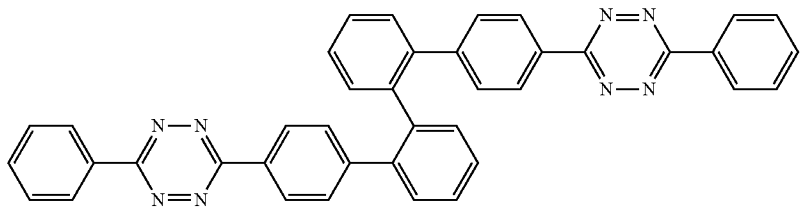

E5

Compound E5 was prepared in the same manner as in Preparation Example 2-1, except that each starting material was used as in the above reaction scheme.

MS: $[M+H]^+$=619

Preparation Example 2-6: Preparation of Compound E6

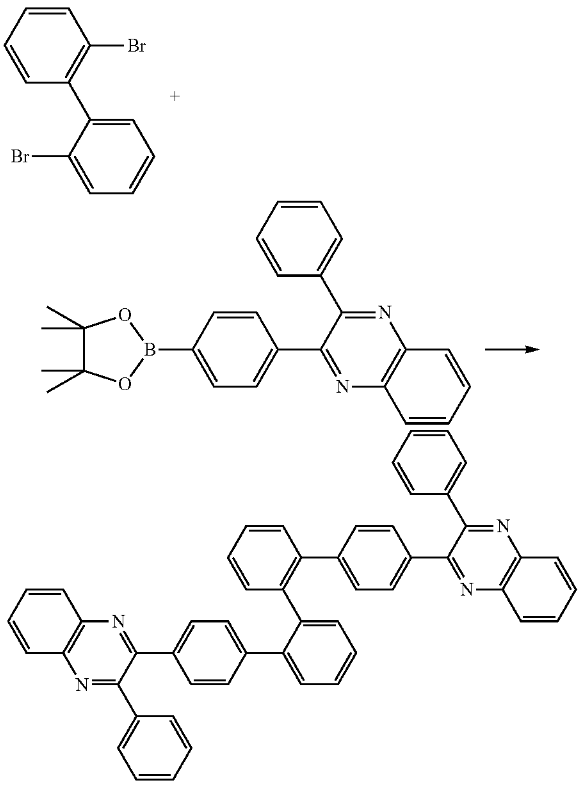

E6

Compound E6 was prepared in the same manner as in Preparation Example 2-1, except that each starting material was used as in the above reaction scheme.

MS: [M+H]+=715

Preparation Example 2-7: Preparation of Compound E7

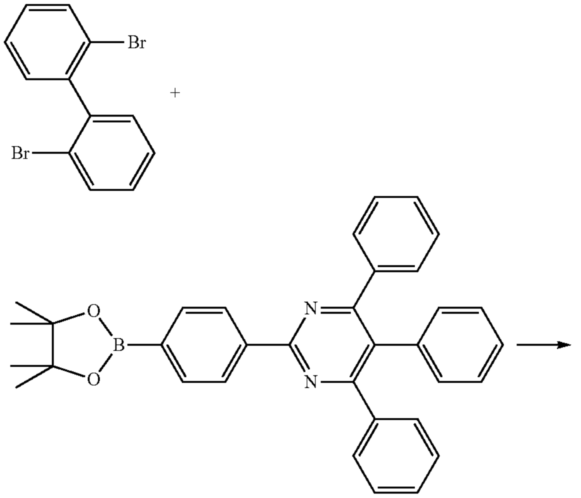

-continued

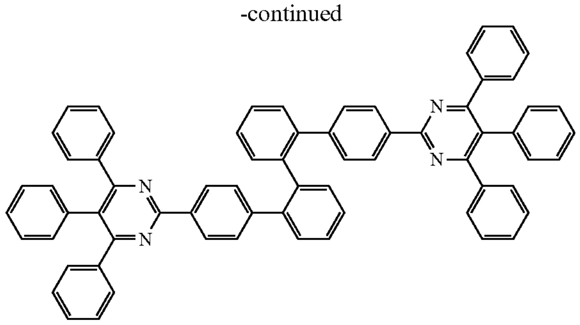

E7

Compound E7 was prepared in the same manner as in Preparation Example 2-1, except that each starting material was used as in the above reaction scheme.

MS: [M+H]+=919

Preparation Example 2-8: Preparation of Compound E8

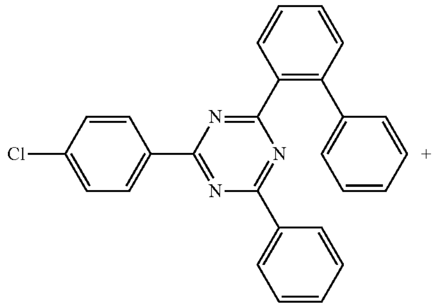

E8-A

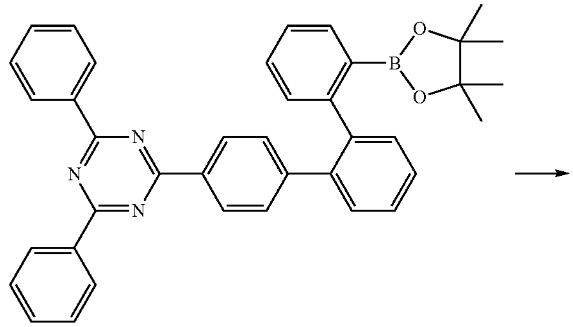

E8-B

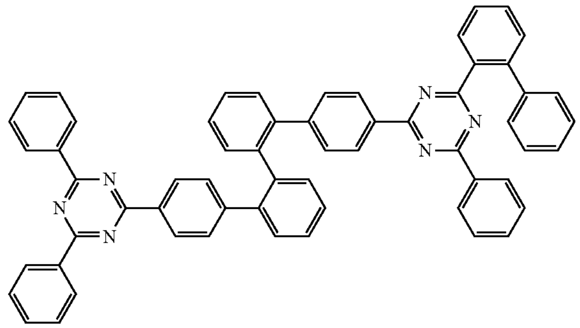

E8

E8-A (20 g, 47.6 mmol) and E8-B (28 g, 47.6 mmol) were added to 1,4-dioxane (400 ml) under a nitrogen atmosphere, and the mixture was stirred and refluxed. Then, tripotassium phosphate (30.3 g, 142.9 mmol) was dissolved in water (30 ml), and then added thereto. Thereafter, it was stirred sufficiently, followed by adding dibenzylideneacetonepalladium (0.8 g, 1.4 mmol) and tricyclohexylphosphine (0.8 g, 2.9 mmol). After 5 hours of reaction, cooling was performed to room temperature, and the resulting solid was filtered. The resulting solid was dissolved again in chloroform (30 times, 1207 mL), and washed twice with water. Thereafter, the organic layer was separated, treated with anhydrous magnesium sulfate, stirred, then filtered, and the filtrate was distilled under reduced pressure. The concentrated compound was recrystallized with chloroform and ethyl acetate to prepare Compound E8 in the form of white solid (6 g, 15%).

MS: $[M+H]^+=845$

Preparation Example 2-9: Preparation of Compound E9

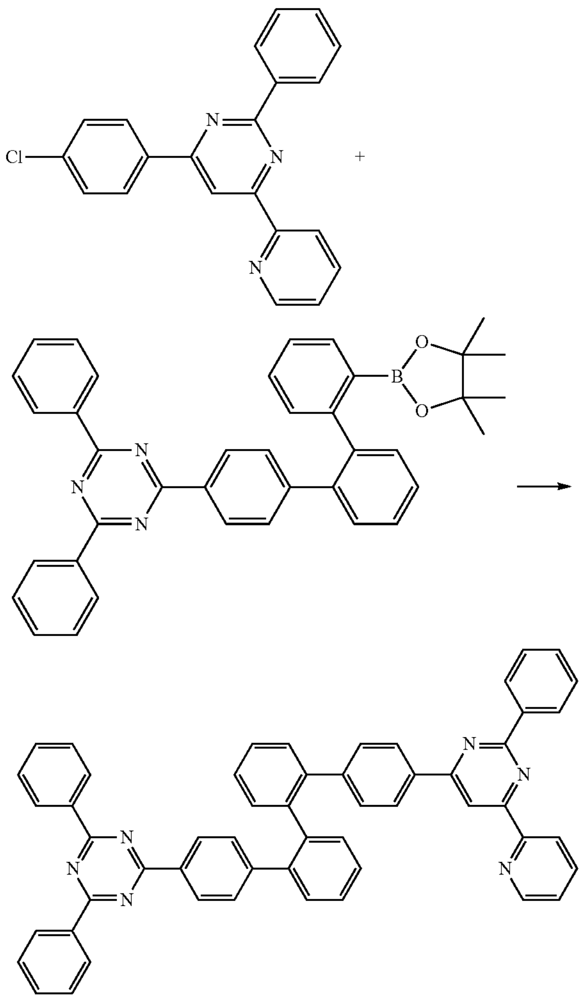

E9

Compound E9 was prepared in the same manner as in Preparation Example 2-8, except that each starting material was used as in the above reaction scheme.

MS: $[M+H]^+=769$

Preparation Example 2-10: Preparation of Compound E10

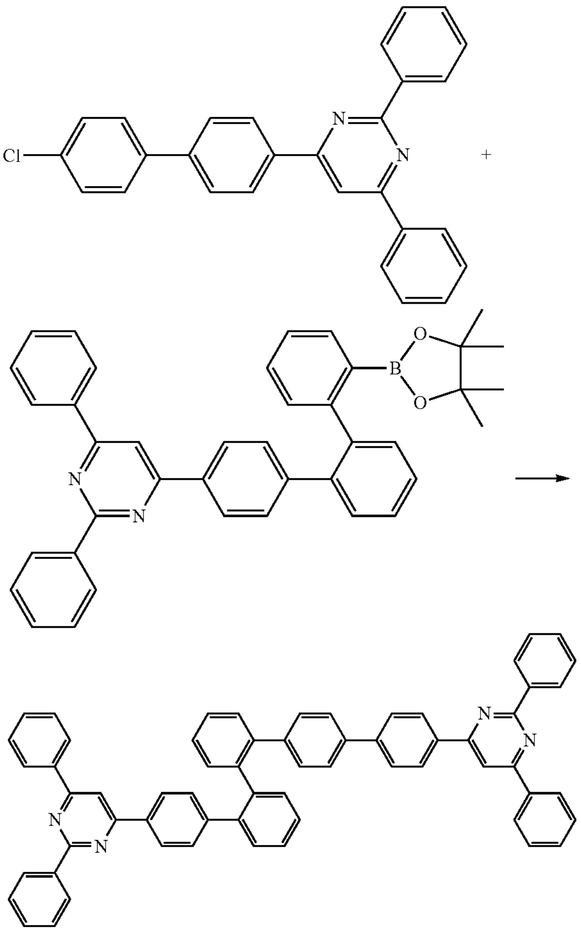

E10

Compound E10 was prepared in the same manner as in Preparation Example 2-8, except that each starting material was used as in the above reaction scheme.

MS: $[M+H]^+=843$

Preparation Example 2-11: Preparation of Compound E11

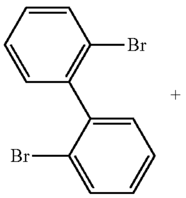

-continued

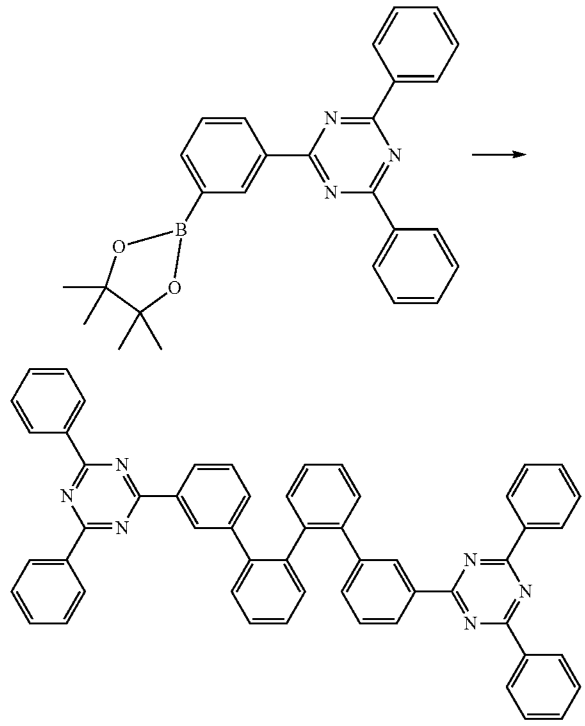

E11

Compound E11 was prepared in the same manner as in Preparation Example 2-1, except that each starting material was used as in the above reaction scheme.

MS: $[M+H]^+=769$

Preparation Example 2-12: Preparation of Compound E12

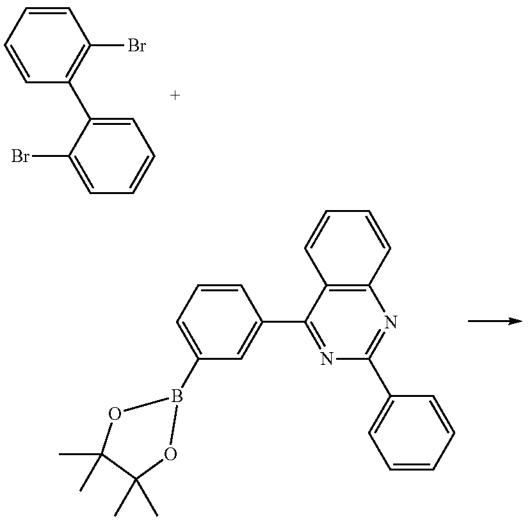

-continued

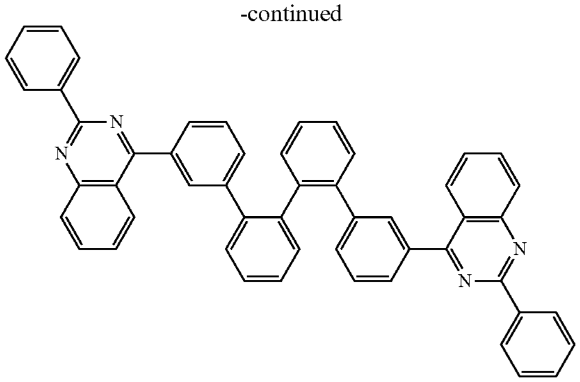

E12

Compound E12 was prepared in the same manner as in Preparation Example 2-1, except that each starting material was used as in the above reaction scheme.

MS: $[M+H]^+=715$

Preparation Example 2-13: Preparation of Compound E13

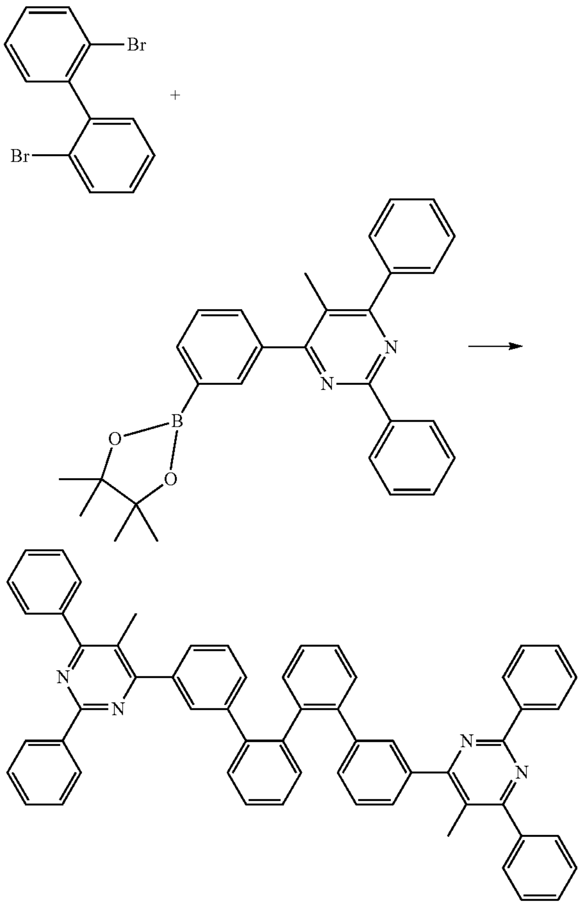

E13

Compound E13 was prepared in the same manner as in Preparation Example 2-1, except that each starting material was used as in the above reaction scheme.

MS: $[M+H]^+=795$

Preparation Example 2-14: Preparation of Compound E14

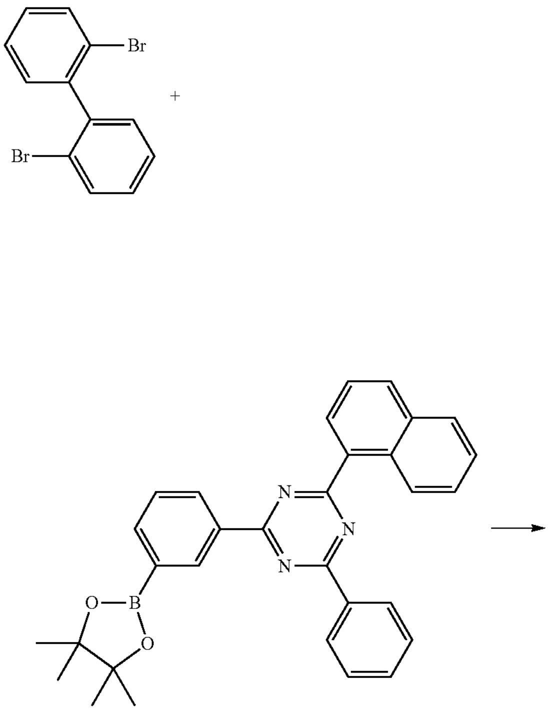

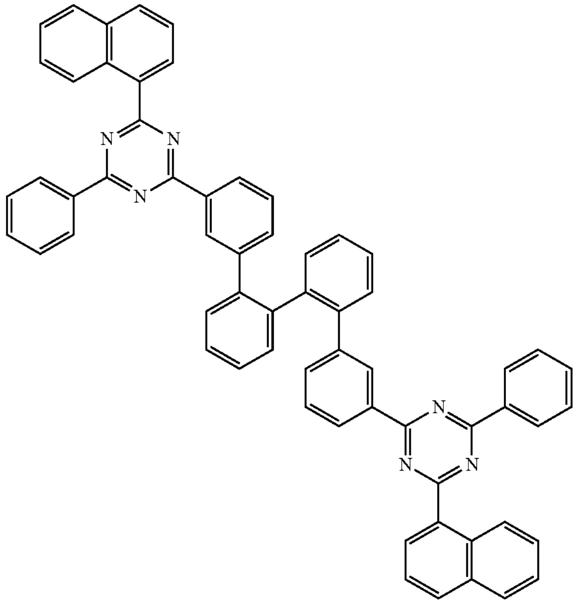

E14

Compound E14 was prepared in the same manner as in Preparation Example 2-1, except that each starting material was used as in the above reaction scheme.

MS: $[M+H]^+$=869

Preparation Example 2-15: Preparation of Compound E15

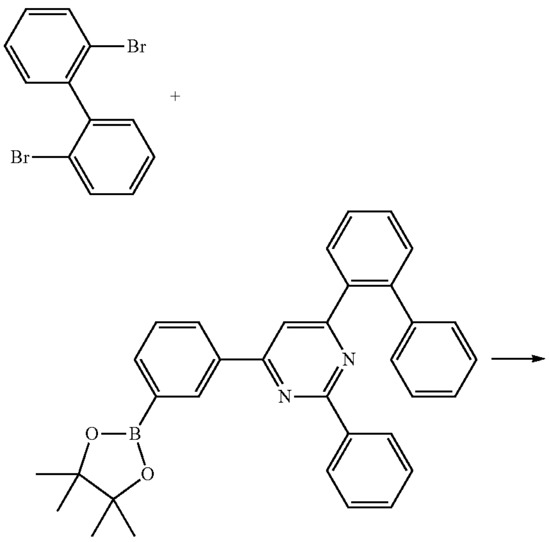

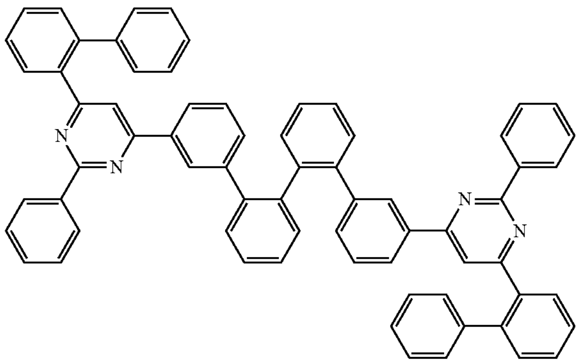

E15

Compound E15 was prepared in the same manner as in Preparation Example 2-1, except that each starting material was used as in the above reaction scheme.

MS: $[M+H]^+$=919

Preparation Example 2-16: Preparation of Compound E16

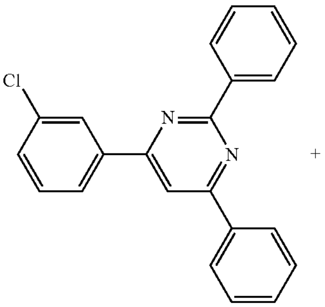

-continued

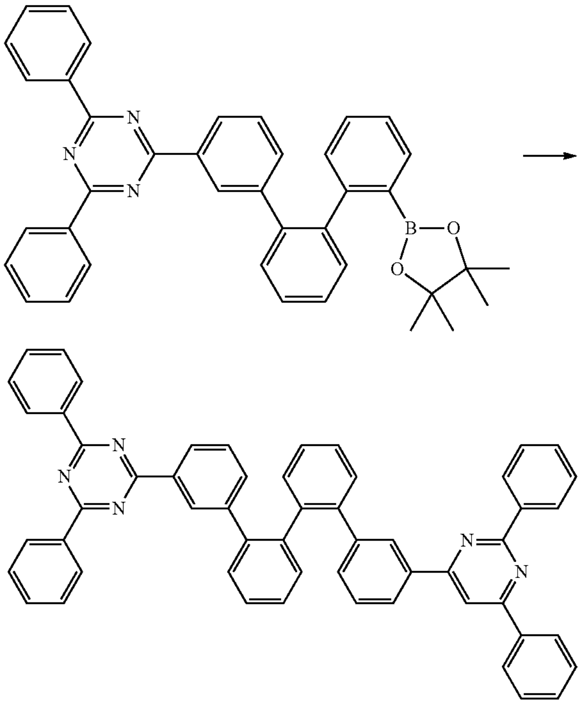

E16

Compound E16 was prepared in the same manner as in Preparation Example 2-8, except that each starting material was used as in the above reaction scheme.

MS: $[M+H]^+$=768

Preparation Example 2-17: Preparation of Compound E17

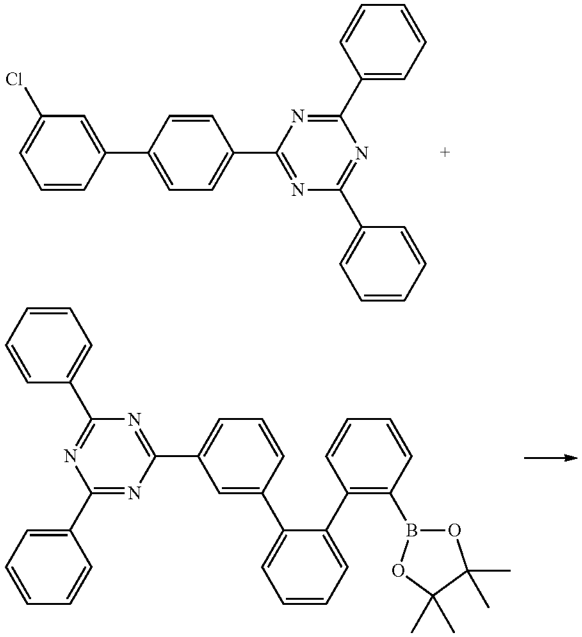

-continued

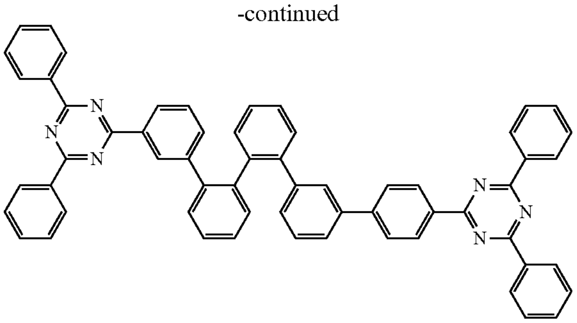

E17

Compound E17 was prepared in the same manner as in Preparation Example 2-8, except that each starting material was used as in the above reaction scheme.

MS: $[M+H]^+$=845

Preparation Example 2-18: Preparation of Compound E18

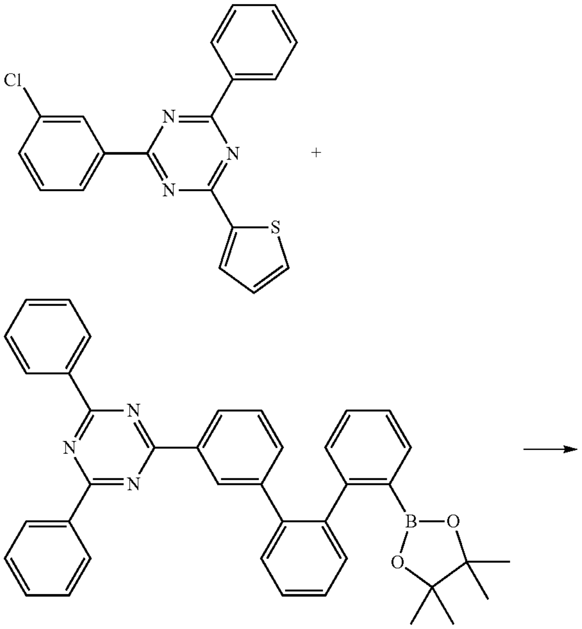

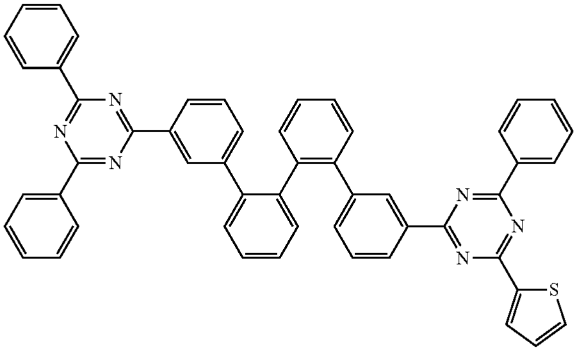

E18

Compound E18 was prepared in the same manner as in Preparation Example 2-8, except that each starting material was used as in the above reaction scheme.

MS: $[M+H]^+$=775

Preparation Example 2-19: Preparation of Compound E19
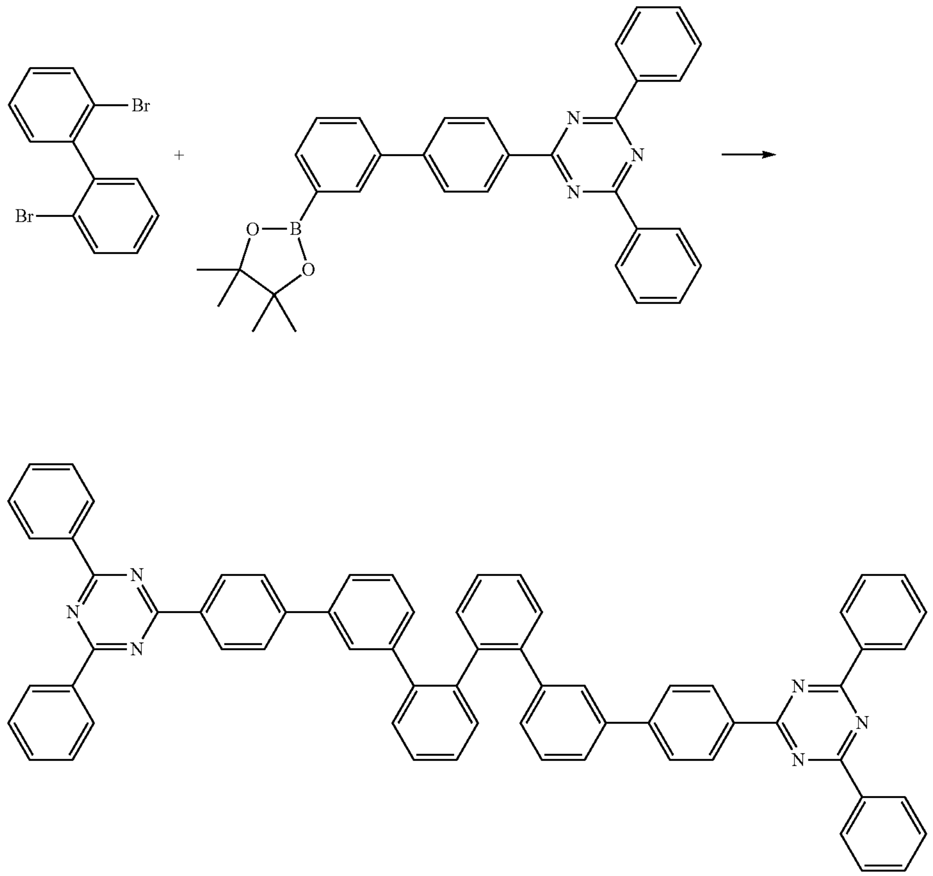
E19
Compound E19 was prepared in the same manner as in Preparation Example 2-1, except that each starting material was used as in the above reaction scheme.
MS: $[M+H]^+$=921
Preparation Example 2-20: Preparation of Compound E20
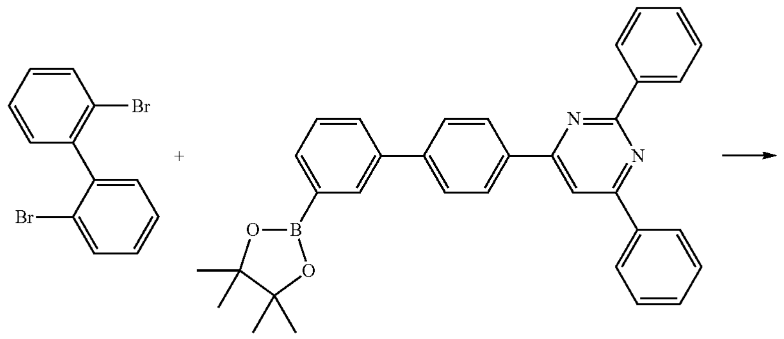

-continued

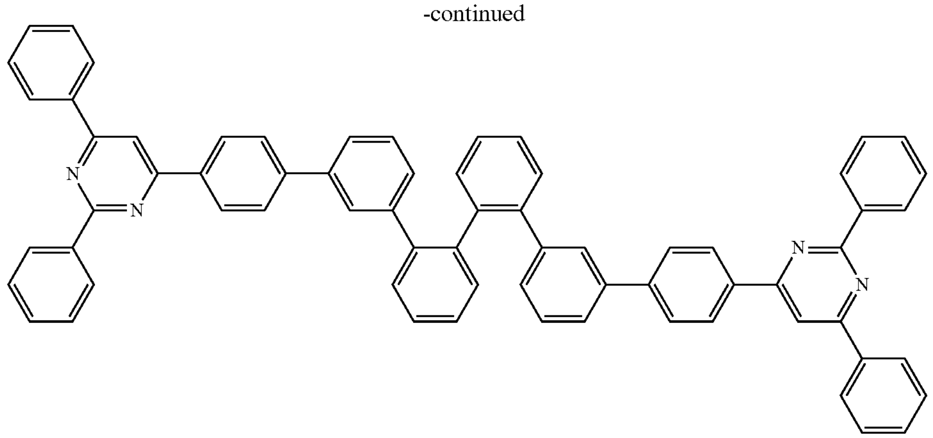

E20

Compound E20 was prepared in the same manner as in Preparation Example 2-1, except that each starting material was used as in the above reaction scheme.

MS: $[M+H]^+$=919

EXPERIMENTAL EXAMPLES

Experimental Example 1

A glass substrate on which ITO (Indium Tin Oxide) was coated as a thin film to a thickness of 1,000 Å was put into distilled water in which a detergent was dissolved, and ultrasonically cleaned. At this time, a product manufactured by Fischer Co. was used as the detergent, and distilled water filtered twice using a filter manufactured by Millipore Co. was used as the distilled water. After the ITO was cleaned for 30 minutes, ultrasonic cleaning was repeated twice using distilled water for 10 minutes. After the cleaning with distilled water was completed, the substrate was ultrasonically cleaned with solvents of isopropyl alcohol, acetone, and methanol, dried, and then transferred to a plasma cleaner. Then, the substrate was cleaned for 5 minutes using oxygen plasma and then transferred to a vacuum depositor.

On the prepared ITO transparent electrode, the following Compound HI-A was thermally vacuum-deposited to a thickness of 600 Å to form a hole injection layer. On the hole injection layer, hexaazatriphenylene (HAT, 50 Å) with the following formula and the following Compound HT-A (600 Å) were sequentially vacuum-deposited to form a hole transport layer.

Then, the following Compounds B1 and BD were vacuum-deposited on the hole transport layer at a weight ratio of 25:1 to a thickness of 200 Å to form a light emitting layer.

The Compound E1 and the following Compound LiQ (Lithium quinolate) were vacuum-deposited on the light emitting layer at a weight ratio of 1:1 to a thickness of 350 Å to form an electron injection and transport layer. On the electron injection and transport layer, lithium fluoride (LiF) and aluminum were sequentially deposited to a thickness of 10 Å and 1,000 Å, respectively to form a cathode.

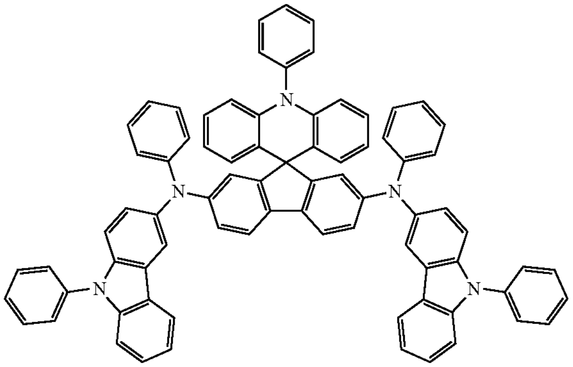

HI-A

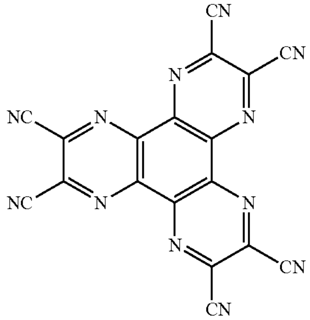

HAT

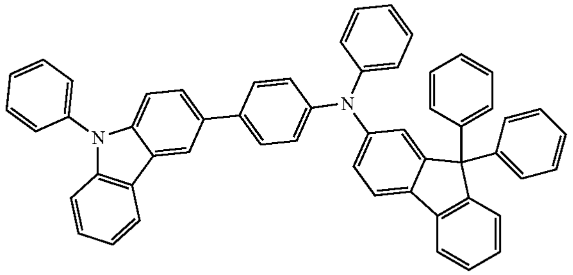

HT-A

-continued

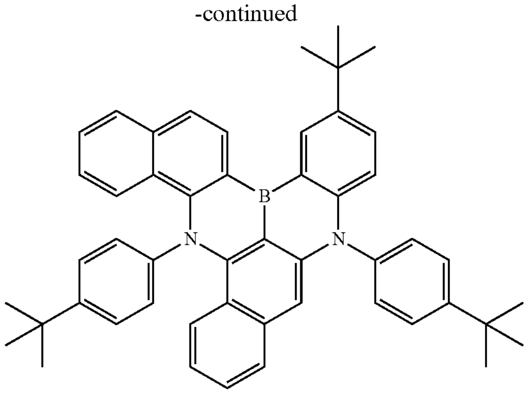

BD

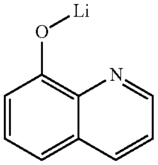

LiQ

In the above process, the deposition rate of the organic material was maintained at 0.4 to 0.9 Å/sec, the deposition rate of lithium fluoride of the cathode was maintained at 0.3 Å/sec, and the deposition rate of aluminum was maintained at 2 Å/sec. In addition, the degree of vacuum during the deposition was maintained at $1\times10^{-7}$ to $5\times10^{-8}$ torr, thereby manufacturing an organic light emitting device.

Experimental Examples 2 to 100

An organic light emitting device was manufactured in the same manner as in Experimental Example 1, except that the compound shown in Table 1 was used instead of Compound B1 or Compound E1.

Comparative Experimental Examples 1 to 251

An organic light emitting device was manufactured in the same manner as in Experimental Example 1, except that the compound shown in Table 1 was used instead of Compound B1 or Compound E1. At this time, Compounds BH-1 to BH-4, and ET-1 to ET-19 listed in Table 1 are as follows.

BH-1

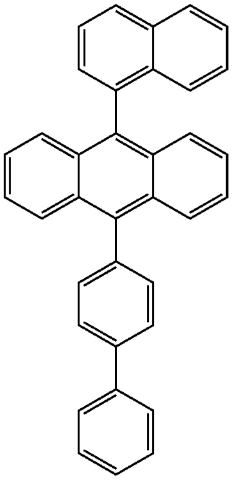

BH-2

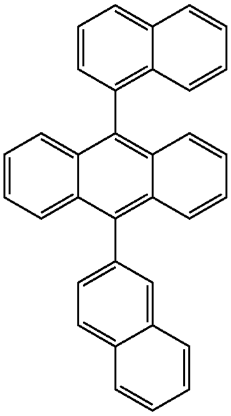

BH-3

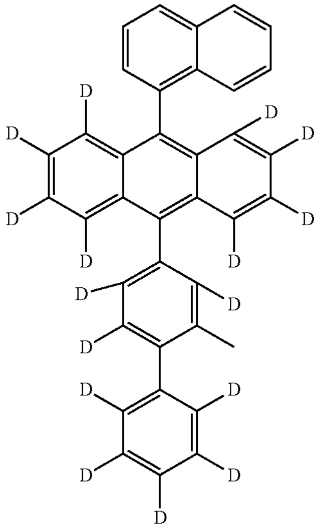

BH-4

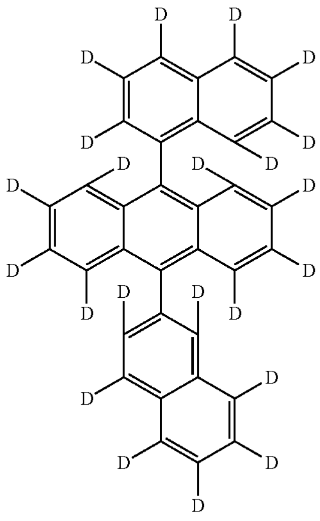

-continued
ET-1
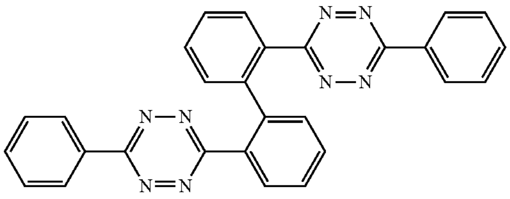
ET-2
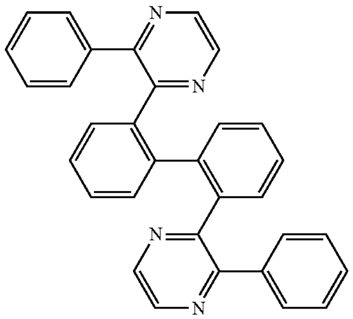
ET-3
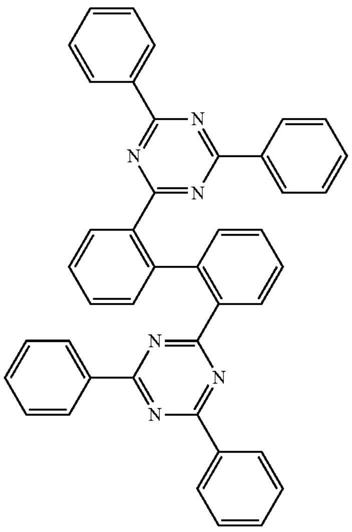
ET-4
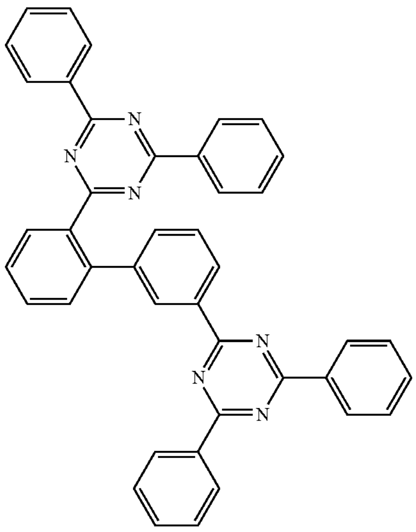
ET-5
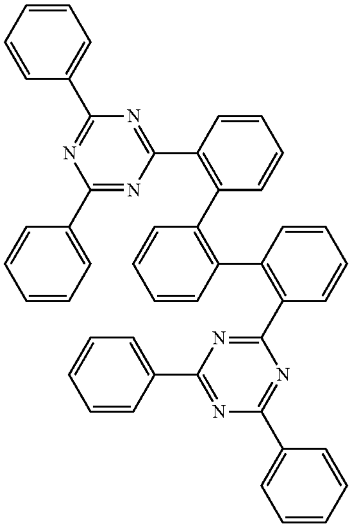
ET-6
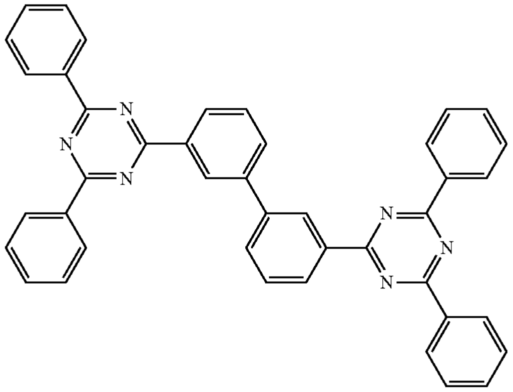

-continued
ET-7
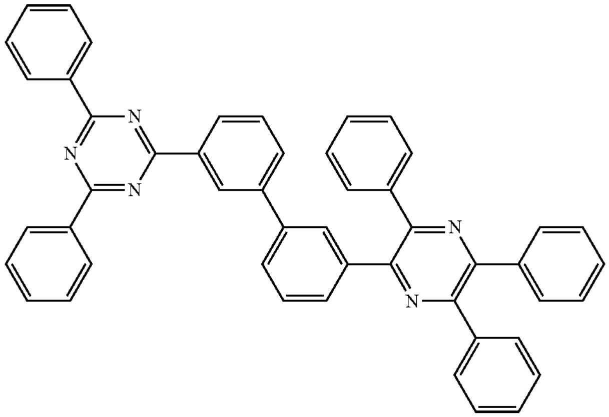
ET-8
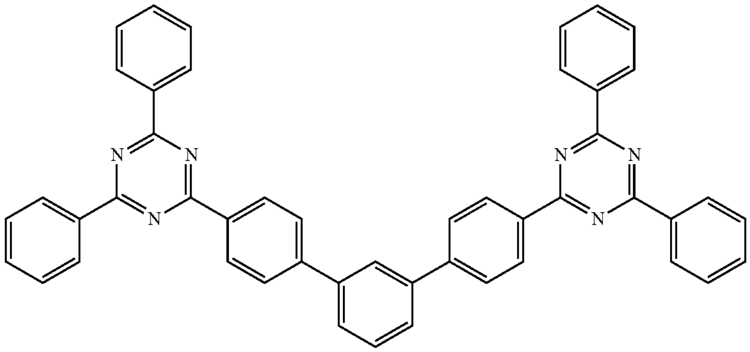
ET-9
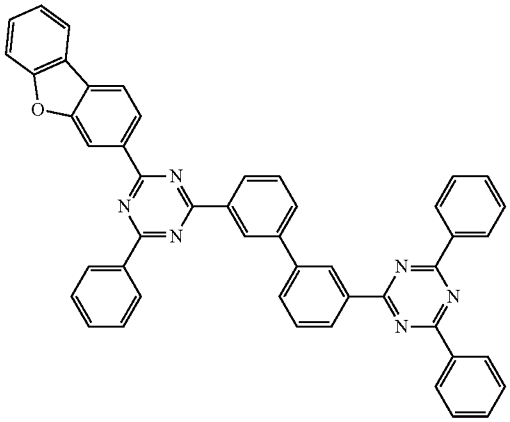
ET-10
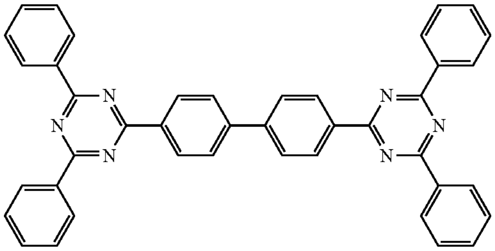
ET-11
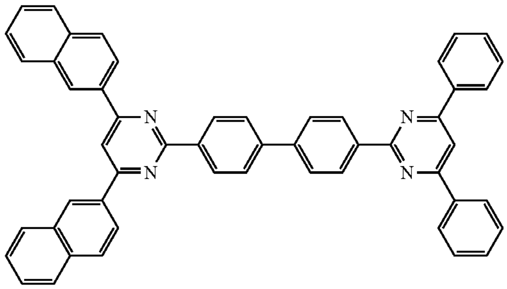
ET-12
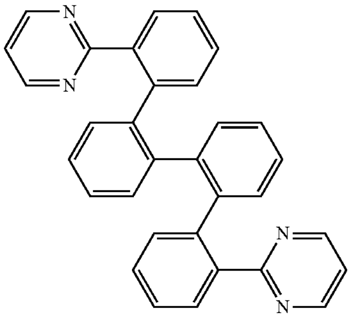

-continued
ET-13
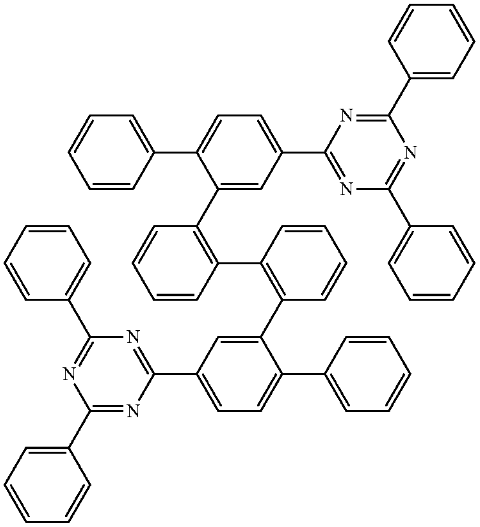
ET-14
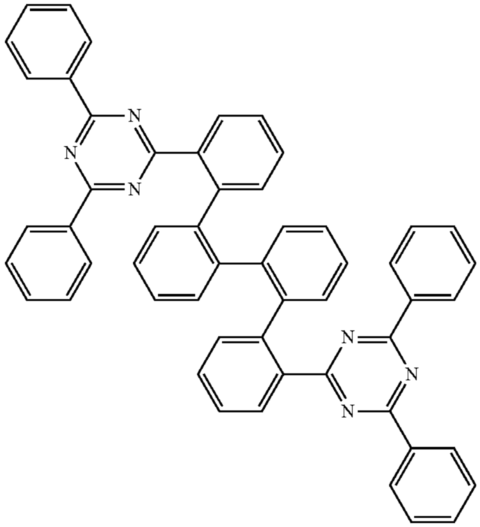
ET-15
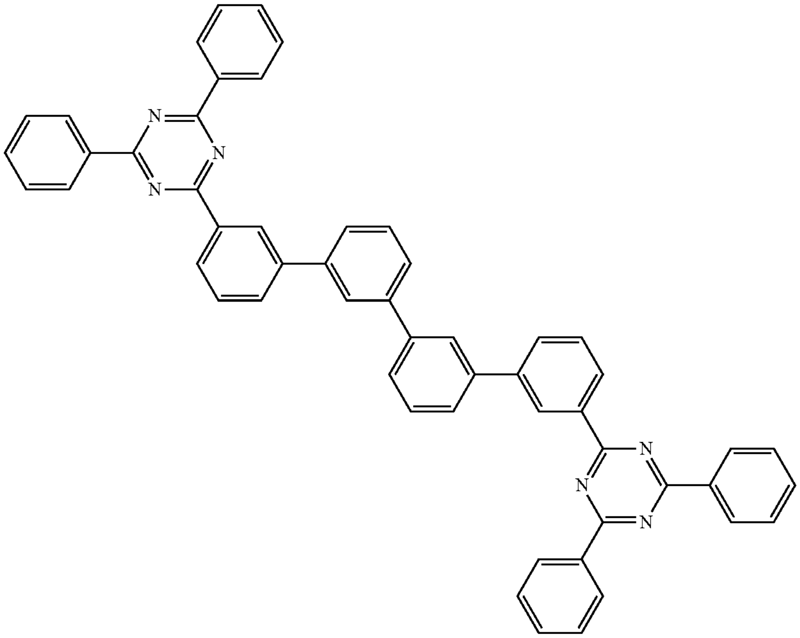
ET-16
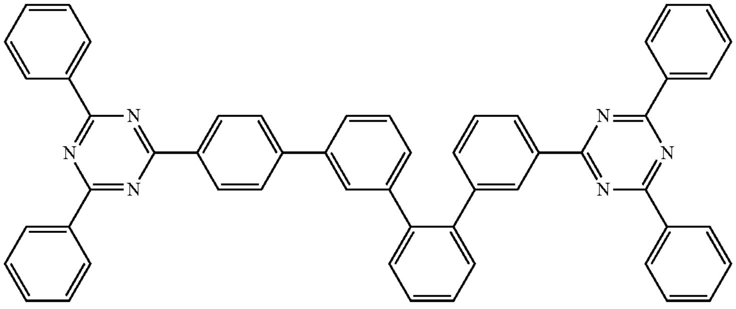

-continued

ET-17

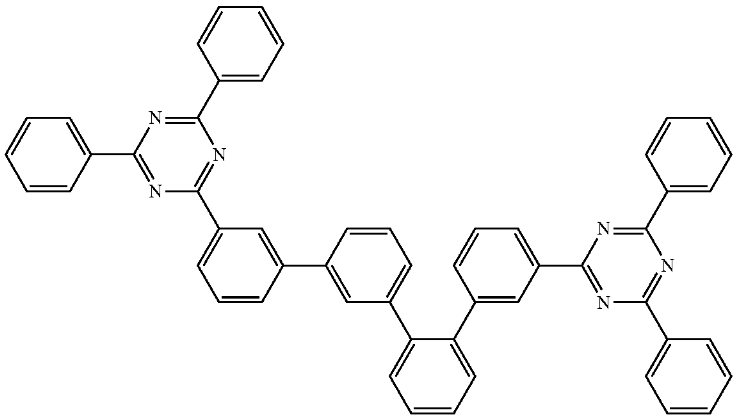

ET-18

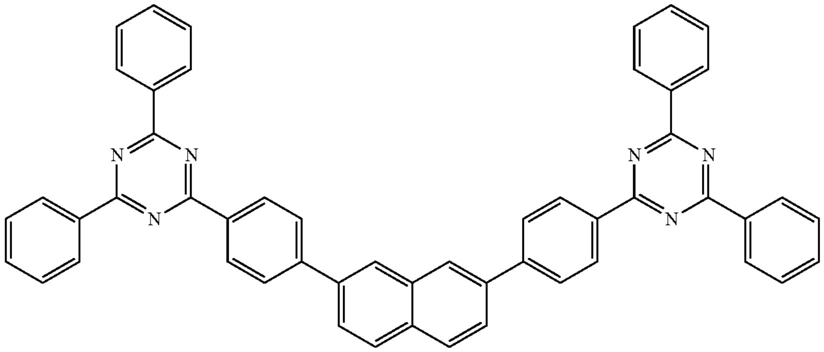

ET-19

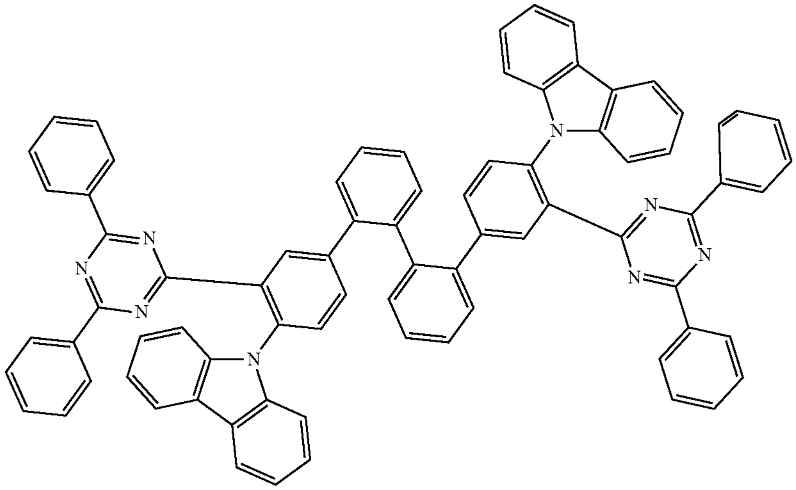

For the organic light emitting devices, the driving voltage and luminous efficiency were measured at a current density of 10 mA/cm$^2$. In addition, $T_{90}$, which is the time taken until the initial luminance decreases to 90% at a current density of 20 mA/cm$^2$, was measured. The results are shown in Table 1 below.

TABLE 1

| | Compound (BH) | Compound (Electron transport and injection layer) | Voltage (V@10 mA/cm$^2$) | Efficiency (cd/A@10 mA/cm$^2$) | Chromaticity coordinates (x, y) | $T_{90}$ (hr@20 mA/cm$^2$) |
|---|---|---|---|---|---|---|
| Experimental Example 1 | B1 | E1 | 3.62 | 4.70 | (0.133, 0.088) | 200 |
| Experimental Example 2 | B1 | E2 | 3.76 | 4.65 | (0.133, 0.088) | 184 |

TABLE 1-continued

| | Compound (BH) | Compound (Electron transport and injection layer) | Voltage (V@10 mA/cm$^2$) | Efficiency (cd/A@10 mA/cm$^2$) | Chromaticity coordinates (x, y) | $T_{90}$ (hr@20 mA/cm$^2$) |
|---|---|---|---|---|---|---|
| Experimental Example 3 | B1 | E3 | 3.80 | 4.56 | (0.133, 0.087) | 178 |
| Experimental Example 4 | B1 | E4 | 3.92 | 4.20 | (0.133, 0.088) | 164 |
| Experimental Example 5 | B1 | E5 | 3.99 | 4.15 | (0.135, 0.087) | 167 |
| Experimental Example 6 | B1 | E6 | 3.91 | 4.14 | (0.133, 0.088) | 160 |
| Experimental Example 7 | B1 | E7 | 3.80 | 4.61 | (0.133, 0.088) | 180 |
| Experimental Example 8 | B1 | E8 | 3.66 | 4.75 | (0.133, 0.087) | 194 |
| Experimental Example 9 | B1 | E9 | 3.69 | 4.61 | (0.133, 0.088) | 208 |
| Experimental Example 10 | B1 | E10 | 3.69 | 4.75 | (0.133, 0.088) | 188 |
| Experimental Example 11 | B1 | E11 | 3.66 | 4.65 | (0.133, 0.088) | 208 |
| Experimental Example 12 | B1 | E12 | 3.73 | 4.76 | (0.133, 0.088) | 180 |
| Experimental Example 13 | B1 | E13 | 3.77 | 4.66 | (0.133, 0.087) | 173 |
| Experimental Example 14 | B1 | E14 | 3.69 | 4.56 | (0.133, 0.088) | 220 |
| Experimental Example 15 | B1 | E15 | 3.73 | 4.57 | (0.133, 0.088) | 180 |
| Experimental Example 16 | B1 | E16 | 3.69 | 4.61 | (0.133, 0.088) | 204 |
| Experimental Example 17 | B1 | E17 | 3.67 | 4.65 | (0.133, 0.088) | 202 |
| Experimental Example 18 | B1 | E18 | 3.73 | 4.42 | (0.133, 0.087) | 188 |
| Experimental Example 19 | B1 | E19 | 3.69 | 4.61 | (0.133, 0.088) | 205 |
| Experimental Example 20 | B1 | E20 | 3.73 | 4.56 | (0.133, 0.088) | 203 |
| Experimental Example 21 | B2 | E1 | 3.66 | 5.17 | (0.133, 0.091) | 196 |
| Experimental Example 22 | B2 | E2 | 3.80 | 5.12 | (0.133, 0.090) | 180 |
| Experimental Example 23 | B2 | E3 | 3.84 | 5.02 | (0.133, 0.091) | 175 |
| Experimental Example 24 | B2 | E4 | 3.96 | 4.61 | (0.133, 0.091) | 161 |
| Experimental Example 25 | B2 | E5 | 4.03 | 4.57 | (0.133, 0.090) | 164 |
| Experimental Example 26 | B2 | E6 | 3.95 | 4.55 | (0.133, 0.091) | 157 |
| Experimental Example 27 | B2 | E7 | 3.84 | 5.07 | (0.133, 0.091) | 177 |
| Experimental Example 28 | B2 | E8 | 3.69 | 5.22 | (0.133, 0.090) | 190 |
| Experimental Example 29 | B2 | E9 | 3.73 | 5.07 | (0.133, 0.091) | 204 |
| Experimental Example 30 | B2 | E10 | 3.73 | 5.22 | (0.133, 0.091) | 184 |
| Experimental Example 31 | B2 | E11 | 3.69 | 5.12 | (0.133, 0.090) | 204 |
| Experimental Example 32 | B2 | E12 | 3.77 | 5.23 | (0.133, 0.091) | 176 |
| Experimental Example 33 | B2 | E13 | 3.80 | 5.13 | (0.133, 0.091) | 169 |
| Experimental Example 34 | B2 | E14 | 3.73 | 5.02 | (0.133, 0.090) | 216 |
| Experimental Example 35 | B2 | E15 | 3.77 | 5.02 | (0.133, 0.091) | 176 |
| Experimental Example 36 | B2 | E16 | 3.73 | 5.07 | (0.133, 0.091) | 200 |
| Experimental Example 37 | B2 | E17 | 3.71 | 5.12 | (0.133, 0.090) | 198 |
| Experimental Example 38 | B2 | E18 | 3.77 | 4.86 | (0.133, 0.091) | 184 |

TABLE 1-continued

| | Compound (BH) | Compound (Electron transport and injection layer) | Voltage (V@10 mA/cm$^2$) | Efficiency (cd/A@10 mA/cm$^2$) | Chromaticity coordinates (x, y) | $T_{90}$ (hr@20 mA/cm$^2$) |
|---|---|---|---|---|---|---|
| Experimental Example 39 | B2 | E19 | 3.73 | 5.07 | (0.133, 0.091) | 201 |
| Experimental Example 40 | B2 | E20 | 3.77 | 5.02 | (0.133, 0.090) | 199 |
| Experimental Example 41 | B3 | E1 | 3.37 | 4.94 | (0.133, 0.090) | 320 |
| Experimental Example 42 | B3 | E2 | 3.50 | 4.89 | (0.133, 0.089) | 294 |
| Experimental Example 43 | B3 | E3 | 3.54 | 4.79 | (0.133, 0.090) | 286 |
| Experimental Example 44 | B3 | E4 | 3.64 | 4.40 | (0.133, 0.090) | 263 |
| Experimental Example 45 | B3 | E5 | 3.72 | 4.36 | (0.133, 0.089) | 268 |
| Experimental Example 46 | B3 | E6 | 3.64 | 4.34 | (0.133, 0.090) | 256 |
| Experimental Example 47 | B3 | E7 | 3.54 | 4.84 | (0.133, 0.090) | 289 |
| Experimental Example 48 | B3 | E8 | 3.40 | 4.98 | (0.133, 0.089) | 310 |
| Experimental Example 49 | B3 | E9 | 3.43 | 4.84 | (0.133, 0.090) | 333 |
| Experimental Example 50 | B3 | E10 | 3.43 | 4.98 | (0.133, 0.090) | 301 |
| Experimental Example 51 | B3 | E11 | 3.40 | 4.89 | (0.133, 0.089) | 333 |
| Experimental Example 52 | B3 | E12 | 3.47 | 4.99 | (0.133, 0.090) | 288 |
| Experimental Example 53 | B3 | E13 | 3.50 | 4.89 | (0.133, 0.090) | 276 |
| Experimental Example 54 | B3 | E14 | 3.43 | 4.79 | (0.133, 0.089) | 353 |
| Experimental Example 55 | B3 | E15 | 3.47 | 4.80 | (0.133, 0.090) | 288 |
| Experimental Example 56 | B3 | E16 | 3.43 | 4.84 | (0.133, 0.090) | 326 |
| Experimental Example 57 | B3 | E17 | 3.42 | 4.89 | (0.133, 0.089) | 323 |
| Experimental Example 58 | B3 | E18 | 3.47 | 4.64 | (0.133, 0.090) | 301 |
| Experimental Example 59 | B3 | E19 | 3.43 | 4.84 | (0.133, 0.090) | 328 |
| Experimental Example 60 | B3 | E20 | 3.47 | 4.79 | (0.133, 0.089) | 325 |
| Experimental Example 61 | B4 | E1 | 3.48 | 5.03 | (0.133, 0.091) | 240 |
| Experimental Example 62 | B4 | E2 | 3.61 | 4.98 | (0.133, 0.090) | 221 |
| Experimental Example 63 | B4 | E3 | 3.65 | 4.88 | (0.133, 0.091) | 214 |
| Experimental Example 64 | B4 | E4 | 3.76 | 4.49 | (0.133, 0.091) | 197 |
| Experimental Example 65 | B4 | E5 | 3.84 | 4.44 | (0.133, 0.090) | 201 |
| Experimental Example 66 | B4 | E6 | 3.76 | 4.43 | (0.133, 0.091) | 192 |
| Experimental Example 67 | B4 | E7 | 3.65 | 4.93 | (0.133, 0.091) | 216 |
| Experimental Example 68 | B4 | E8 | 3.51 | 5.08 | (0.133, 0.090) | 233 |
| Experimental Example 69 | B4 | E9 | 3.54 | 4.93 | (0.133, 0.091) | 250 |
| Experimental Example 70 | B4 | E10 | 3.54 | 5.08 | (0.133, 0.091) | 226 |
| Experimental Example 71 | B4 | E11 | 3.51 | 4.98 | (0.133, 0.090) | 250 |
| Experimental Example 72 | B4 | E12 | 3.58 | 5.09 | (0.133, 0.091) | 216 |
| Experimental Example 73 | B4 | E13 | 3.62 | 4.99 | (0.133, 0.091) | 207 |
| Experimental Example 74 | B4 | E14 | 3.55 | 4.88 | (0.133, 0.090) | 265 |

TABLE 1-continued

| | Compound (BH) | Compound (Electron transport and injection layer) | Voltage (V@10 mA/cm$^2$) | Efficiency (cd/A@10 mA/cm$^2$) | Chromaticity coordinates (x, y) | $T_{90}$ (hr@20 mA/cm$^2$) |
|---|---|---|---|---|---|---|
| Experimental Example 75 | B4 | E15 | 3.58 | 4.89 | (0.133, 0.091) | 216 |
| Experimental Example 76 | B4 | E16 | 3.55 | 4.93 | (0.133, 0.091) | 245 |
| Experimental Example 77 | B4 | E17 | 3.53 | 4.98 | (0.133, 0.090) | 242 |
| Experimental Example 78 | B4 | E18 | 3.58 | 4.73 | (0.133, 0.091) | 226 |
| Experimental Example 79 | B4 | E19 | 3.54 | 4.93 | (0.133, 0.091) | 246 |
| Experimental Example 80 | B4 | E20 | 3.58 | 4.88 | (0.133, 0.090) | 244 |
| Experimental Example 81 | B5 | E1 | 3.62 | 4.70 | (0.133, 0.088) | 300 |
| Experimental Example 82 | B5 | E2 | 3.76 | 4.65 | (0.133, 0.088) | 276 |
| Experimental Example 83 | B5 | E3 | 3.80 | 4.56 | (0.133, 0.087) | 268 |
| Experimental Example 84 | B5 | E4 | 3.92 | 4.20 | (0.133, 0.088) | 246 |
| Experimental Example 85 | B5 | E5 | 3.99 | 4.15 | (0.135, 0.087) | 251 |
| Experimental Example 86 | B5 | E6 | 3.91 | 4.14 | (0.133, 0.088) | 240 |
| Experimental Example 87 | B5 | E7 | 3.80 | 4.61 | (0.133, 0.088) | 270 |
| Experimental Example 88 | B5 | E8 | 3.66 | 4.75 | (0.133, 0.087) | 291 |
| Experimental Example 89 | B5 | E9 | 3.69 | 4.61 | (0.133, 0.088) | 312 |
| Experimental Example 90 | B5 | E10 | 3.69 | 4.75 | (0.133, 0.088) | 282 |
| Experimental Example 91 | B5 | E11 | 3.66 | 4.65 | (0.133, 0.088) | 312 |
| Experimental Example 92 | B5 | E12 | 3.73 | 4.76 | (0.133, 0.088) | 270 |
| Experimental Example 93 | B5 | E13 | 3.77 | 4.66 | (0.133, 0.087) | 259 |
| Experimental Example 94 | B5 | E14 | 3.69 | 4.56 | (0.133, 0.088) | 331 |
| Experimental Example 95 | B5 | E15 | 3.73 | 4.57 | (0.133, 0.088) | 270 |
| Experimental Example 96 | B5 | E16 | 3.69 | 4.61 | (0.133, 0.088) | 306 |
| Experimental Example 97 | B5 | E17 | 3.67 | 4.65 | (0.133, 0.088) | 303 |
| Experimental Example 98 | B5 | E18 | 3.73 | 4.42 | (0.133, 0.087) | 282 |
| Experimental Example 99 | B5 | E19 | 3.69 | 4.61 | (0.133, 0.088) | 308 |
| Experimental Example 100 | B5 | E20 | 3.73 | 4.56 | (0.133, 0.088) | 305 |
| Comparative Experimental Example 1 | B1 | ET-1 | 4.47 | 1.66 | (0.133, 0.088) | 44 |
| Comparative Experimental Example 2 | B1 | ET-2 | 4.38 | 1.65 | (0.133, 0.087) | 42 |
| Comparative Experimental Example 3 | B1 | ET-3 | 4.05 | 1.88 | (0.133, 0.088) | 52 |
| Comparative Experimental Example 4 | B1 | ET-4 | 4.09 | 1.86 | (0.135, 0.087) | 51 |
| Comparative Experimental Example 5 | B1 | ET-5 | 4.01 | 2.26 | (0.133, 0.088) | 122 |
| Comparative Experimental Example 6 | B1 | ET-6 | 4.18 | 1.82 | (0.133, 0.088) | 78 |
| Comparative Experimental Example 7 | B1 | ET-7 | 4.22 | 1.81 | (0.133, 0.087) | 76 |

TABLE 1-continued

| | Compound (BH) | Compound (Electron transport and injection layer) | Voltage (V@10 mA/cm$^2$) | Efficiency (cd/A@10 mA/cm$^2$) | Chromaticity coordinates (x, y) | $T_{90}$ (hr@20 mA/cm$^2$) |
|---|---|---|---|---|---|---|
| Comparative Experimental Example 8 | B1 | ET-8 | 4.02 | 2.35 | (0.133, 0.088) | 140 |
| Comparative Experimental Example 9 | B1 | ET-9 | 4.30 | 1.79 | (0.135, 0.087) | 75 |
| Comparative Experimental Example 10 | B1 | ET-10 | 4.43 | 1.73 | (0.133, 0.088) | 147 |
| Comparative Experimental Example 11 | B1 | ET-11 | 4.69 | 1.72 | (0.133, 0.088) | 110 |
| Comparative Experimental Example 12 | B1 | ET-12 | 4.70 | 1.36 | (0.133, 0.087) | 32 |
| Comparative Experimental Example 13 | B1 | ET-13 | 4.23 | 3.32 | (0.133, 0.088) | 129 |
| Comparative Experimental Example 14 | B1 | ET-14 | 4.19 | 3.36 | (0.133, 0.088) | 116 |
| Comparative Experimental Example 15 | B1 | ET-15 | 4.44 | 3.26 | (0.133, 0.088) | 131 |
| Comparative Experimental Example 16 | B1 | ET-16 | 4.49 | 3.19 | (0.133, 0.087) | 132 |
| Comparative Experimental Example 17 | B1 | ET-17 | 4.53 | 3.09 | (0.133, 0.088) | 136 |
| Comparative Experimental Example 18 | B1 | ET-18 | 4.40 | 3.13 | (0.133, 0.088) | 135 |
| Comparative Experimental Example 19 | B1 | ET-19 | 4.42 | 1.81 | (0.133, 0.088) | 100 |
| Comparative Experimental Example 20 | B2 | ET-1 | 4.52 | 1.83 | (0.133, 0.091) | 43 |
| Comparative Experimental Example 21 | B2 | ET-2 | 4.43 | 1.82 | (0.133, 0.090) | 41 |
| Comparative Experimental Example 22 | B2 | ET-3 | 4.09 | 2.07 | (0.133, 0.091) | 51 |
| Comparative Experimental Example 23 | B2 | ET-4 | 4.14 | 2.05 | (0.133, 0.091) | 50 |
| Comparative Experimental Example 24 | B2 | ET-5 | 4.05 | 2.48 | (0.133, 0.090) | 120 |
| Comparative Experimental Example 25 | B2 | ET-6 | 4.22 | 2.01 | (0.133, 0.091) | 76 |
| Comparative Experimental Example 26 | B2 | ET-7 | 4.26 | 1.99 | (0.133, 0.091) | 75 |
| Comparative Experimental Example 27 | B2 | ET-8 | 4.06 | 2.59 | (0.133, 0.090) | 137 |
| Comparative Experimental Example 28 | B2 | ET-9 | 4.34 | 1.97 | (0.133, 0.091) | 73 |
| Comparative Experimental Example 29 | B2 | ET-10 | 4.47 | 1.91 | (0.133, 0.091) | 144 |
| Comparative Experimental Example 30 | B2 | ET-11 | 4.74 | 1.89 | (0.133, 0.090) | 108 |
| Comparative Experimental Example 31 | B2 | ET-12 | 4.74 | 1.49 | (0.133, 0.091) | 31 |
| Comparative Experimental Example 32 | B2 | ET-13 | 4.28 | 3.65 | (0.133, 0.091) | 126 |

TABLE 1-continued

| | Compound (BH) | Compound (Electron transport and injection layer) | Voltage (V@10 mA/cm$^2$) | Efficiency (cd/A@10 mA/cm$^2$) | Chromaticity coordinates (x, y) | $T_{90}$ (hr@20 mA/cm$^2$) |
|---|---|---|---|---|---|---|
| Comparative Experimental Example 33 | B2 | ET-14 | 4.23 | 3.69 | (0.133, 0.090) | 114 |
| Comparative Experimental Example 34 | B2 | ET-15 | 4.49 | 3.58 | (0.133, 0.091) | 129 |
| Comparative Experimental Example 35 | B2 | ET-16 | 4.53 | 3.51 | (0.133, 0.091) | 130 |
| Comparative Experimental Example 36 | B2 | ET-17 | 4.58 | 3.40 | (0.133, 0.090) | 134 |
| Comparative Experimental Example 37 | B2 | ET-18 | 4.45 | 3.44 | (0.133, 0.091) | 132 |
| Comparative Experimental Example 38 | B2 | ET-19 | 4.46 | 1.99 | (0.133, 0.091) | 98 |
| Comparative Experimental Example 39 | B3 | ET-1 | 4.16 | 1.74 | (0.133, 0.090) | 70 |
| Comparative Experimental Example 40 | B3 | ET-2 | 4.08 | 1.74 | (0.133, 0.089) | 67 |
| Comparative Experimental Example 41 | B3 | ET-3 | 3.77 | 1.97 | (0.133, 0.090) | 83 |
| Comparative Experimental Example 42 | B3 | ET-4 | 3.81 | 1.95 | (0.133, 0.090) | 82 |
| Comparative Experimental Example 43 | B3 | ET-5 | 3.73 | 2.37 | (0.133, 0.089) | 195 |
| Comparative Experimental Example 44 | B3 | ET-6 | 3.88 | 1.91 | (0.133, 0.090) | 125 |
| Comparative Experimental Example 45 | B3 | ET-7 | 3.92 | 1.90 | (0.133, 0.090) | 122 |
| Comparative Experimental Example 46 | B3 | ET-8 | 3.74 | 2.47 | (0.133, 0.089) | 224 |
| Comparative Experimental Example 47 | B3 | ET-9 | 4.00 | 1.88 | (0.133, 0.090) | 120 |
| Comparative Experimental Example 48 | B3 | ET-10 | 4.12 | 1.82 | (0.133, 0.090) | 235 |
| Comparative Experimental Example 49 | B3 | ET-11 | 4.36 | 1.80 | (0.133, 0.089) | 176 |
| Comparative Experimental Example 50 | B3 | ET-12 | 4.37 | 1.43 | (0.133, 0.090) | 51 |
| Comparative Experimental Example 51 | B3 | ET-13 | 3.94 | 3.49 | (0.133, 0.090) | 206 |
| Comparative Experimental Example 52 | B3 | ET-14 | 3.90 | 3.52 | (0.133, 0.089) | 186 |
| Comparative Experimental Example 53 | B3 | ET-15 | 4.13 | 3.42 | (0.133, 0.090) | 210 |
| Comparative Experimental Example 54 | B3 | ET-16 | 4.17 | 3.35 | (0.133, 0.090) | 212 |
| Comparative Experimental Example 55 | B3 | ET-17 | 4.22 | 3.25 | (0.133, 0.089) | 218 |
| Comparative Experimental Example 56 | B3 | ET-18 | 4.09 | 3.28 | (0.133, 0.090) | 216 |
| Comparative Experimental Example 57 | B3 | ET-19 | 4.11 | 1.90 | (0.133, 0.090) | 160 |

TABLE 1-continued

| | Compound (BH) | Compound (Electron transport and injection layer) | Voltage (V@10 mA/cm$^2$) | Efficiency (cd/A@10 mA/cm$^2$) | Chromaticity coordinates (x, y) | $T_{90}$ (hr@20 mA/cm$^2$) |
|---|---|---|---|---|---|---|
| Comparative Experimental Example 58 | B4 | ET-1 | 4.30 | 1.78 | (0.133, 0.091) | 52 |
| Comparative Experimental Example 59 | B4 | ET-2 | 4.21 | 1.77 | (0.133, 0.090) | 50 |
| Comparative Experimental Example 60 | B4 | ET-3 | 3.89 | 2.01 | (0.133, 0.091) | 62 |
| Comparative Experimental Example 61 | B4 | ET-4 | 3.93 | 1.99 | (0.133, 0.091) | 61 |
| Comparative Experimental Example 62 | B4 | ET-5 | 3.85 | 2.41 | (0.133, 0.090) | 146 |
| Comparative Experimental Example 63 | B4 | ET-6 | 4.01 | 1.95 | (0.133, 0.091) | 94 |
| Comparative Experimental Example 64 | B4 | ET-7 | 4.05 | 1.93 | (0.133, 0.091) | 92 |
| Comparative Experimental Example 65 | B4 | ET-8 | 3.86 | 2.51 | (0.133, 0.090) | 168 |
| Comparative Experimental Example 66 | B4 | ET-9 | 4.13 | 1.91 | (0.133, 0.091) | 90 |
| Comparative Experimental Example 67 | B4 | ET-10 | 4.25 | 1.85 | (0.133, 0.091) | 176 |
| Comparative Experimental Example 68 | B4 | ET-11 | 4.50 | 1.84 | (0.133, 0.090) | 132 |
| Comparative Experimental Example 69 | B4 | ET-12 | 4.51 | 1.45 | (0.133, 0.091) | 38 |
| Comparative Experimental Example 70 | B4 | ET-13 | 4.07 | 3.56 | (0.133, 0.091) | 155 |
| Comparative Experimental Example 71 | B4 | ET-14 | 4.02 | 3.59 | (0.133, 0.090) | 139 |
| Comparative Experimental Example 72 | B4 | ET-15 | 4.27 | 3.48 | (0.133, 0.091) | 157 |
| Comparative Experimental Example 73 | B4 | ET-16 | 4.31 | 3.41 | (0.133, 0.091) | 159 |
| Comparative Experimental Example 74 | B4 | ET-17 | 4.35 | 3.31 | (0.133, 0.090) | 164 |
| Comparative Experimental Example 75 | B4 | ET-18 | 4.23 | 3.34 | (0.133, 0.091) | 162 |
| Comparative Experimental Example 76 | B4 | ET-19 | 4.24 | 1.94 | (0.133, 0.091) | 120 |
| Comparative Experimental Example 77 | B5 | ET-1 | 4.47 | 1.66 | (0.133, 0.088) | 65 |
| Comparative Experimental Example 78 | B5 | ET-2 | 4.38 | 1.65 | (0.133, 0.088) | 62 |
| Comparative Experimental Example 79 | B5 | ET-3 | 4.05 | 1.88 | (0.133, 0.087) | 78 |
| Comparative Experimental Example 80 | B5 | ET-4 | 4.09 | 1.86 | (0.133, 0.088) | 76 |
| Comparative Experimental Example 81 | B5 | ET-5 | 4.01 | 2.26 | (0.135, 0.087) | 183 |
| Comparative Experimental Example 82 | B5 | ET-6 | 4.18 | 1.82 | (0.133, 0.088) | 117 |

TABLE 1-continued

| | Compound (BH) | Compound (Electron transport and injection layer) | Voltage (V@10 mA/cm$^2$) | Efficiency (cd/A@10 mA/cm$^2$) | Chromaticity coordinates (x, y) | $T_{90}$ (hr@20 mA/cm$^2$) |
|---|---|---|---|---|---|---|
| Comparative Experimental Example 83 | B5 | ET-7 | 4.22 | 1.81 | (0.133, 0.088) | 115 |
| Comparative Experimental Example 84 | B5 | ET-8 | 4.02 | 2.35 | (0.133, 0.087) | 210 |
| Comparative Experimental Example 85 | B5 | ET-9 | 4.30 | 1.79 | (0.133, 0.088) | 112 |
| Comparative Experimental Example 86 | B5 | ET-10 | 4.43 | 1.73 | (0.133, 0.088) | 220 |
| Comparative Experimental Example 87 | B5 | ET-11 | 4.69 | 1.72 | (0.133, 0.088) | 165 |
| Comparative Experimental Example 88 | B5 | ET-12 | 4.70 | 1.36 | (0.133, 0.088) | 48 |
| Comparative Experimental Example 89 | B5 | ET-13 | 4.23 | 3.32 | (0.133, 0.087) | 193 |
| Comparative Experimental Example 90 | B5 | ET-14 | 4.19 | 3.36 | (0.133, 0.088) | 174 |
| Comparative Experimental Example 91 | B5 | ET-15 | 4.44 | 3.26 | (0.133, 0.088) | 197 |
| Comparative Experimental Example 92 | B5 | ET-16 | 4.49 | 3.19 | (0.133, 0.088) | 199 |
| Comparative Experimental Example 93 | B5 | ET-17 | 4.53 | 3.09 | (0.133, 0.088) | 205 |
| Comparative Experimental Example 94 | B5 | ET-18 | 4.40 | 3.13 | (0.133, 0.087) | 203 |
| Comparative Experimental Example 95 | B5 | ET-19 | 4.42 | 1.81 | (0.133, 0.088) | 150 |
| Comparative Experimental Example 96 | BH-1 | E1 | 3.98 | 4.09 | (0.133, 0.091) | 40 |
| Comparative Experimental Example 97 | BH-1 | E2 | 4.14 | 4.05 | (0.133, 0.090) | 37 |
| Comparative Experimental Example 98 | BH-1 | E3 | 4.18 | 3.97 | (0.133, 0.091) | 36 |
| Comparative Experimental Example 99 | BH-1 | E4 | 4.31 | 3.65 | (0.133, 0.091) | 33 |
| Comparative Experimental Example 100 | BH-1 | E5 | 4.39 | 3.61 | (0.133, 0.090) | 33 |
| Comparative Experimental Example 101 | BH-1 | E6 | 4.31 | 3.60 | (0.133, 0.091) | 32 |
| Comparative Experimental Example 102 | BH-1 | E7 | 4.18 | 4.01 | (0.133, 0.091) | 36 |
| Comparative Experimental Example 103 | BH-1 | E8 | 4.02 | 4.13 | (0.133, 0.090) | 39 |
| Comparative Experimental Example 104 | BH-1 | E9 | 4.06 | 4.01 | (0.133, 0.091) | 42 |
| Comparative Experimental Example 105 | BH-1 | E10 | 4.06 | 4.13 | (0.133, 0.091) | 38 |
| Comparative Experimental Example 106 | BH-1 | E11 | 4.02 | 4.05 | (0.133, 0.090) | 42 |
| Comparative Experimental Example 107 | BH-1 | E12 | 4.10 | 4.14 | (0.133, 0.091) | 36 |

TABLE 1-continued

| | Compound (BH) | Compound (Electron transport and injection layer) | Voltage (V@10 mA/cm$^2$) | Efficiency (cd/A@10 mA/cm$^2$) | Chromaticity coordinates (x, y) | $T_{90}$ (hr@20 mA/cm$^2$) |
|---|---|---|---|---|---|---|
| Comparative Experimental Example 108 | BH-1 | E13 | 4.14 | 4.06 | (0.133, 0.091) | 35 |
| Comparative Experimental Example 109 | BH-1 | E14 | 4.06 | 3.97 | (0.133, 0.090) | 44 |
| Comparative Experimental Example 110 | BH-1 | E15 | 4.10 | 3.97 | (0.133, 0.091) | 36 |
| Comparative Experimental Example 111 | BH-1 | E16 | 4.06 | 4.01 | (0.133, 0.091) | 41 |
| Comparative Experimental Example 112 | BH-1 | E17 | 4.04 | 4.05 | (0.133, 0.090) | 40 |
| Comparative Experimental Example 113 | BH-1 | E18 | 4.10 | 3.84 | (0.133, 0.091) | 38 |
| Comparative Experimental Example 114 | BH-1 | E19 | 4.06 | 4.01 | (0.133, 0.091) | 41 |
| Comparative Experimental Example 115 | BH-1 | E20 | 4.10 | 3.97 | (0.133, 0.091) | 41 |
| Comparative Experimental Example 116 | BH-2 | E1 | 3.87 | 4.23 | (0.133, 0.092) | 60 |
| Comparative Experimental Example 117 | BH-2 | E2 | 4.03 | 4.19 | (0.133, 0.091) | 55 |
| Comparative Experimental Example 118 | BH-2 | E3 | 4.07 | 4.10 | (0.133, 0.092) | 54 |
| Comparative Experimental Example 119 | BH-2 | E4 | 4.19 | 3.78 | (0.133, 0.092) | 49 |
| Comparative Experimental Example 120 | BH-2 | E5 | 4.27 | 3.74 | (0.133, 0.091) | 50 |
| Comparative Experimental Example 121 | BH-2 | E6 | 4.19 | 3.72 | (0.133, 0.092) | 48 |
| Comparative Experimental Example 122 | BH-2 | E7 | 4.07 | 4.15 | (0.133, 0.092) | 54 |
| Comparative Experimental Example 123 | BH-2 | E8 | 3.91 | 4.27 | (0.133, 0.091) | 58 |
| Comparative Experimental Example 124 | BH-2 | E9 | 3.95 | 4.15 | (0.133, 0.092) | 62 |
| Comparative Experimental Example 125 | BH-2 | E10 | 3.95 | 4.27 | (0.133, 0.092) | 56 |
| Comparative Experimental Example 126 | BH-2 | E11 | 3.91 | 4.19 | (0.133, 0.091) | 62 |
| Comparative Experimental Example 127 | BH-2 | E12 | 3.99 | 4.28 | (0.133, 0.092) | 54 |
| Comparative Experimental Example 128 | BH-2 | E13 | 4.03 | 4.20 | (0.133, 0.092) | 52 |
| Comparative Experimental Example 129 | BH-2 | E14 | 3.95 | 4.10 | (0.133, 0.091) | 66 |
| Comparative Experimental Example 130 | BH-2 | E15 | 3.99 | 4.11 | (0.133, 0.092) | 54 |
| Comparative Experimental Example 131 | BH-2 | E16 | 3.95 | 4.15 | (0.133, 0.092) | 61 |
| Comparative Experimental Example 132 | BH-2 | E17 | 3.93 | 4.19 | (0.133, 0.091) | 61 |

TABLE 1-continued

| | Compound (BH) | Compound (Electron transport and injection layer) | Voltage (V@10 mA/cm$^2$) | Efficiency (cd/A@10 mA/cm$^2$) | Chromaticity coordinates (x, y) | $T_{90}$ (hr@20 mA/cm$^2$) |
|---|---|---|---|---|---|---|
| Comparative Experimental Example 133 | BH-2 | E18 | 3.99 | 3.98 | (0.133, 0.092) | 56 |
| Comparative Experimental Example 134 | BH-2 | E19 | 3.95 | 4.15 | (0.133, 0.092) | 62 |
| Comparative Experimental Example 135 | BH-2 | E20 | 3.99 | 4.11 | (0.133, 0.091) | 61 |
| Comparative Experimental Example 136 | BH-3 | E1 | 3.98 | 4.09 | (0.133, 0.091) | 50 |
| Comparative Experimental Example 137 | BH-3 | E2 | 4.14 | 4.05 | (0.133, 0.090) | 46 |
| Comparative Experimental Example 138 | BH-3 | E3 | 4.18 | 3.97 | (0.133, 0.091) | 45 |
| Comparative Experimental Example 139 | BH-3 | E4 | 4.31 | 3.65 | (0.133, 0.091) | 41 |
| Comparative Experimental Example 140 | BH-3 | E5 | 4.39 | 3.61 | (0.133, 0.090) | 42 |
| Comparative Experimental Example 141 | BH-3 | E6 | 4.31 | 3.60 | (0.133, 0.091) | 40 |
| Comparative Experimental Example 142 | BH-3 | E7 | 4.18 | 4.01 | (0.133, 0.091) | 45 |
| Comparative Experimental Example 143 | BH-3 | E8 | 4.02 | 4.13 | (0.133, 0.090) | 49 |
| Comparative Experimental Example 144 | BH-3 | E9 | 4.06 | 4.01 | (0.133, 0.091) | 52 |
| Comparative Experimental Example 145 | BH-3 | E10 | 4.06 | 4.13 | (0.133, 0.091) | 47 |
| Comparative Experimental Example 146 | BH-3 | E11 | 4.02 | 4.05 | (0.133, 0.090) | 52 |
| Comparative Experimental Example 147 | BH-3 | E12 | 4.10 | 4.14 | (0.133, 0.091) | 45 |
| Comparative Experimental Example 148 | BH-3 | E13 | 4.14 | 4.06 | (0.133, 0.091) | 43 |
| Comparative Experimental Example 149 | BH-3 | E14 | 4.06 | 3.97 | (0.133, 0.090) | 55 |
| Comparative Experimental Example 150 | BH-3 | E15 | 4.10 | 3.97 | (0.133, 0.091) | 45 |
| Comparative Experimental Example 151 | BH-3 | E16 | 4.06 | 4.01 | (0.133, 0.091) | 51 |
| Comparative Experimental Example 152 | BH-3 | E17 | 4.04 | 4.05 | (0.133, 0.090) | 51 |
| Comparative Experimental Example 153 | BH-3 | E18 | 4.10 | 3.84 | (0.133, 0.091) | 47 |
| Comparative Experimental Example 154 | BH-3 | E19 | 4.06 | 4.01 | (0.133, 0.091) | 51 |
| Comparative Experimental Example 155 | BH-3 | E20 | 4.10 | 3.97 | (0.133, 0.091) | 51 |
| Comparative Experimental Example 156 | BH-4 | E1 | 3.60 | 4.44 | (0.133, 0.092) | 90 |
| Comparative Experimental Example 157 | BH-4 | E2 | 3.75 | 4.40 | (0.133, 0.091) | 83 |

TABLE 1-continued

| | Compound (BH) | Compound (Electron transport and injection layer) | Voltage (V@10 mA/cm$^2$) | Efficiency (cd/A@10 mA/cm$^2$) | Chromaticity coordinates (x, y) | $T_{90}$ (hr@20 mA/cm$^2$) |
|---|---|---|---|---|---|---|
| Comparative Experimental Example 158 | BH-4 | E3 | 3.78 | 4.31 | (0.133, 0.092) | 80 |
| Comparative Experimental Example 159 | BH-4 | E4 | 3.90 | 3.96 | (0.133, 0.092) | 74 |
| Comparative Experimental Example 160 | BH-4 | E5 | 3.98 | 3.92 | (0.133, 0.091) | 75 |
| Comparative Experimental Example 161 | BH-4 | E6 | 3.90 | 3.91 | (0.133, 0.092) | 72 |
| Comparative Experimental Example 162 | BH-4 | E7 | 3.78 | 4.35 | (0.133, 0.092) | 81 |
| Comparative Experimental Example 163 | BH-4 | E8 | 3.64 | 4.49 | (0.133, 0.091) | 87 |
| Comparative Experimental Example 164 | BH-4 | E9 | 3.67 | 4.35 | (0.133, 0.092) | 94 |
| Comparative Experimental Example 165 | BH-4 | E10 | 3.67 | 4.49 | (0.133, 0.092) | 85 |
| Comparative Experimental Example 166 | BH-4 | E11 | 3.64 | 4.40 | (0.133, 0.091) | 94 |
| Comparative Experimental Example 167 | BH-4 | E12 | 3.71 | 4.49 | (0.133, 0.092) | 81 |
| Comparative Experimental Example 168 | BH-4 | E13 | 3.75 | 4.40 | (0.133, 0.092) | 78 |
| Comparative Experimental Example 169 | BH-4 | E14 | 3.67 | 4.31 | (0.133, 0.091) | 99 |
| Comparative Experimental Example 170 | BH-4 | E15 | 3.71 | 4.32 | (0.133, 0.092) | 81 |
| Comparative Experimental Example 171 | BH-4 | E16 | 3.67 | 4.35 | (0.133, 0.092) | 92 |
| Comparative Experimental Example 172 | BH-4 | E17 | 3.66 | 4.40 | (0.133, 0.091) | 91 |
| Comparative Experimental Example 173 | BH-4 | E18 | 3.71 | 4.18 | (0.133, 0.092) | 85 |
| Comparative Experimental Example 174 | BH-4 | E19 | 3.67 | 4.36 | (0.133, 0.092) | 92 |
| Comparative Experimental Example 175 | BH-4 | E20 | 3.71 | 4.31 | (0.133, 0.091) | 91 |
| Comparative Experimental Example 176 | BH-1 | ET-1 | 4.92 | 1.45 | (0.133, 0.091) | 9 |
| Comparative Experimental Example 177 | BH-1 | ET-2 | 4.82 | 1.44 | (0.133, 0.090) | 8 |
| Comparative Experimental Example 178 | BH-1 | ET-3 | 4.46 | 1.64 | (0.133, 0.091) | 10 |
| Comparative Experimental Example 179 | BH-1 | ET-4 | 4.50 | 1.62 | (0.133, 0.091) | 10 |
| Comparative Experimental Example 180 | BH-1 | ET-5 | 4.42 | 1.96 | (0.133, 0.090) | 24 |
| Comparative Experimental Example 181 | BH-1 | ET-6 | 4.59 | 1.59 | (0.133, 0.091) | 16 |
| Comparative Experimental Example 182 | BH-1 | ET-7 | 4.64 | 1.57 | (0.133, 0.091) | 15 |

TABLE 1-continued

| | Compound (BH) | Compound (Electron transport and injection layer) | Voltage (V@10 mA/cm²) | Efficiency (cd/A@10 mA/cm²) | Chromaticity coordinates (x, y) | $T_{90}$ (hr@20 mA/cm²) |
|---|---|---|---|---|---|---|
| Comparative Experimental Example 183 | BH-1 | ET-8 | 4.42 | 2.04 | (0.133, 0.090) | 28 |
| Comparative Experimental Example 184 | BH-1 | ET-9 | 4.73 | 1.55 | (0.133, 0.091) | 15 |
| Comparative Experimental Example 185 | BH-1 | ET-10 | 4.87 | 1.51 | (0.133, 0.091) | 29 |
| Comparative Experimental Example 186 | BH-1 | ET-11 | 5.16 | 1.49 | (0.133, 0.090) | 22 |
| Comparative Experimental Example 187 | BH-1 | ET-12 | 5.16 | 1.18 | (0.133, 0.091) | 6 |
| Comparative Experimental Example 188 | BH-1 | ET-13 | 4.66 | 2.89 | (0.133, 0.091) | 26 |
| Comparative Experimental Example 189 | BH-1 | ET-14 | 4.61 | 2.92 | (0.133, 0.090) | 23 |
| Comparative Experimental Example 190 | BH-1 | ET-15 | 4.89 | 2.83 | (0.133, 0.091) | 26 |
| Comparative Experimental Example 191 | BH-1 | ET-16 | 4.94 | 2.78 | (0.133, 0.091) | 26 |
| Comparative Experimental Example 192 | BH-1 | ET-17 | 4.99 | 2.69 | (0.133, 0.090) | 27 |
| Comparative Experimental Example 193 | BH-1 | ET-18 | 4.84 | 2.72 | (0.133, 0.091) | 27 |
| Comparative Experimental Example 194 | BH-1 | ET-19 | 4.86 | 1.57 | (0.133, 0.091) | 20 |
| Comparative Experimental Example 195 | BH-2 | ET-1 | 4.79 | 1.50 | (0.133, 0.092) | 13 |
| Comparative Experimental Example 196 | BH-2 | ET-2 | 4.69 | 1.49 | (0.133, 0.092) | 12 |
| Comparative Experimental Example 197 | BH-2 | ET-3 | 4.34 | 1.69 | (0.133, 0.091) | 16 |
| Comparative Experimental Example 198 | BH-2 | ET-4 | 4.38 | 1.68 | (0.133, 0.092) | 15 |
| Comparative Experimental Example 199 | BH-2 | ET-5 | 4.29 | 2.03 | (0.133, 0.092) | 37 |
| Comparative Experimental Example 200 | BH-2 | ET-6 | 4.47 | 1.64 | (0.133, 0.091) | 23 |
| Comparative Experimental Example 201 | BH-2 | ET-7 | 4.51 | 1.62 | (0.133, 0.092) | 23 |
| Comparative Experimental Example 202 | BH-2 | ET-8 | 4.30 | 2.12 | (0.133, 0.092) | 42 |
| Comparative Experimental Example 203 | BH-2 | ET-9 | 4.60 | 1.61 | (0.133, 0.091) | 22 |
| Comparative Experimental Example 204 | BH-2 | ET-10 | 4.74 | 1.56 | (0.133, 0.092) | 44 |
| Comparative Experimental Example 205 | BH-2 | ET-11 | 5.02 | 1.54 | (0.133, 0.092) | 33 |
| Comparative Experimental Example 206 | BH-2 | ET-12 | 5.02 | 1.22 | (0.133, 0.091) | 10 |
| Comparative Experimental Example 207 | BH-2 | ET-13 | 4.53 | 2.99 | (0.133, 0.092) | 39 |

TABLE 1-continued

| | Compound (BH) | Compound (Electron transport and injection layer) | Voltage (V@10 mA/cm$^2$) | Efficiency (cd/A@10 mA/cm$^2$) | Chromaticity coordinates (x, y) | $T_{90}$ (hr@20 mA/cm$^2$) |
|---|---|---|---|---|---|---|
| Comparative Experimental Example 208 | BH-2 | ET-14 | 4.49 | 3.02 | (0.133, 0.092) | 35 |
| Comparative Experimental Example 209 | BH-2 | ET-15 | 4.75 | 2.93 | (0.133, 0.091) | 39 |
| Comparative Experimental Example 210 | BH-2 | ET-16 | 4.80 | 2.87 | (0.133, 0.092) | 40 |
| Comparative Experimental Example 211 | BH-2 | ET-17 | 4.85 | 2.78 | (0.133, 0.092) | 41 |
| Comparative Experimental Example 212 | BH-2 | ET-18 | 4.71 | 2.81 | (0.133, 0.091) | 41 |
| Comparative Experimental Example 213 | BH-2 | ET-19 | 4.73 | 1.63 | (0.133, 0.092) | 30 |
| Comparative Experimental Example 214 | BH-3 | ET-1 | 4.92 | 1.45 | (0.133, 0.091) | 11 |
| Comparative Experimental Example 215 | BH-3 | ET-2 | 4.82 | 1.44 | (0.133, 0.090) | 10 |
| Comparative Experimental Example 216 | BH-3 | ET-3 | 4.46 | 1.64 | (0.133, 0.091) | 13 |
| Comparative Experimental Example 217 | BH-3 | ET-4 | 4.50 | 1.62 | (0.133, 0.091) | 13 |
| Comparative Experimental Example 218 | BH-3 | ET-5 | 4.42 | 1.96 | (0.133, 0.090) | 31 |
| Comparative Experimental Example 219 | BH-3 | ET-6 | 4.59 | 1.59 | (0.133, 0.091) | 20 |
| Comparative Experimental Example 220 | BH-3 | ET-7 | 4.64 | 1.57 | (0.133, 0.091) | 19 |
| Comparative Experimental Example 221 | BH-3 | ET-8 | 4.42 | 2.04 | (0.133, 0.090) | 35 |
| Comparative Experimental Example 222 | BH-3 | ET-9 | 4.73 | 1.55 | (0.133, 0.091) | 19 |
| Comparative Experimental Example 223 | BH-3 | ET-10 | 4.87 | 1.51 | (0.133, 0.091) | 37 |
| Comparative Experimental Example 224 | BH-3 | ET-11 | 5.16 | 1.49 | (0.133, 0.090) | 28 |
| Comparative Experimental Example 225 | BH-3 | ET-12 | 5.16 | 1.18 | (0.133, 0.091) | 8 |
| Comparative Experimental Example 226 | BH-3 | ET-13 | 4.66 | 2.89 | (0.133, 0.091) | 32 |
| Comparative Experimental Example 227 | BH-3 | ET-14 | 4.61 | 2.92 | (0.133, 0.090) | 29 |
| Comparative Experimental Example 228 | BH-3 | ET-15 | 4.89 | 2.83 | (0.133, 0.091) | 33 |
| Comparative Experimental Example 229 | BH-3 | ET-16 | 4.94 | 2.78 | (0.133, 0.091) | 33 |
| Comparative Experimental Example 230 | BH-3 | ET-17 | 4.99 | 2.69 | (0.133, 0.090) | 34 |
| Comparative Experimental Example 231 | BH-3 | ET-18 | 4.84 | 2.72 | (0.133, 0.091) | 34 |
| Comparative Experimental Example 232 | BH-3 | ET-19 | 4.86 | 1.57 | (0.133, 0.091) | 25 |

TABLE 1-continued

| | Compound (BH) | Compound (Electron transport and injection layer) | Voltage (V@10 mA/cm$^2$) | Efficiency (cd/A@10 mA/cm$^2$) | Chromaticity coordinates (x, y) | $T_{90}$ (hr@20 mA/cm$^2$) |
|---|---|---|---|---|---|---|
| Comparative Experimental Example 233 | BH-4 | ET-1 | 4.45 | 1.57 | (0.133, 0.092) | 20 |
| Comparative Experimental Example 234 | BH-4 | ET-2 | 4.36 | 1.56 | (0.133, 0.091) | 19 |
| Comparative Experimental Example 235 | BH-4 | ET-3 | 4.03 | 1.78 | (0.133, 0.092) | 23 |
| Comparative Experimental Example 236 | BH-4 | ET-4 | 4.07 | 1.76 | (0.133, 0.092) | 23 |
| Comparative Experimental Example 237 | BH-4 | ET-5 | 3.99 | 2.13 | (0.133, 0.091) | 55 |
| Comparative Experimental Example 238 | BH-4 | ET-6 | 4.16 | 1.72 | (0.133, 0.092) | 35 |
| Comparative Experimental Example 239 | BH-4 | ET-7 | 4.20 | 1.71 | (0.133, 0.092) | 34 |
| Comparative Experimental Example 240 | BH-4 | ET-8 | 4.00 | 2.22 | (0.133, 0.091) | 63 |
| Comparative Experimental Example 241 | BH-4 | ET-9 | 4.28 | 1.69 | (0.133, 0.092) | 34 |
| Comparative Experimental Example 242 | BH-4 | ET-10 | 4.40 | 1.64 | (0.133, 0.092) | 66 |
| Comparative Experimental Example 243 | BH-4 | ET-11 | 4.67 | 1.62 | (0.133, 0.091) | 50 |
| Comparative Experimental Example 244 | BH-4 | ET-12 | 4.67 | 1.28 | (0.133, 0.092) | 14 |
| Comparative Experimental Example 245 | BH-4 | ET-13 | 4.21 | 3.14 | (0.133, 0.092) | 58 |
| Comparative Experimental Example 246 | BH-4 | ET-14 | 4.17 | 3.17 | (0.133, 0.091) | 52 |
| Comparative Experimental Example 247 | BH-4 | ET-15 | 4.42 | 3.08 | (0.133, 0.092) | 59 |
| Comparative Experimental Example 248 | BH-4 | ET-16 | 4.47 | 3.01 | (0.133, 0.092) | 60 |
| Comparative Experimental Example 249 | BH-4 | ET-17 | 4.51 | 2.92 | (0.133, 0.091) | 61 |
| Comparative Experimental Example 250 | BH-4 | ET-18 | 4.38 | 2.95 | (0.133, 0.092) | 61 |
| Comparative Experimental Example 251 | BH-4 | ET-19 | 4.39 | 1.71 | (0.133, 0.092) | 45 |

As shown in Table 1, the compound of Chemical Formula 1 of the present disclosure can be used in an organic material layer corresponding to the light emitting layer of an organic light emitting device.

As shown in Table 1, the compound of Chemical Formula 2 or 3 of the present disclosure can be used in an organic material layer capable of simultaneously performing electron injection and electron transport of an organic light emitting device.

When comparing Experimental Examples 1 to 100 and Comparative Experimental Examples 96 to 175 of Table 1, it was confirmed that the organic light emitting device including the heterocyclic compound of Chemical Formula 1 of the present disclosure had significantly superior efficiency and lifespan than the organic light emitting device including a compound in which only an aryl group is substituted in the light emitting layer.

When comparing Experimental Examples 1 to 100 and Comparative Experimental Examples, 1 to 11, 20 to 30, 39 to 49, 58 to 68, 77 to 87, 176 to 186, 195 to 205, 214 to 224, and 233 to 243 of Table 1, it was confirmed that the organic light emitting device including the heterocyclic compound of Chemical Formula 2 or 3 of the present disclosure had significantly superior efficiency and lifespan than the organic light emitting device including a compound in which a phenyl group less than quaterphenyl is substituted between $Ar_2$ and $Ar_3$.

When comparing Experimental Examples 1 to 100 and Comparative Experimental Examples 12 to 17, 31 to 36, 50 to 55, 69 to 74, 88 to 93, 187 to 192, 206 to 211, 225 to 230, and 244 to 249 of Table 1, it was confirmed that the organic light emitting device including the heterocyclic compound of Chemical Formula 2 or 3 of the present disclosure had significantly superior efficiency and lifespan than the organic light emitting device including a compound in which quaterphenyl is substituted at a different substitution position from the present disclosure.

When comparing Experimental Examples 1 to 100 and Comparative Experimental Examples 18, 37, 56, 75, 94, 193, 212, 231, 250 of Table 1, it was confirmed that the organic light emitting device including the heterocyclic compound of Chemical Formula 2 or 3 of the present disclosure had significantly superior efficiency and lifespan than the organic light emitting device including a compound in which naphthalene is substituted between $Ar_2$ and $Ar_3$.

When comparing Experimental Examples 1 to 100 and Comparative Experimental Examples 19, 38, 57, 76, 95, 194, 213, 232, 251 of Table 1, it was confirmed that the organic light emitting device including the heterocyclic compound of Chemical Formula 2 or 3 of the present disclosure had significantly superior efficiency and lifespan than the organic light emitting device including a compound in which heteroaryl is additionally substituted to quaterphenylene.

DESCRIPTION OF SYMBOLS

| | |
|---|---|
| 1: Substrate | 2: Anode |
| 3: Hole transport layer | 4: Light emitting layer |
| 5: Electron transport and injection layer | 6: Cathode |
| 7: Hole injection layer | 8: Electron blocking layer |
| 9: Hole blocking layer | |

The invention claimed is:

1. An organic light emitting device, comprising:

an anode;

a hole transport layer;

a light emitting layer;

an electron transport layer, an electron injection layer, or an electron transport and injection layer; and a cathode, wherein the light emitting layer comprises a compound of the following Chemical Formula 1, and the electron transport layer, the electron injection layer, or the electron transport and injection layer comprises at least one compound of the following Chemical Formula 2 and Chemical Formula 3:

[Chemical Formula 1]

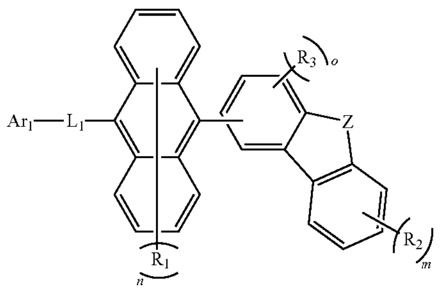

wherein in Chemical Formula 1:

Z is O or S;

$L_1$ is a direct bond or a substituted or unsubstituted $C_{6-60}$ arylene;

$Ar_1$ is a substituted or unsubstituted $C_{6-60}$ aryl;

$R_1$ to $R_3$ are each independently hydrogen, deuterium, or a substituted or unsubstituted $C_{6-60}$ aryl, or two adjacent substituents thereof are combined to form a benzene ring;

n is an integer of 0 to 8;

m is an integer of 0 to 4; and o is an integer of 0 to 3;

[Chemical Formula 2]

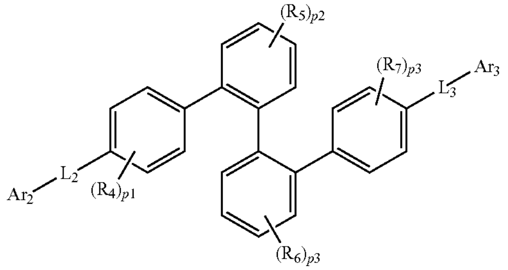

[Chemical Formula 3]

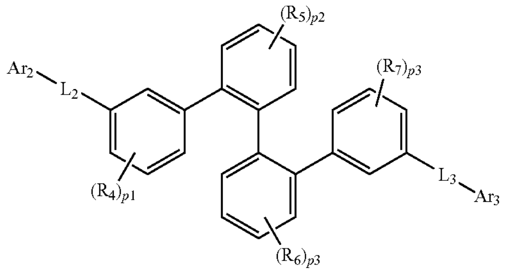

wherein in Chemical Formula 2 or 3:

$R_4$ to $R_7$ are each independently hydrogen or deuterium;

p1 to p4 are an integer of 1 to 4;

$L_2$ and $L_3$ are each independently a direct bond or a substituted or unsubstituted $C_{6-60}$ arylene; and $Ar_2$ and $Ar_3$ are each independently a substituent of Chemical Formula 4:

[Chemical Formula 4]

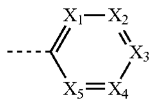

wherein in Chemical Formula 4:

$X_1$ to $X_5$ are each independently N or $C(R_8)$, wherein at least two of $X_1$ to $X_5$ are N; and each $R_8$ is independently hydrogen, deuterium, a substituted or unsubstituted $C_{1-20}$ alkyl, a substituted or unsubstituted $C_{6-60}$ aryl, or a substituted or unsubstituted $C_{2-60}$ heteroaryl containing at least one heteroatom selected from the group consisting of N, O and S, or two adjacent $R_8$s combine to form a benzene ring.

2. The organic light emitting device of claim 1, wherein $L_1$ is a direct bond, phenylene, biphenylene, or naphthylene, and the phenylene, biphenylene, or naphthylene is each independently unsubstituted or substituted with deuterium.

3. The organic light emitting device of claim 1, wherein $Ar_1$ is phenyl, biphenylyl, naphthyl, or phenanthrenyl, and the phenyl, biphenylyl, naphthyl, or phenanthrenyl is each independently unsubstituted or substituted with deuterium.

4. The organic light emitting device of claim 1, wherein $R_1$ to $R_3$ are each independently hydrogen, deuterium, phenyl, or naphthyl, or two adjacent substituents thereof combine to form a benzene ring, and the phenyl, naphthyl, or benzene ring is each independently unsubstituted or substituted with deuterium.

5. The organic light emitting device of claim 1, wherein:

each $R_1$ is independently hydrogen or deuterium;

each $R_2$ or $R_3$ is independently hydrogen, deuterium, phenyl, or naphthyl, or two adjacent substituents thereof combine to form a benzene ring, and the phenyl, naphthyl, or benzene ring is each independently unsubstituted or substituted with deuterium.

6. The organic light emitting device of claim 1, wherein the compound of Chemical Formula 1 contains at least one deuterium.

7. The organic light emitting device of claim 1, wherein the compound of Chemical Formula 1 is any one compound selected from the group consisting of the following compounds:

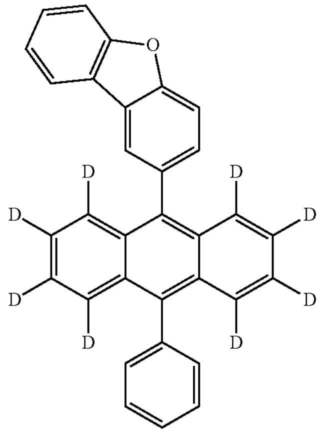

-continued

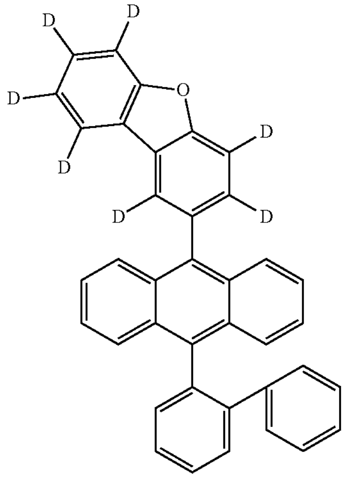

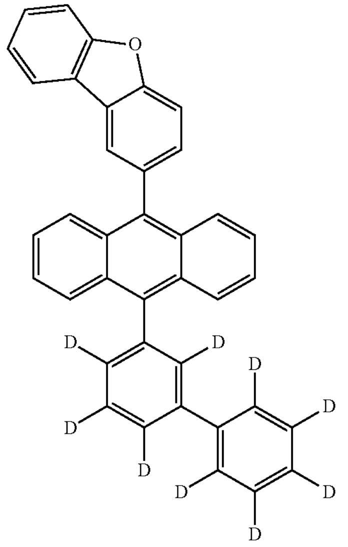

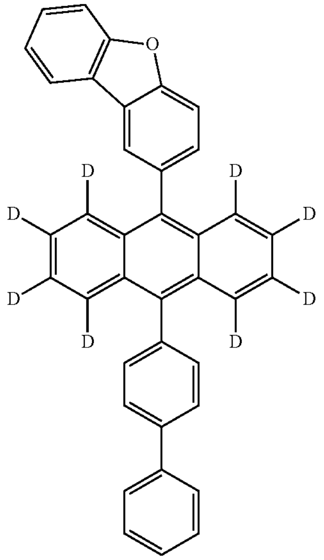

-continued
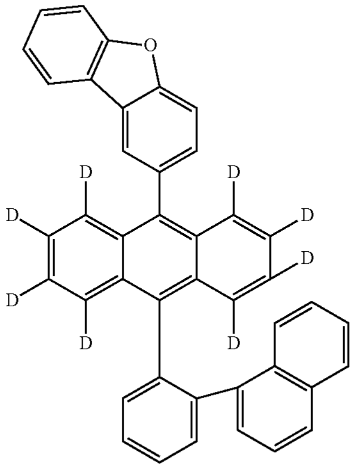
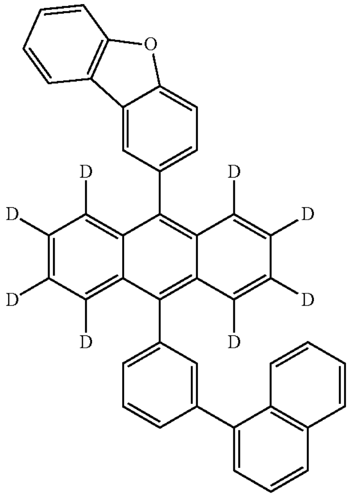
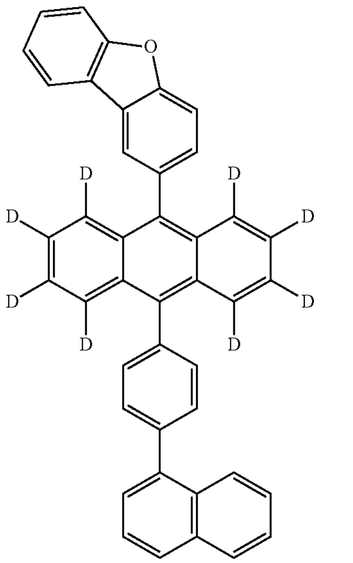
-continued
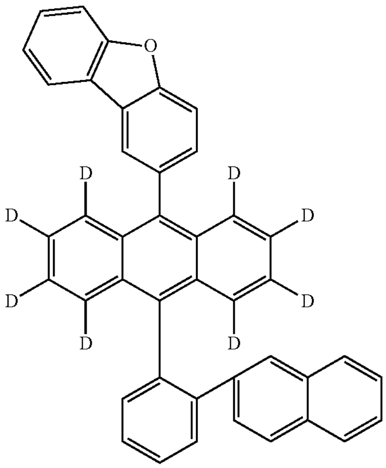
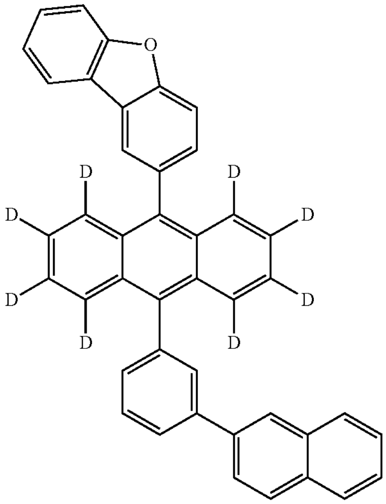
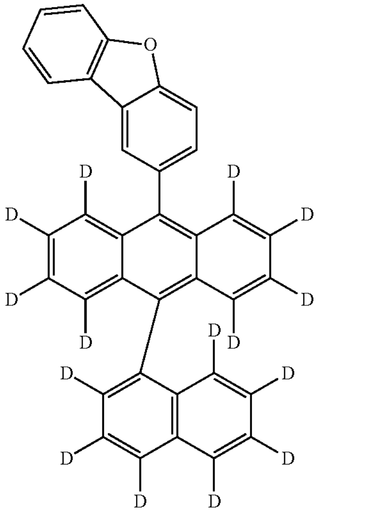

-continued
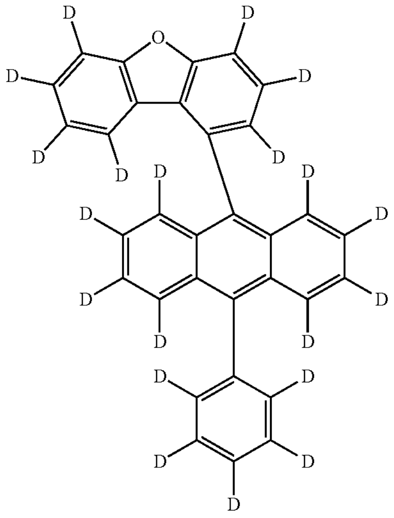
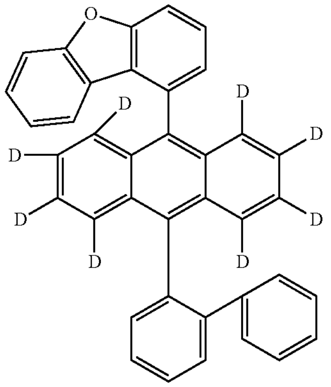
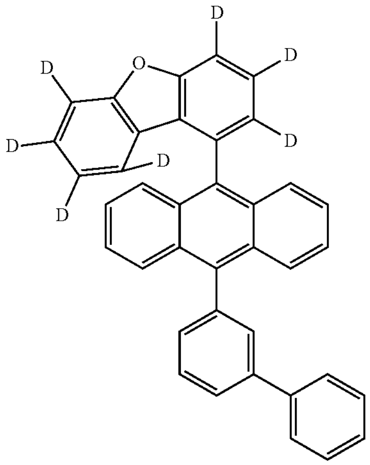
-continued
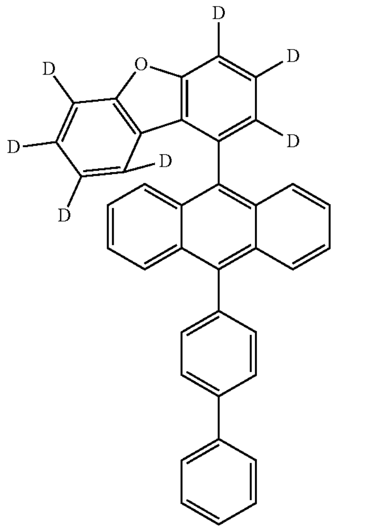
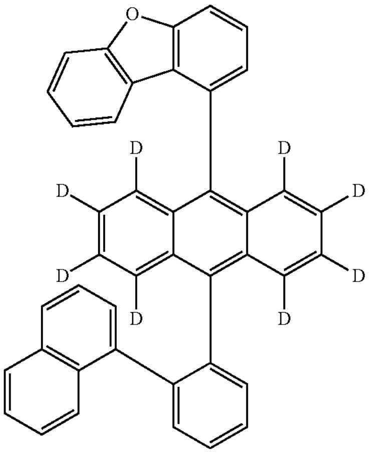
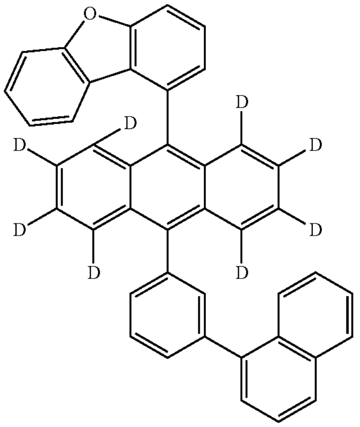

-continued
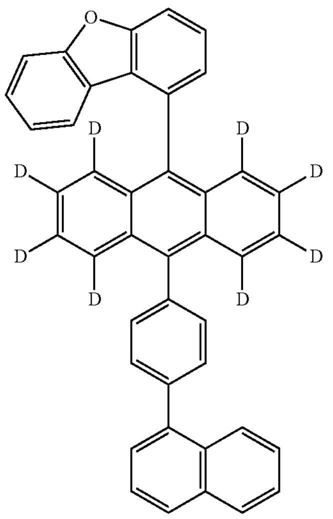
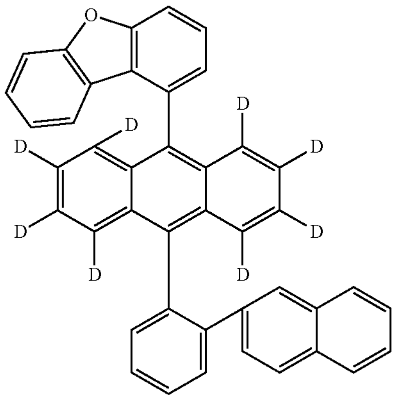
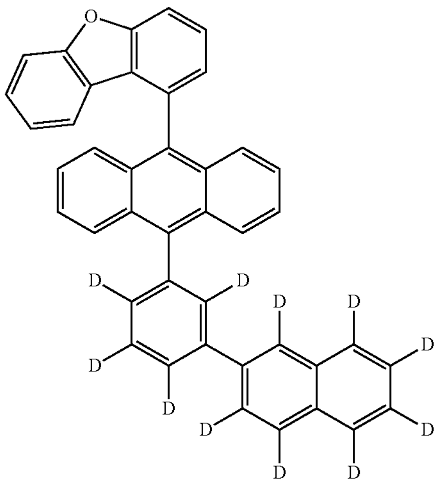
-continued
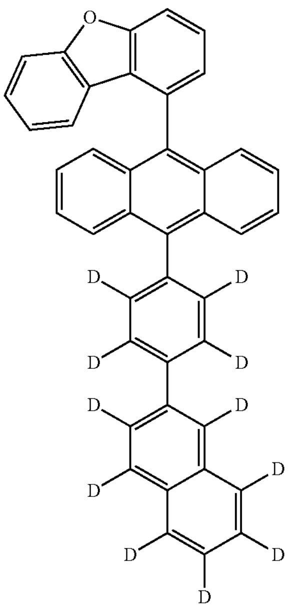
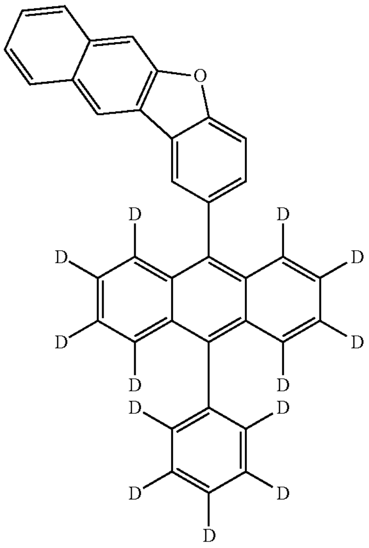
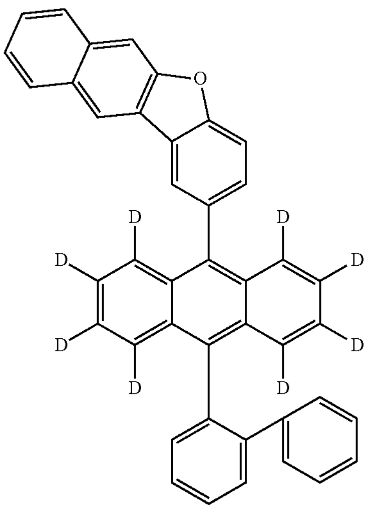

-continued
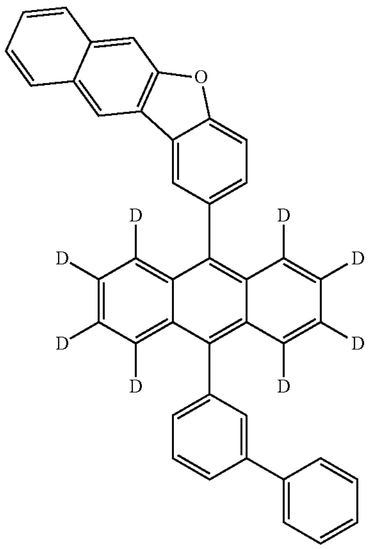
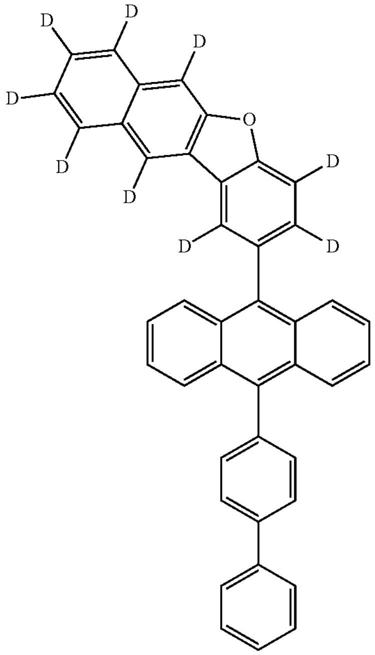
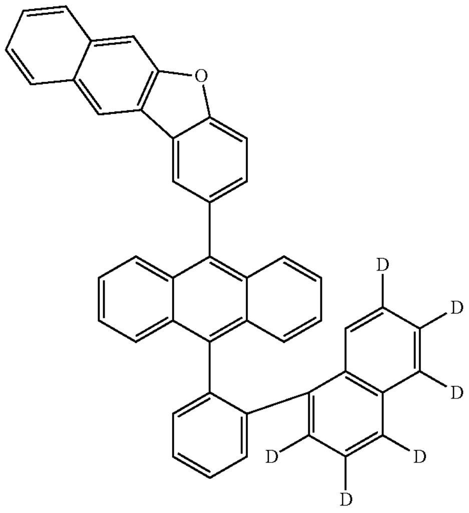
-continued
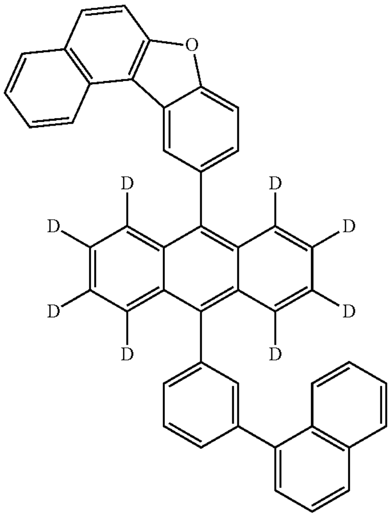
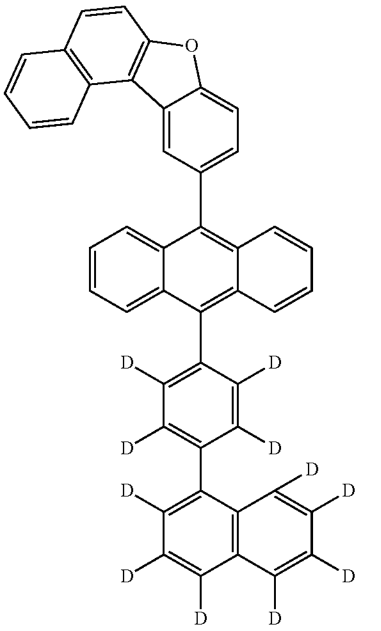
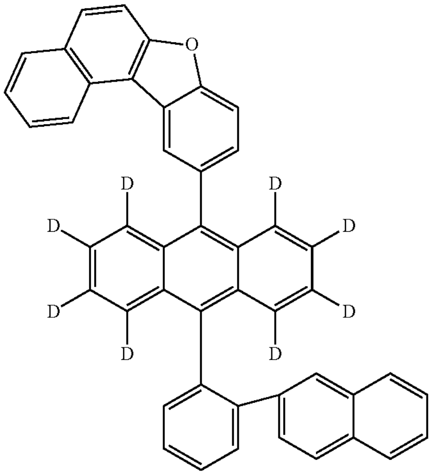

-continued
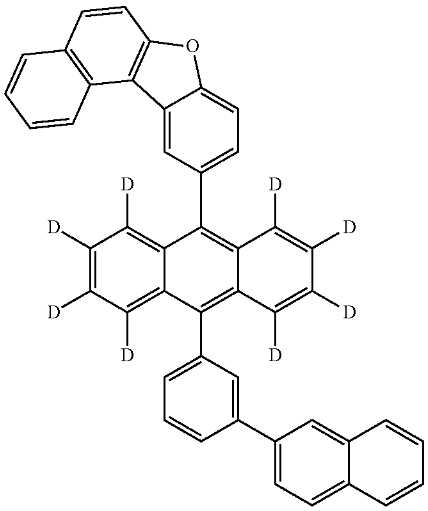
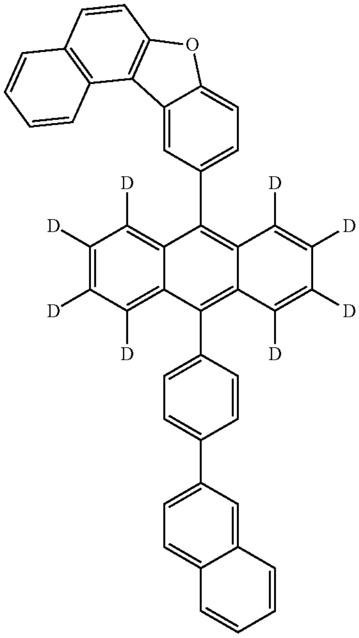
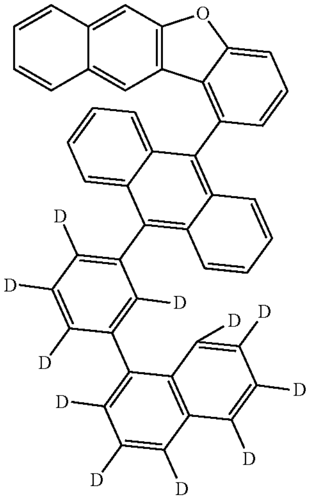
-continued
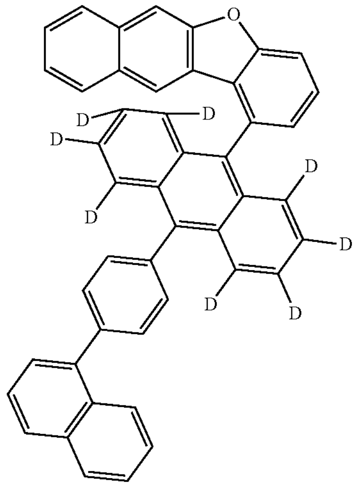
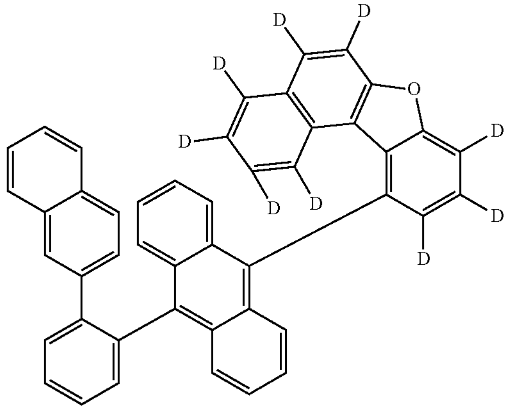
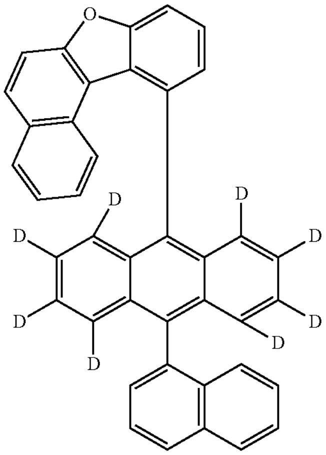

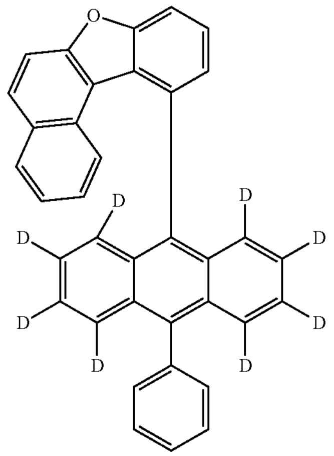
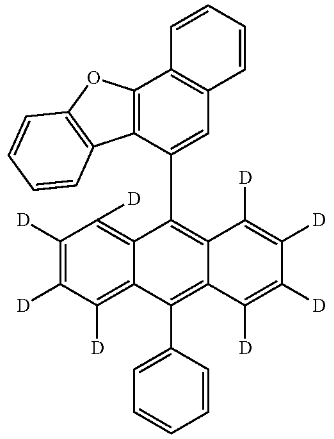
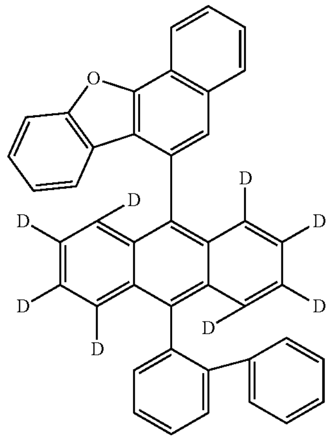
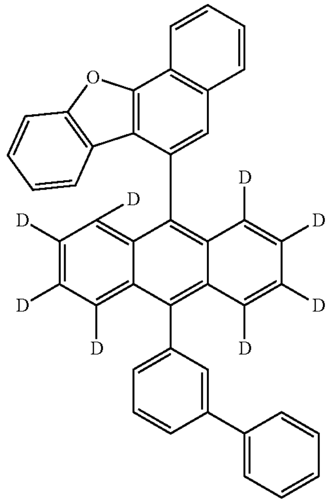
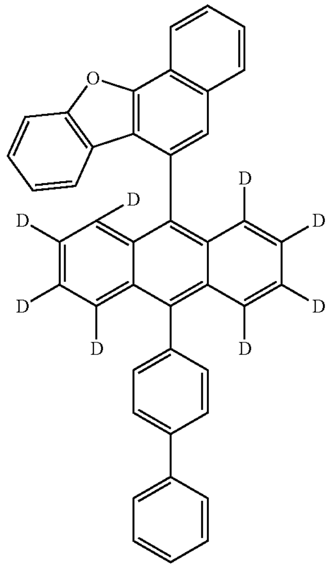
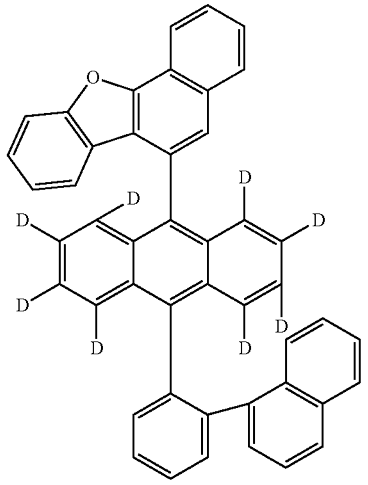

-continued
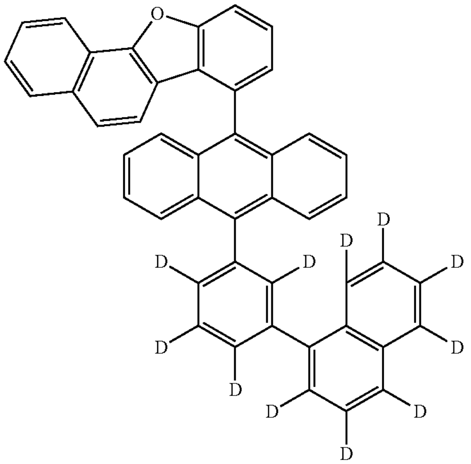
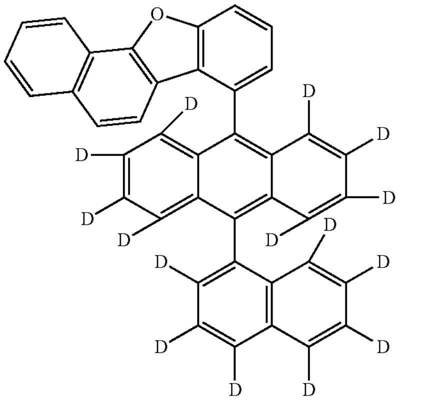
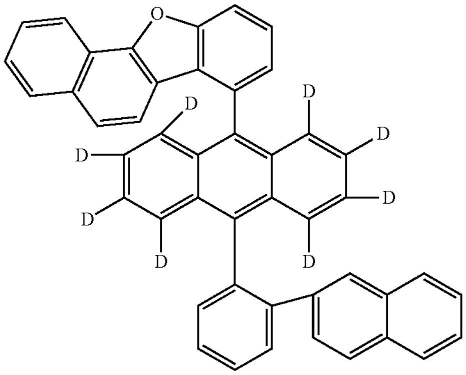 [SMILES: [2H]c1c([2H])c([2H])c2c(-c3cccc4oc5c6ccccc6ccc5c34)c3c([2H])c([2H])c([2H])c([2H])c3c(-c3ccccc3-c3ccc4ccccc4c3)c2c1[2H]]
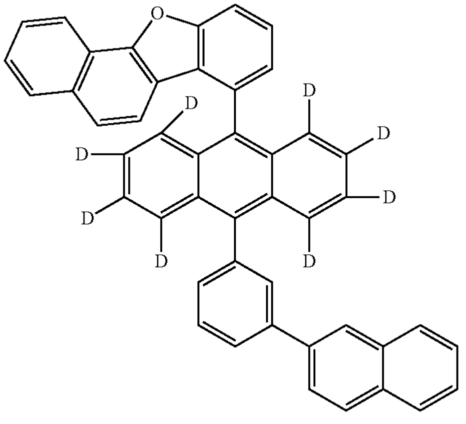
-continued
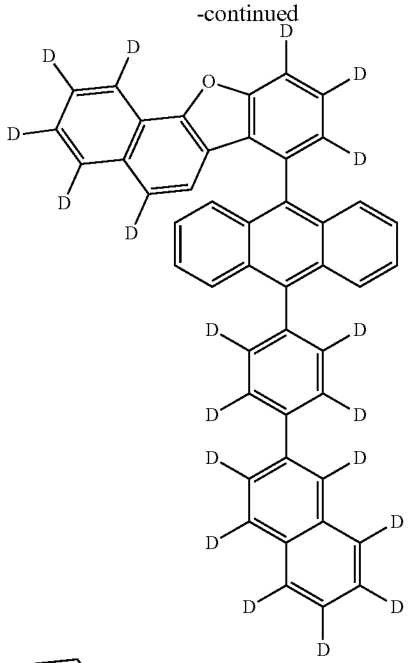
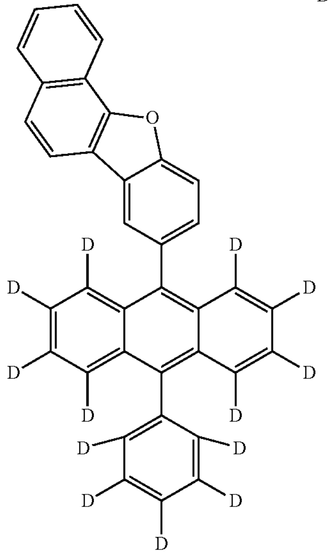
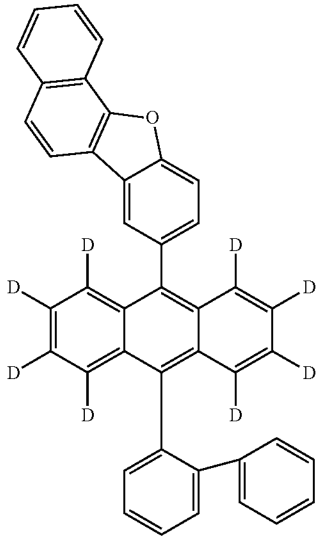

-continued
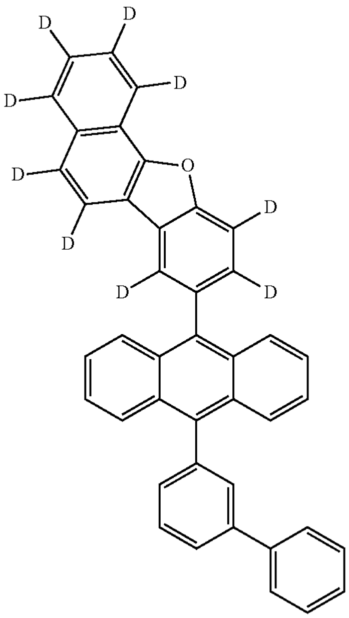
-continued
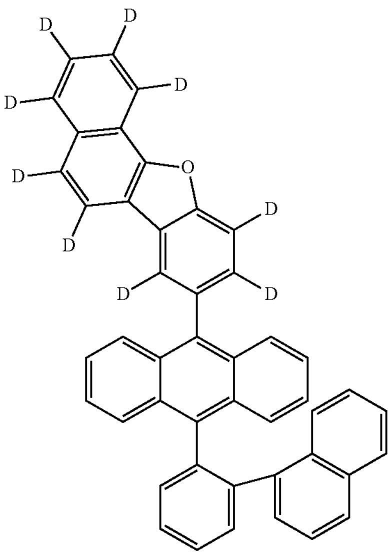
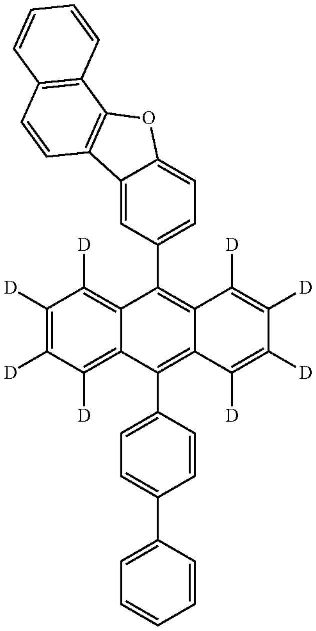
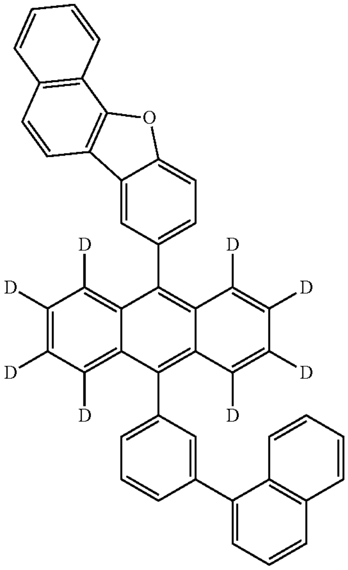

-continued
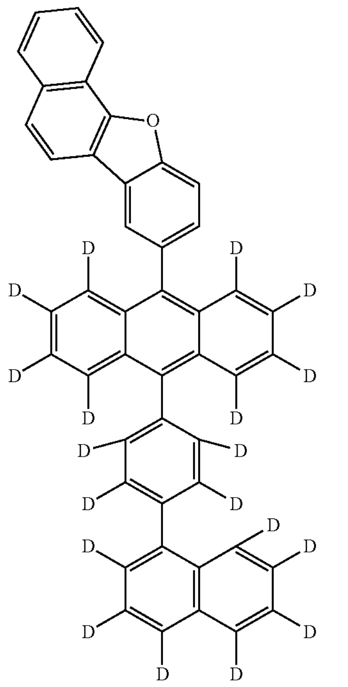
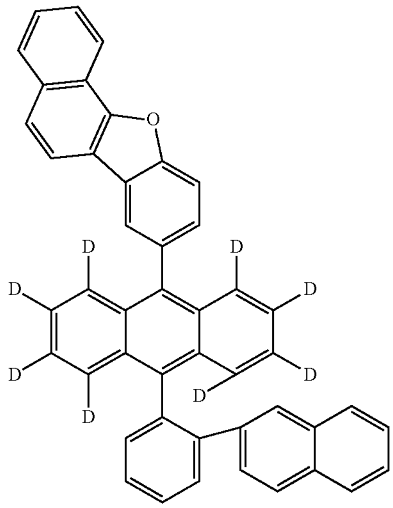
-continued
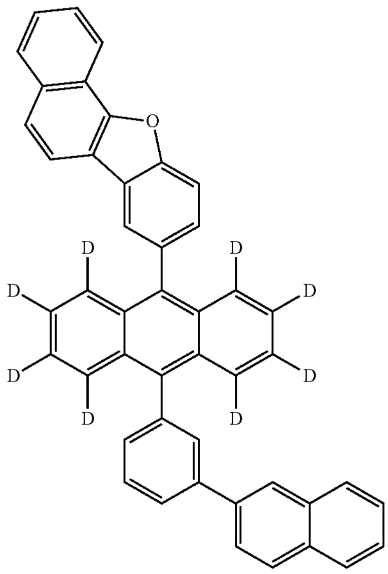
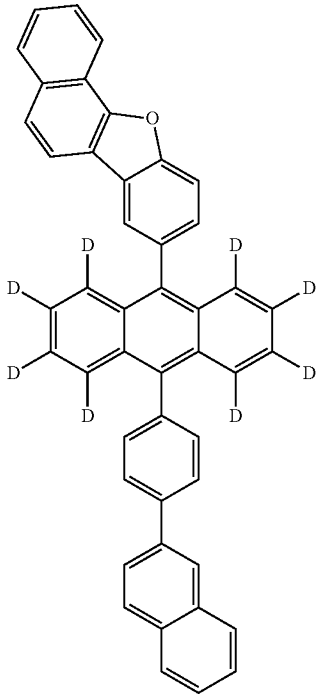
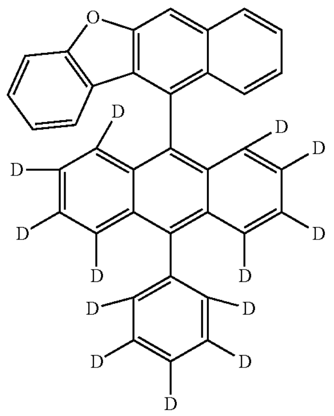

-continued
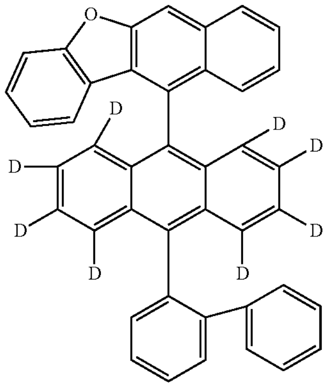
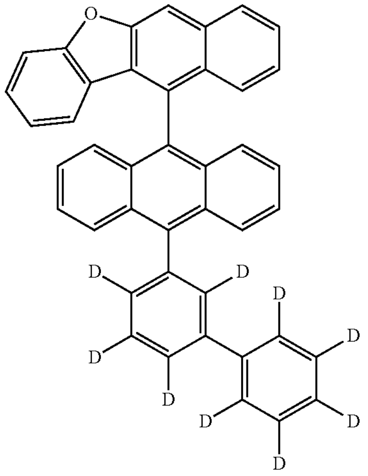
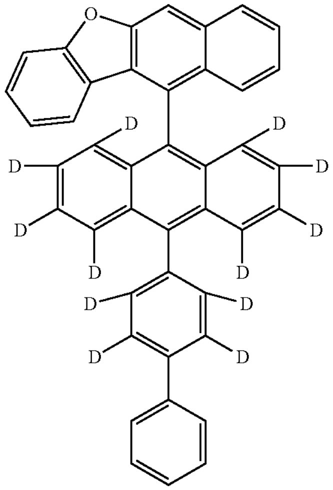
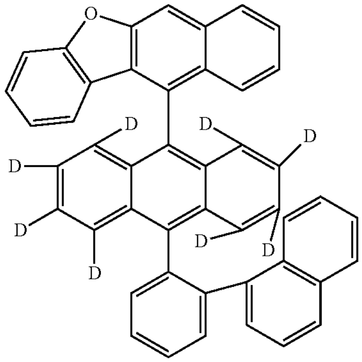
-continued
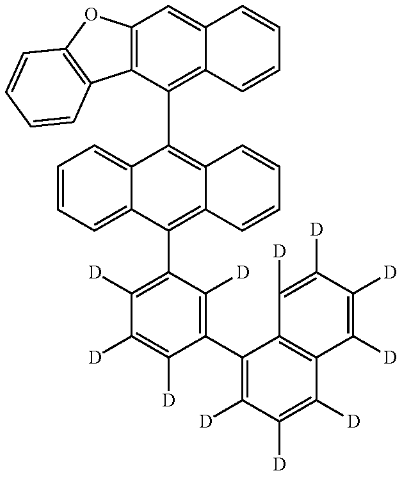
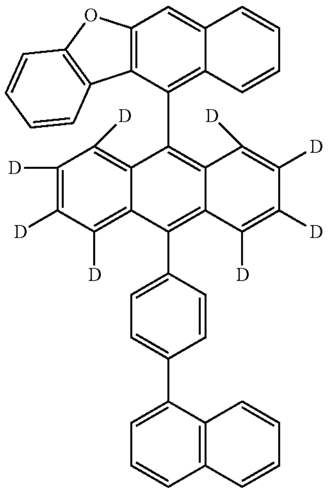
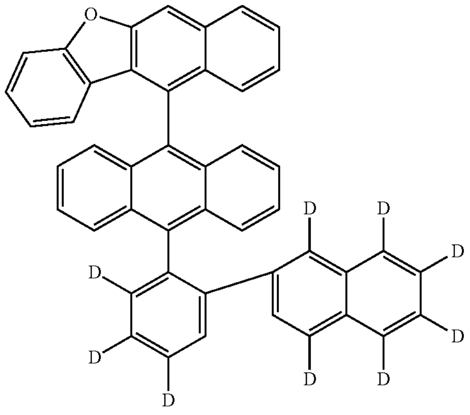

-continued
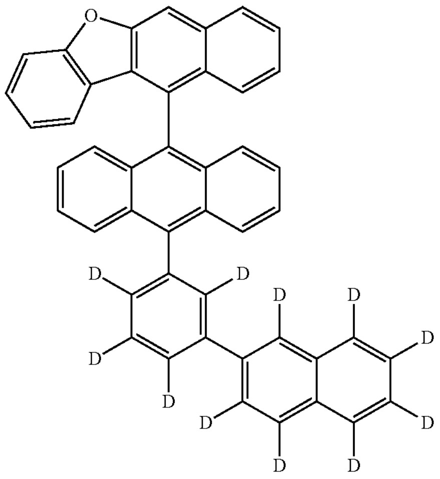
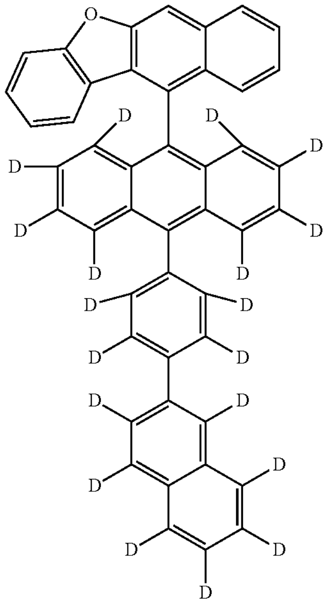
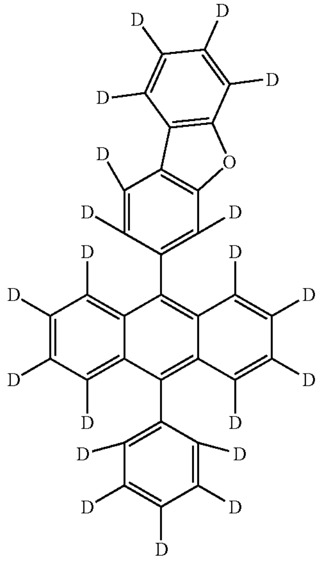 [SMILES: [2H]c1c([2H])c([2H])c(-c2c3c([2H])c([2H])c([2H])c([2H])c3c(-c3c([2H])c([2H])c4c(sc5c([2H])c([2H])c([2H])c([2H])c54)c3[2H])c3c([2H])c([2H])c([2H])c([2H])c23)c([2H])c1[2H]]
-continued
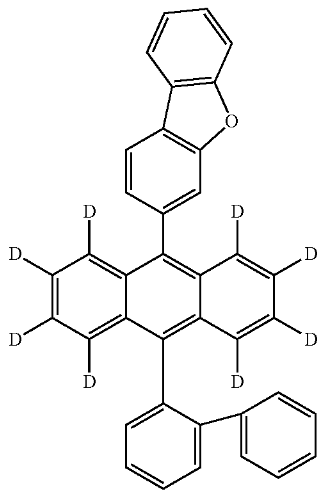
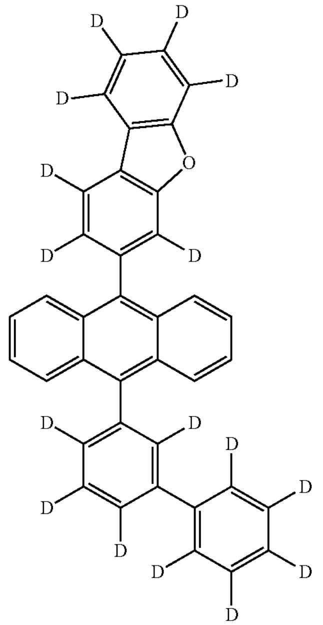
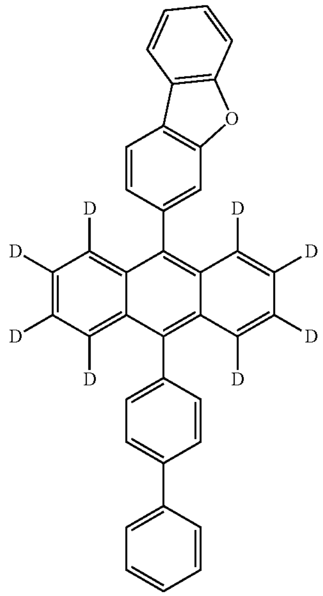

-continued
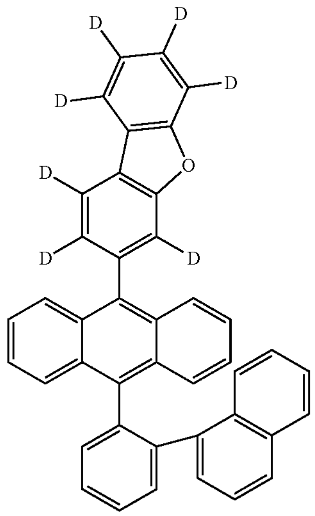
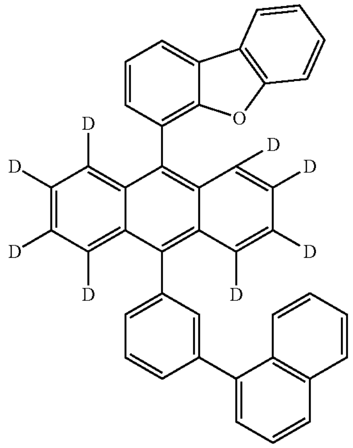
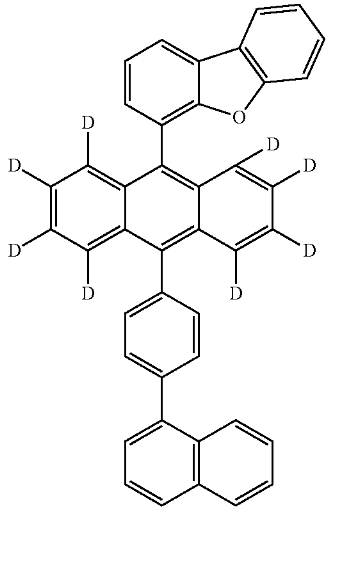
-continued
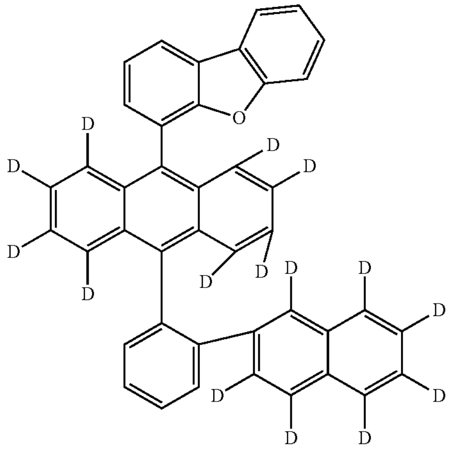
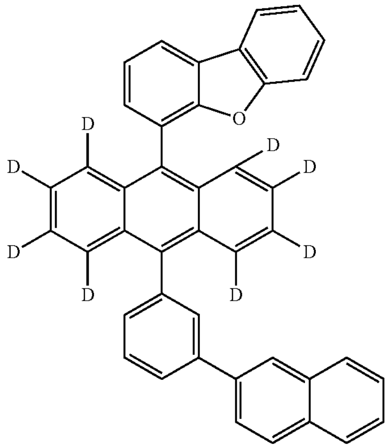
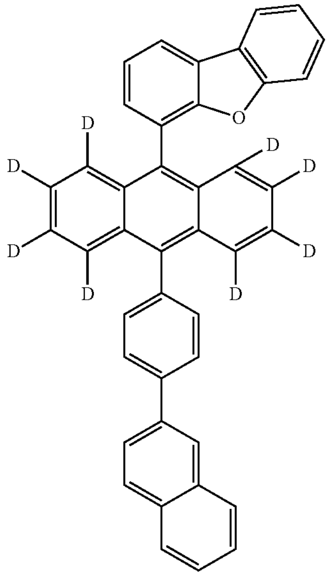

-continued
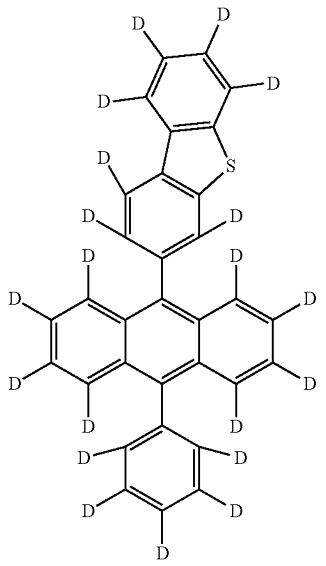
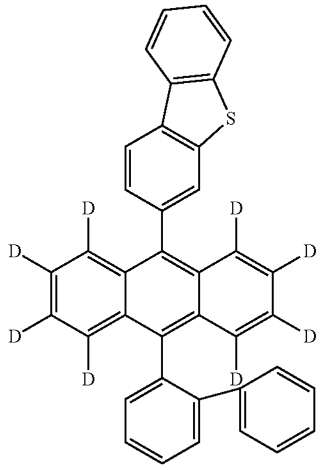
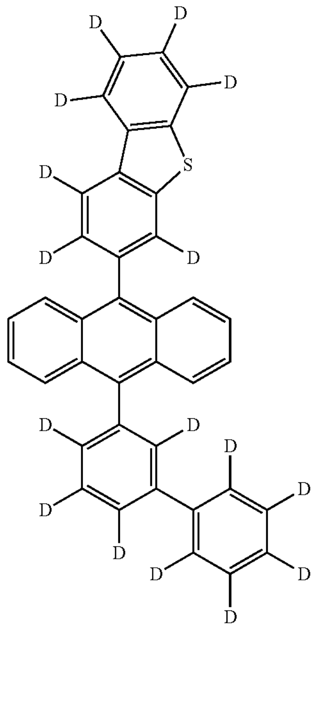
-continued
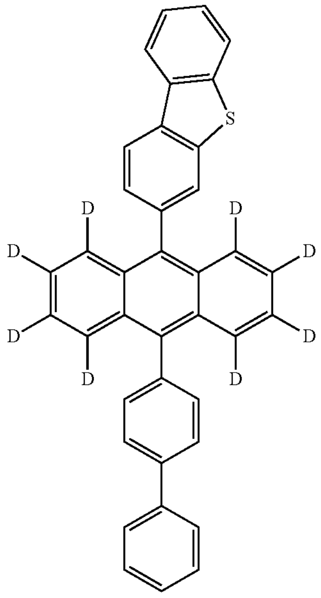
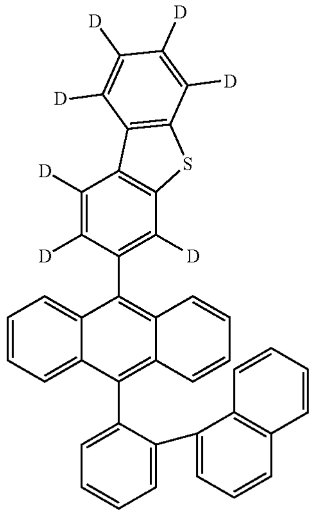
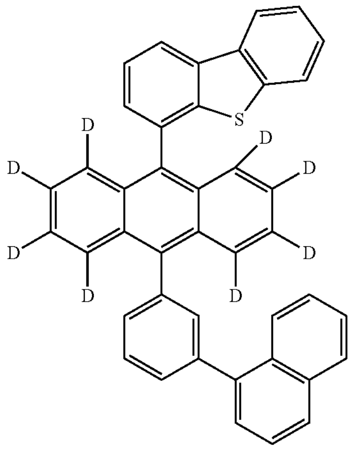

-continued
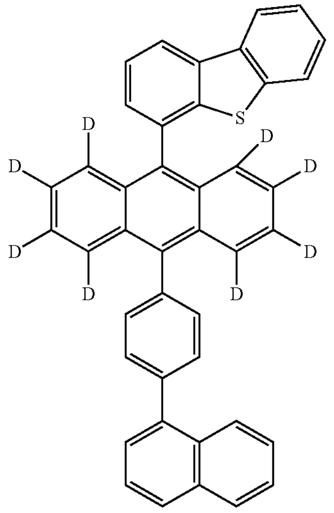
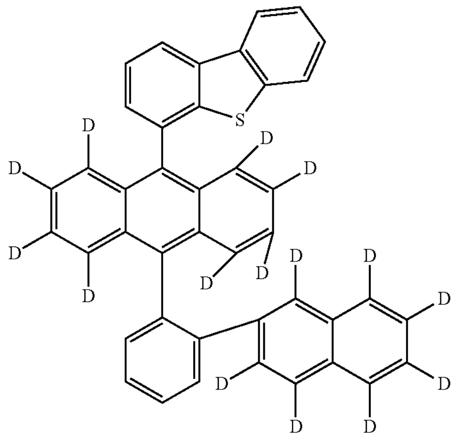
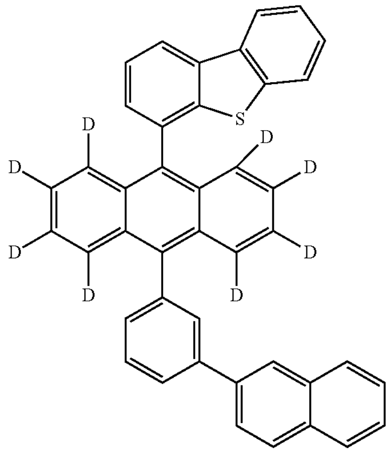
-continued
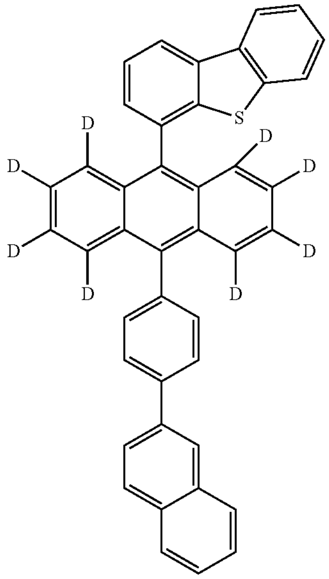
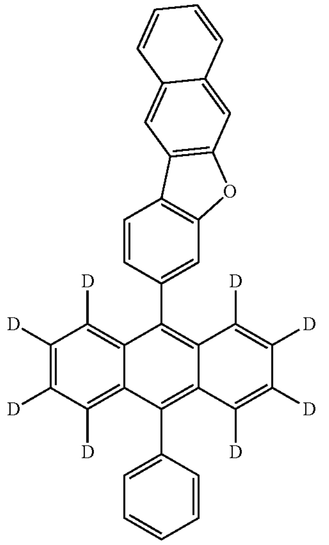
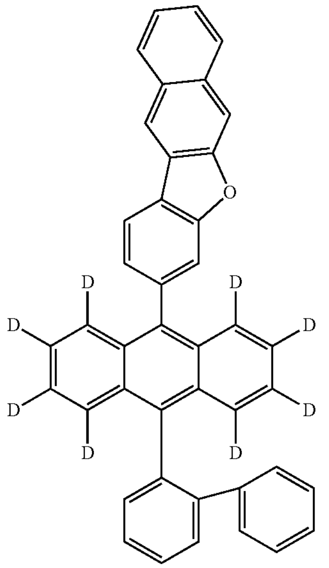

-continued
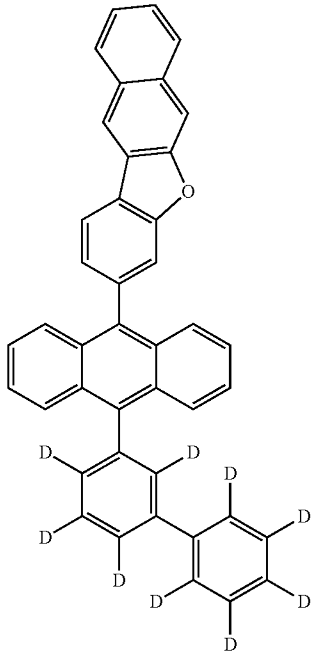
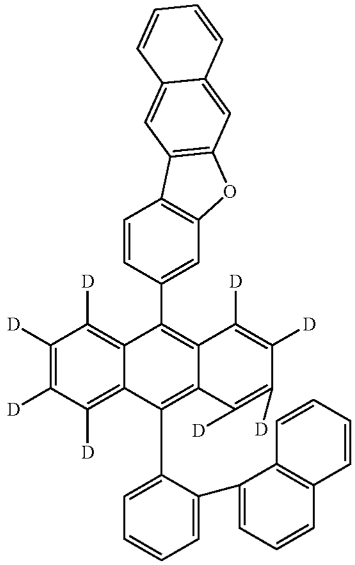
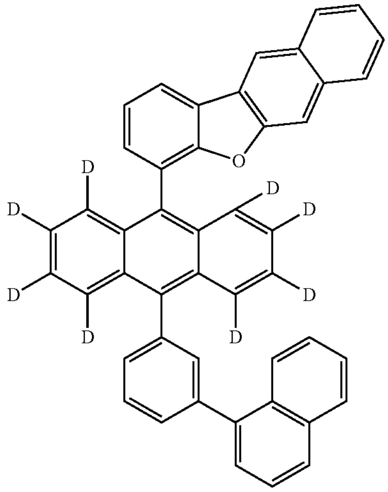
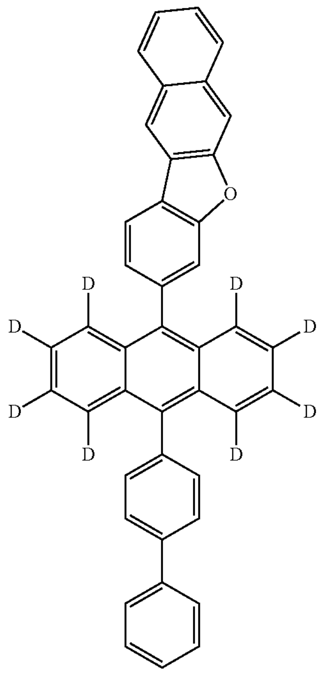
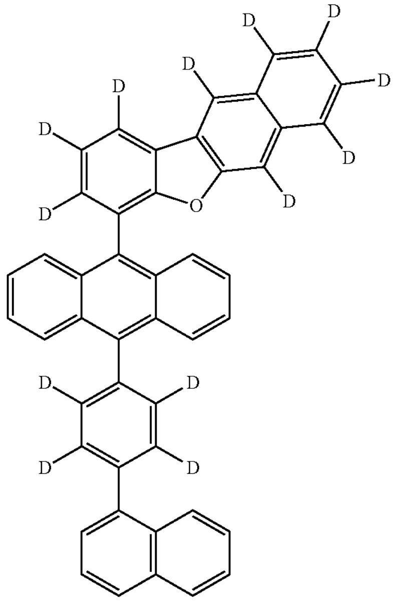
-continued -continued
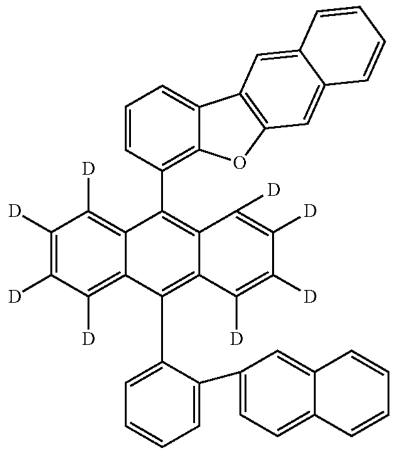
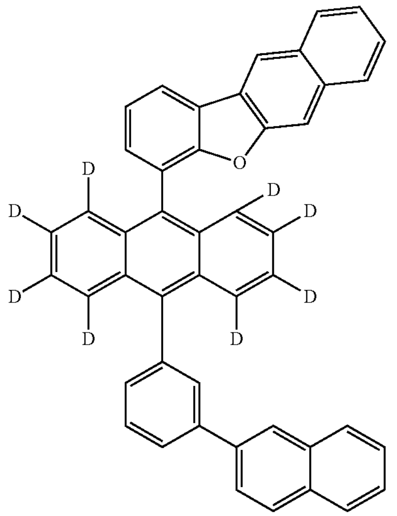
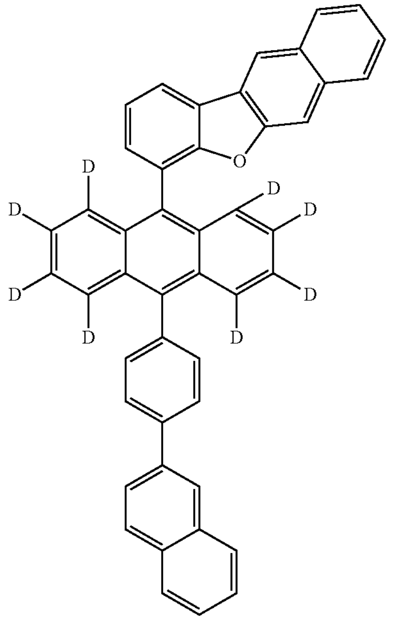
-continued
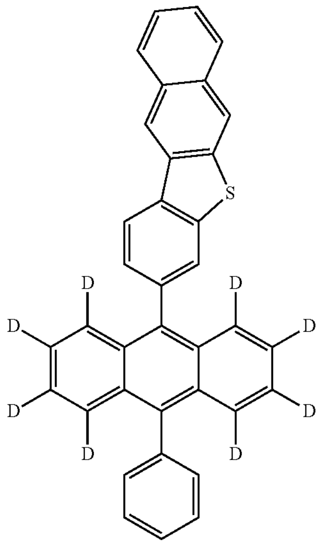
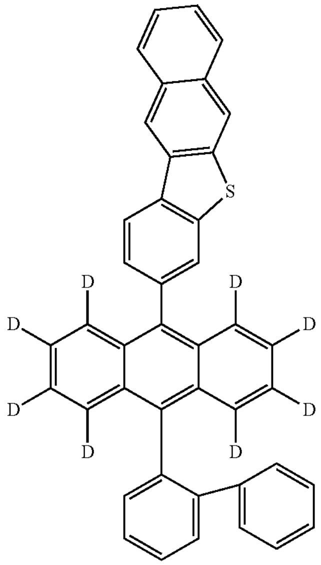

-continued
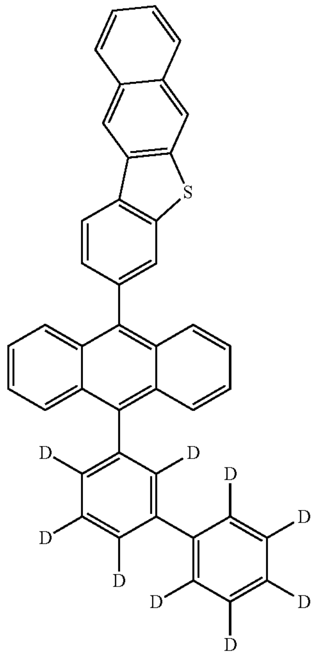
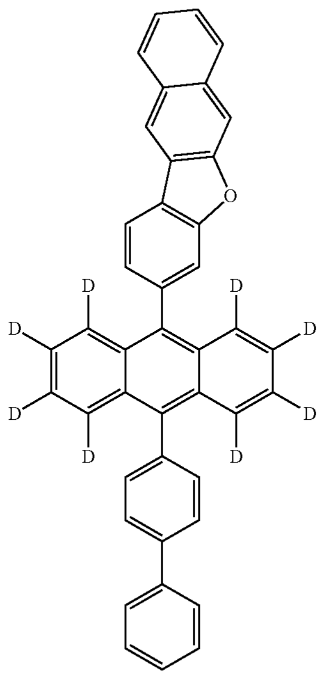
-continued
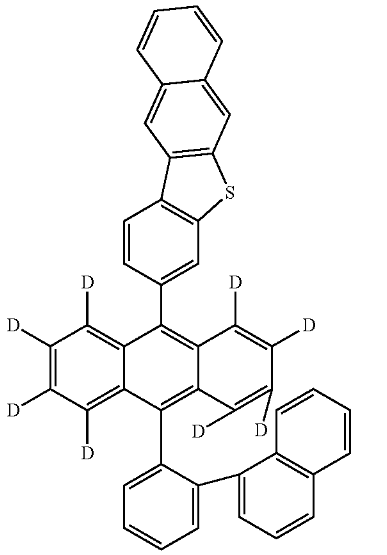
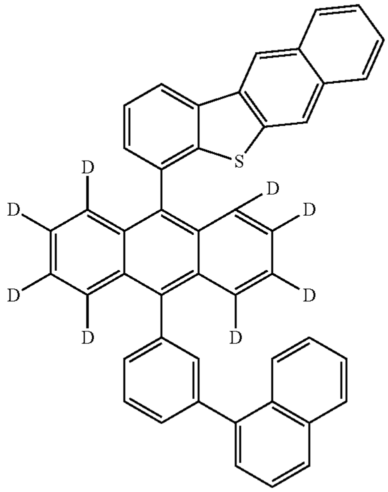
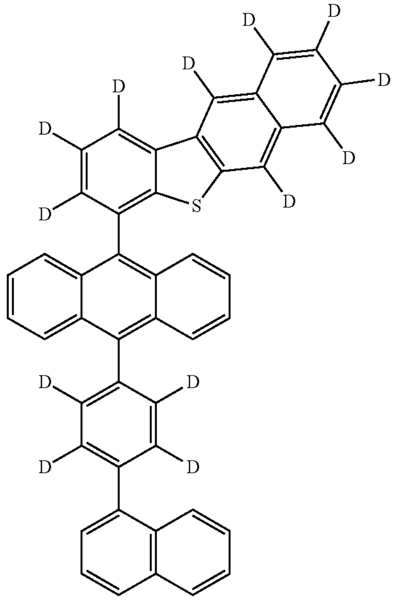

-continued
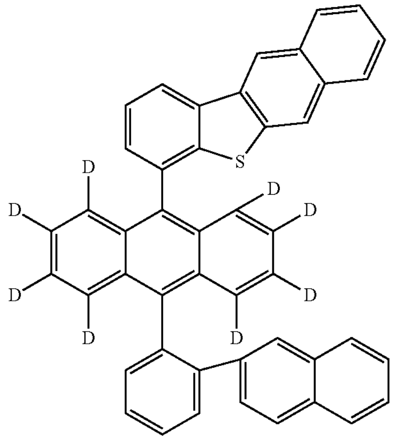
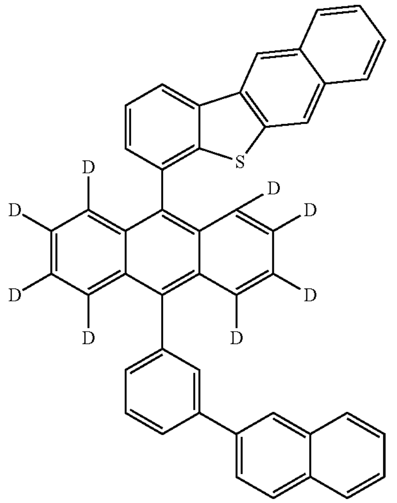
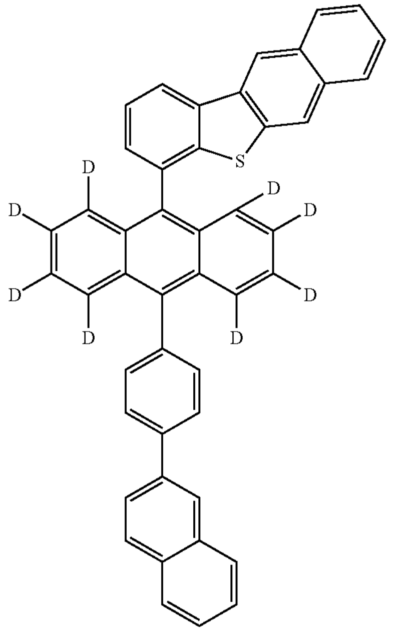
-continued
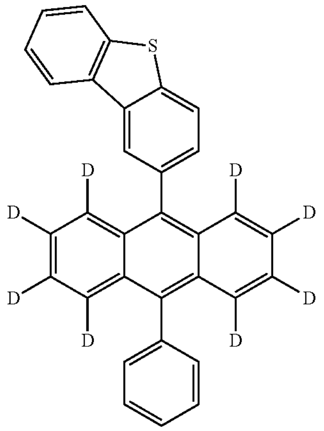
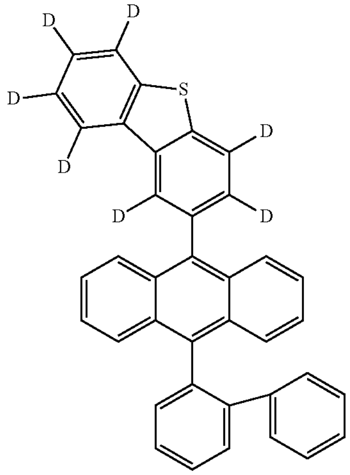
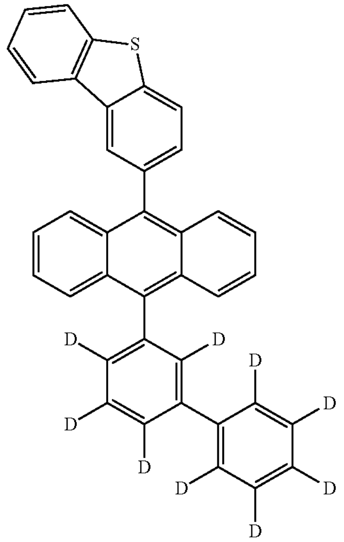

-continued
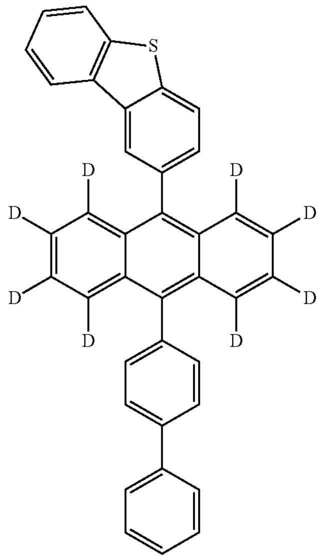
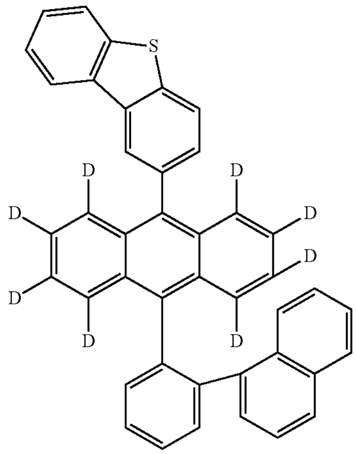
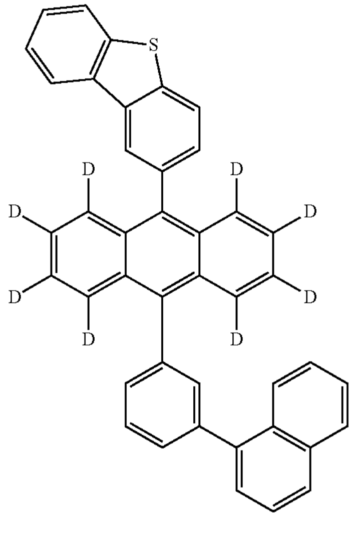
-continued
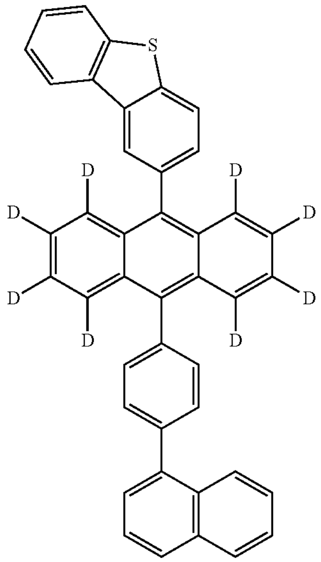
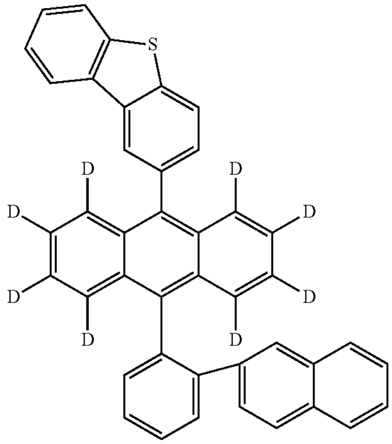
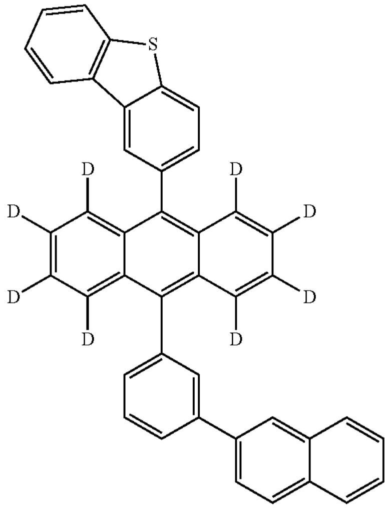

-continued
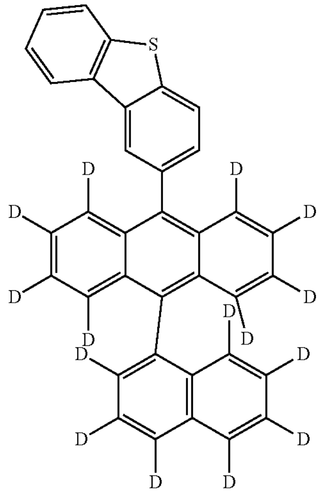
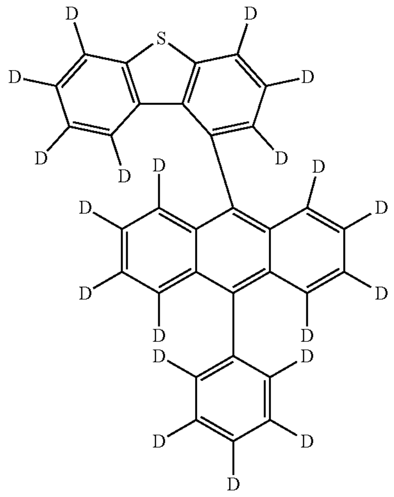
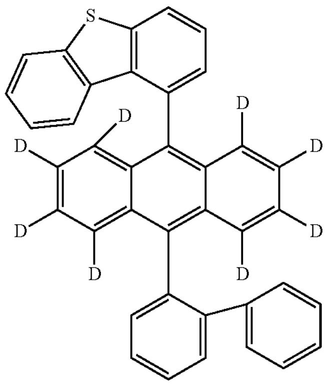
-continued
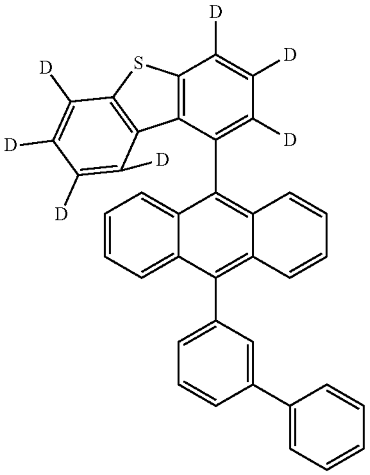
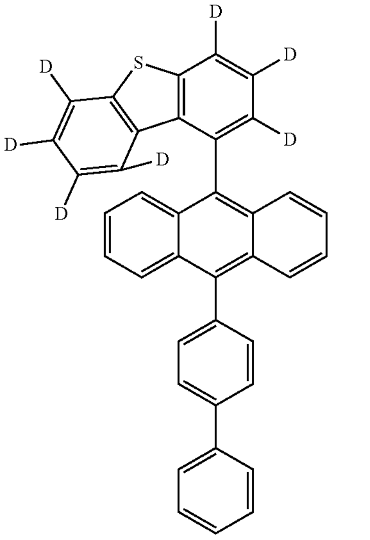
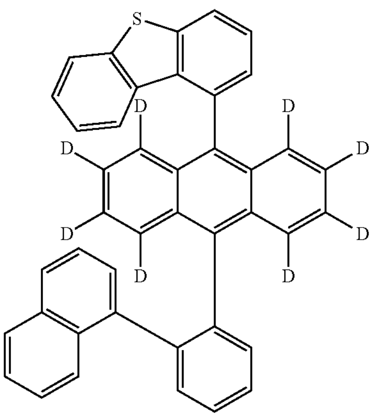

-continued
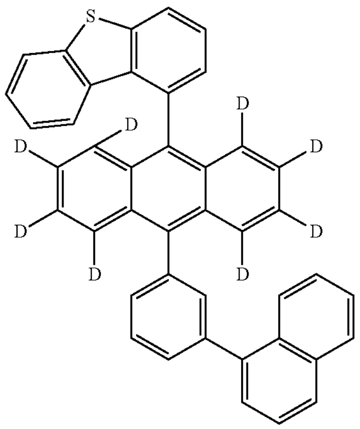
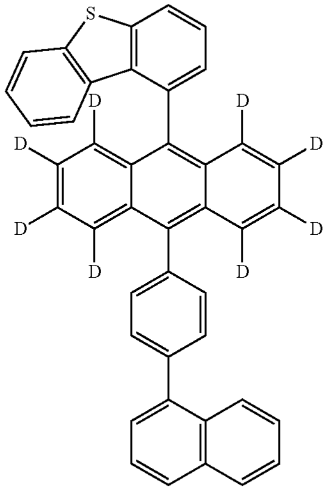
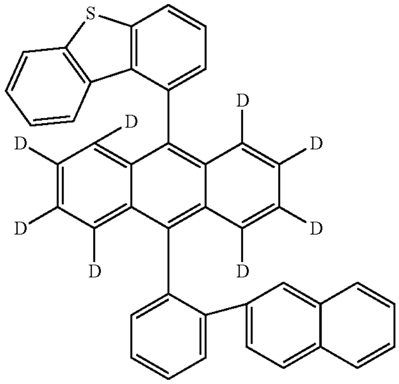
-continued
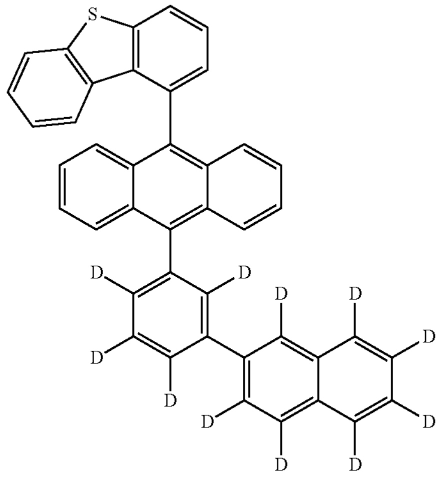
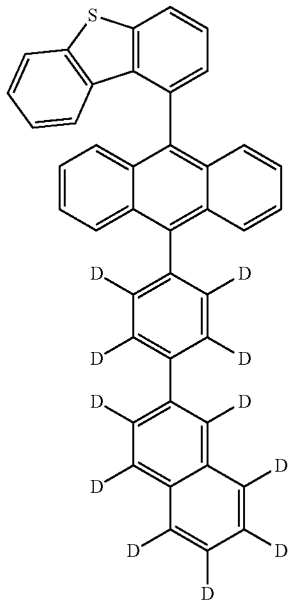
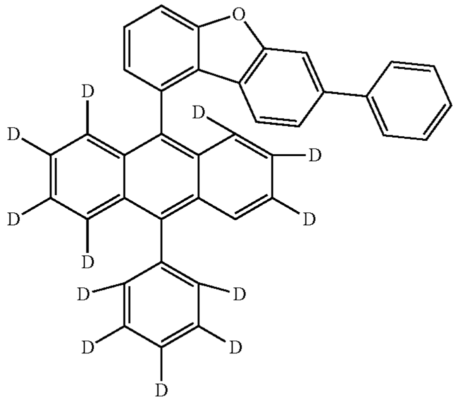

-continued
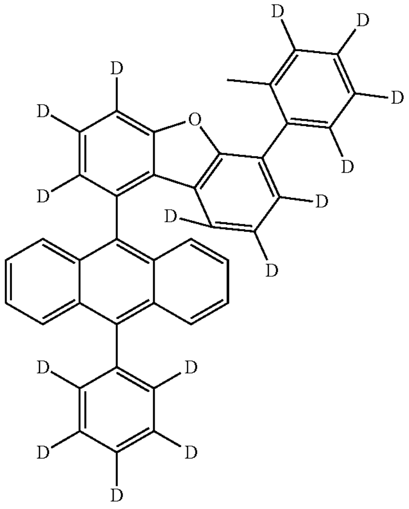
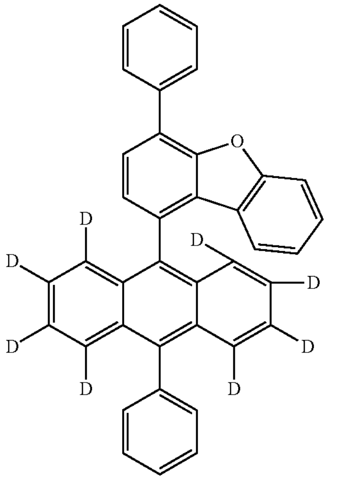
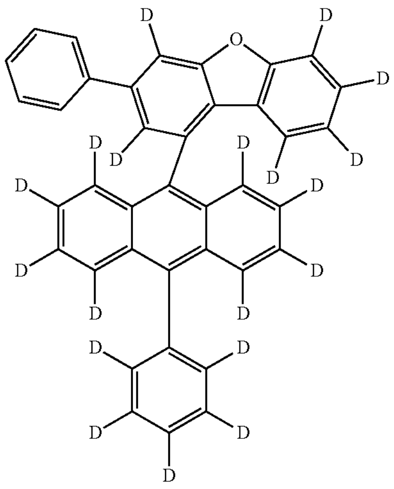
-continued
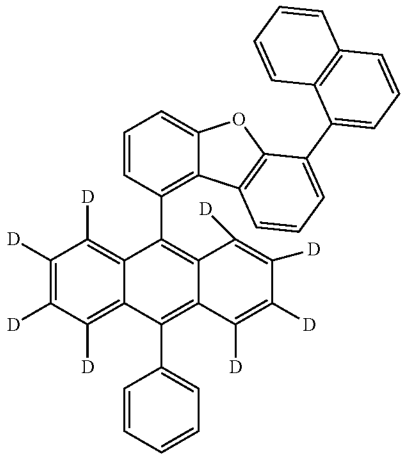
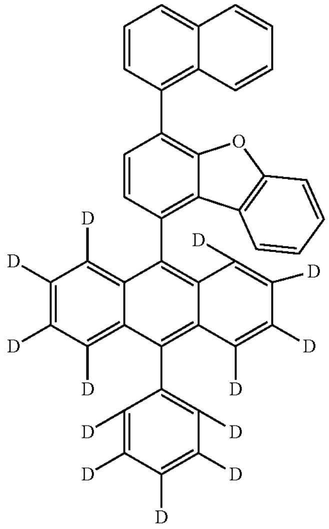
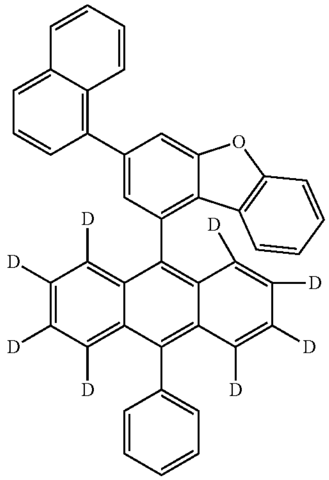

-continued
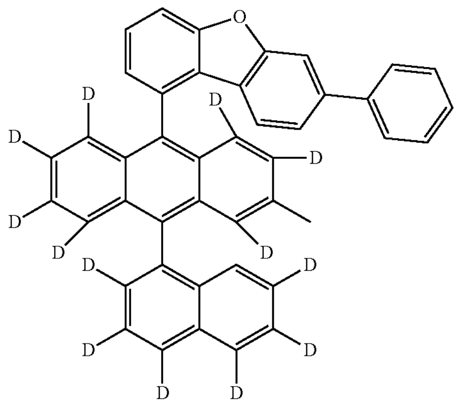
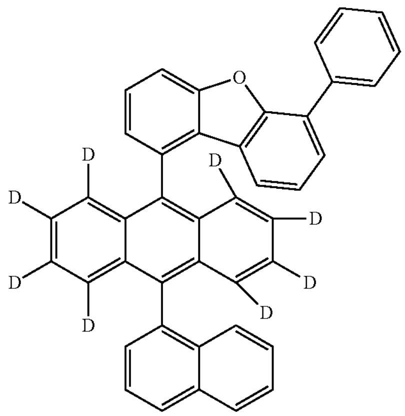
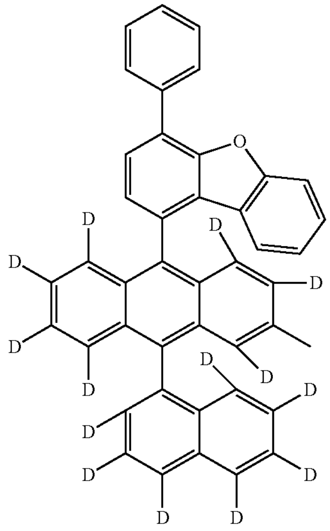
-continued
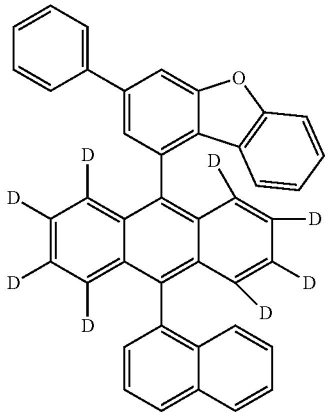
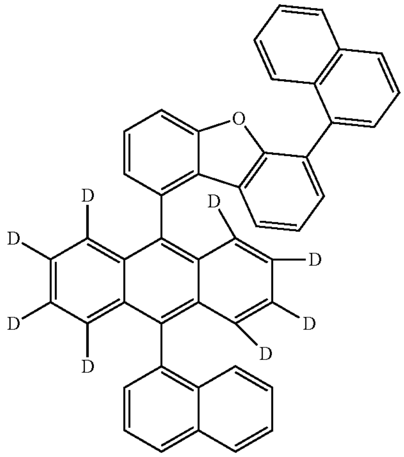
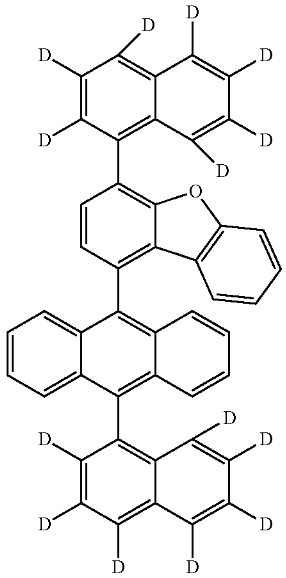

-continued
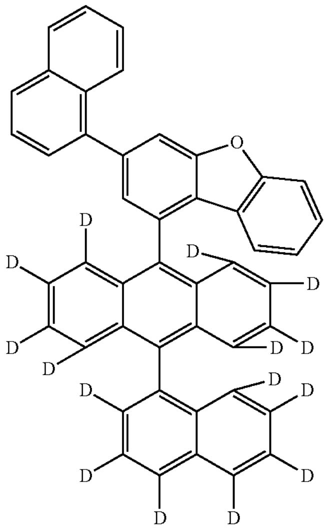
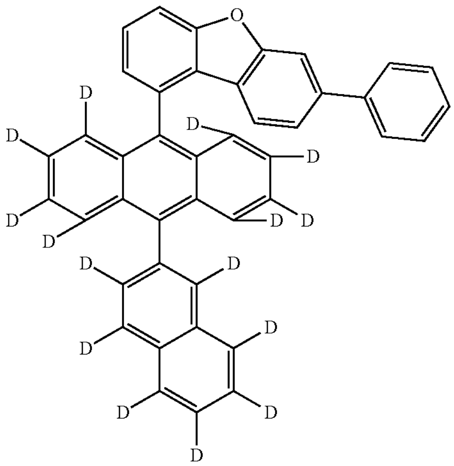
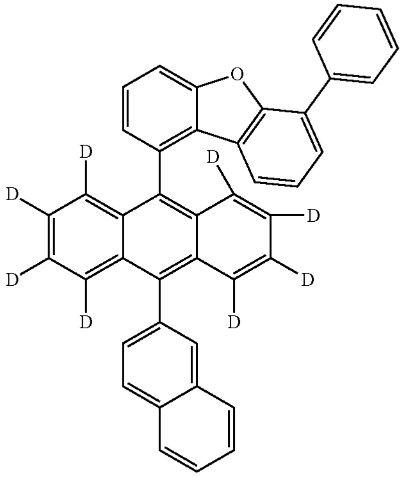
-continued
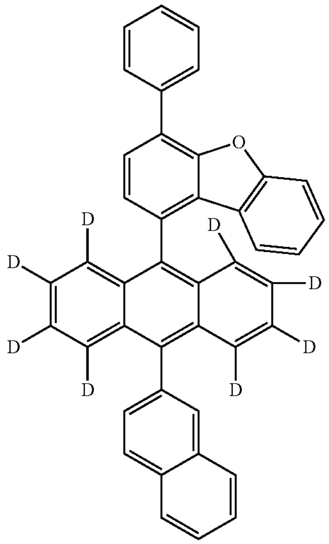
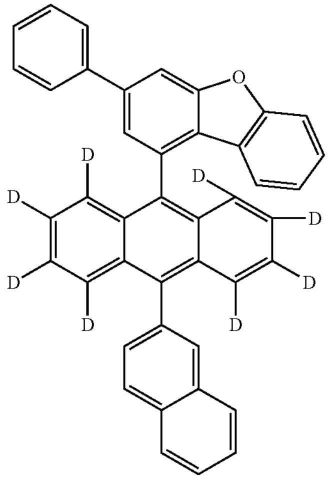
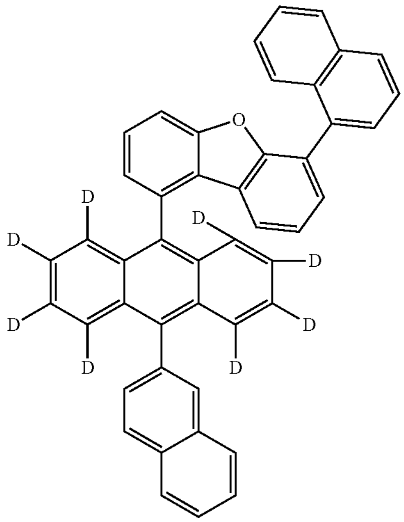

-continued
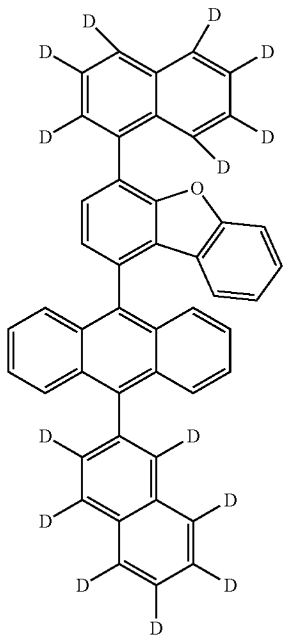
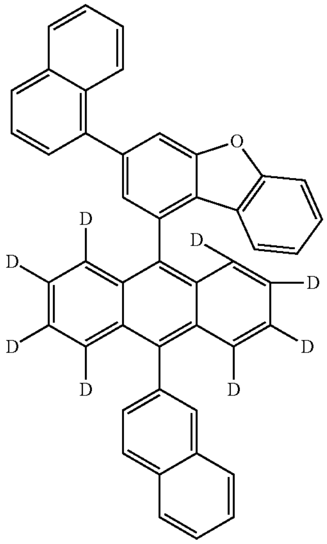
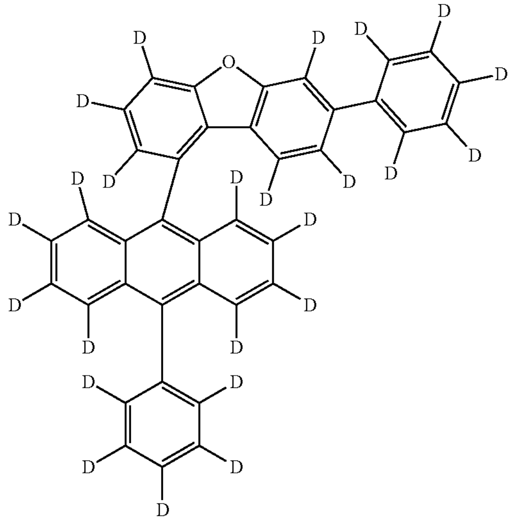
-continued
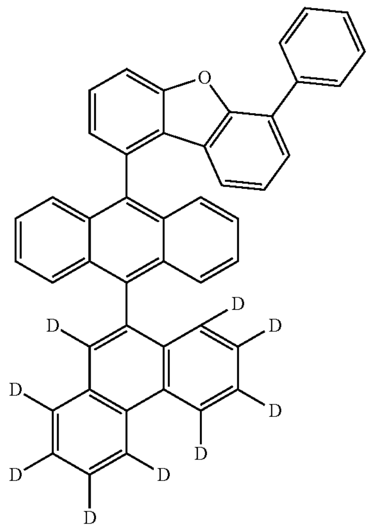
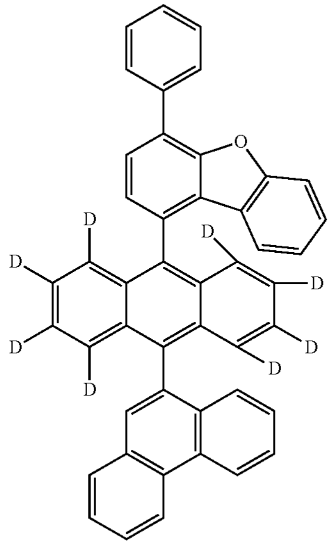
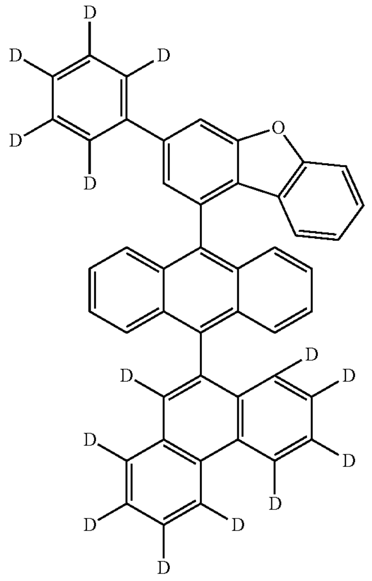

-continued
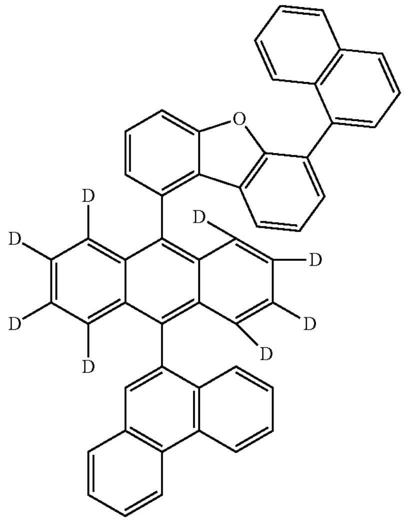
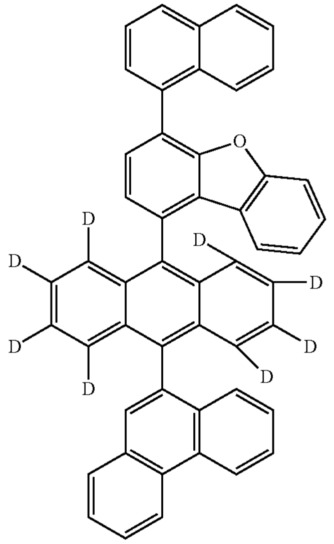
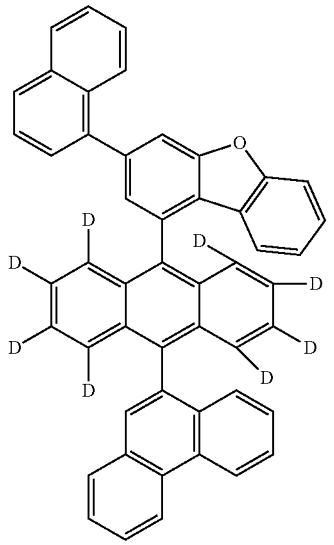
-continued
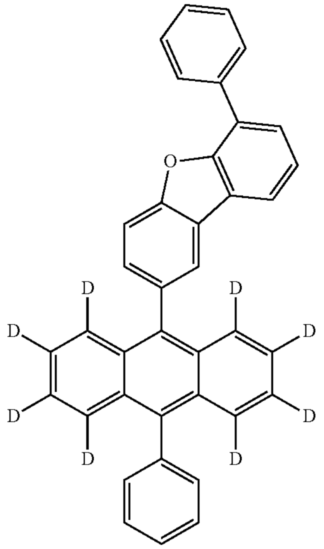
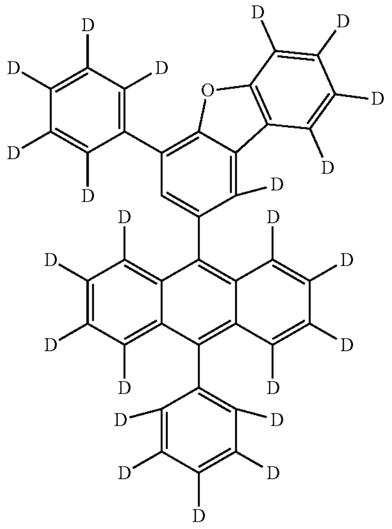
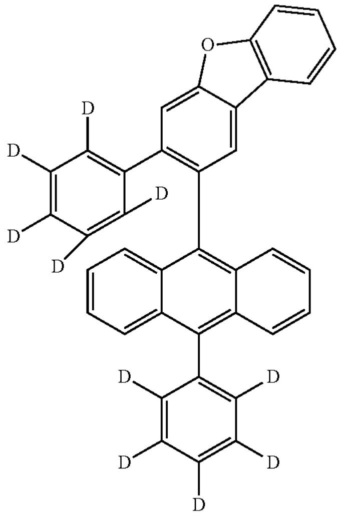

-continued
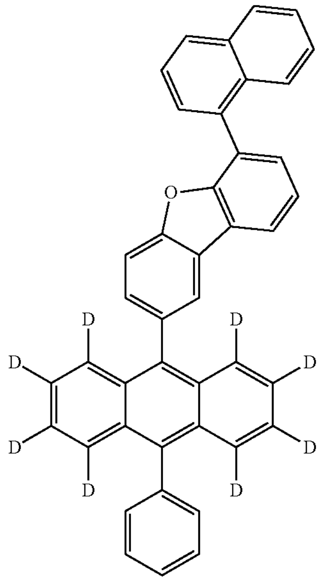
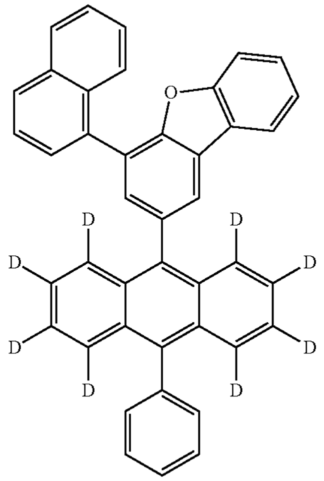
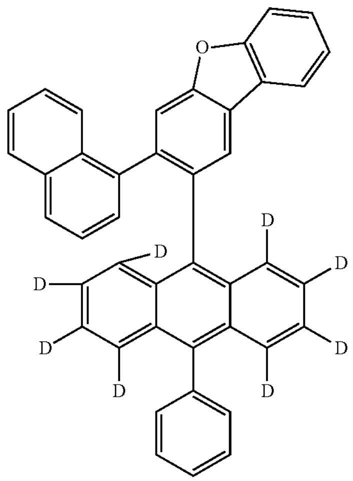
-continued
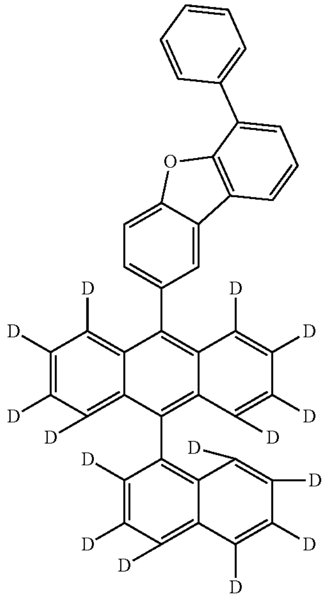
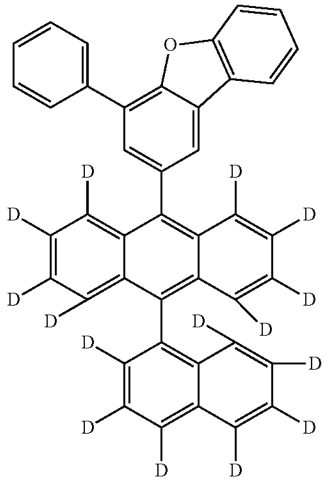
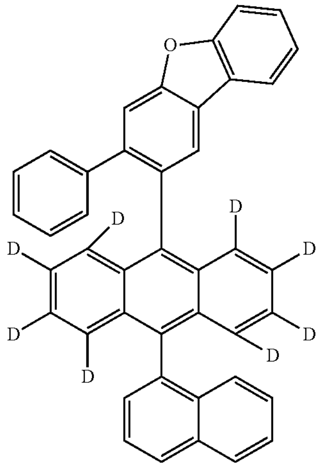

-continued
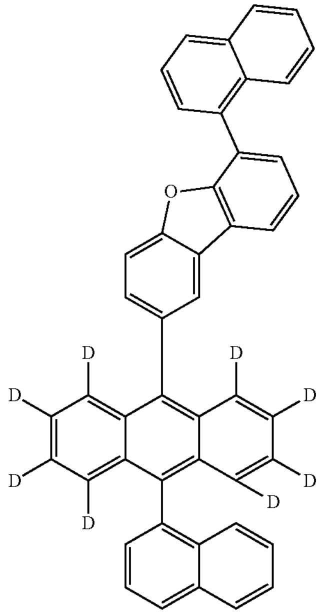
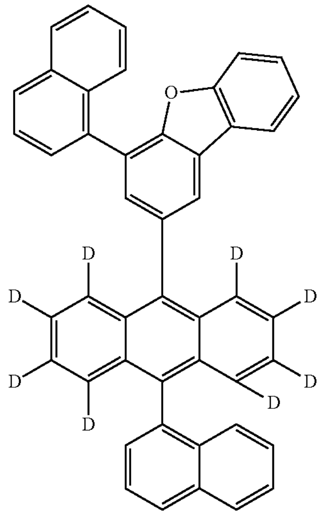
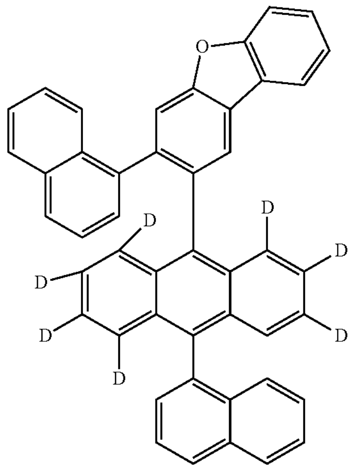
-continued
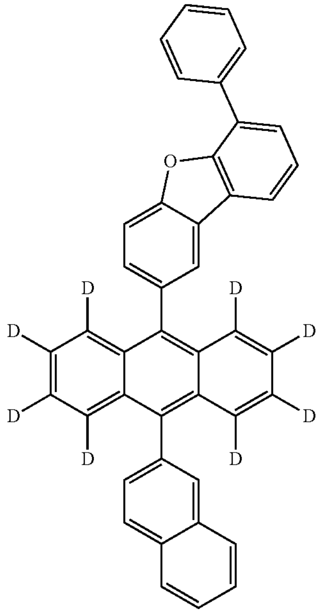
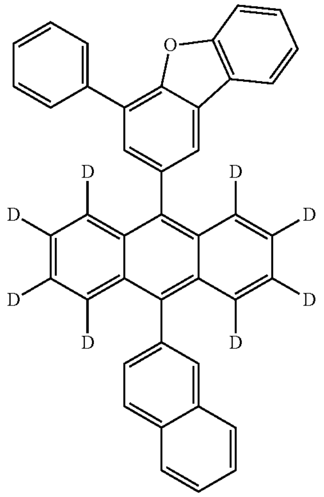
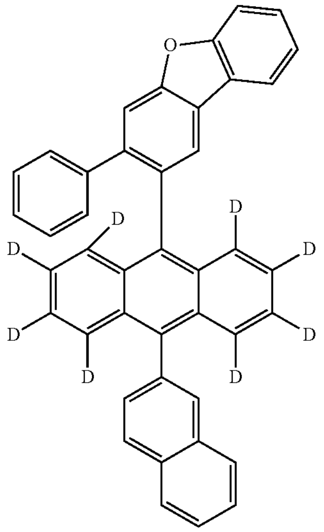

-continued
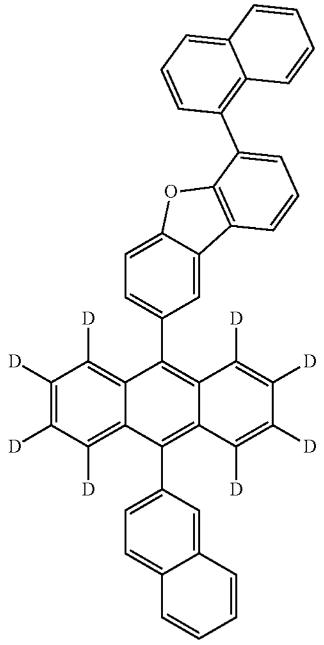
-continued
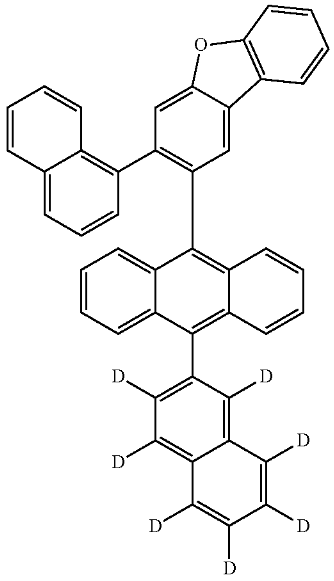
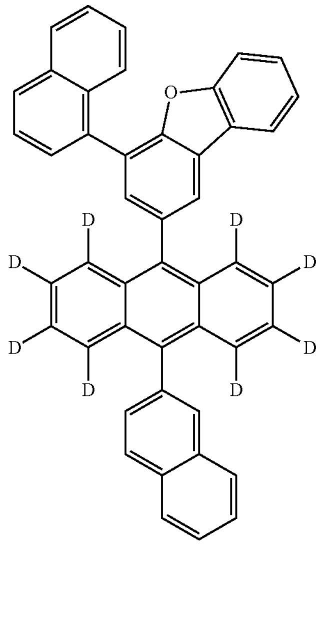
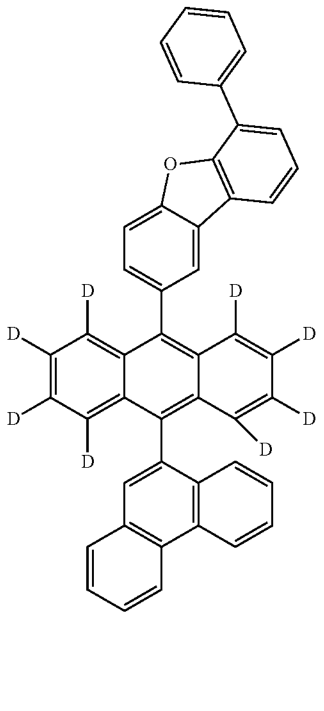

-continued
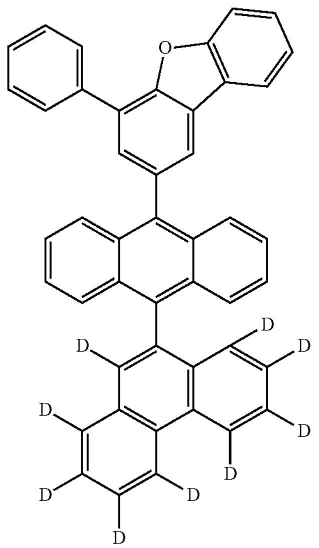
-continued
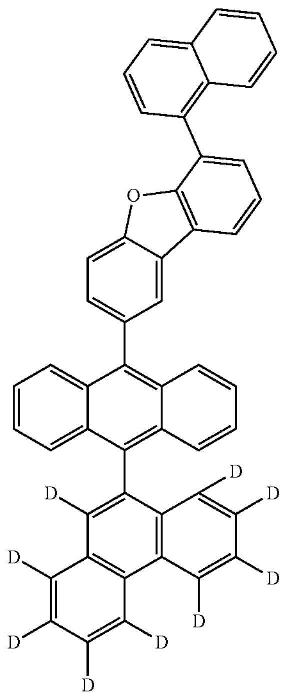
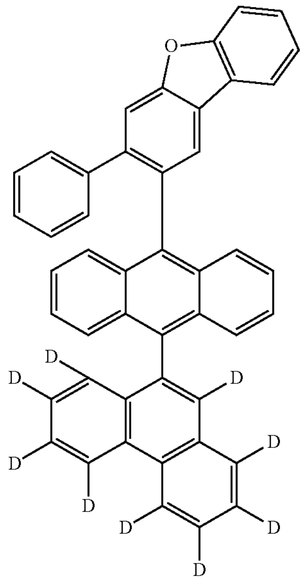
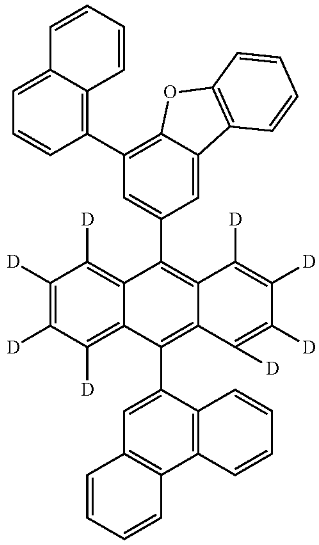

-continued
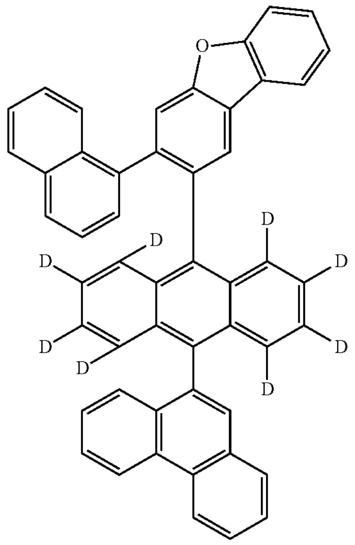
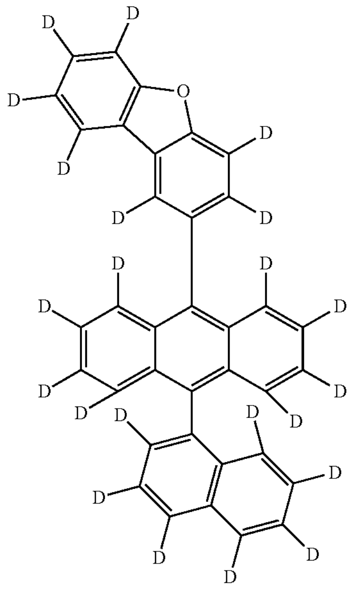
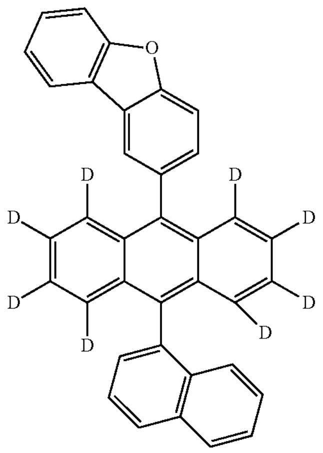
-continued
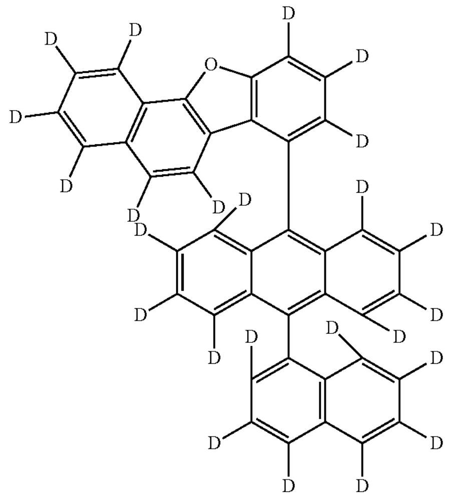
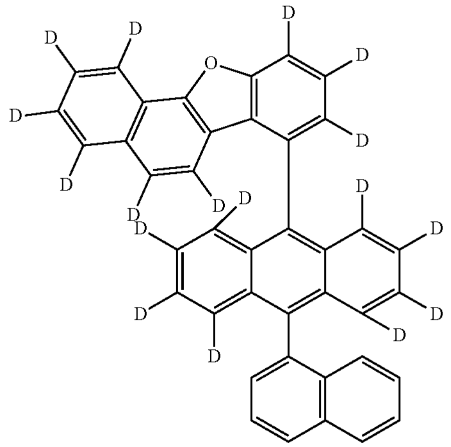
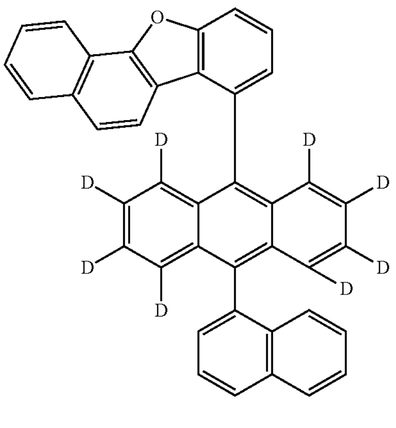

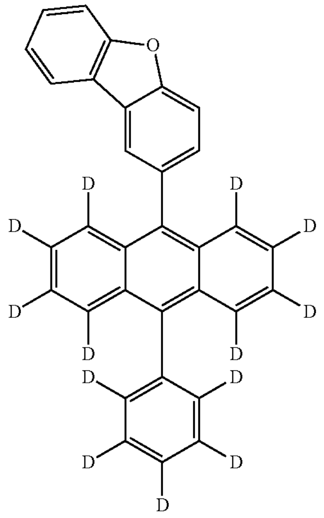
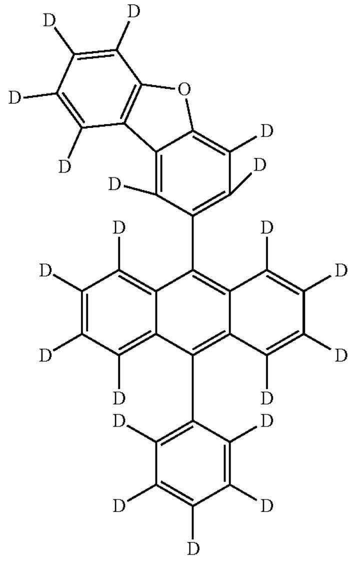
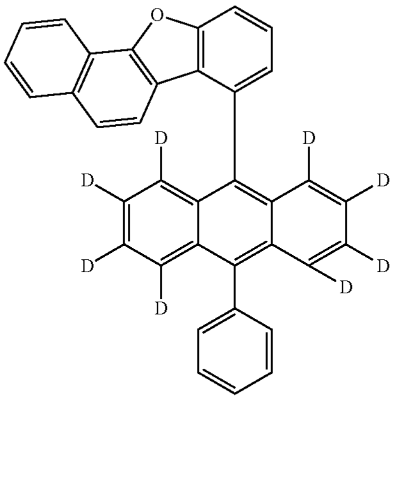 [SMILES: [2H]c1c([2H])c([2H])c2c(-c3cccc4oc5c6ccccc6ccc5c34)c3c([2H])c([2H])c([2H])c([2H])c3c(-c3ccccc3)c2c1[2H]]
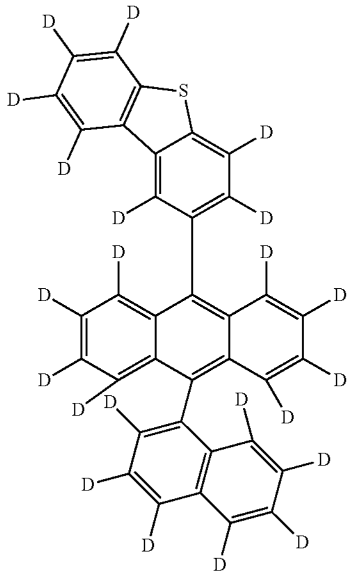
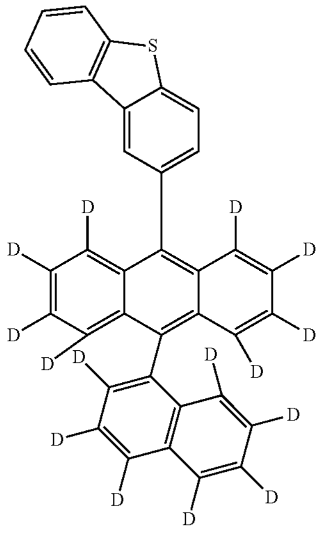
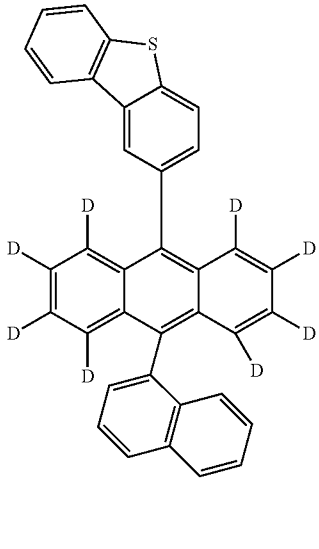

-continued
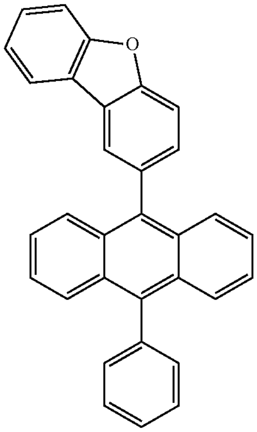
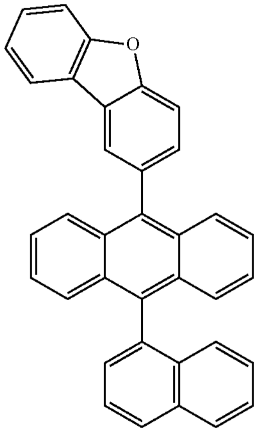
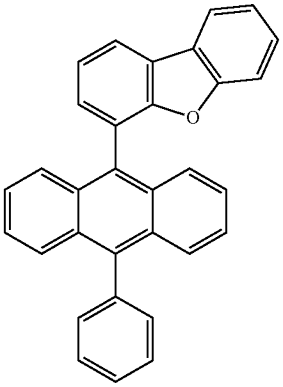
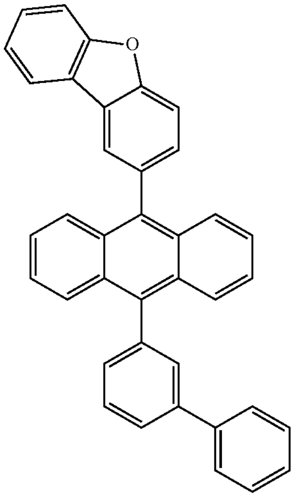
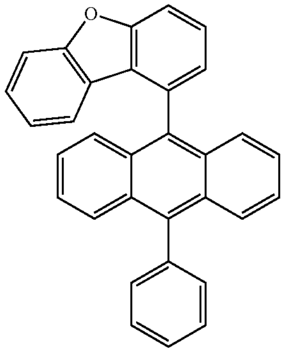
-continued
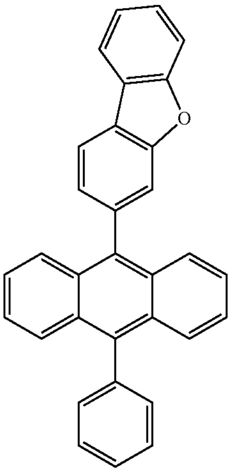
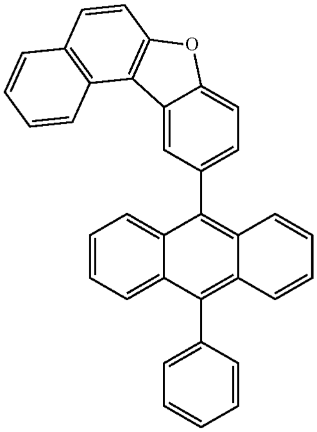
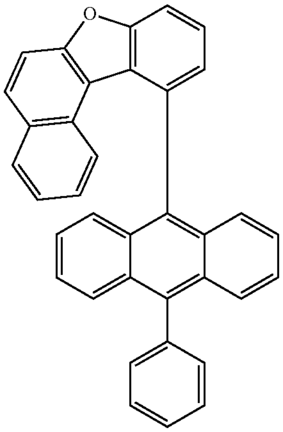

-continued
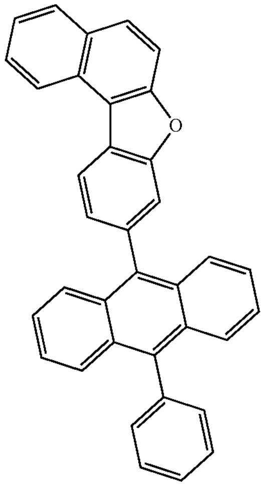
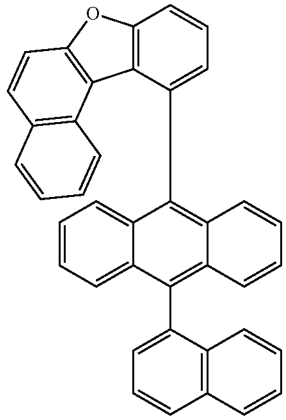
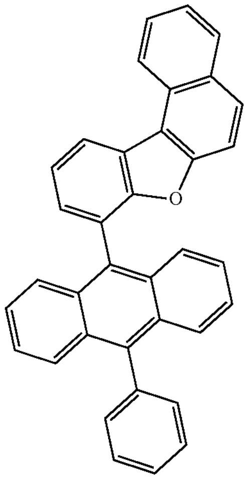
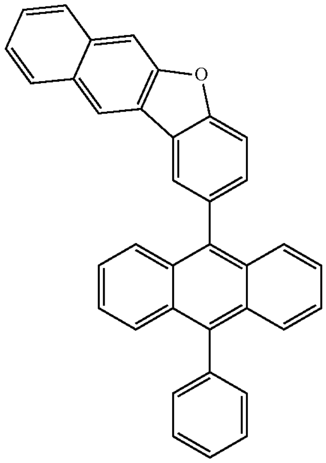
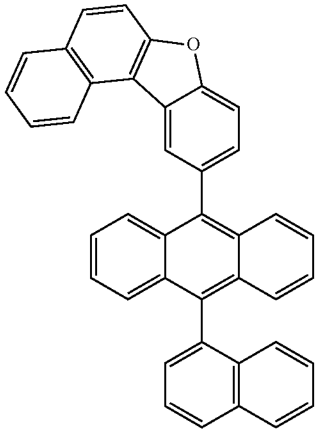
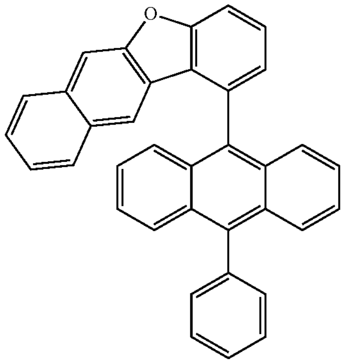
-continued -continued
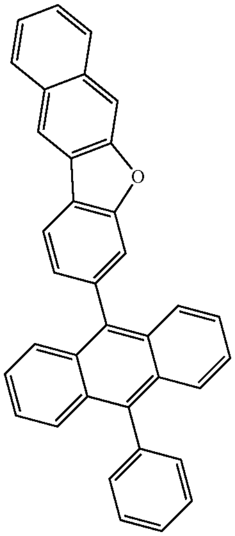
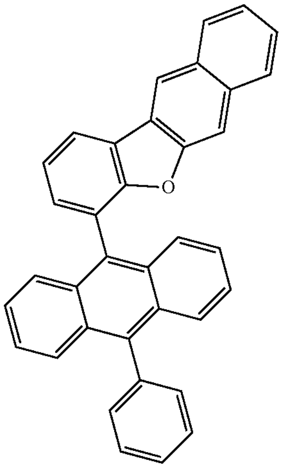
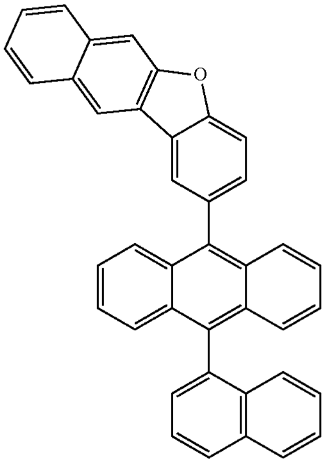
-continued
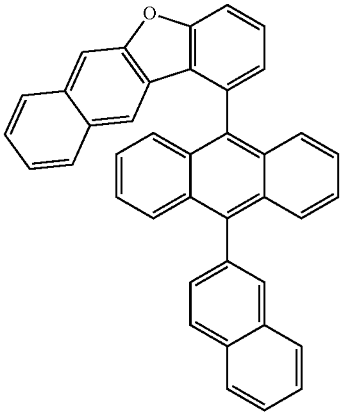
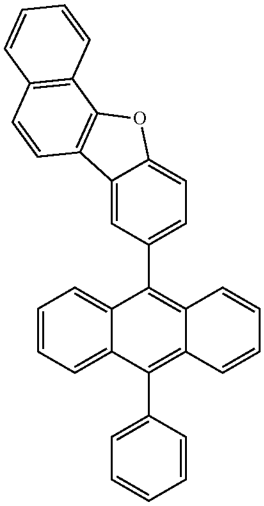
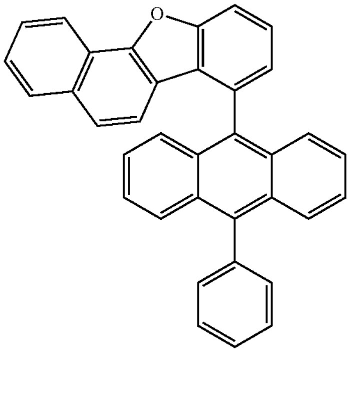

-continued
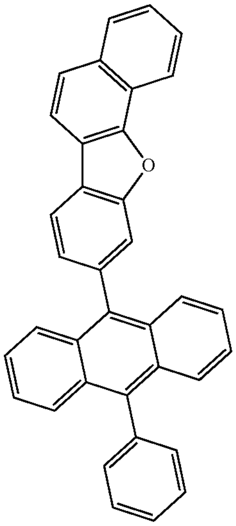
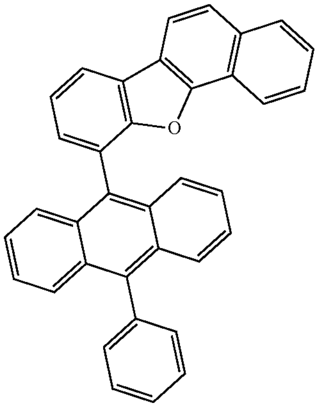
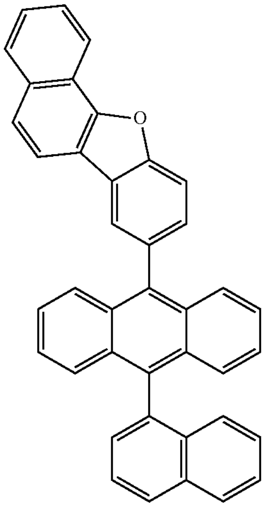
-continued
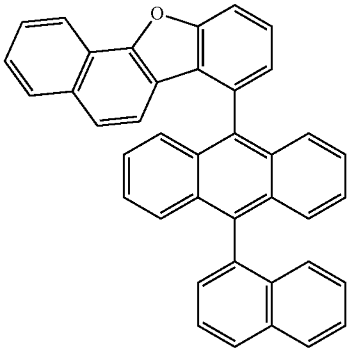
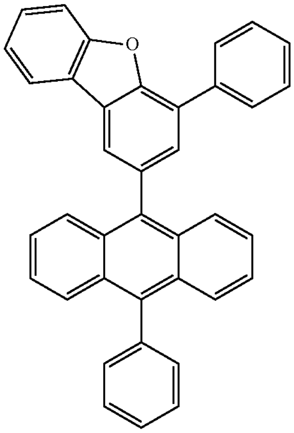
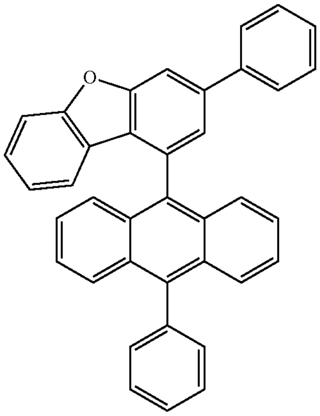
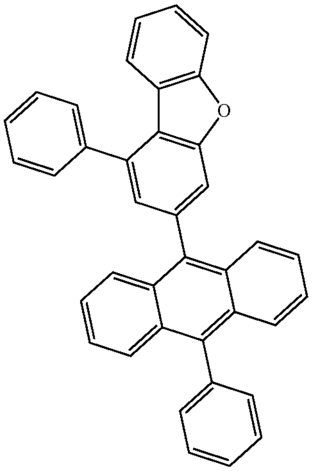

-continued
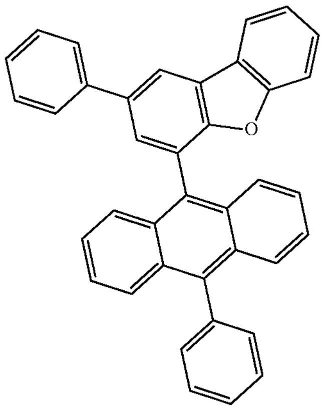
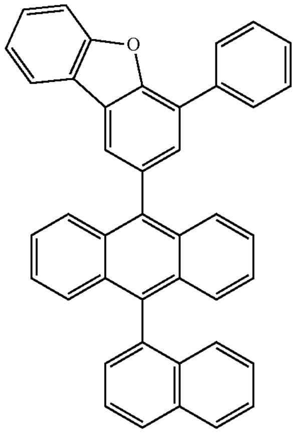
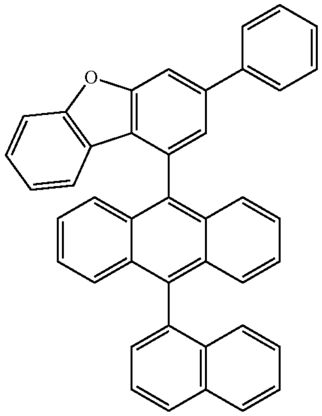
-continued
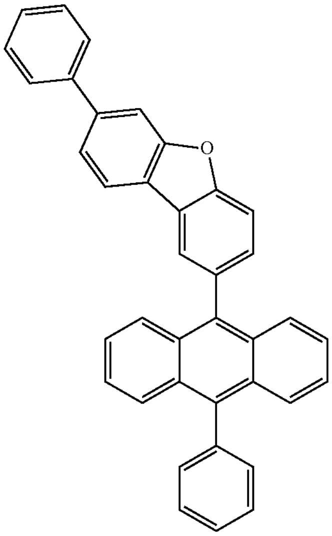
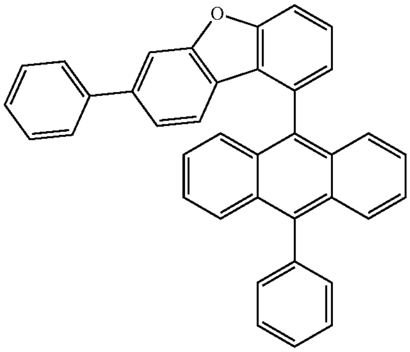
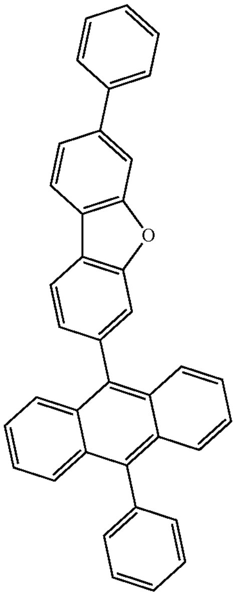

-continued

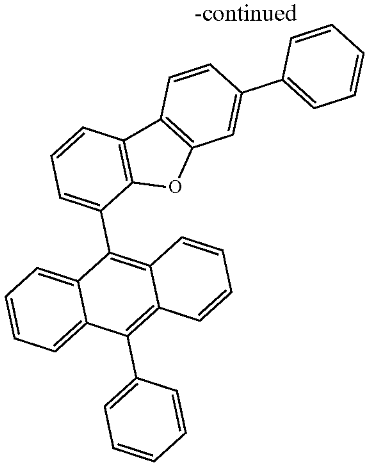

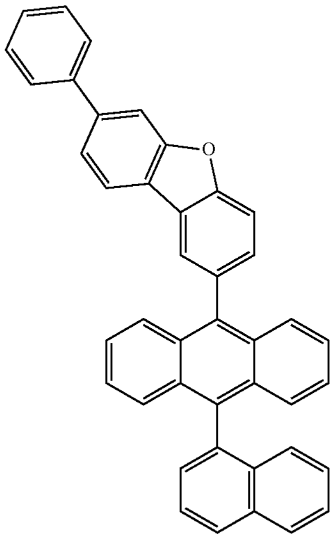

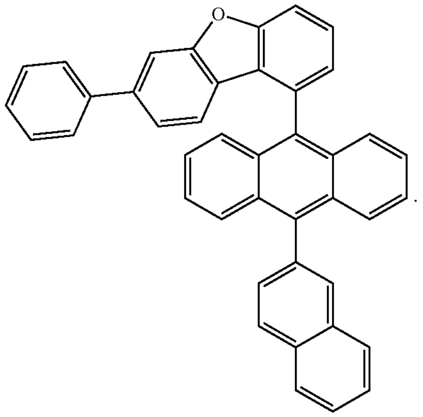 [SMILES: c1ccc(-c2ccc3c(c2)oc2cccc(-c4c5ccccc5c(-c5ccc6ccccc6c5)c5ccccc45)c23)cc1]

8. The organic light emitting device of claim 1, wherein Chemical Formula 2 is the following Chemical Formula 2-1, and Chemical Formula 3 is the following Chemical Formula 3-1:

[Chemical Formula 2-1]

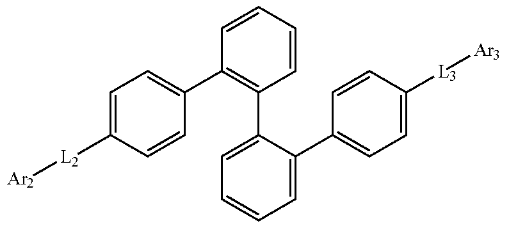

[Chemical Formula 3-1]

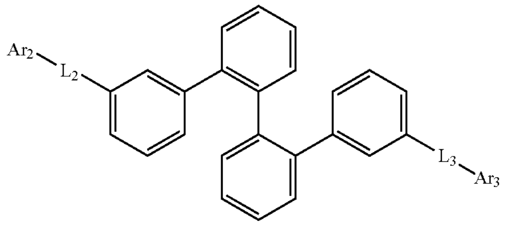

wherein in the Chemical Formula 2-1 or 3-1, $L_2$, $L_3$, $Ar_2$ and $Ar_3$ are as defined in claim 1.

9. The organic light emitting device of claim 1, wherein $L_2$ and $L_3$ are each independently a direct bond, phenylene, or biphenyldiyl.

10. The organic light emitting device of claim 1, wherein $Ar_2$ and $Ar_3$ are each independently any one selected from the group consisting of:

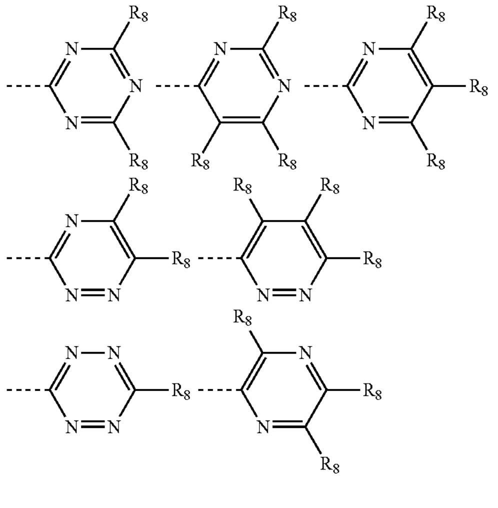

wherein in the above group, $R_8$ is as defined in claim 1.

11. The organic light emitting device of claim 1, wherein each $R_8$ is independently hydrogen, deuterium, methyl, tert-butyl, phenyl, biphenylyl, terphenylyl, naphthyl, pyridinyl, furanyl, or thiophenyl, or two adjacent $R_8$s combine to form a benzene ring, and the phenyl, biphenylyl, terphenylyl, naphthyl, pyridinyl, furanyl, or thiophenyl is each independently unsubstituted or substituted with deuterium, methyl, or tert-butyl.

12. The organic light emitting device of claim 1, wherein $Ar_2$ and $Ar_3$ are each independently any one compound selected from the group consisting of:

-continued
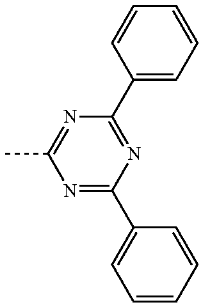
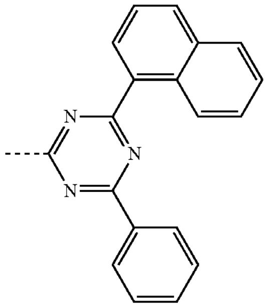
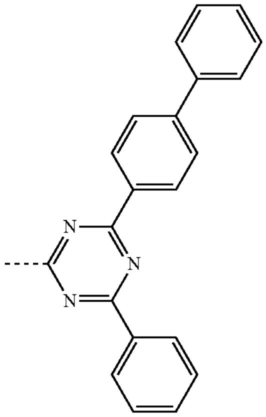
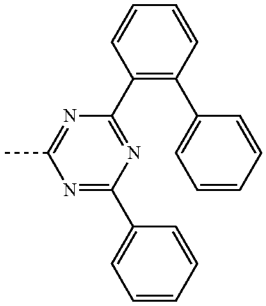
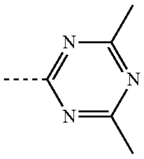
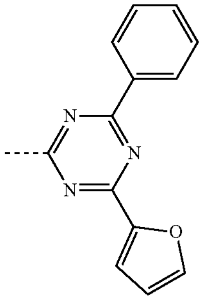
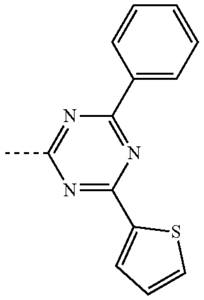
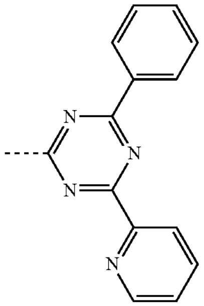
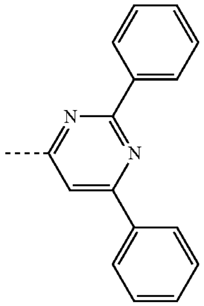
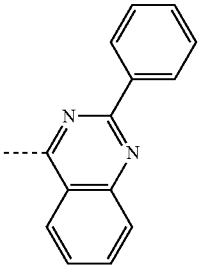
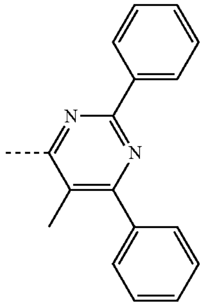
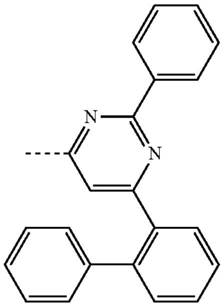
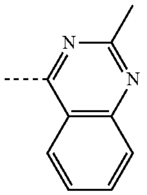
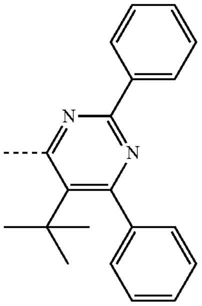
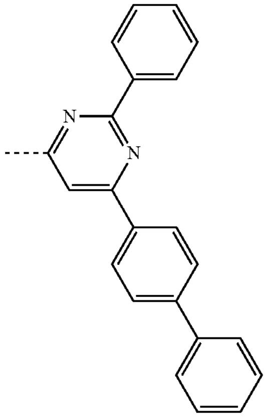
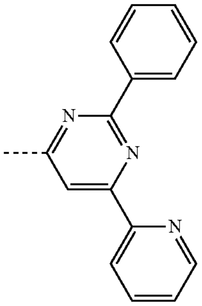
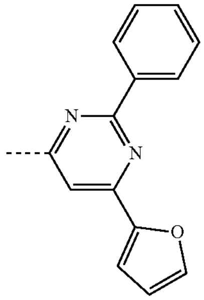
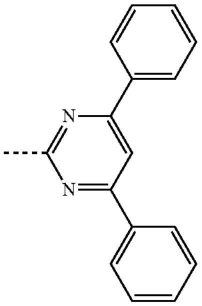
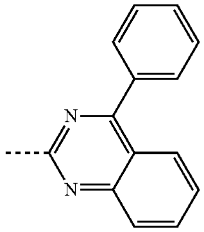

-continued
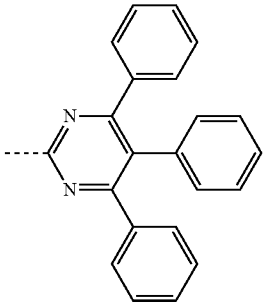
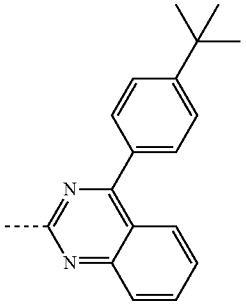
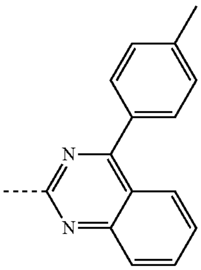
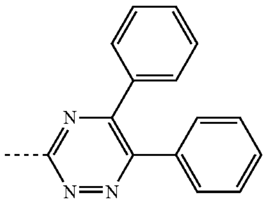
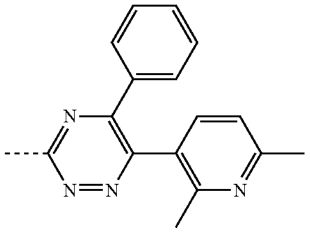
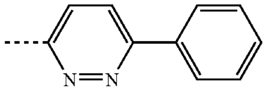
-continued
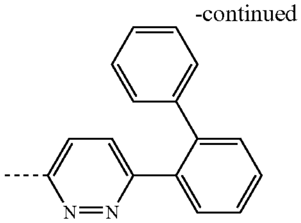
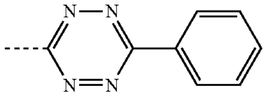
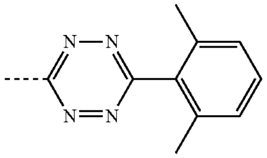
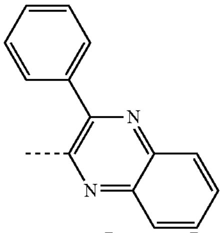
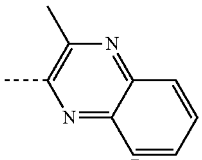
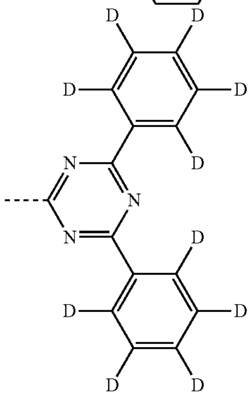
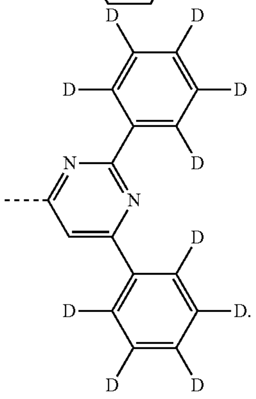
13. The organic light emitting device of claim 1, wherein the compound of Chemical Formula 2 and the compound of Chemical Formula 3 are any one compound selected from the group consisting of the following compounds:
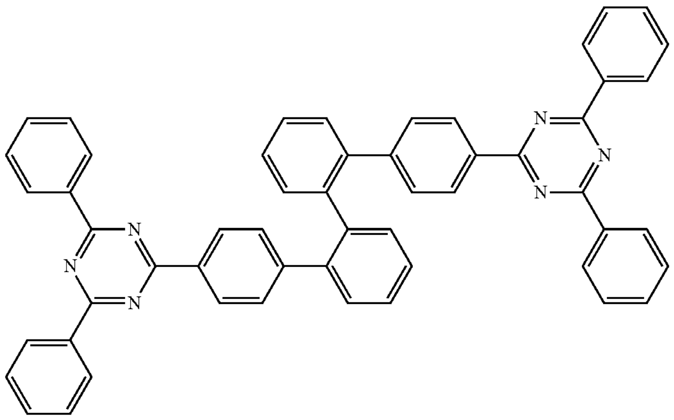

-continued
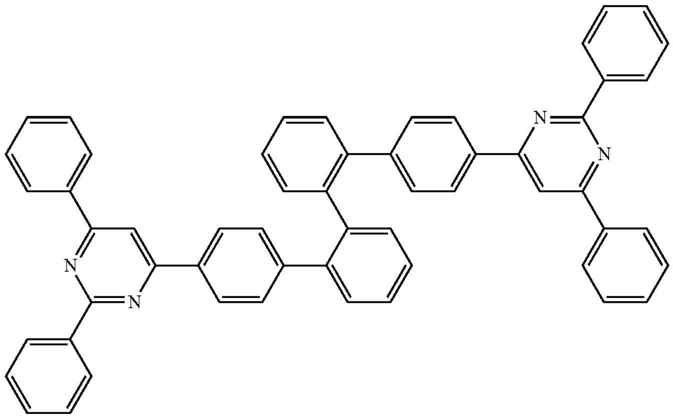
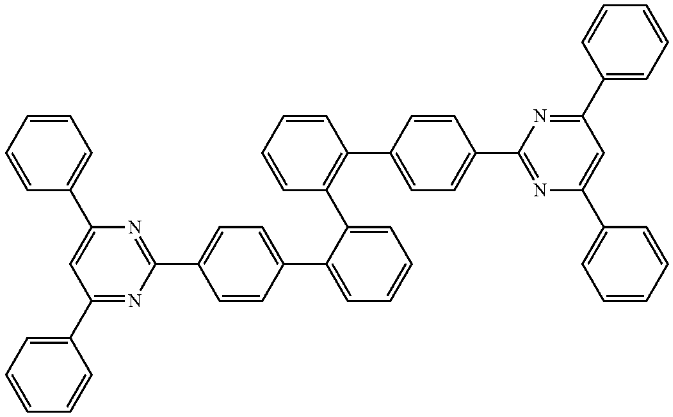
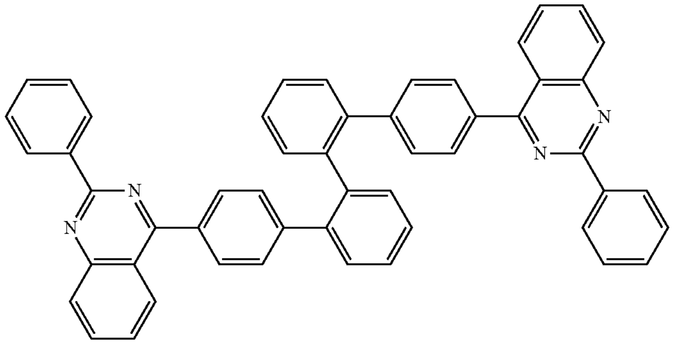
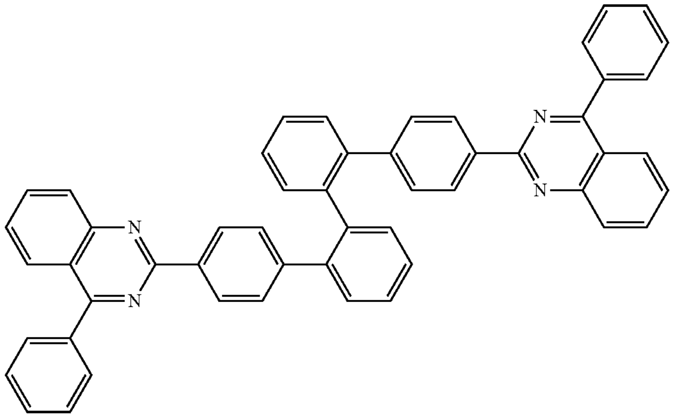

-continued
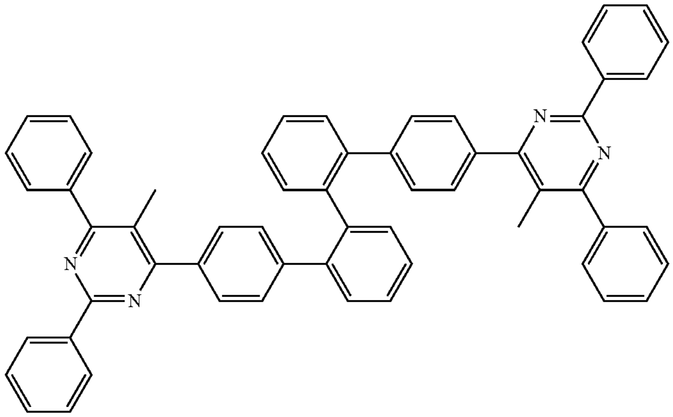
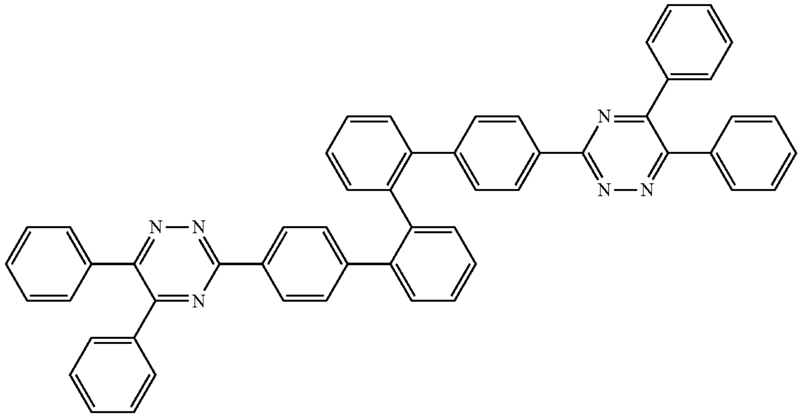
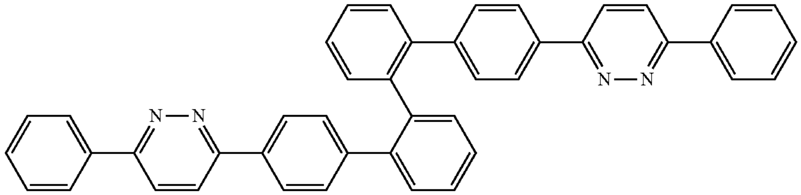
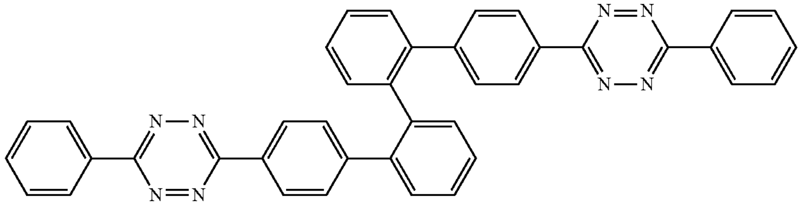
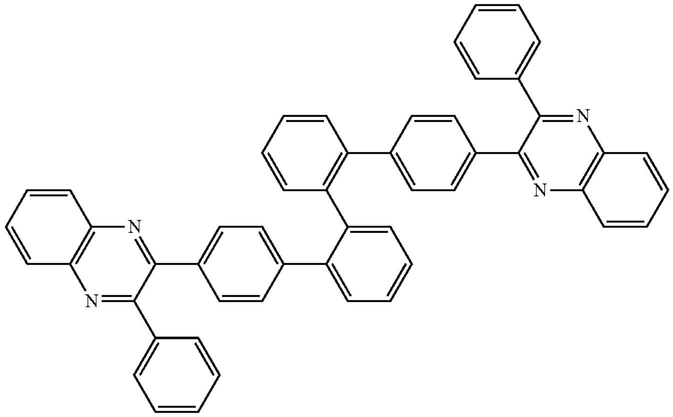

-continued
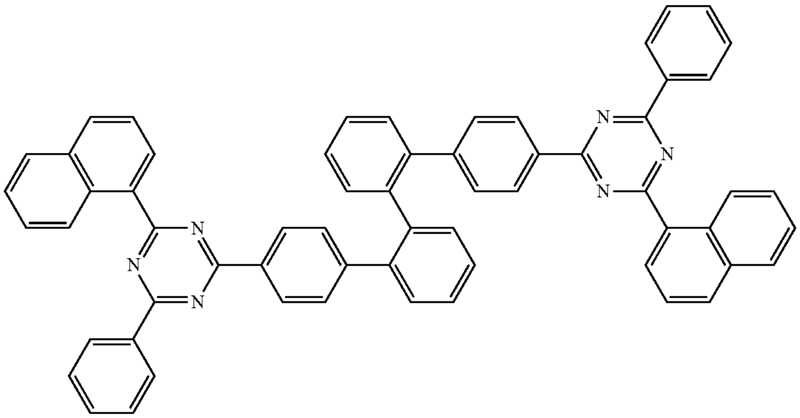
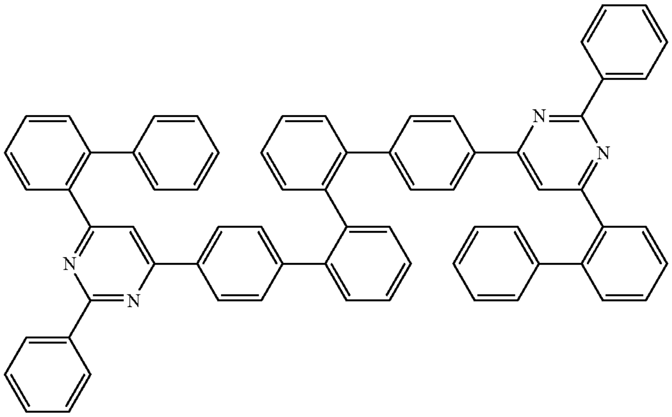
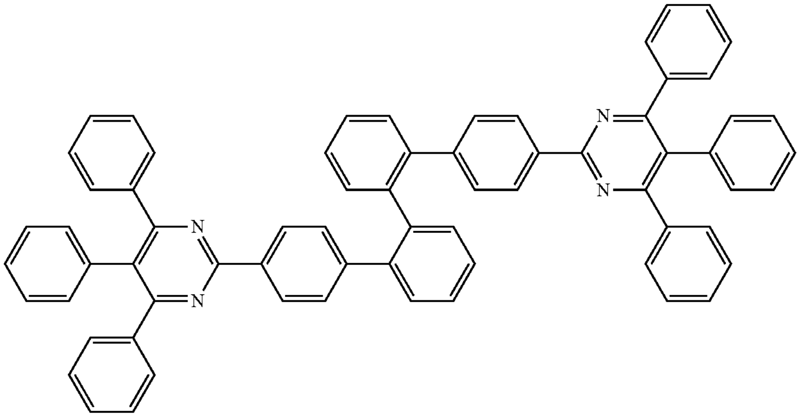
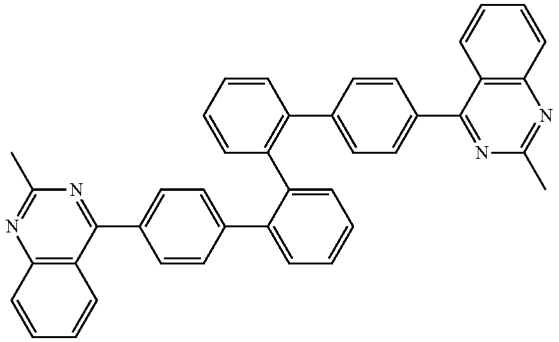

-continued
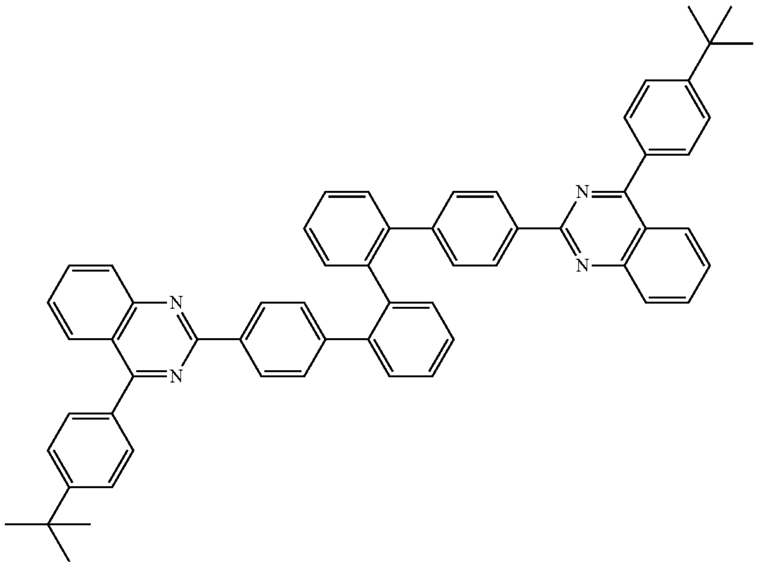
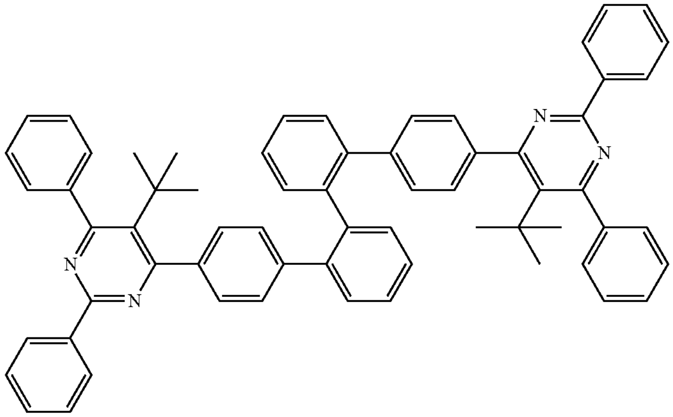
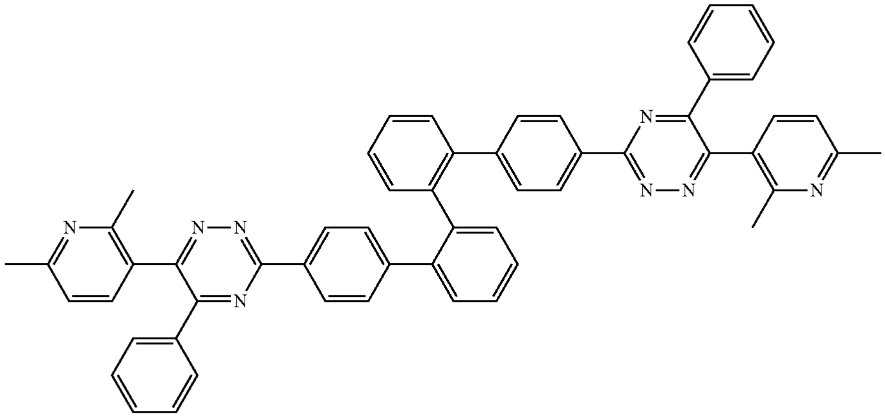

-continued
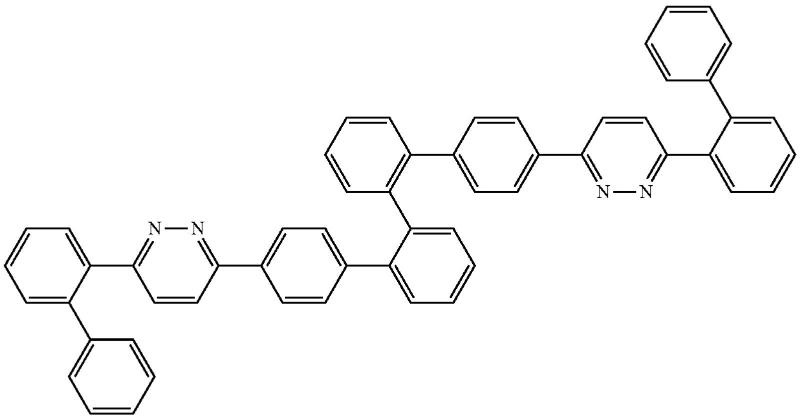
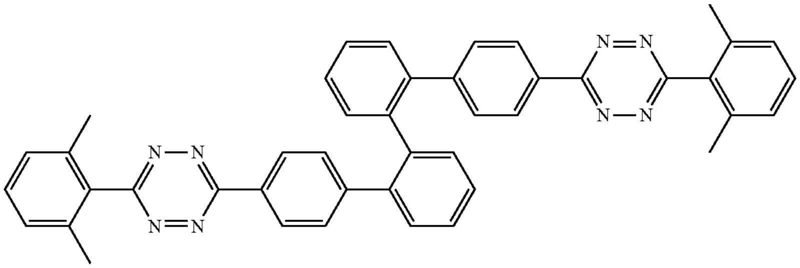
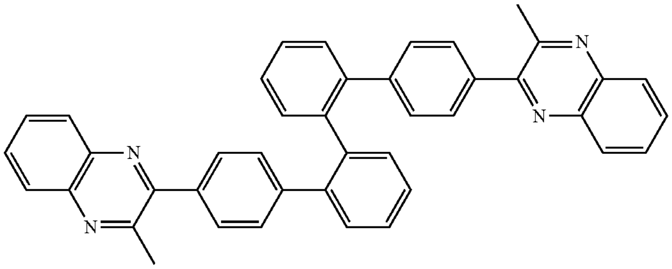
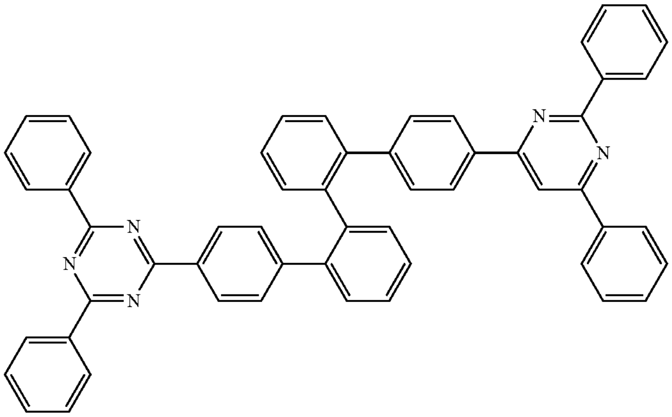

-continued
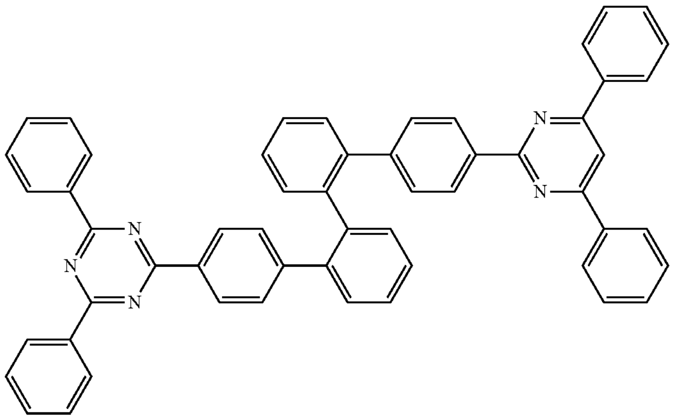
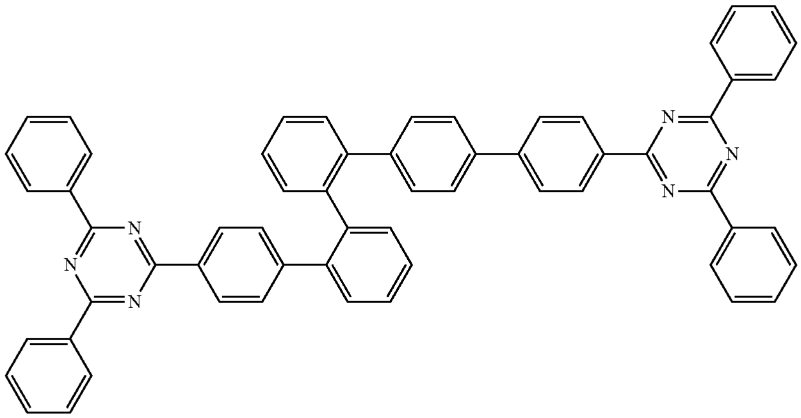
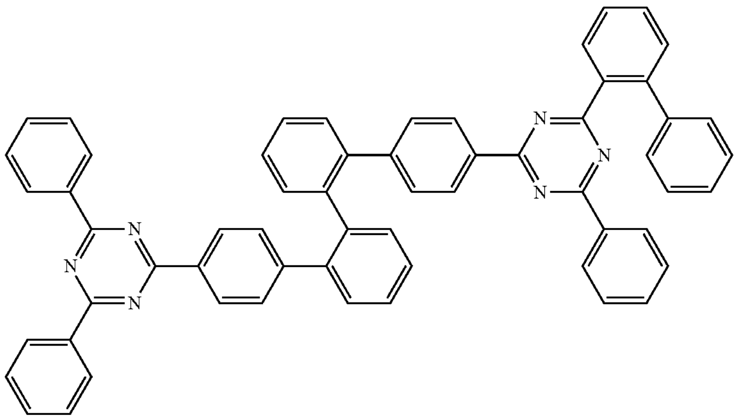
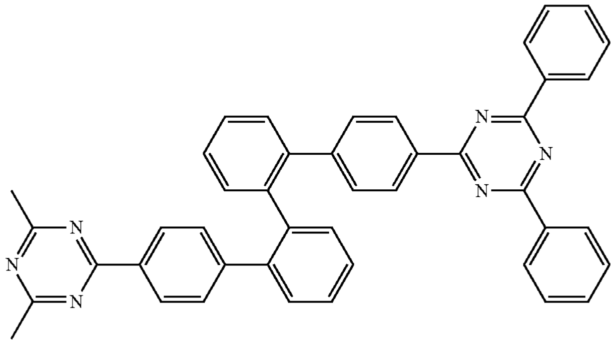

-continued
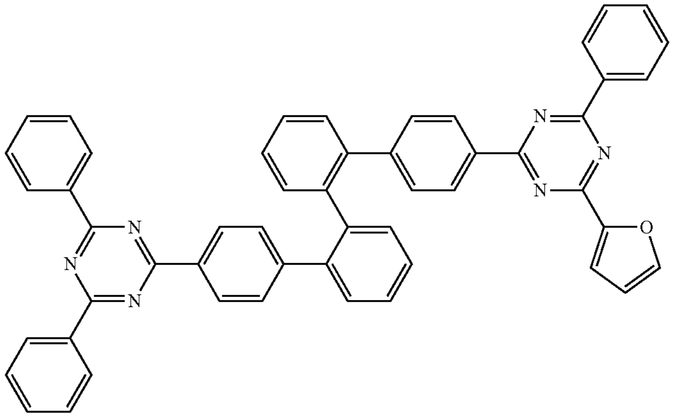
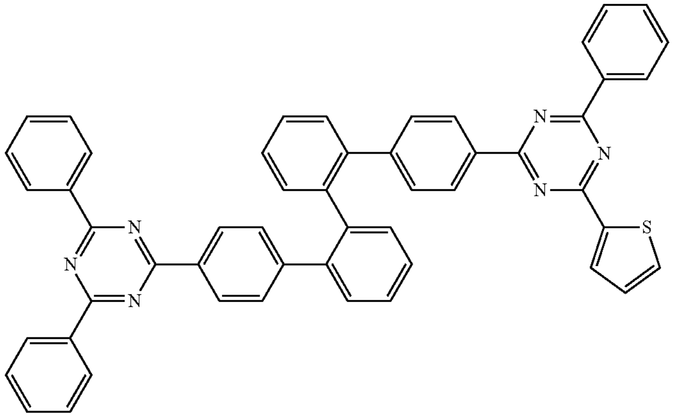
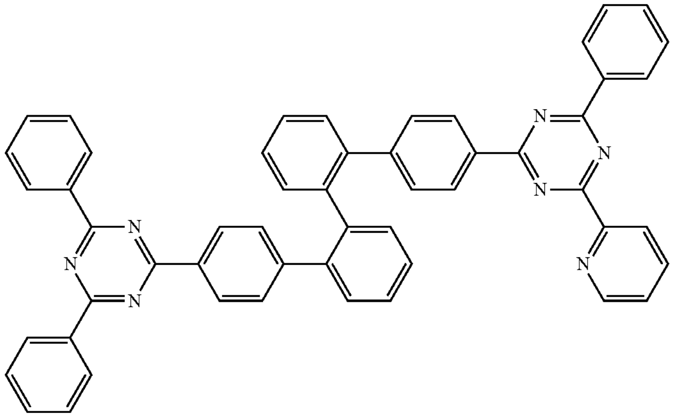
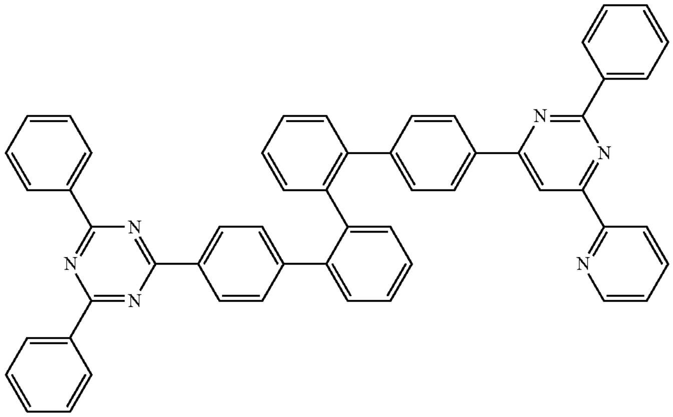

-continued
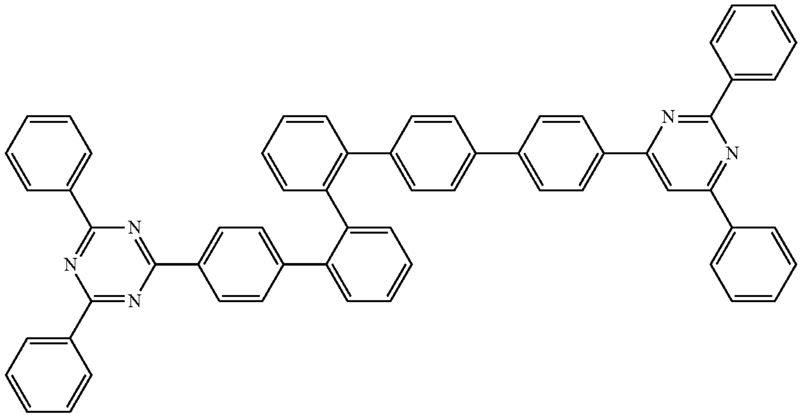
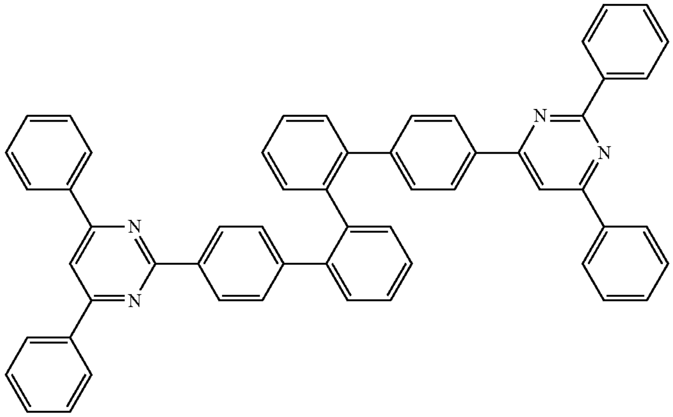
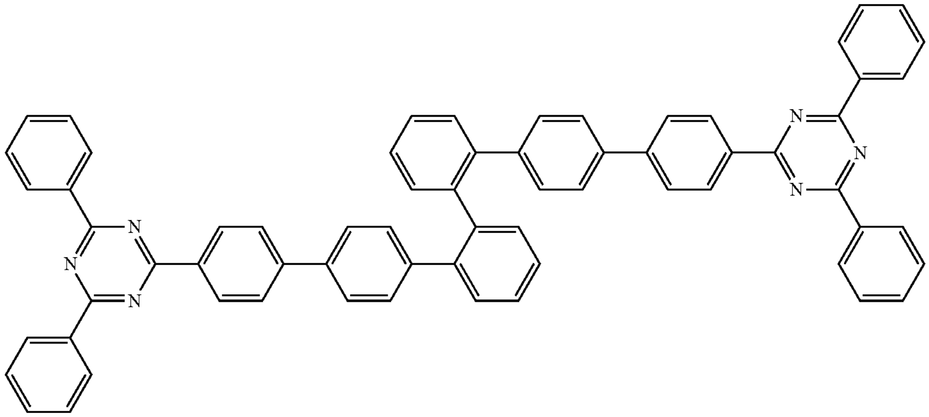
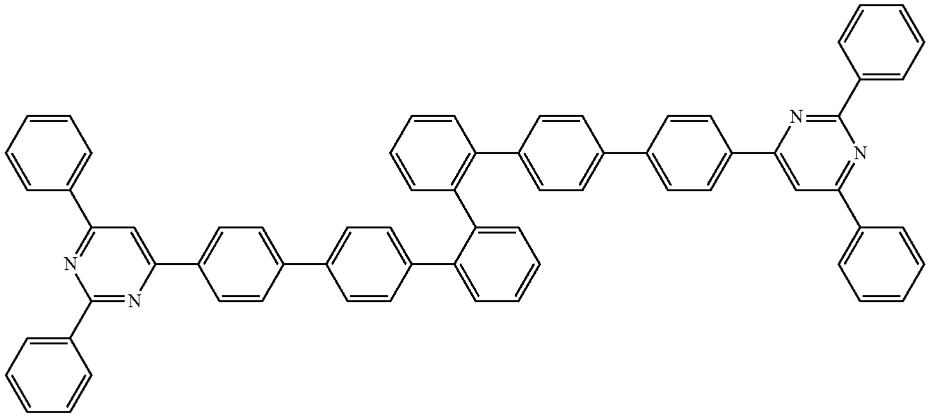

-continued
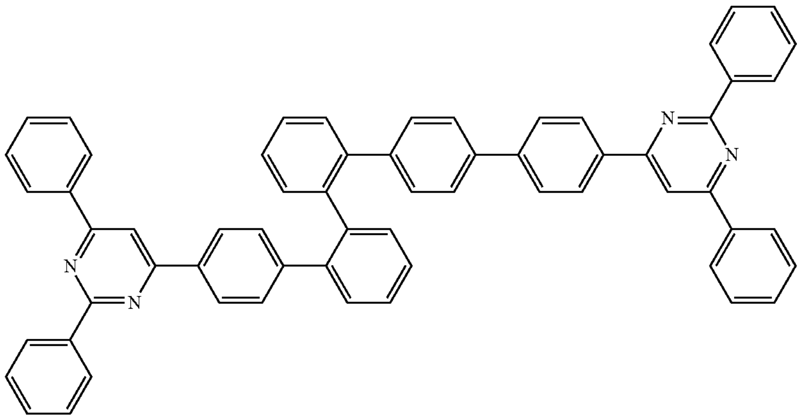
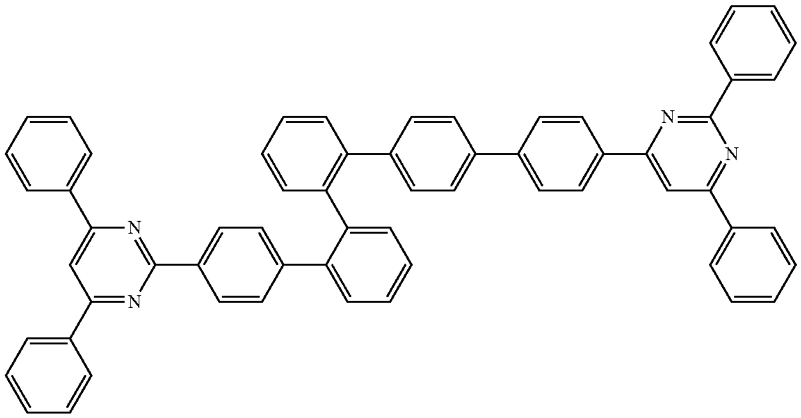
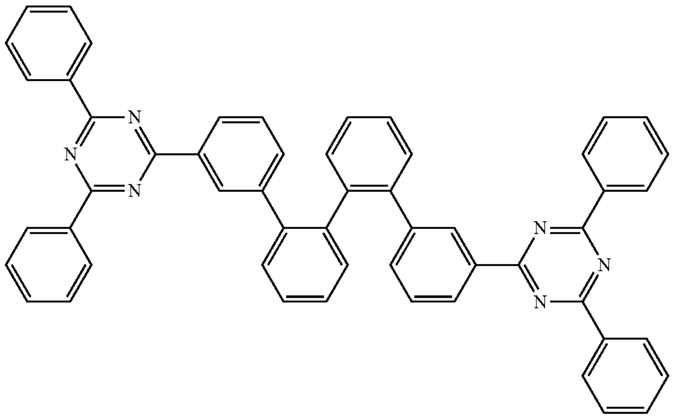
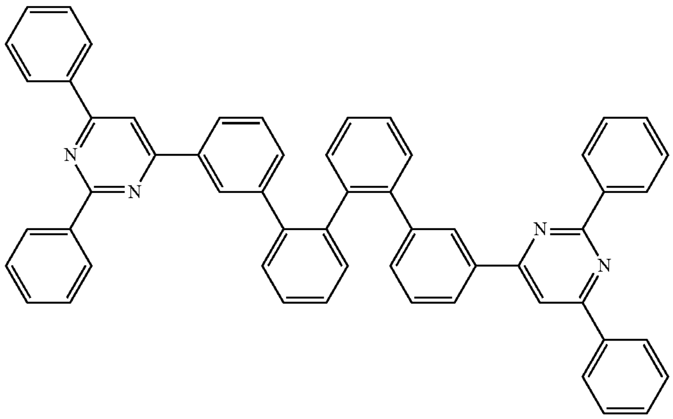

-continued
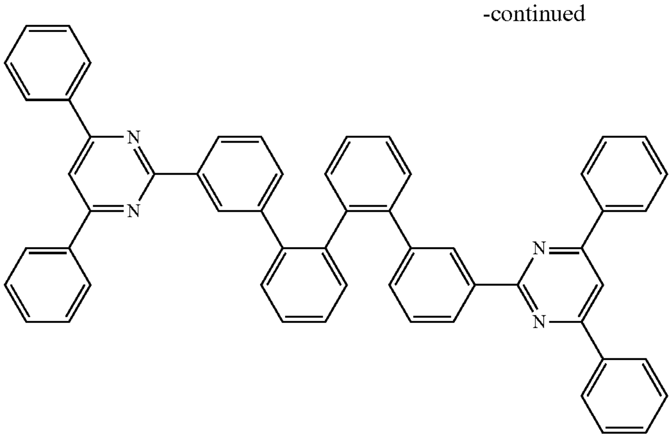
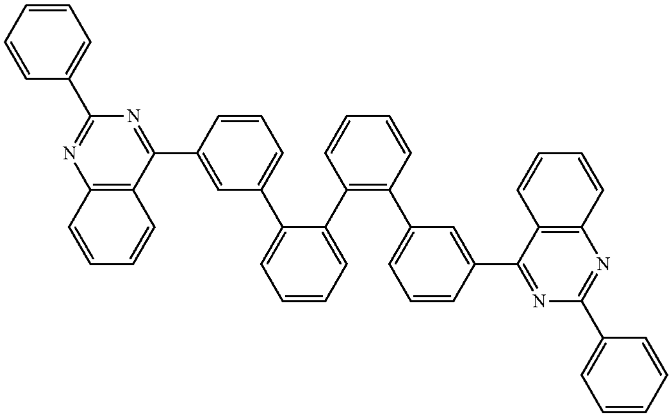
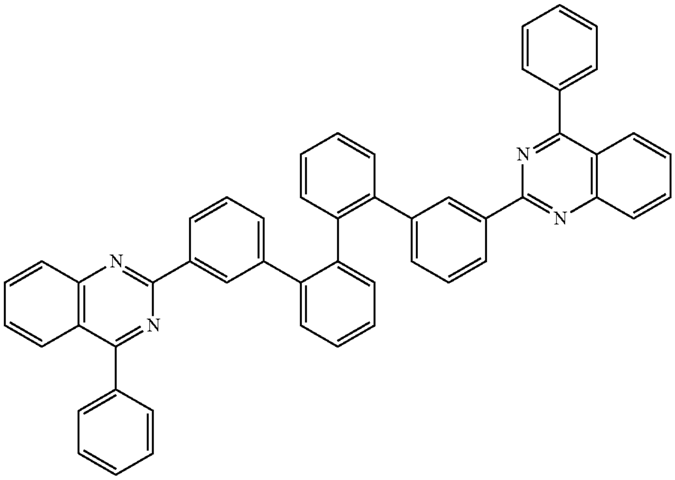
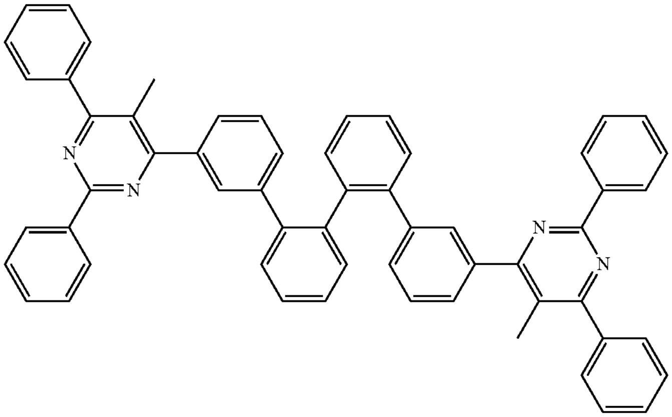

-continued
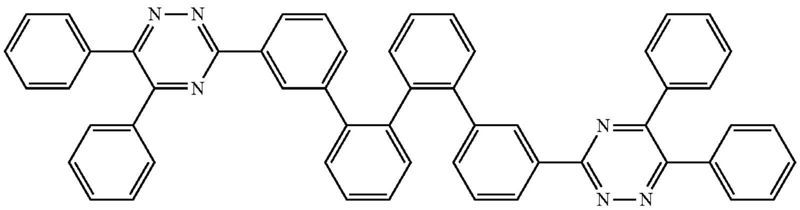
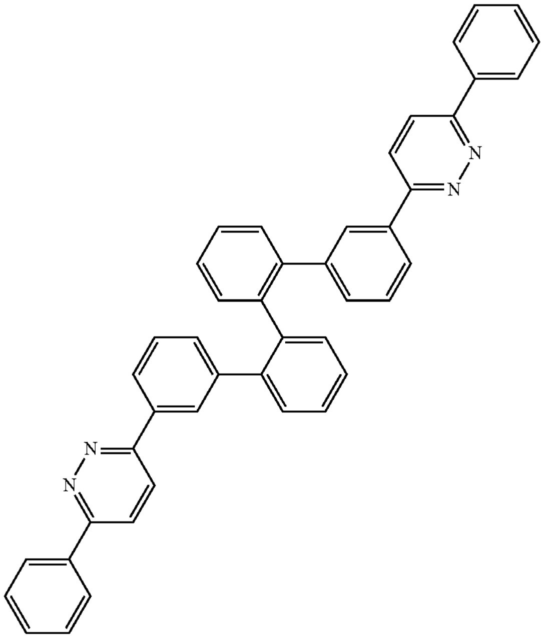
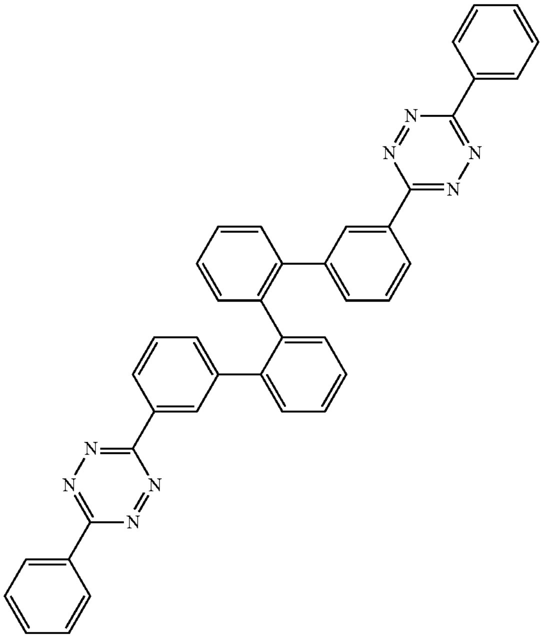
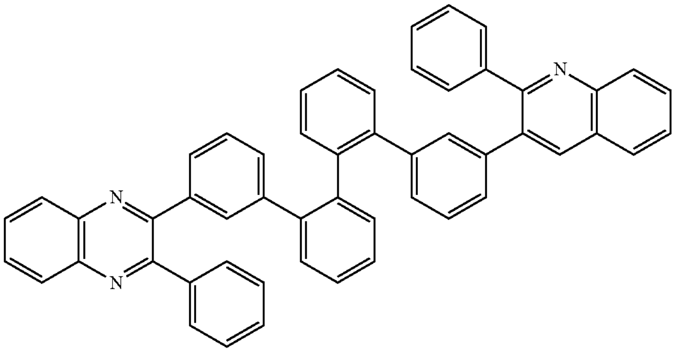

-continued
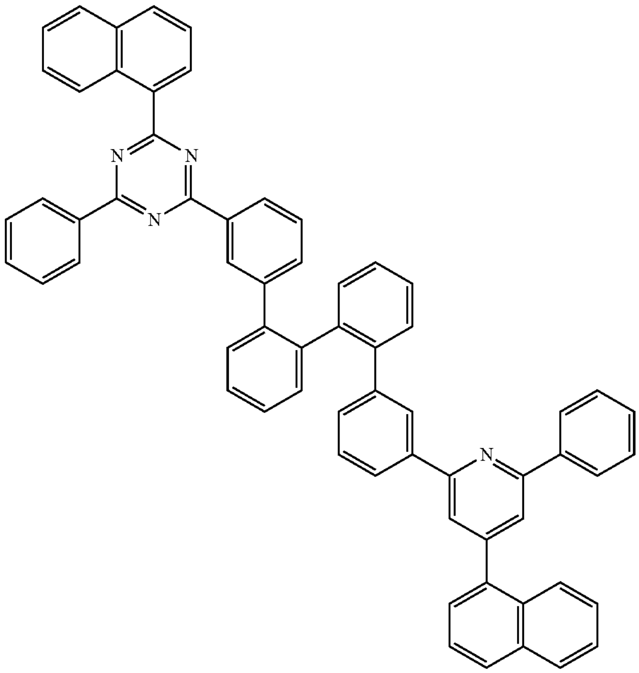
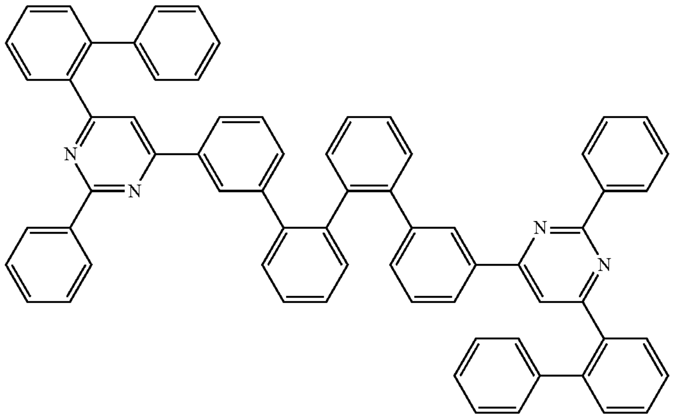
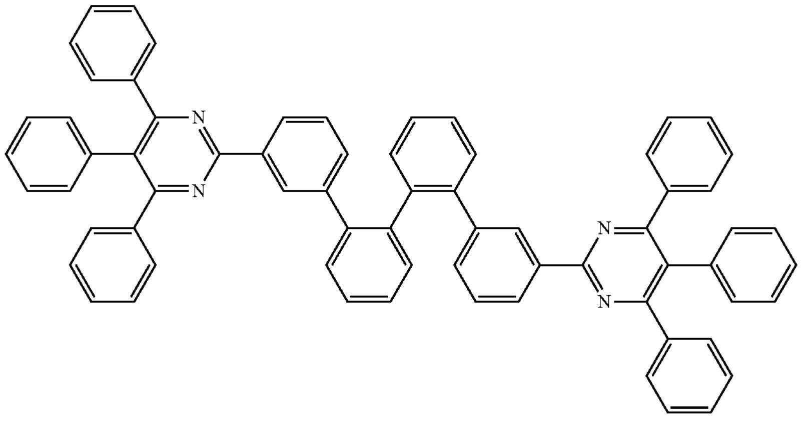

-continued
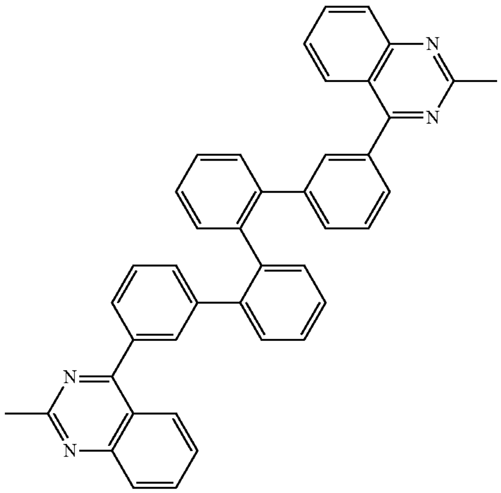
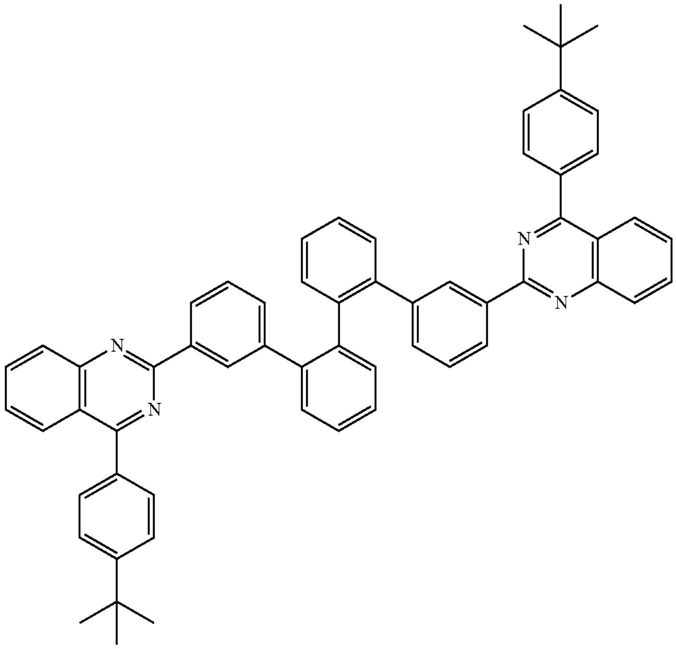
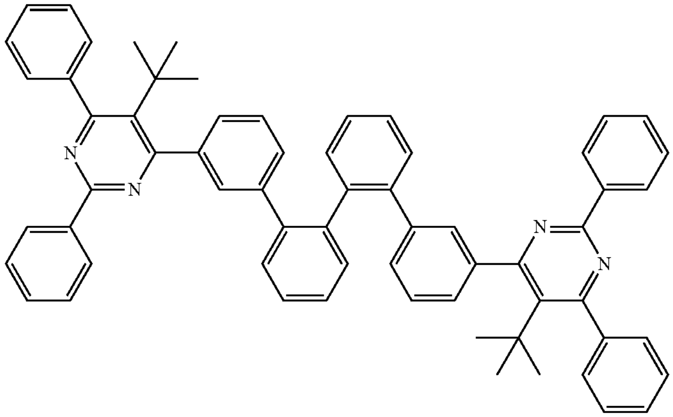

-continued
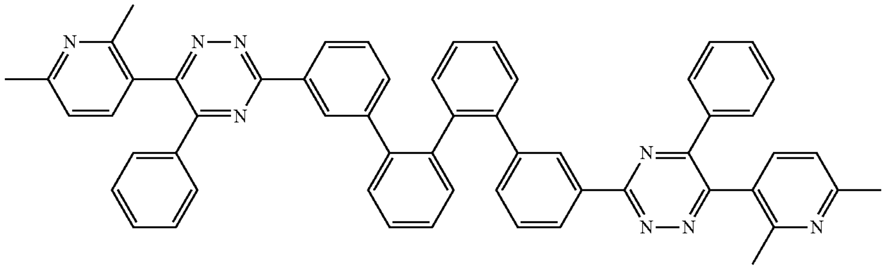
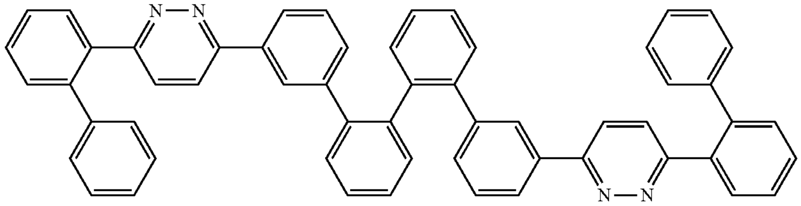
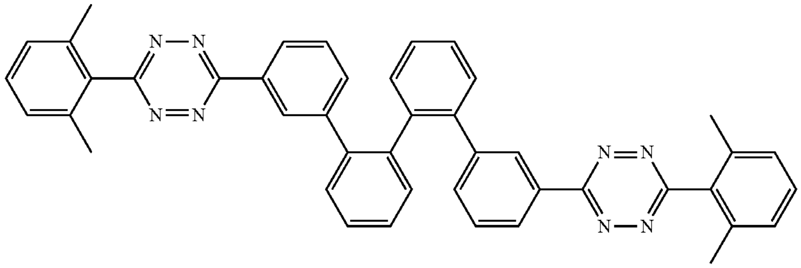
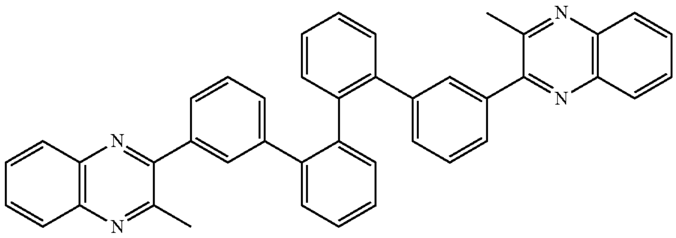
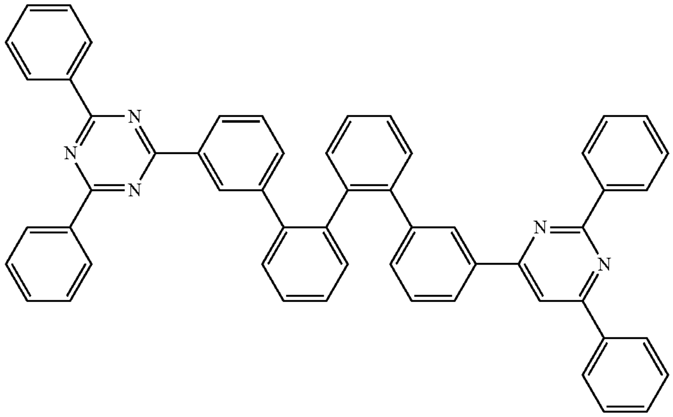

-continued
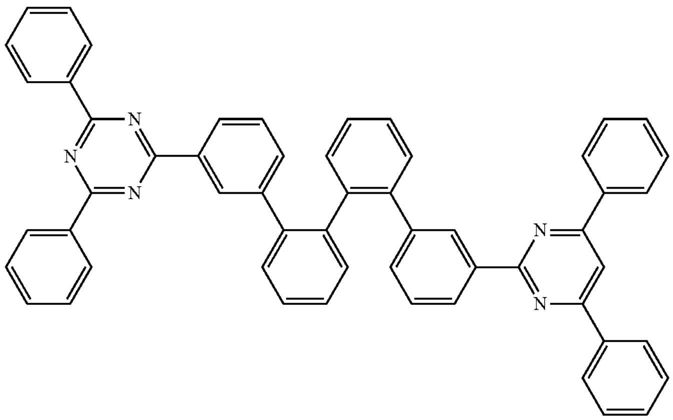
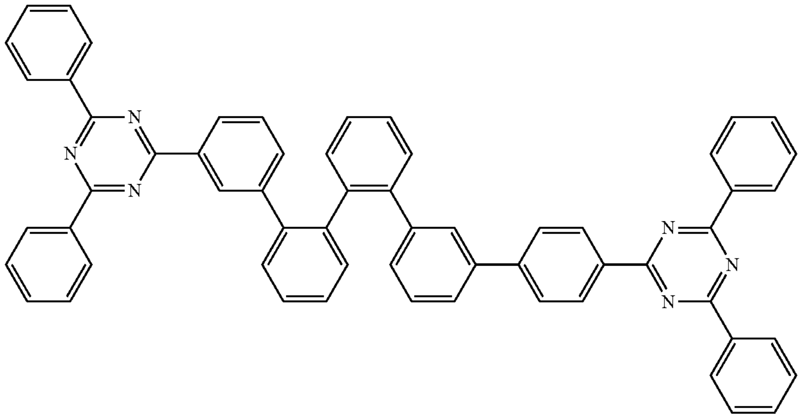
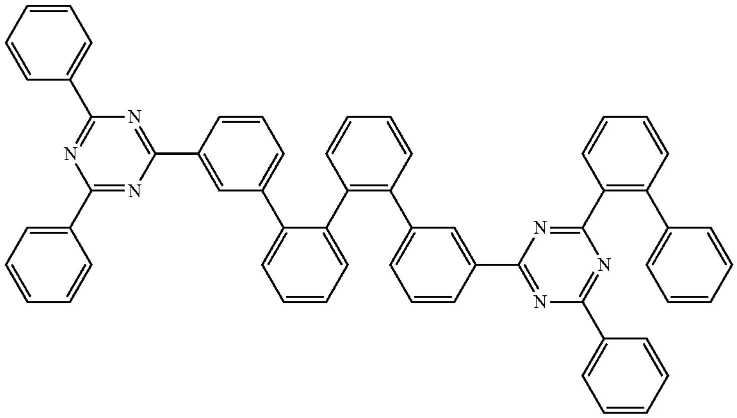

-continued
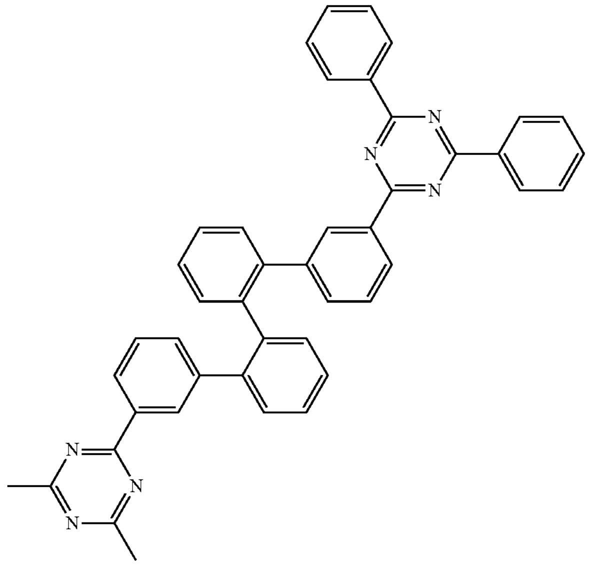
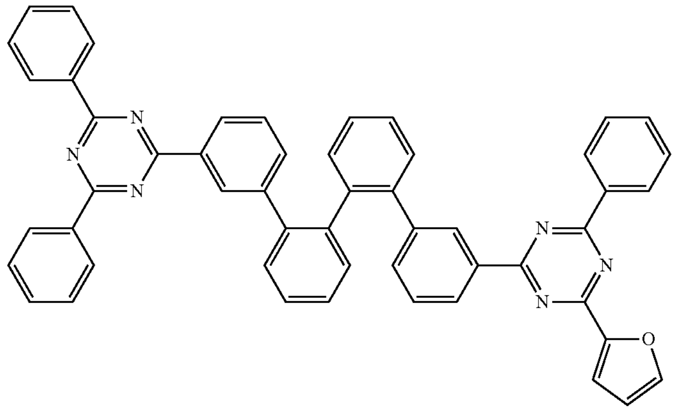
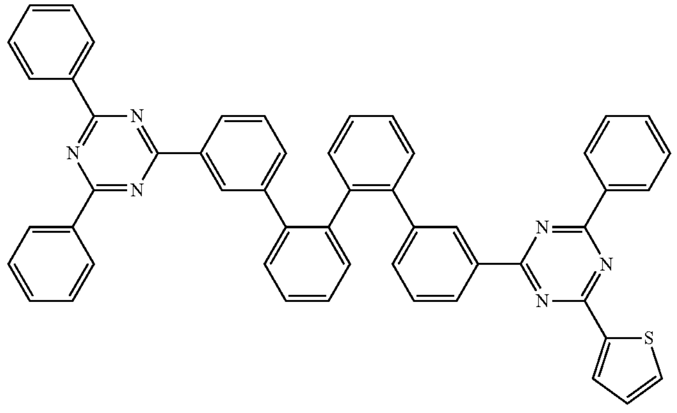

-continued
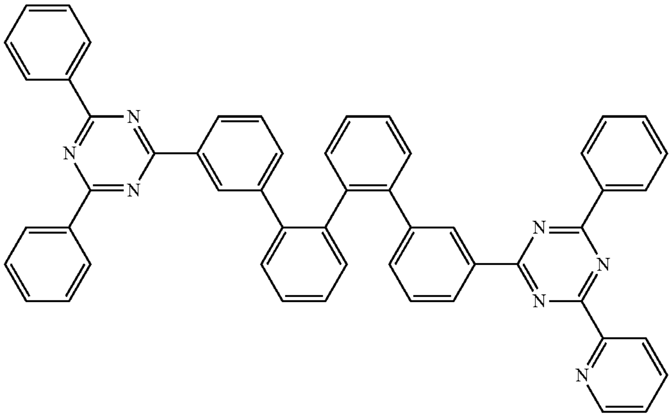
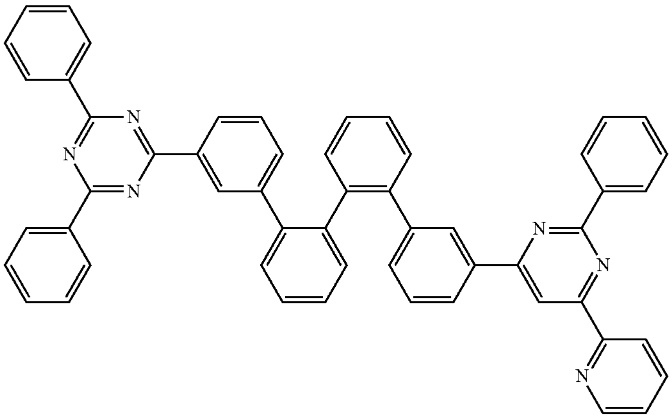
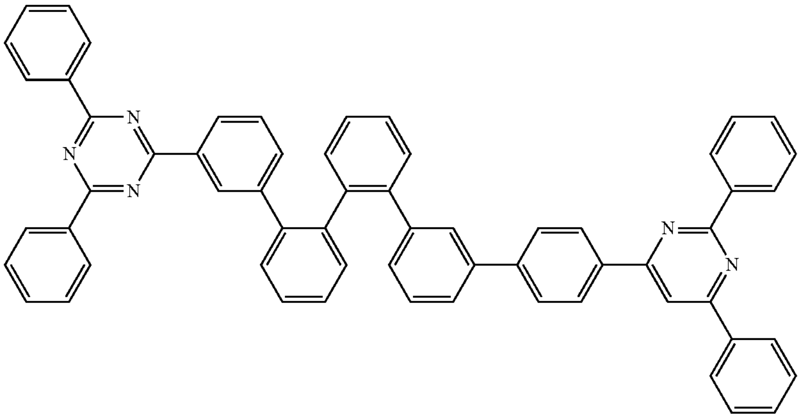
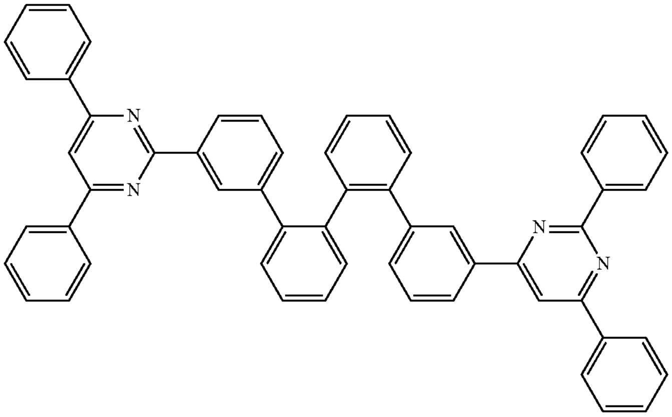

-continued
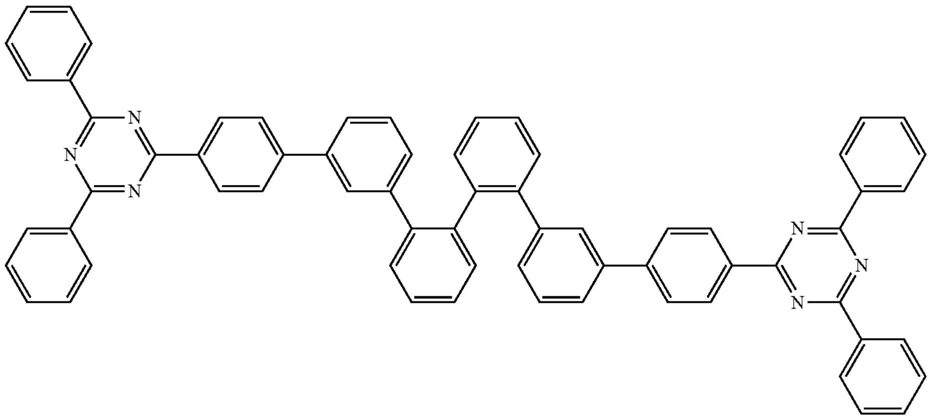
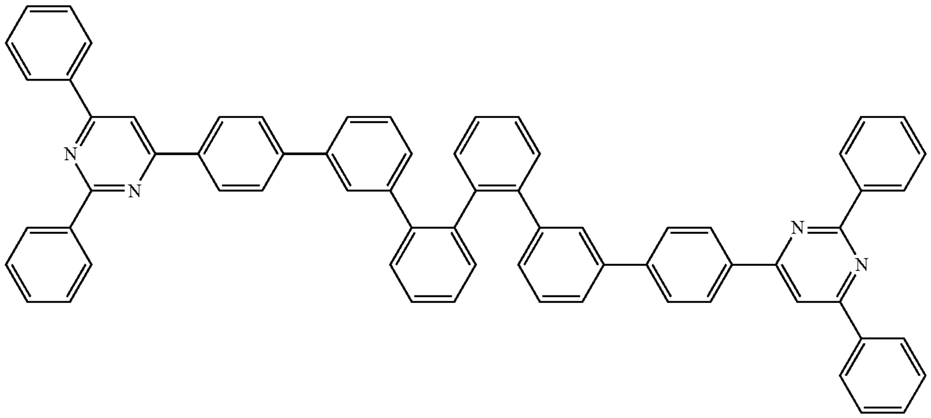
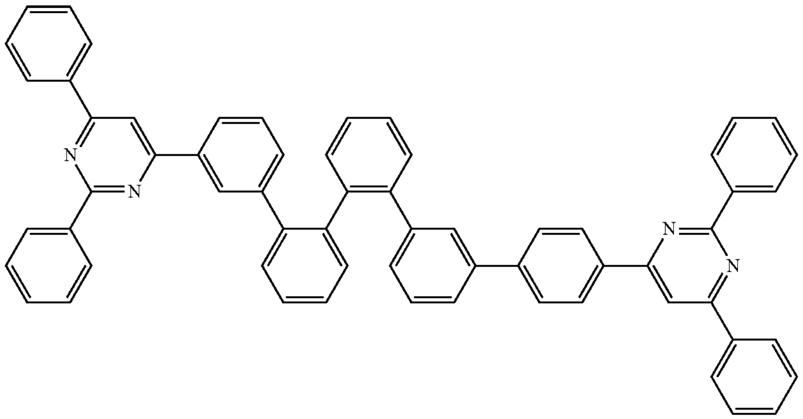
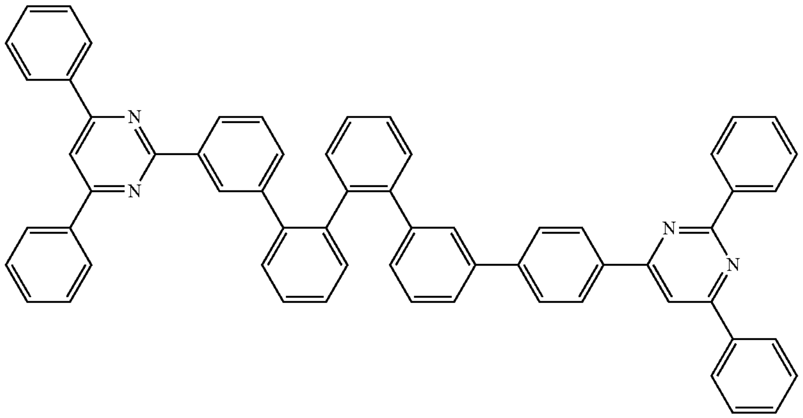

-continued
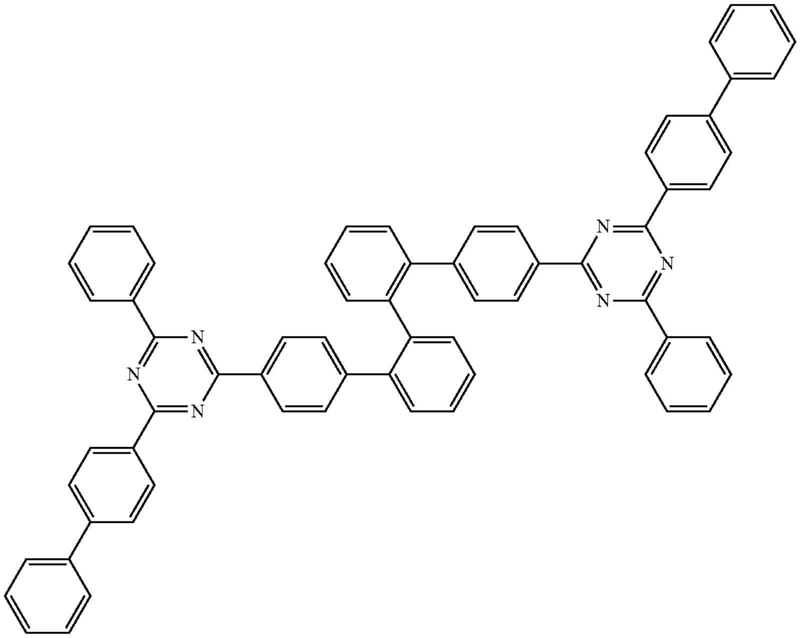
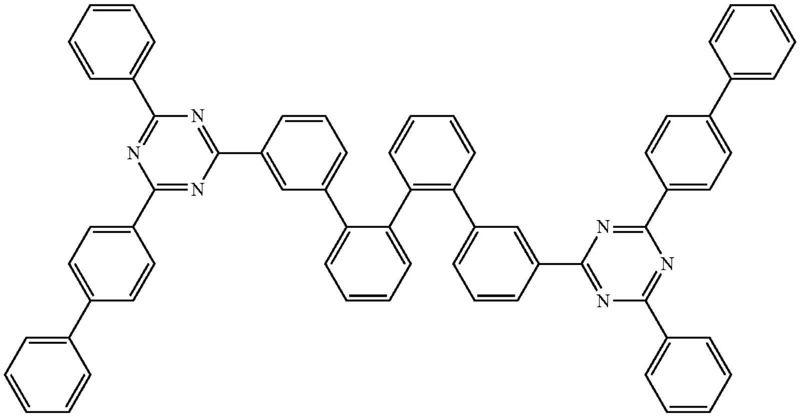
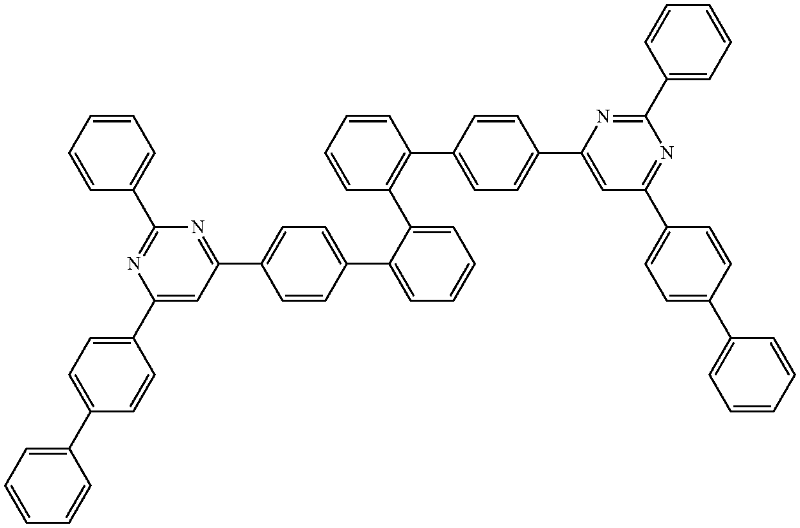

-continued
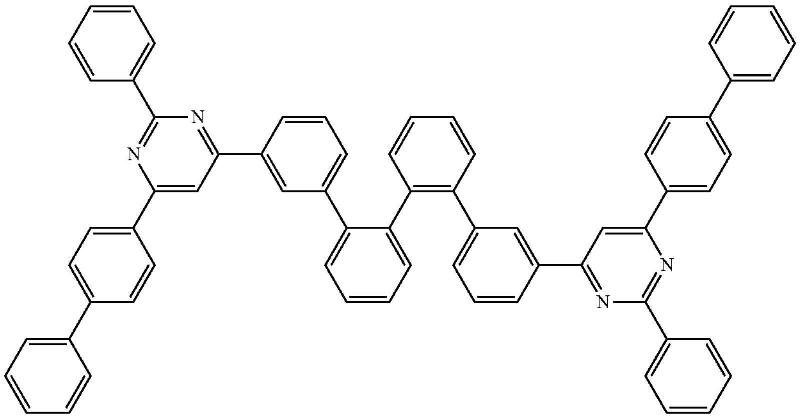
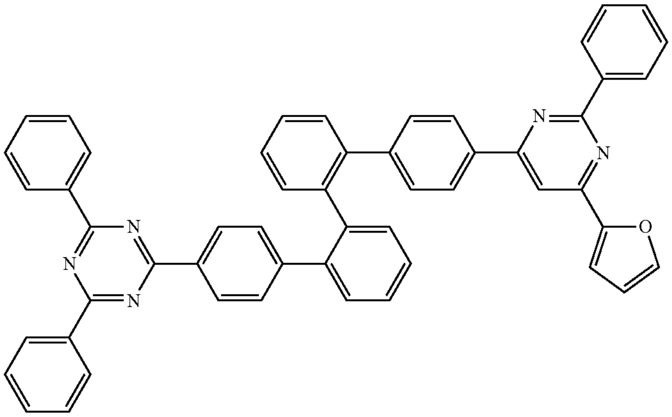
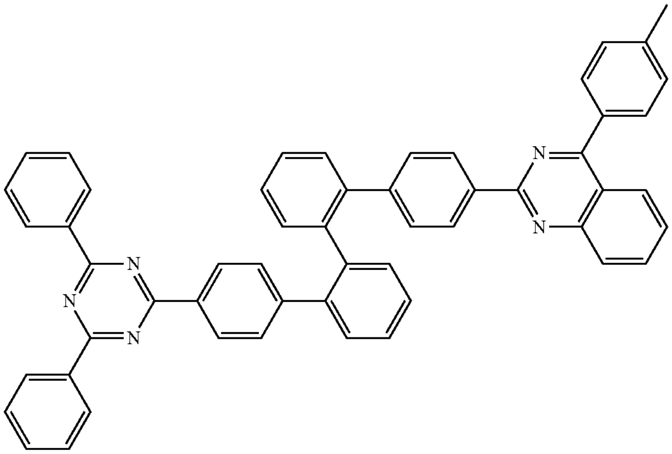
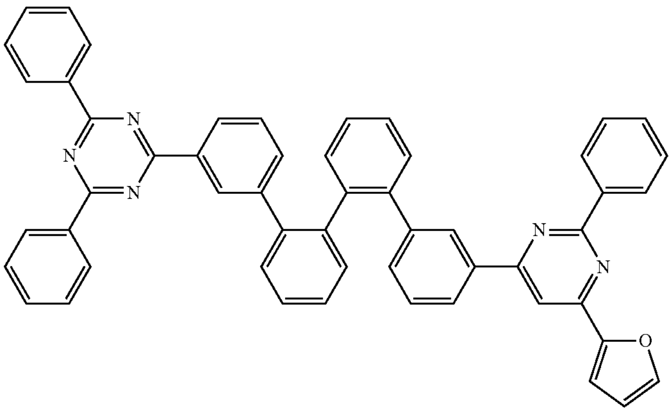

-continued
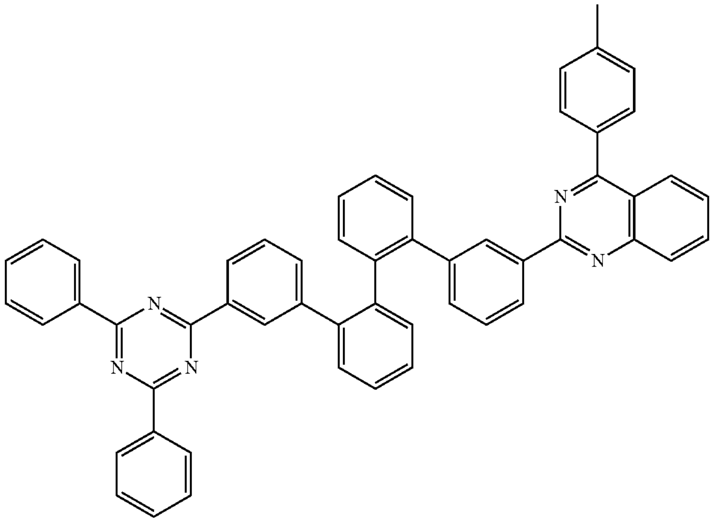
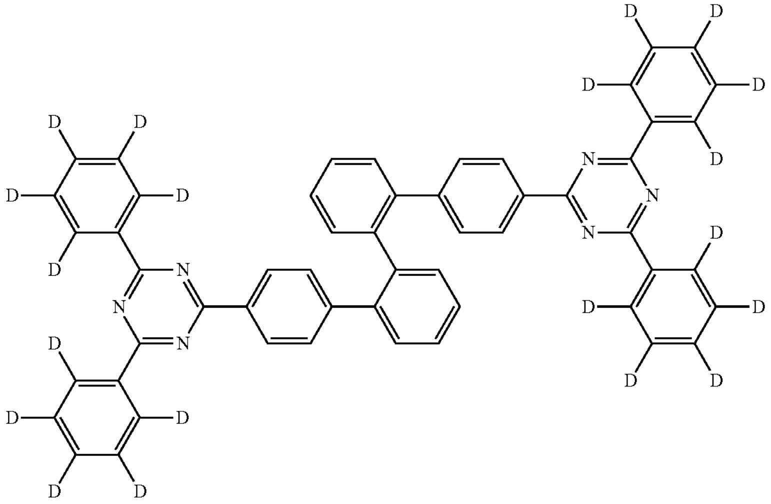
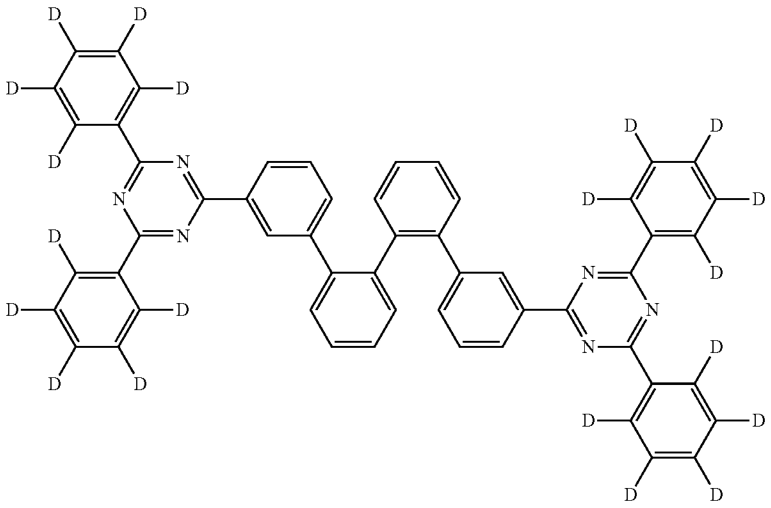

-continued
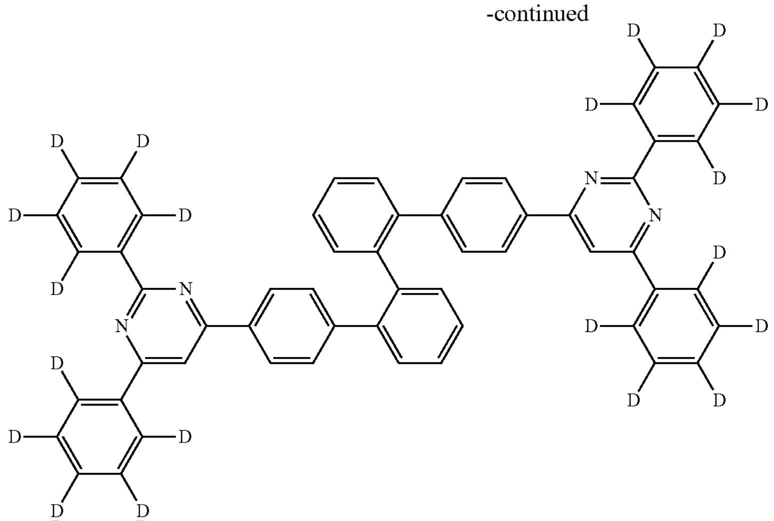
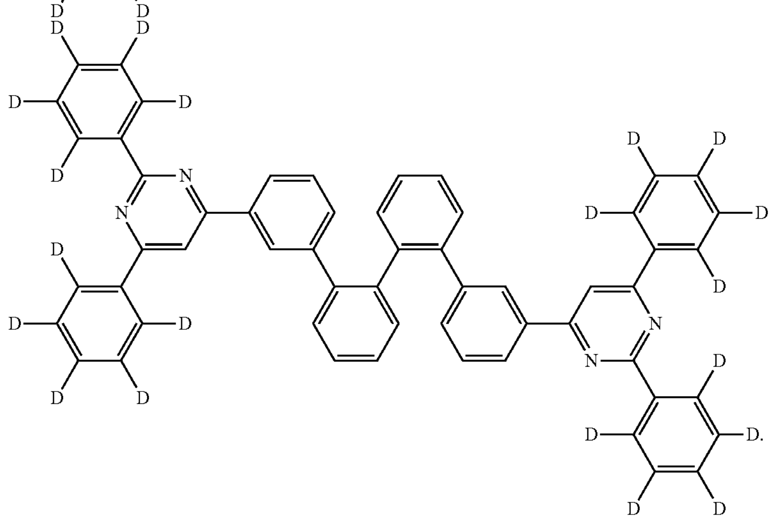
* * * * *